(12) United States Patent
Kubo

(10) Patent No.: US 11,963,354 B2
(45) Date of Patent: Apr. 16, 2024

(54) THREE-DIMENSIONAL MEMORY DEVICE WITH DIELECTRIC OR SEMICONDUCTOR WALL SUPPORT STRUCTURES AND METHOD OF FORMING THE SAME

(71) Applicant: SANDISK TECHNOLOGIES LLC, Addison, TX (US)

(72) Inventor: Tomohiro Kubo, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 291 days.

(21) Appl. No.: 17/467,970

(22) Filed: Sep. 7, 2021

(65) Prior Publication Data

US 2022/0102375 A1 Mar. 31, 2022

Related U.S. Application Data

(63) Continuation-in-part of application No. 17/039,160, filed on Sep. 30, 2020, now Pat. No. 11,322,440.

(51) Int. Cl.
| | |
|---|---|
| H10B 43/27 | (2023.01) |
| H10B 41/10 | (2023.01) |
| H10B 41/27 | (2023.01) |
| H10B 41/35 | (2023.01) |
| H10B 43/10 | (2023.01) |
| H10B 43/35 | (2023.01) |

(52) U.S. Cl.
CPC ............ *H10B 43/27* (2023.02); *H10B 41/10* (2023.02); *H10B 41/27* (2023.02); *H10B 41/35* (2023.02); *H10B 43/10* (2023.02); *H10B 43/35* (2023.02)

(58) Field of Classification Search
None
See application file for complete search history.

(56) References Cited

U.S. PATENT DOCUMENTS

| | | | |
|---|---|---|---|
| 5,915,167 | A | 6/1999 | Leedy |
| 9,754,963 | B1 | 9/2017 | Kawamura et al. |
| 9,806,093 | B2 | 10/2017 | Toyama et al. |
| 9,818,693 | B2 | 11/2017 | Toyama et al. |
| 9,818,759 | B2 | 11/2017 | Kai et al. |
| 9,953,992 | B1 | 4/2018 | Ogawa et al. |
| 10,038,006 | B2 | 7/2018 | Furihata et al. |
| 10,115,681 | B1 | 10/2018 | Ariyoshi |
| 10,249,640 | B2 | 4/2019 | Yu et al. |
| 10,381,371 | B2 | 8/2019 | Ogawa et al. |
| 10,840,260 | B2 | 11/2020 | Kai et al. |
| 10,861,871 | B2 | 12/2020 | Tobioka |
| 10,879,264 | B1 | 12/2020 | Otsu et al. |

(Continued)

OTHER PUBLICATIONS

USPTO Office Communication, Non-Final Office Action for U.S. Appl. No. 17/039,160, dated Sep. 30, 2021, 15 pages.

(Continued)

*Primary Examiner* — Hsien Ming Lee
(74) *Attorney, Agent, or Firm* — THE MARBURY LAW GROUP PLLC

(57) ABSTRACT

A three-dimensional memory device includes an alternating stack of insulating layers and electrically conductive layers, memory openings vertically extending through each layer of the alternating stack; memory opening fill structures located in the memory openings, and a perforated wall structure including lateral openings at levels of the insulating layers.

20 Claims, 137 Drawing Sheets

(56) References Cited

U.S. PATENT DOCUMENTS

| | | |
|---|---|---|
| 10,903,237 B1 | 1/2021 | Hosoda et al. |
| 11,081,443 B1 | 8/2021 | Mizutani et al. |
| 11,322,440 B2* | 5/2022 | Kubo .................. H10B 43/50 |
| 2017/0179026 A1 | 6/2017 | Toyama et al. |
| 2017/0179151 A1 | 6/2017 | Kai et al. |
| 2017/0179152 A1 | 6/2017 | Toyama et al. |
| 2017/0179153 A1 | 6/2017 | Ogawa et al. |
| 2017/0179154 A1 | 6/2017 | Furihata et al. |
| 2017/0358593 A1 | 12/2017 | Yu et al. |
| 2019/0057974 A1 | 2/2019 | Lu et al. |
| 2019/0280001 A1 | 9/2019 | Terasawa et al. |
| 2021/0057336 A1 | 2/2021 | Shao et al. |
| 2021/0134827 A1 | 5/2021 | Iwai et al. |
| 2021/0242128 A1 | 8/2021 | Ito et al. |
| 2022/0254733 A1* | 8/2022 | Mizuno .................. H10B 41/27 |

OTHER PUBLICATIONS

Endoh et al., "Novel Ultra High Density Memory with a Stacked-Surrounding Gate Transistor (S-SGT) Structured Cell," IEDM Proc. (2001) 33-36.

Notification of Transmittal of the International Search Report and the Written Opinion of the International Searching Authority for International Patent Application No. PCTUS2021/035322, dated Aug. 10, 2021, 12 pages.

U.S. Appl. No. 16/881,346, filed May 22, 2020, SanDisk Technologies LLC.

U.S. Appl. No. 16/881,401, filed May 22, 2020, SanDisk Technologies LLC.

U.S. Appl. No. 16/921,146, filed Jul. 6, 2020, SanDisk Technologies LLC.

* cited by examiner

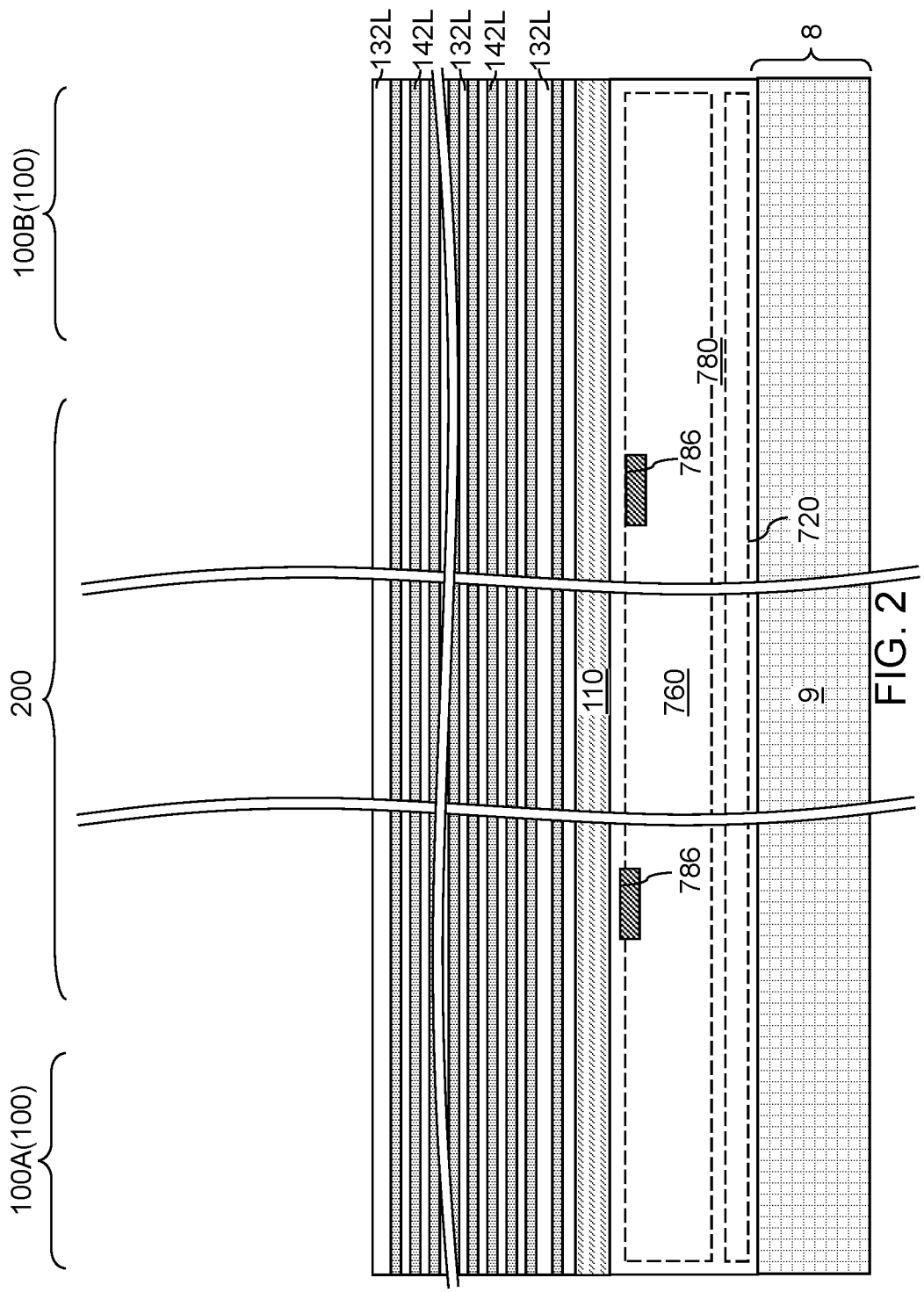

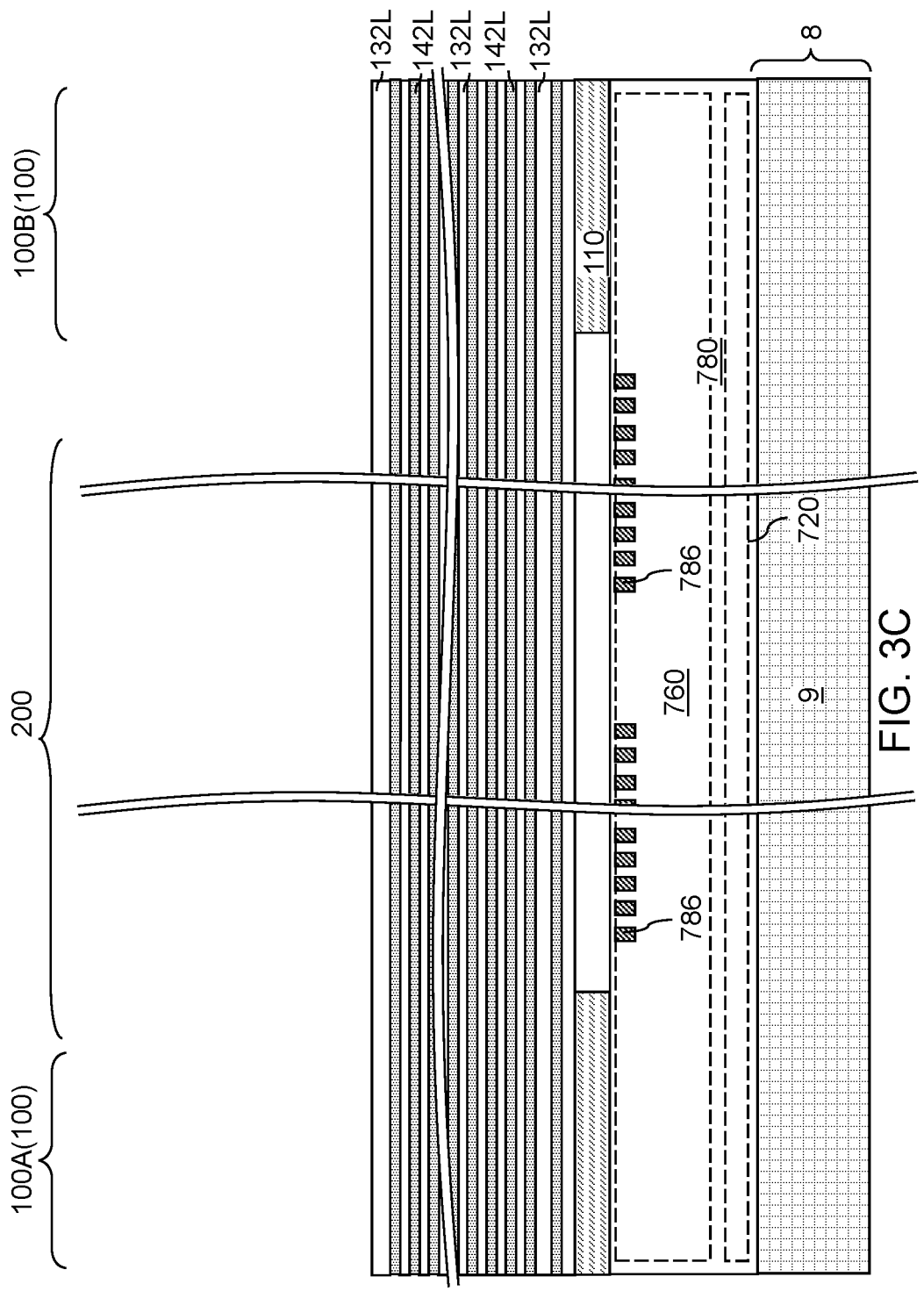

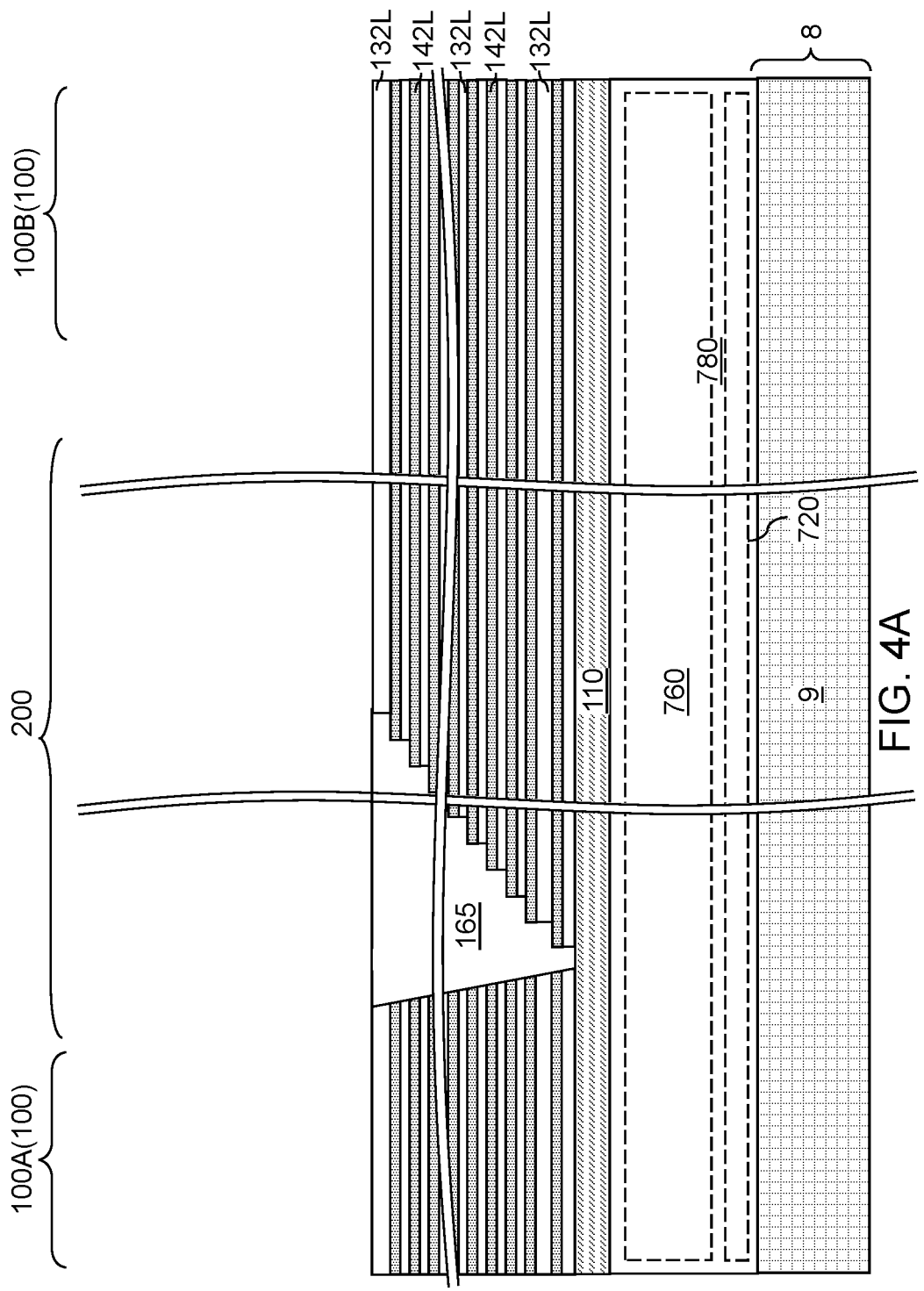

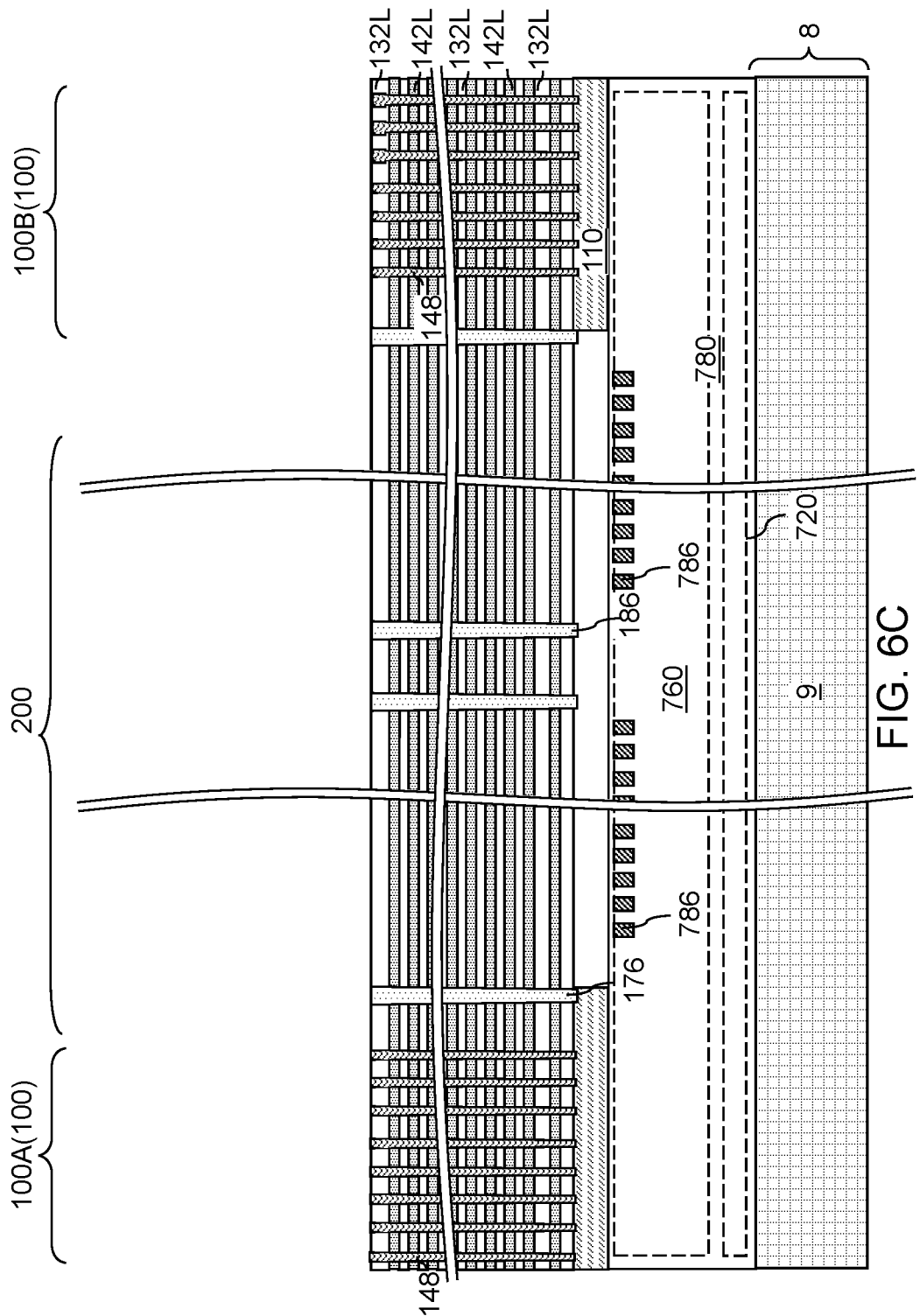

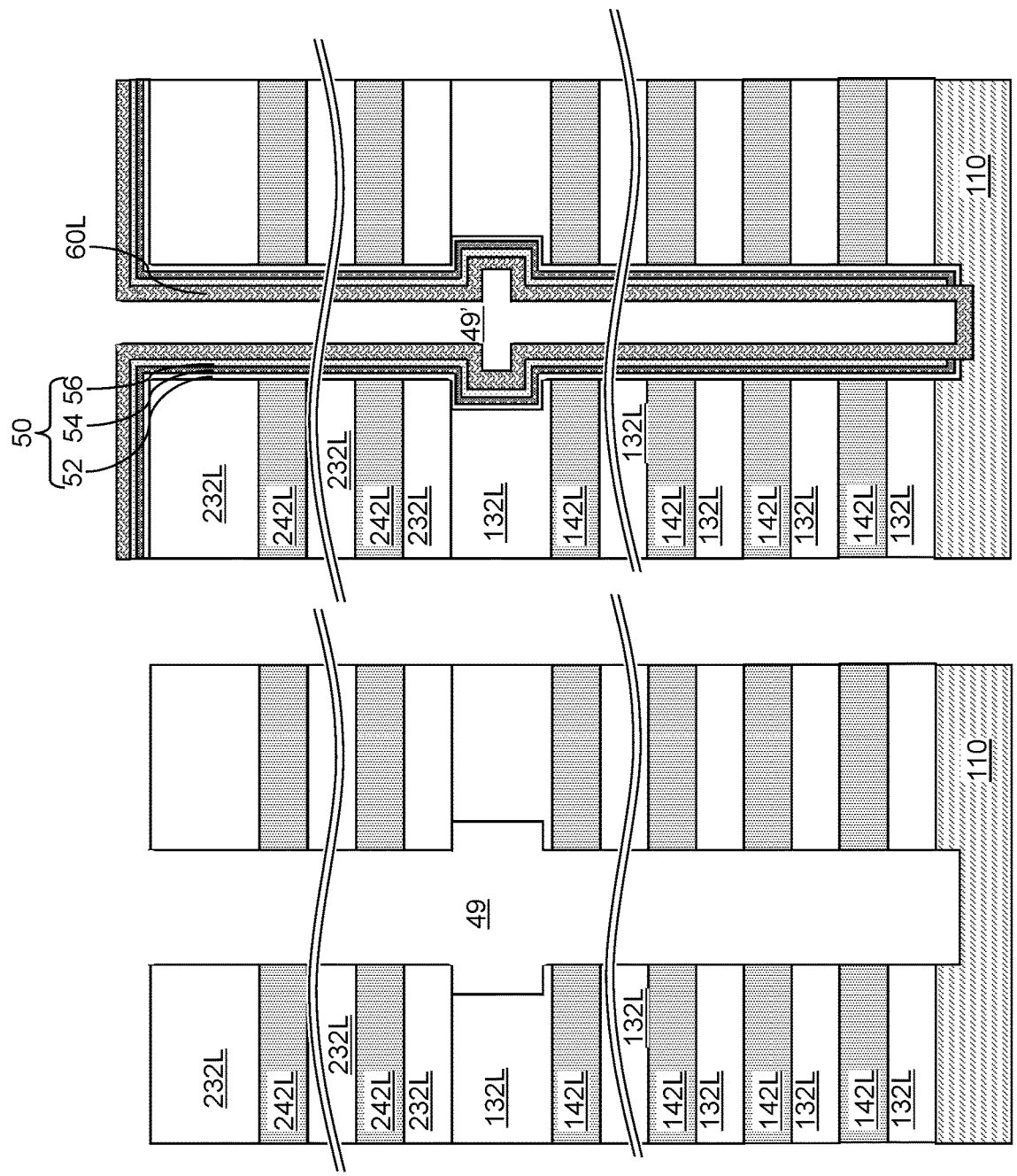

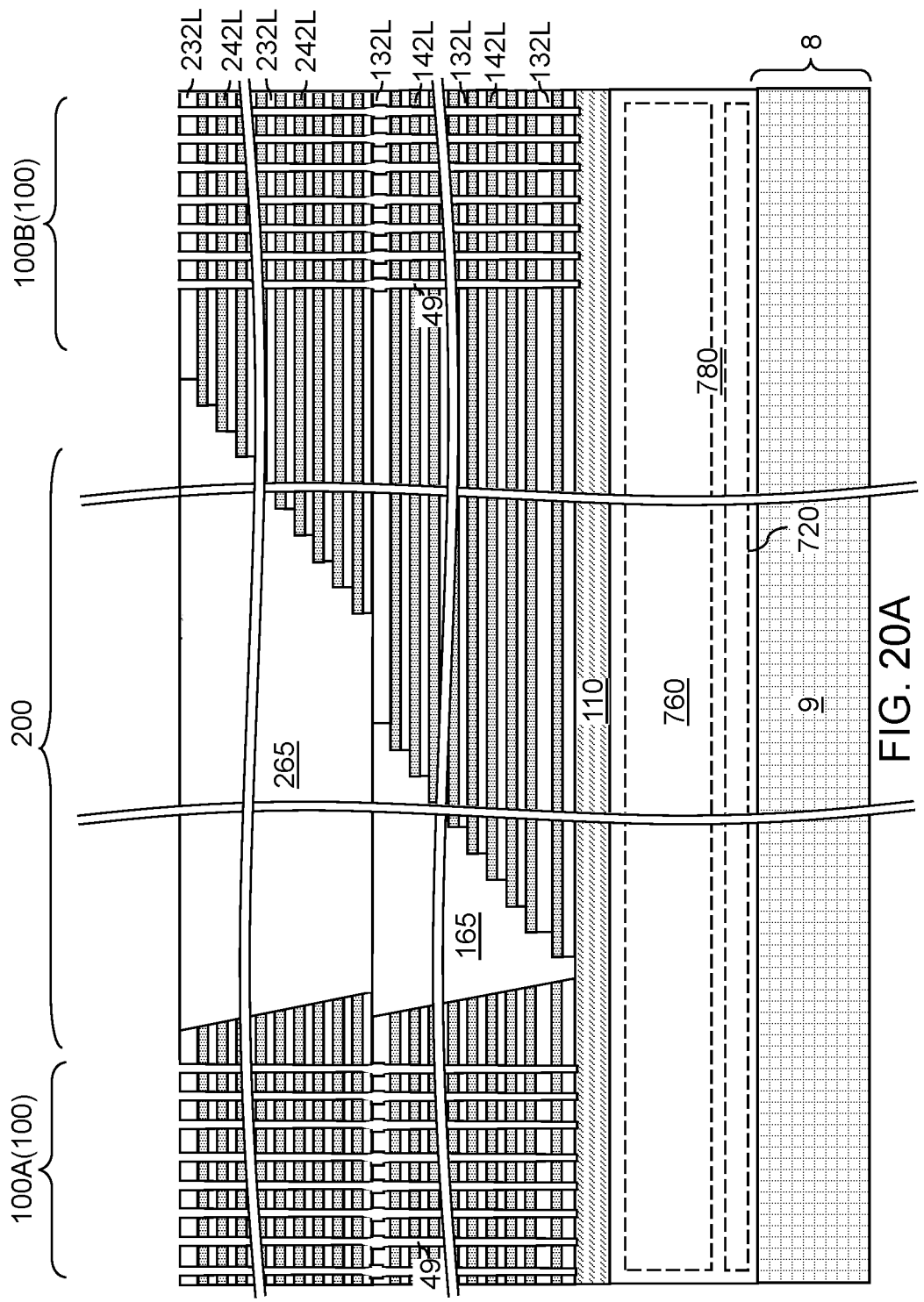

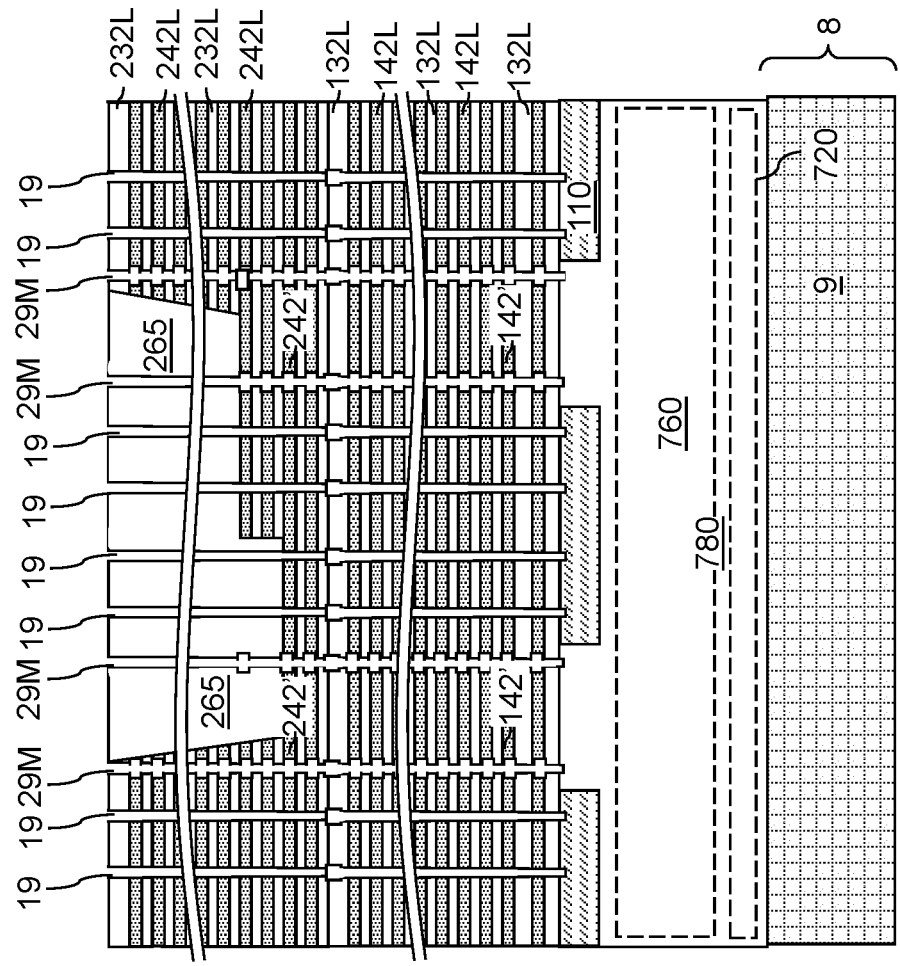

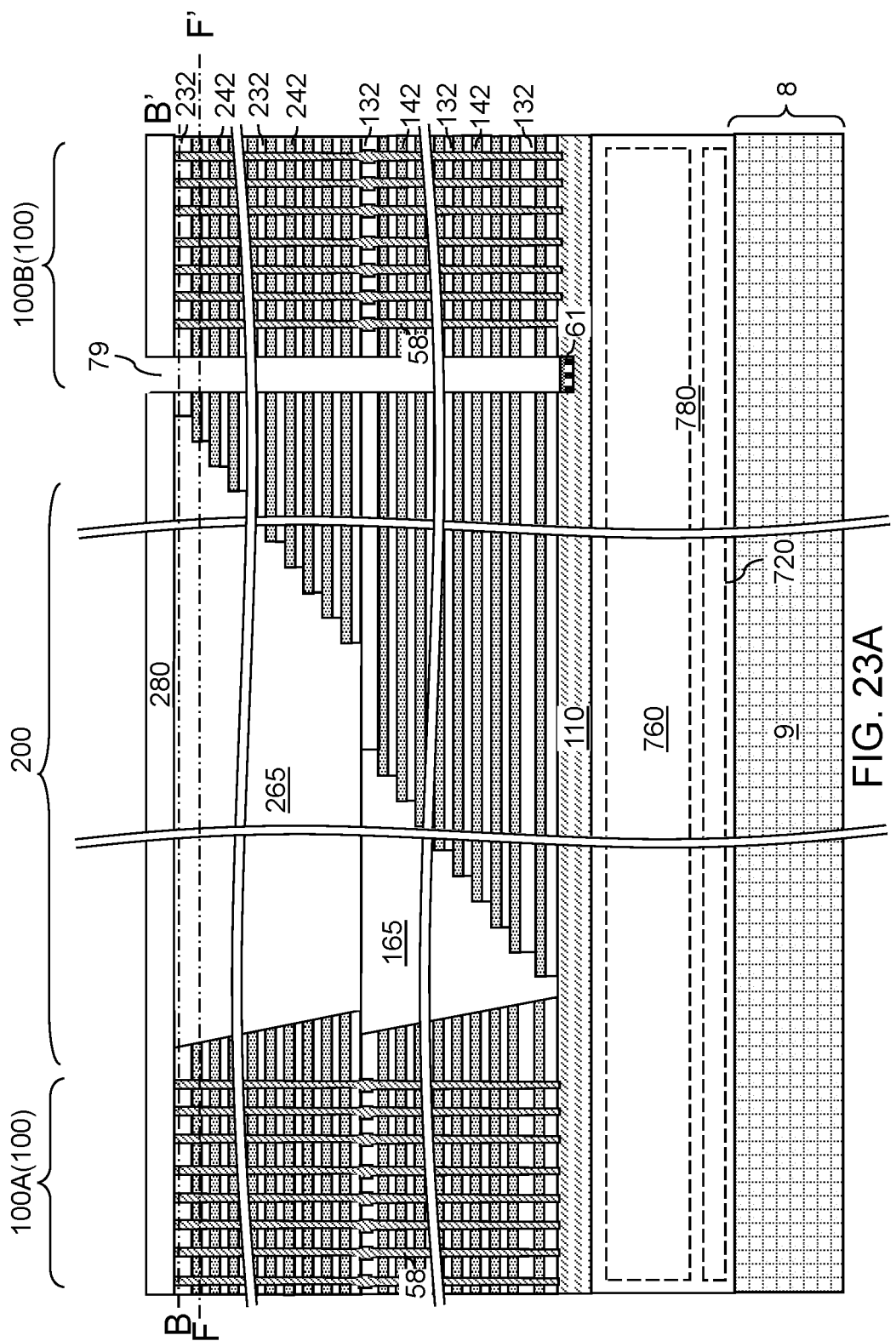

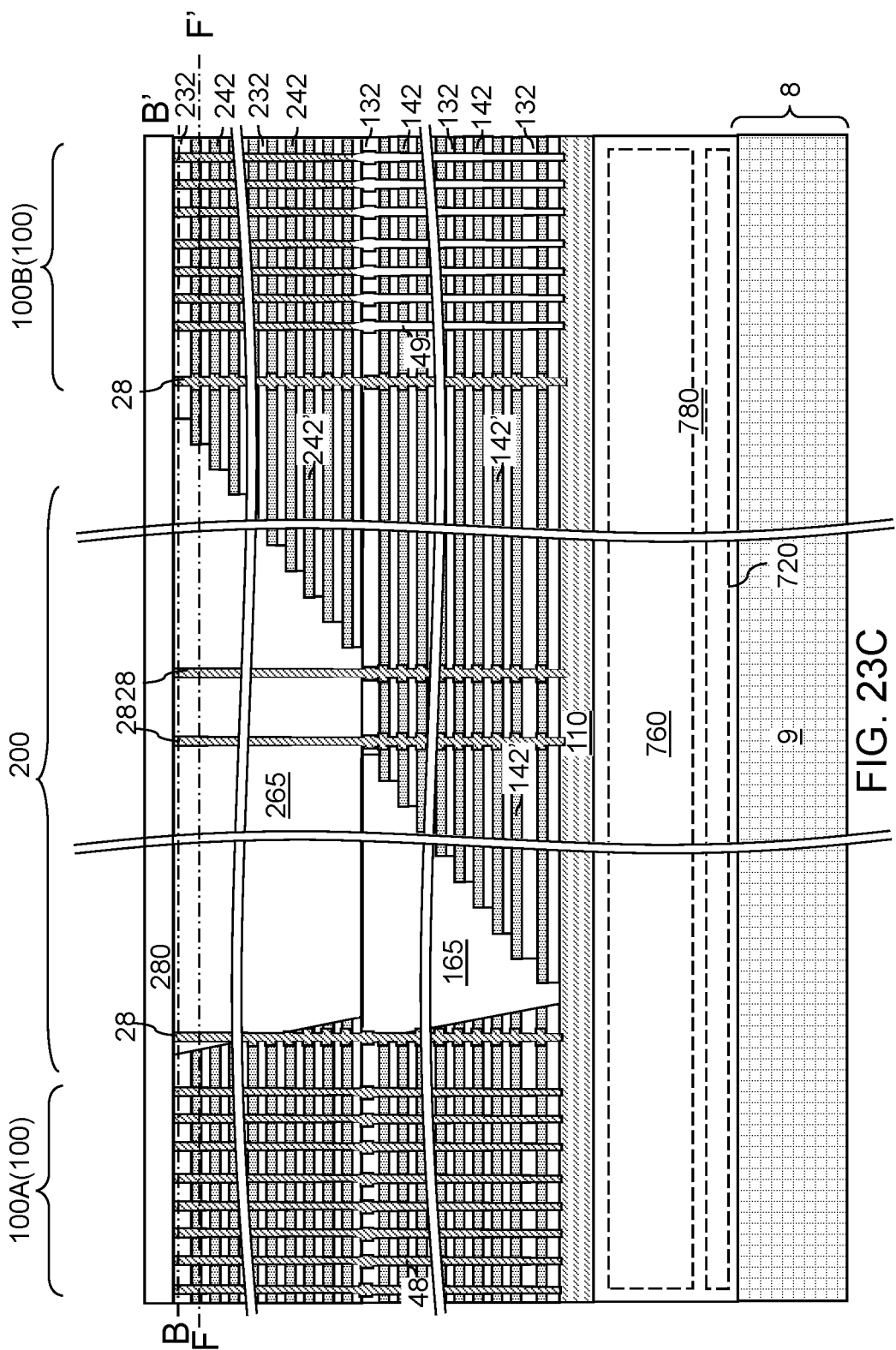

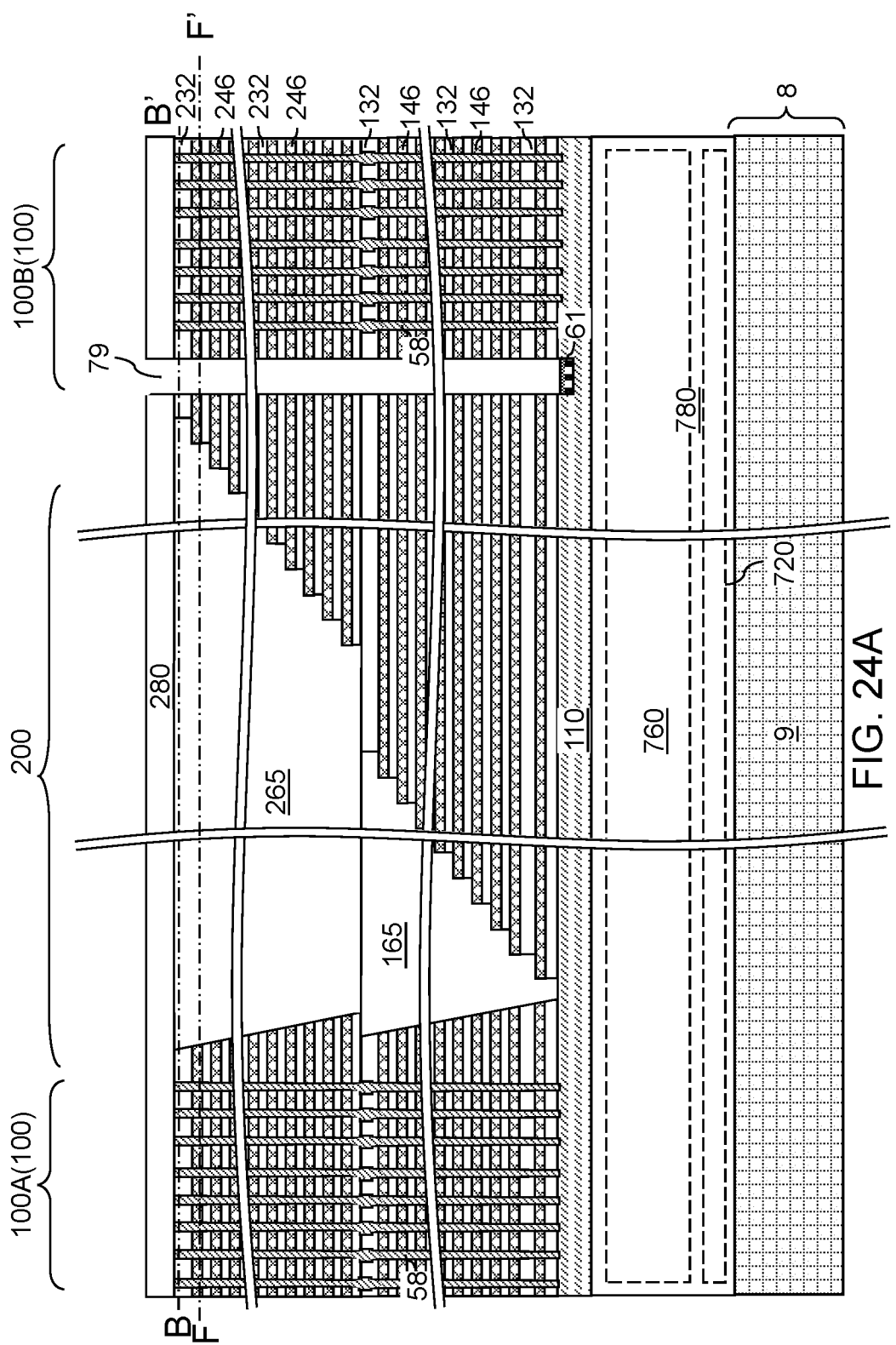

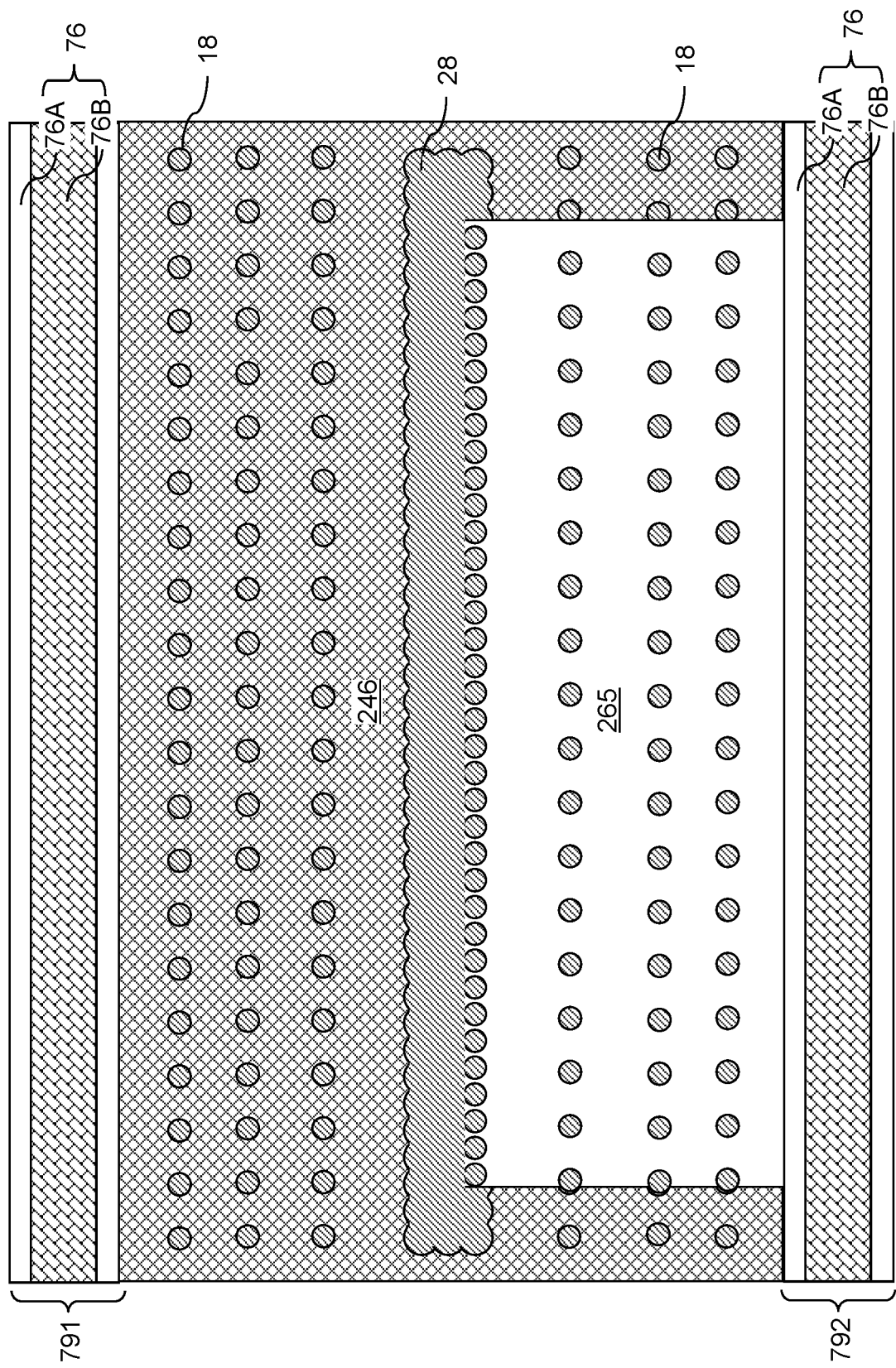

THREE-DIMENSIONAL MEMORY DEVICE WITH DIELECTRIC OR SEMICONDUCTOR WALL SUPPORT STRUCTURES AND METHOD OF FORMING THE SAME

RELATED APPLICATIONS

This application is a continuation-in-part application of U.S. patent application Ser. No. 17/039,160 filed on Sep. 30, 2020, the entire contents of which are incorporated herein by reference.

FIELD

The present disclosure relates generally to the field of semiconductor devices, and particularly to a three-dimensional memory device including dielectric wall support structures and methods of forming the same.

BACKGROUND

A three-dimensional memory device including three-dimensional vertical NAND strings having one bit per cell are disclosed in an article by T. Endoh et al, titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device is provided, which comprises: an alternating stack of insulating layers and electrically conductive layers located between a first line trench and a second line trench that laterally extend along a first horizontal direction and over a substrate; memory openings vertically extending through each layer of the alternating stack and located in a memory array region; memory opening fill structures located in the memory openings, wherein each of the memory opening fill structures comprises a memory film comprising a dielectric layer stack, a vertical semiconductor channel, and a dielectric core comprising a dielectric fill material; and a perforated wall structure located between the first line trench and the second line trench and including lateral openings at levels of the insulating layers through which a respective insulating layer laterally extends from outside the perforated wall structure into inside the perforated wall structure.

According to another aspect of the present disclosure, a method of forming a semiconductor structure is provided, which comprises: forming an alternating layer stack of continuous insulating layers and continuous sacrificial material layers; forming memory openings and columnar openings through each layer of the alternating layer stack; forming a continuous perforated cavity by isotropically etching portions of the sacrificial material layers around the columnar openings, wherein volumes of the columnar openings expand at levels of the sacrificial material layers and merge to form the continuous perforated cavity; forming memory opening fill structures in the memory openings and a perforated wall structure in the continuous perforated cavity, wherein each of the memory opening fill structures comprises a memory film and a vertical semiconductor channel and the perforated wall structure includes lateral openings at levels of the insulating layers through which a respective insulating layer laterally extends from outside the perforated wall structure into inside the perforated wall structure; patterning the alternating layer stack into multiple alternating stacks of insulating layers and sacrificial material layers; and replacing the sacrificial material layers with electrically conductive layers.

According to an embodiment of the present disclosure, a three-dimensional memory device comprises: an alternating stack of insulating layers and electrically conductive layers located between a first line trench and a second line trench that laterally extend along a first horizontal direction and over a substrate; a first memory array region and a second memory array region that are laterally spaced apart along the first horizontal direction and including each layer of the alternating stack, wherein a respective set of memory stack structures each comprising a vertical semiconductor channel and a memory film vertically extends through the alternating stack within each of the first memory array region and the second memory array region; a first dielectric wall structure and a second dielectric wall structure that are located between the first line trench and the second line trench and between the first memory array region and the second memory array region, laterally extending along the first horizontal direction, and having a lesser lateral extent that the first line trench and the second line trench, wherein a connection region is located between the first line trench and the first dielectric wall structure and each layer within the alternating stack continuously extends between the first memory array region and the second memory array region in the connection region, and a staircase region is located between the second line trench and the second dielectric wall structure, and the electrically conductive layers of the alternating stack have lateral extents along the first horizontal direction that decrease with a distance from the substrate; and an alternating stack of dielectric material plates and insulating plates or layers located between the first dielectric wall structure and the second dielectric wall structure, wherein the dielectric material plates have horizontal cross-sectional areas that decrease with the vertical distance from the substrate.

According to another aspect of the present disclosure, a three-dimensional memory device comprises an alternating stack of insulating layers and electrically conductive layers located between a first line trench and a second line trench that laterally extend along a first horizontal direction and over a substrate;
a first memory array region and a second memory array region that are laterally spaced apart along the first horizontal direction and including each layer of the alternating stack, wherein a respective set of memory stack structures each comprising a vertical semiconductor channel and a memory film vertically extends through the alternating stack within each of the first memory array region and the second memory array region; at least one dielectric wall structure that is located between the first line trench and the second line trench and between the first memory array region and the second memory array region, extending through all layers of the alternating stack, laterally extending along the first horizontal direction, having a lesser lateral extent that the first line trench and the second line trench along the first horizontal direction, and having a length along the first horizontal direction that is at least three times longer than its width extending along a second horizontal direction that is perpendicular to the first horizontal direction; and a staircase region is located between the second line trench and the at least one dielectric wall structure, and the electrically conductive layers of the alternating stack have lateral extents along the first horizontal direction that decrease with a distance from the substrate in the staircase region.

According to another aspect of the present disclosure, a method of forming a three-dimensional memory device is provided, which comprises: forming an alternating layer stack of continuous insulating layers and continuous sacrificial material layers; forming stepped surfaces underlying a stepped cavity by patterning the alternating layer stack in an inter-array region located between a first memory array region and a second memory array region; forming a dielectric cavity fill material portion over stepped surfaces of the alternating layer stack; forming a first dielectric wall structure and a second dielectric wall structure that laterally extend along a first horizontal direction through materials of the alternating layer stack and the dielectric cavity fill material portion within an area of the inter-array region, wherein the dielectric cavity fill material portion is divided into a retro-stepped dielectric material portion overlying the stepped surfaces of the alternating layer stack and a dielectric fill material portion located between the first dielectric wall structure and the second dielectric wall structure; forming a first line trench and a second line trench through the alternating layer stack, wherein the first line trench and the second line trench laterally extend along the first horizontal direction and are laterally spaced apart along a second horizontal direction by the first dielectric wall structure and the second dielectric wall structure; and replacing remaining portions of the continuous sacrificial material layers located outside a region between the first dielectric wall structure and the second dielectric wall structure with electrically conductive layers, wherein remaining portions of the continuous sacrificial material layers within the region between the first dielectric wall structure and the second dielectric wall structure comprise a stack of dielectric material plates.

BRIEF DESCRIPTION OF THE DRAWINGS

FIG. 2 is a vertical cross-sectional view of a first exemplary structure for forming a semiconductor die after formation of optional semiconductor devices, optional lower level dielectric layers, optional lower metal interconnect structures, a semiconductor material layer, and a first alternating layer stack of first continuous insulating layers and first continuous sacrificial material layers according to an embodiment of the present disclosure.

FIG. 3C is a vertical cross-sectional view along the vertical plane C-C' of FIG. 3B.

FIG. 4A is a vertical cross-sectional view of the first exemplary structure after formation of first-tier moat trenches according to an embodiment of the present disclosure.

FIG. 6C is a vertical cross-sectional view along the vertical plane C-C' of FIG. 6B.

FIGS. 10A-10D illustrate sequential vertical cross-sectional views of a memory opening during formation of a memory opening fill structure according to an embodiment of the present disclosure.

FIG. 20A is a vertical cross-sectional view of the second exemplary structure after formation of a second alternating layer stack, inter-tier memory openings, inter-tier support openings, and inter-tier columnar openings according to an embodiment of the present disclosure.

FIG. 21E is a vertical cross-sectional view along the vertical plane E-E' of FIG. 21B.

FIG. 23A is a vertical cross-sectional view of the second exemplary structure after formation of a contact-level dielectric layer and line trenches according to an embodiment of the present disclosure.

FIG. 23C is a vertical cross-sectional view along the vertical plane C-C' of FIG. 23B.

FIG. 24A is a vertical cross-sectional view of the second exemplary structure after replacement of sacrificial material layers with electrically conductive layers according to an embodiment of the present disclosure.

FIG. 26E is a vertical cross-sectional view along the vertical plane E-E' of FIG. 25B.

FIG. 26F is a horizontal cross-sectional view along the horizontal plane F-F' of FIGS. 26A and 26C.

FIG. 27A is a horizontal cross-sectional view of a region of a first configuration of the second exemplary structure including a perforated wall structure at a level of a second insulating layer according to an embodiment of the present disclosure.

FIG. 27B is a horizontal cross-sectional view of a region of the first configuration of the second exemplary structure including the perforated wall structure at a level of a second electrically conductive layer according to an embodiment of the present disclosure.

FIG. 27C is a horizontal cross-sectional view of a region of an alternative embodiment of the first configuration of the second exemplary structure including a perforated wall structure at a level of a second insulating layer according to an embodiment of the present disclosure.

FIG. 27D is a horizontal cross-sectional view of a region of the alternative embodiment of the first configuration of the second exemplary structure including the perforated wall structure at a level of a second electrically conductive layer according to an embodiment of the present disclosure.

FIG. 27E is a horizontal cross-sectional view of a region of another alternative embodiment of the first configuration of the second exemplary structure including a perforated wall structure at a level of a second insulating layer according to an embodiment of the present disclosure.

FIG. 27F is a horizontal cross-sectional view of a region of the another alternative embodiment of the first configuration of the second exemplary structure including the perforated wall structure at a level of a second electrically conductive layer according to an embodiment of the present disclosure.

FIG. 28A is a horizontal cross-sectional view of a region of a second configuration of the second exemplary structure including a perforated wall structure at a level of a second insulating layer according to an embodiment of the present disclosure.

FIG. 28B is a horizontal cross-sectional view of a region of the second configuration of the second exemplary structure including the perforated wall structure at a level of a second electrically conductive layer according to an embodiment of the present disclosure.

FIG. 28C is a horizontal cross-sectional view of a region of the alternative embodiment of the second configuration of the second exemplary structure including the perforated wall structure at a level of a second electrically conductive layer according to an embodiment of the present disclosure.

FIG. 29A is a horizontal cross-sectional view of a region of a third configuration of the second exemplary structure including a perforated wall structure at a level of a second insulating layer according to an embodiment of the present disclosure.

Figure 29A:
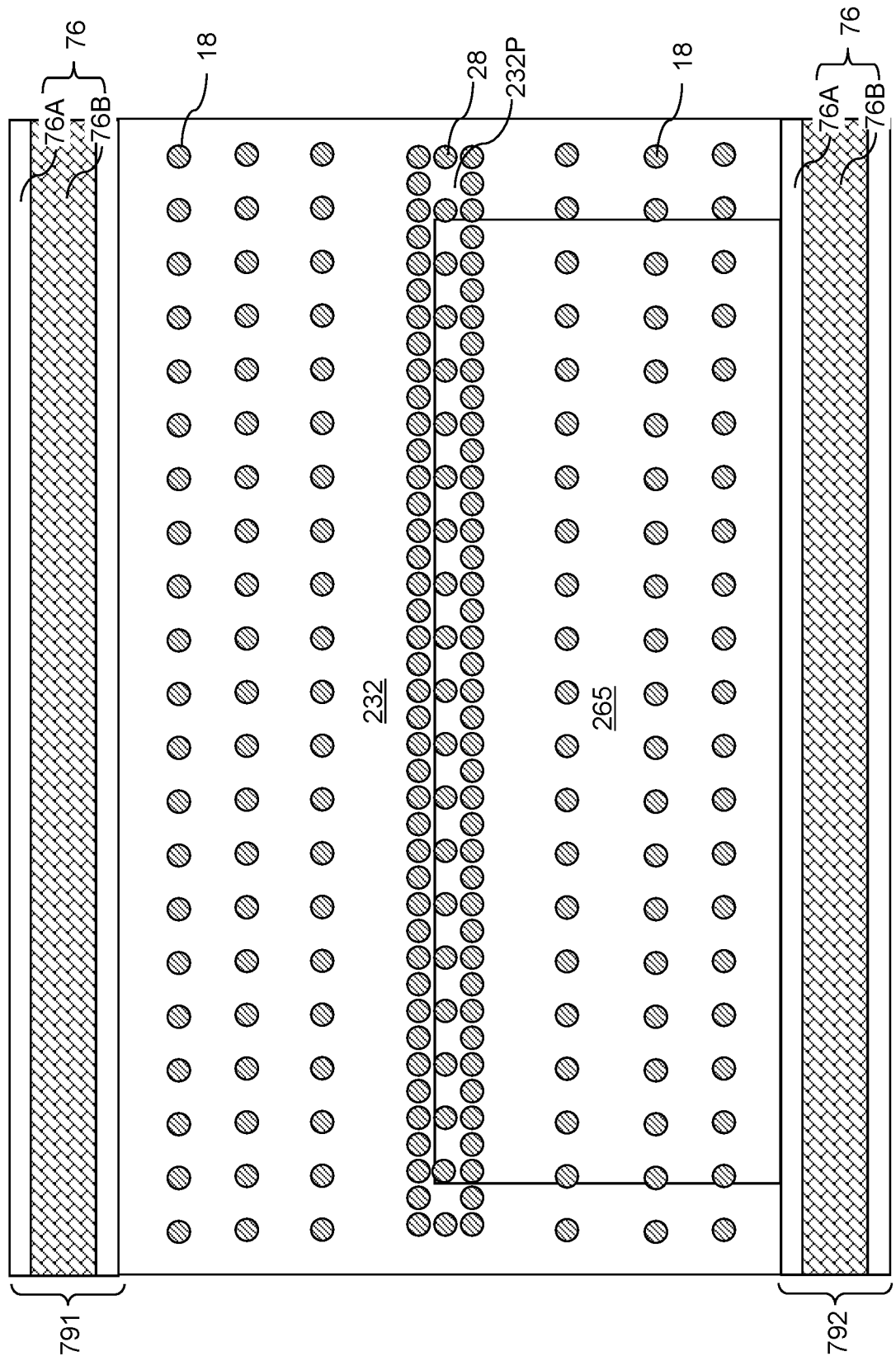
Figure 29B:
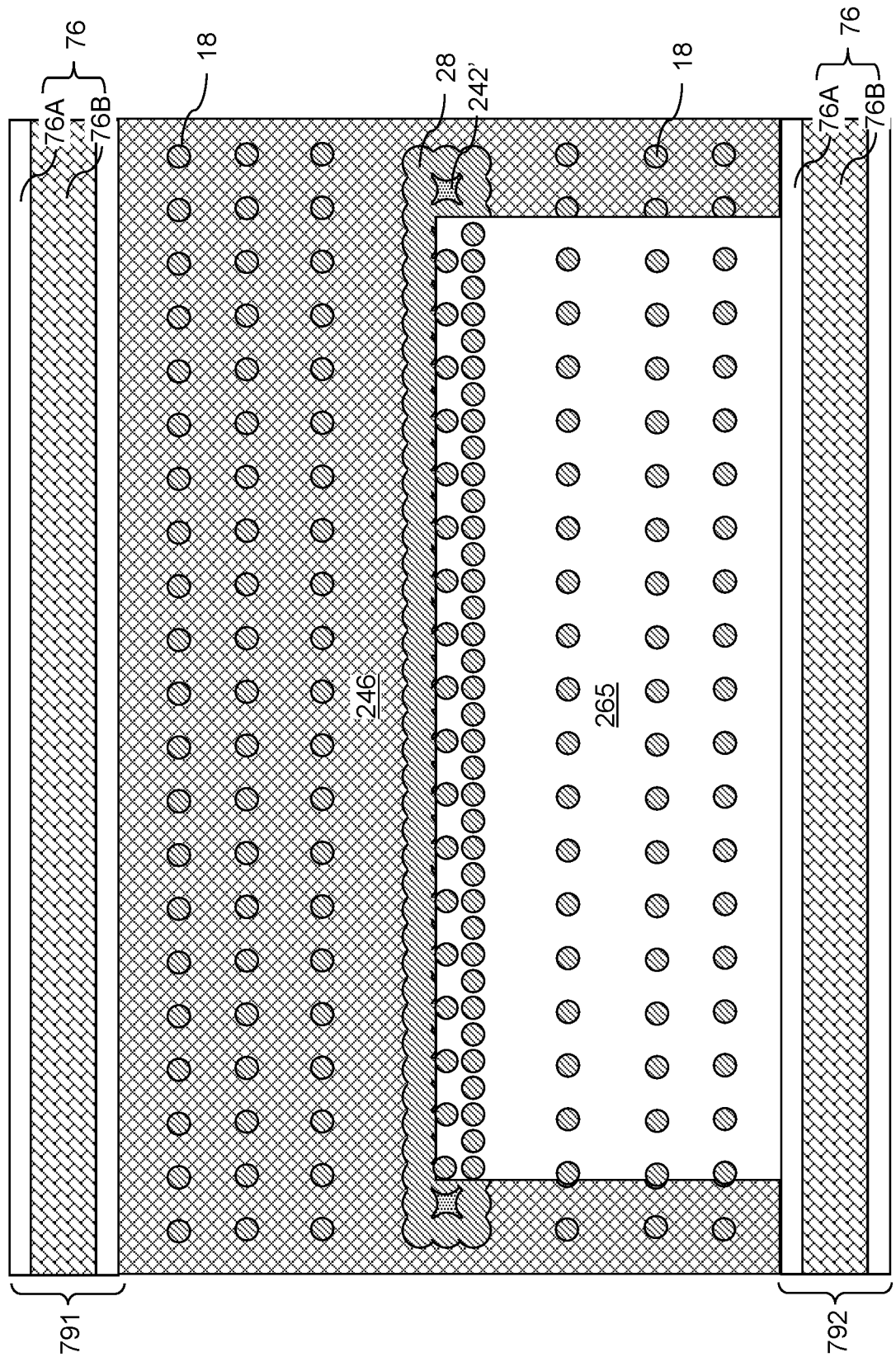

FIG. 29B is a horizontal cross-sectional view of a region of the third configuration of the second exemplary structure including the perforated wall structure at a level of a second electrically conductive layer according to an embodiment of the present disclosure.

FIG. 29C is a horizontal cross-sectional view of a region of the alternative embodiment of the third configuration of the second exemplary structure including the perforated wall structure at a level of a second electrically conductive layer according to an embodiment of the present disclosure.

Figure 30A:
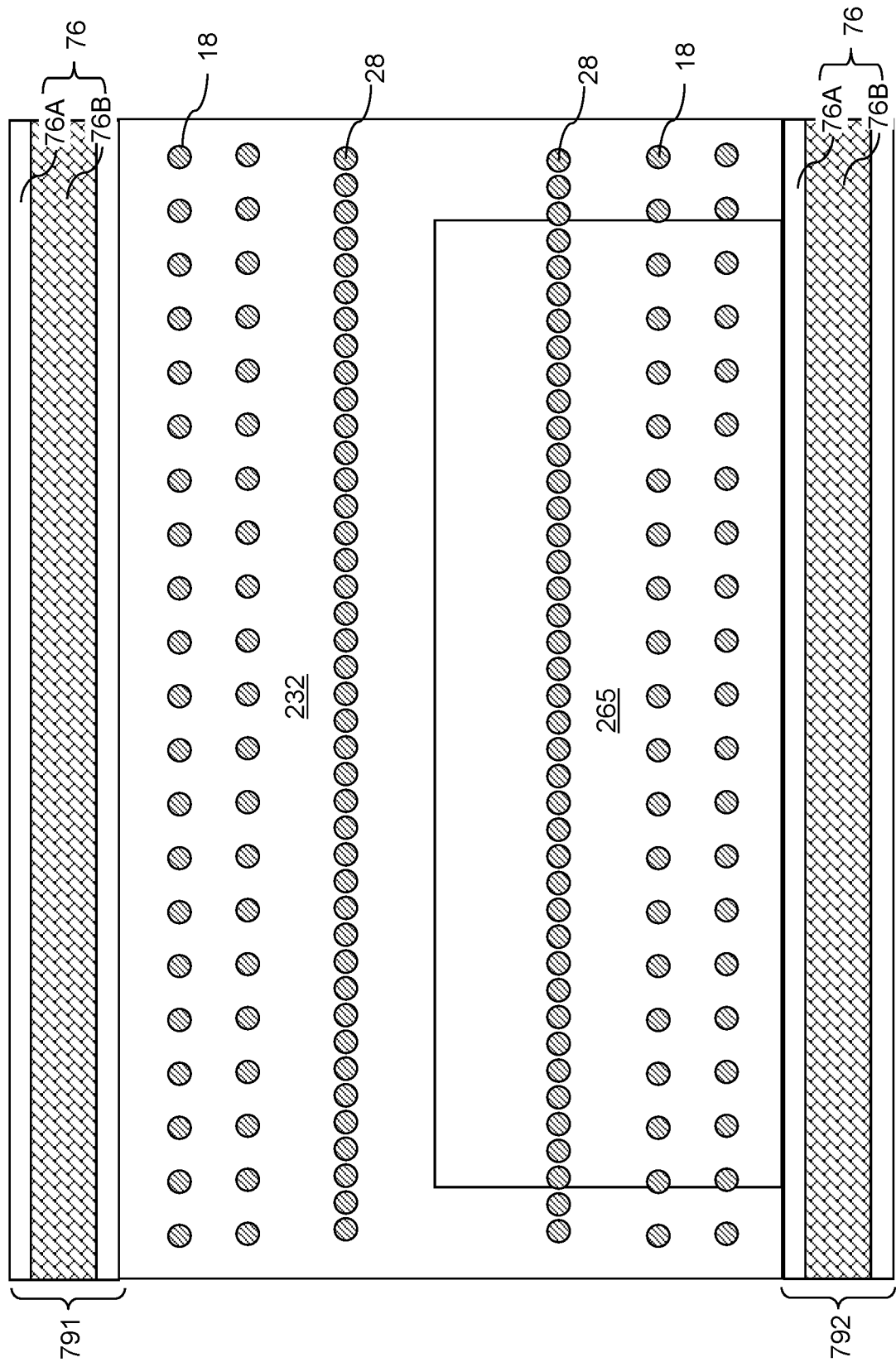

FIG. 30A is a horizontal cross-sectional view of a region of a fourth configuration of the second exemplary structure including a perforated wall structure at a level of a second insulating layer according to an embodiment of the present disclosure.

Figure 30B:
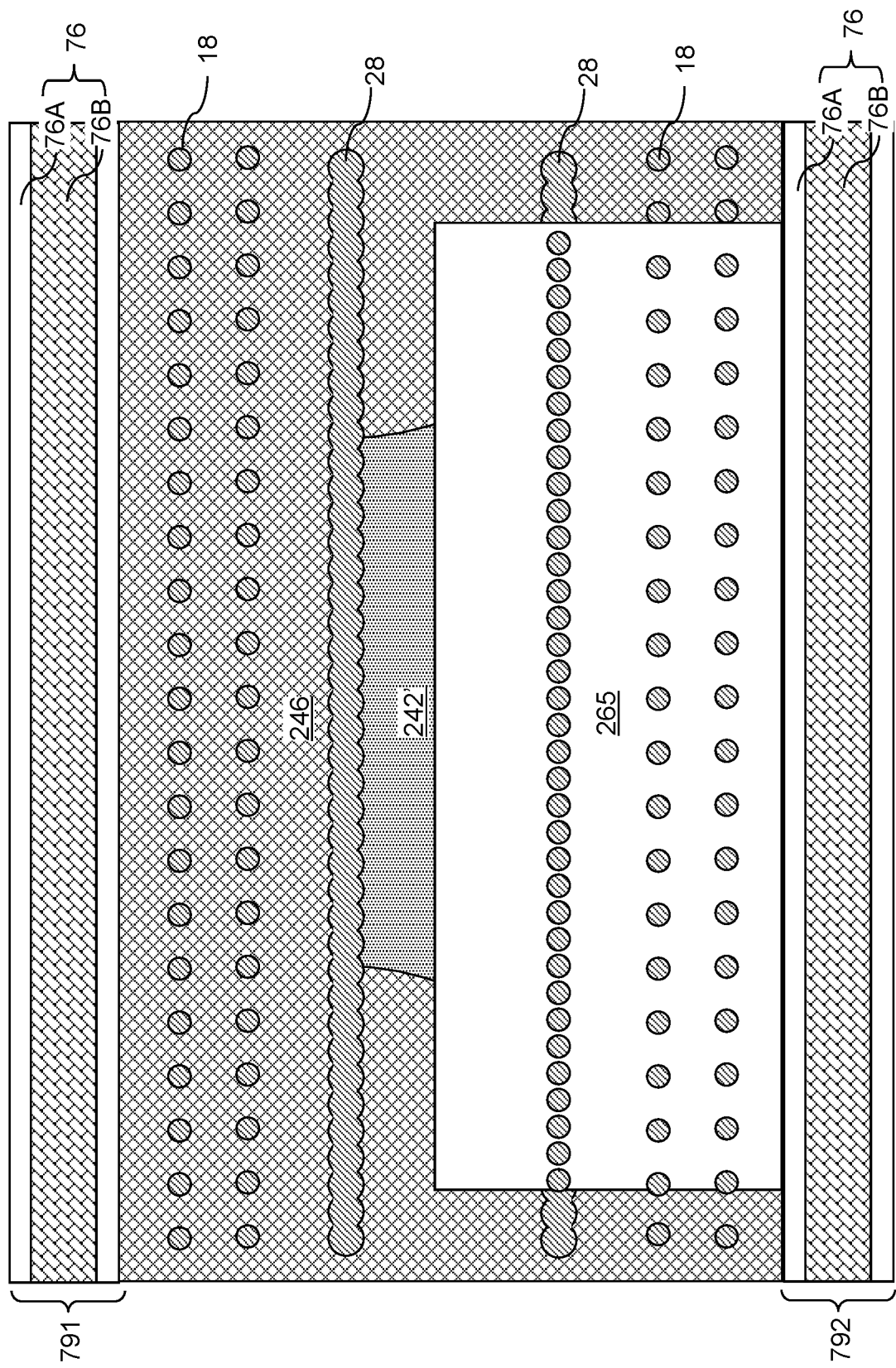

FIG. 30B is a horizontal cross-sectional view of a region of the fourth configuration of the second exemplary structure including the perforated wall structure at a level of a second electrically conductive layer according to an embodiment of the present disclosure.

Figure 31A:
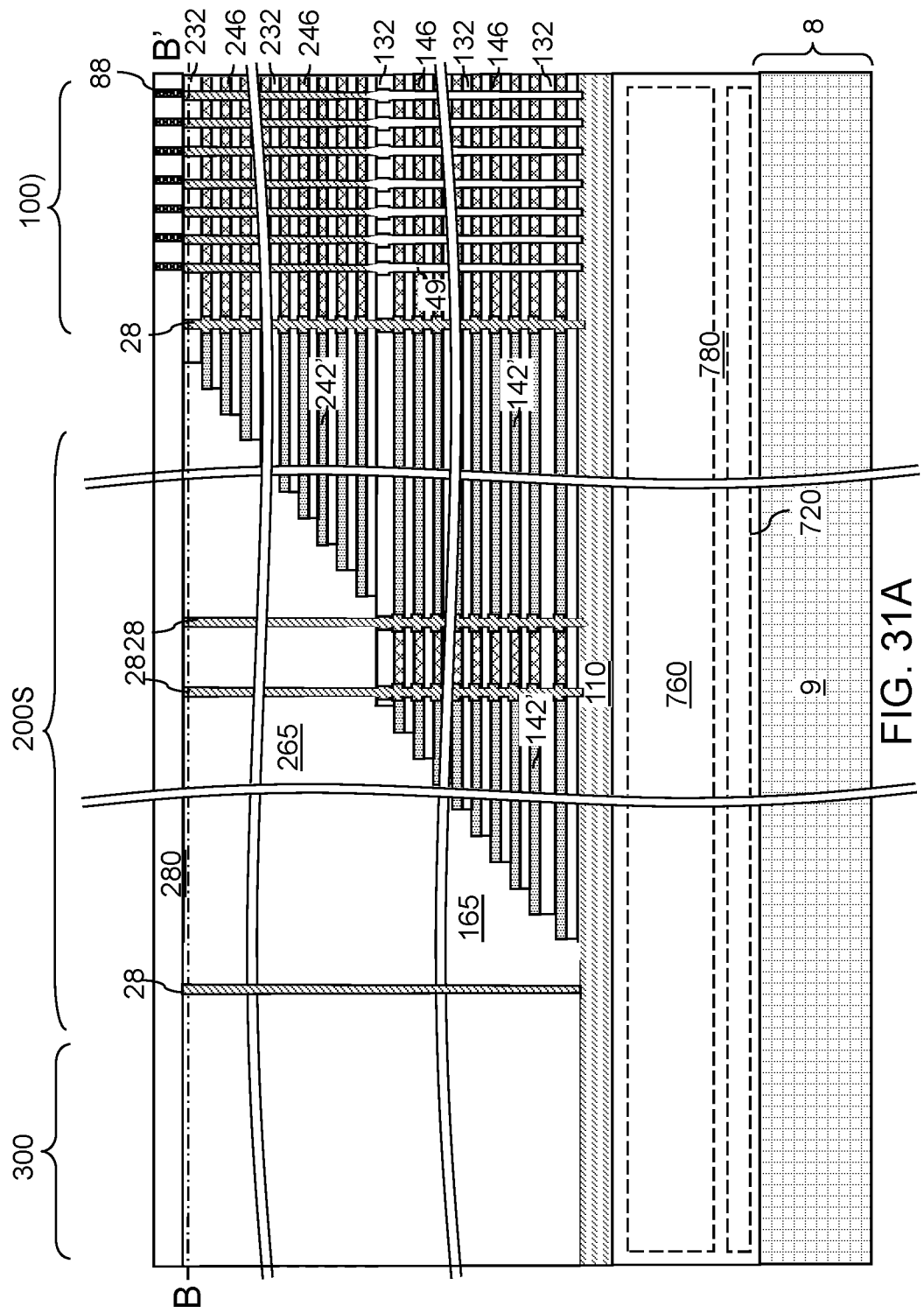

FIG. 31A is a vertical cross-sectional view of a third exemplary structure after formation of various contact via structures according to an alternative embodiment of the present disclosure.

Figure 31B:
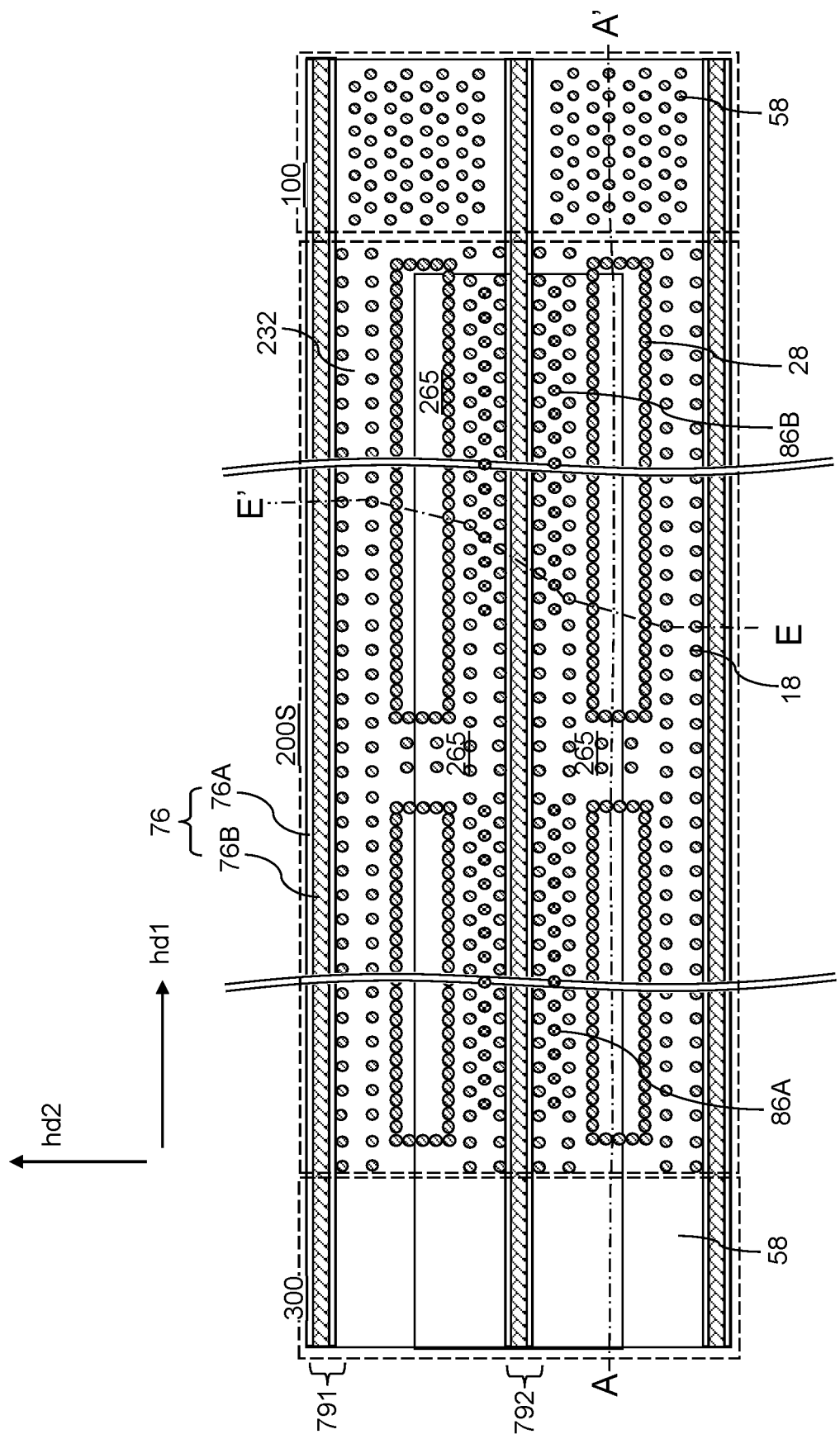

FIG. 31B is a horizontal cross-sectional view along the horizontal plane B-B' of FIG. 31A. The hinged vertical plane A-A' is the plane of the vertical cross-sectional view of FIG. 31.

DETAILED DESCRIPTION

As discussed above, the embodiments of the present disclosure are directed to a three-dimensional memory device including dielectric wall support structures located in or adjacent to staircase regions for reducing lateral connection resistance of word lines and methods of forming the same, the various aspects of which are now described in detail.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the first continuous structure. For example, a layer may be located between any pair of horizontal planes between, or at, a top surface and a bottom surface of the first continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0 \times 10^{-5}$ S/m to $1.0 \times 10^5$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^7$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to provide electrical conductivity greater than $1.0 \times 10^5$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^7$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,177 titled "Three-dimensional Structure Memory." The substrates may be thinned or removed from the memory levels before bonding, but as the memory levels are initially formed over separate substrates, such memories are not true monolithic three-dimensional memory arrays. The substrate may include integrated circuits fabricated thereon, such as driver circuits for a memory device.

The various three-dimensional memory devices of the present disclosure include a monolithic three-dimensional NAND string memory device, and may be fabricated using the various embodiments described herein. The monolithic three-dimensional NAND string is located in a monolithic, three-dimensional array of NAND strings located over the substrate. At least one memory cell in the first device level of the three-dimensional array of NAND strings is located over another memory cell in the second device level of the three-dimensional array of NAND strings.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many number of external commands as the total number of dies therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Figure 1:
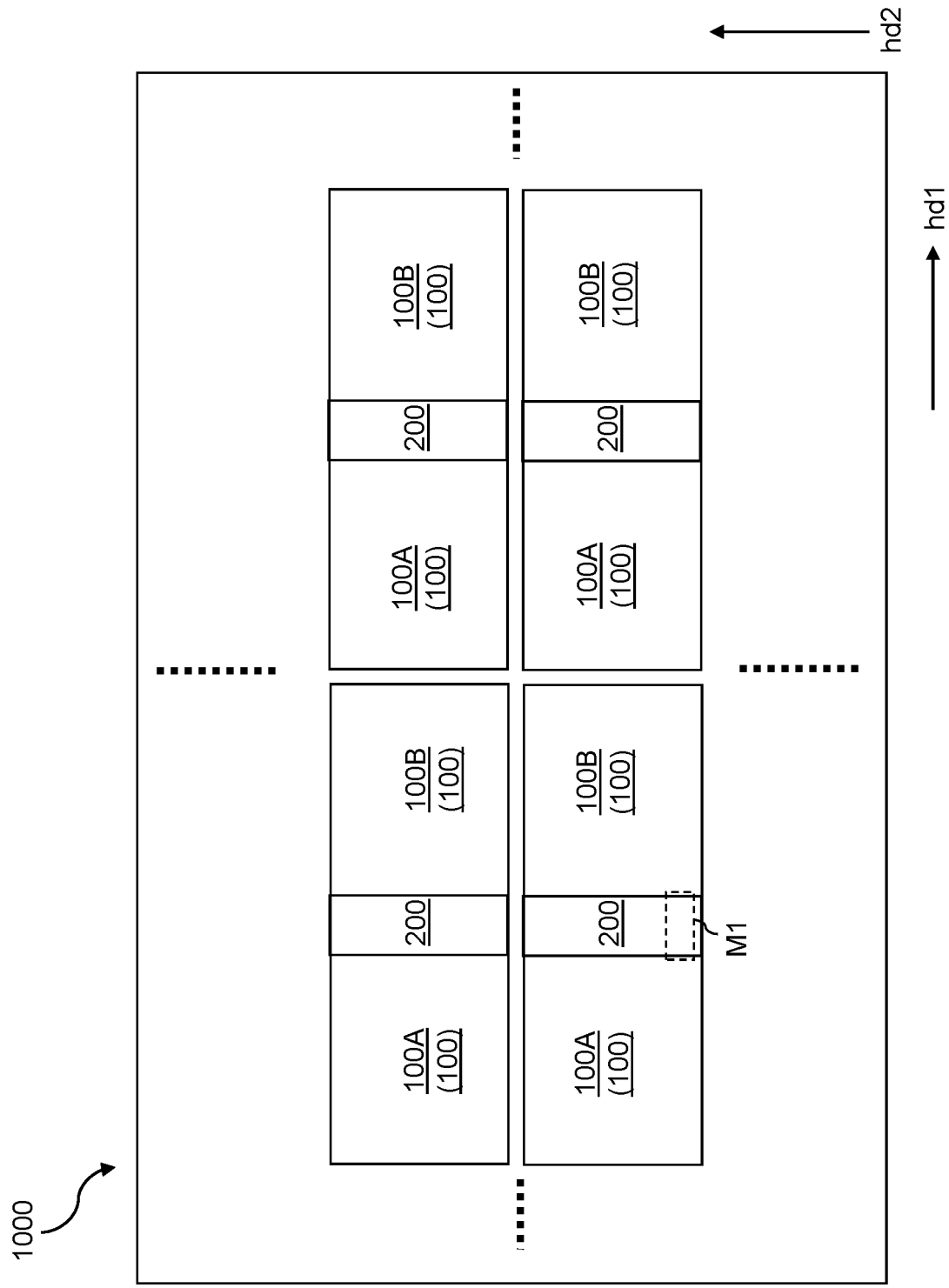
FIG. 1 is a plan view of an exemplary semiconductor die including multiple three-dimensional memory array regions according to an embodiment of the present disclosure.

Referring to FIG. 1, an exemplary semiconductor die 1000 according to an embodiment of the present disclosure is illustrated. The exemplary semiconductor die 1000 includes multiple three-dimensional memory array regions and multiple inter-array regions. The first exemplary semiconductor die 1000 can include multiple planes, each of which includes two memory array regions 100, such as a first memory array region 100A and a second memory array region 100B that are laterally spaced apart by a respective inter-array region 200. Generally, a semiconductor die 1000 may include a single plane or multiple planes. The total number of planes in the semiconductor die 1000 may be selected based on performance requirements on the semiconductor die 1000. A pair of memory array regions 100 in a plane may be laterally spaced apart along a first horizontal direction hd1 (which may be the word line direction). For example, each pair of memory array regions 100 in a plane may include first memory array region 100A and a second memory array region 100B that are laterally spaced apart along the first horizontal direction hd1 by an inter-array region 200. A second horizontal direction hd2 (which may be the bit line direction) can be perpendicular to the first horizontal direction hd1.

The exemplary semiconductor die 1000 of FIG. 1 can be manufactured employing a sequence of processing steps. FIG. 2 is a vertical cross-sectional view of the region M1 in the first exemplary structure of FIG. 1 during a manufacturing step. A substrate 8 is provided, which can include a substrate semiconductor layer 9. The substrate 8 may be a single crystalline silicon wafer, a silicon on insulator (SOI) substrate, or an insulating (e.g., glass or quartz) substrate. The substrate semiconductor layer 9 may be a single crystalline semiconductor material layer such as a single crystalline silicon layer that is epitaxially grown on a silicon wafer or SOI substrate, or a doped well in an upper portion of a silicon wafer or SOI substrate. Semiconductor devices 720 can be formed on the top surface of the substrate semiconductor layer 9. For example, the semiconductor devices 720 may include field effect transistors, resistors, capacitors, diodes, and/or various other semiconductor devices known in the art. In one embodiment, the semiconductor devices 720 may include a peripheral (i.e., driver) circuit for controlling the operation of three-dimensional memory arrays to be subsequently formed thereabove. Metal interconnect structures embedded in dielectric material layers can be formed above the semiconductor devices. The metal interconnect structures are herein referred to as lower-level metal interconnect structures 780, and the dielectric material layers are herein referred to as lower-level dielectric material layers 760. The lower-level metal interconnect structures 780 are electrically connected to various nodes of the semiconductor devices 720, and can include metal line structures and metal via structures located at various levels of the lower-level dielectric material layers 760. The lower-level metal interconnect structures 780 can include metal pads 786, which may be subsequently employed as components of electrically conductive paths.

A semiconductor material layer 110 can be formed on the top surface of the lower-level dielectric material layers 760. The semiconductor material layer 110 may be single crystalline or polycrystalline, and may be formed by a layer transfer from a source substrate (such as a single crystalline silicon layer including a buried hydrogen implantation layer), or may be formed by deposition of a semiconductor material (which may be a polycrystalline semiconductor material, such as polysilicon).

A first alternating layer stack of first continuous insulating layers 132L and first continuous sacrificial material layers 142L can be formed over the semiconductor material layer 110. As used herein, an alternating stack refers to a sequence of multiple instances of a first element and multiple instances of a second element that is arranged such that an instance of a second element is located between each vertically neighboring pair of instances of the first element, and an instance of a first element is located between each vertically neighboring pair of instances of the second element. An alternating layer stack refers to a sequence of multiple instances of a first material layer and multiple instances of a second material layer such that the instances of the first material layer and the instances of the second material layer are interlaced.

The first continuous insulating layers 132L can be composed of the first material, and the first continuous sacrificial material layers 142L can be composed of the second material, which is different from the first material. Each of the first continuous insulating layers 132L is an insulating layer that continuously extends over the entire area of the substrate 8, and may have a uniform thickness throughout. Each of the first continuous sacrificial material layers 142L includes is a sacrificial material layer that includes a dielectric material and continuously extends over the entire area of the substrate 8, and may have a uniform thickness throughout. Insulating materials that may be used for the first continuous insulating layers 132L include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first continuous insulating layers 132L may be silicon oxide.

The second material of the first continuous sacrificial material layers 142L is a dielectric material, which is a sacrificial material that may be removed selective to the first material of the first continuous insulating layers 132L. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material. The second material of the first continuous sacrificial material layers 142L may be subsequently replaced with electrically conductive electrodes which may function, for example, as control gate electrodes of a vertical NAND device. In one embodiment, the first continuous sacrificial material layers 142L may be material layers that comprise silicon nitride.

Referring to FIGS. 3A-3F, first stepped surfaces can be formed within the inter-array regions 200 simultaneously. A hard mask layer (not shown) such as a metallic or dielectric mask material layer can be formed over the first alternating layer stack, and can be patterned to form multiple rectangular openings. The areas of openings within the hard mask layer correspond to areas in which first stepped surfaces are to be subsequently formed. Each opening through the hard mask layer may be rectangular, and may have a pair of sides that are parallel to the first horizontal direction hd1 and a pair of sides that are parallel to the second horizontal direction hd2. The rectangular openings through the hard mask layer may be arranged along the second horizontal direction hd2, and may be alternately staggered along the first horizontal direction hd1. Thus, upon sequentially numbering the rectangular openings along the second horizontal direction hd2, every odd-numbered rectangular openings through the hard mask layer can be formed as a first one-dimensional array arranged along the second horizontal direction hd2 aligned along the first horizontal direction hd1 (i.e., having a same lateral extent along the first horizontal direction), and every even-numbered rectangular openings through the hard mask layer can be formed as a second one-dimensional array arranged along the second horizontal direction hd2 aligned along the first horizontal direction hd1.

A trimmable mask layer (not shown) can be applied over the first alternating layer stack. The trimmable mask layer can include a trimmable photoresist layer that can be controllably trimmed by a timed ashing process. The trimmable mask layer can be patterned with an initial pattern such that a segment of each rectangular opening in the hard mask layer that is most proximal to the memory array regions 100 is not masked by the trimmable mask layer, while the rest of each rectangular opening is covered by the trimmable mask layer. For example, the trimmable mask layer can have a rectangular shape having straight edges that are parallel to the second horizontal direction hd2, such that the straight edges are located over a vertical step of respective first stepped surfaces that is most proximal to one of the memory array regions 100.

The first stepped surfaces can be formed within the rectangular openings in the hard mask layer by iteratively performing a set of layer patterning processing steps as many times as the total number of first continuous sacrificial material layers 142L within the first alternating layer stack less 1. The set of layer patterning processing steps comprises an anisotropic etch process that etches unmasked portions of a pair of a first continuous insulating layer 132L and a first continuous sacrificial material layer 142L, and a mask trimming process in which the trimmable mask layer is isotropically trimmed to provide shifted sidewalls that are shifted away from the most proximal memory array region 100. A final anisotropic etch process can be performed after the last mask trimming process, and the trimmable mask layer can be removed, for example, by ashing. The hard mask layer can be removed selective to the materials of the first alternating layer stack (132L, 142L), for example, by an isotropic etch process (such as a wet etch process).

Figure 3A:
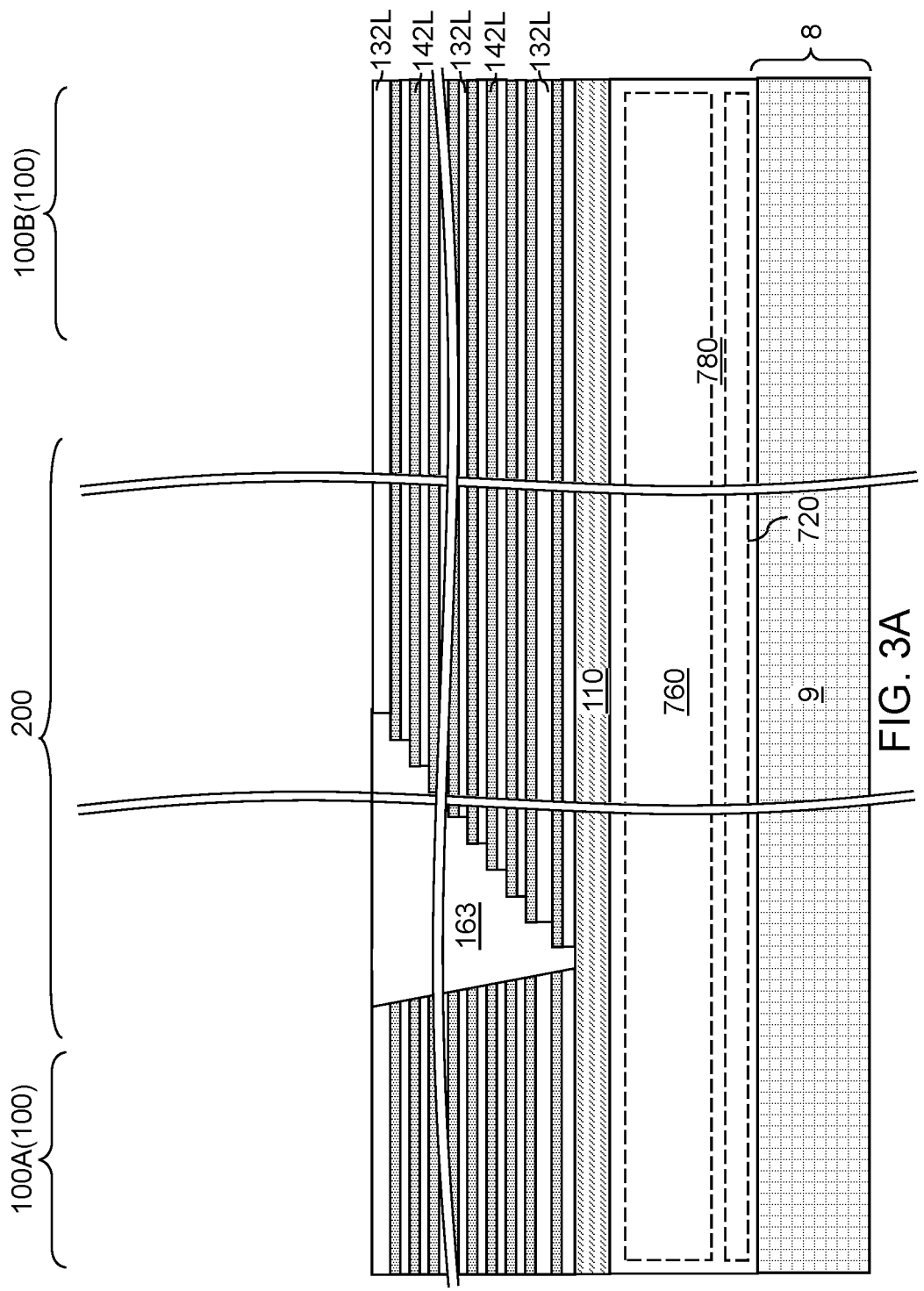
FIG. 3A is a vertical cross-sectional view of the first exemplary structure after formation of first-tier dielectric cavity fill material portions according to an embodiment of the present disclosure.
Figure 3B:
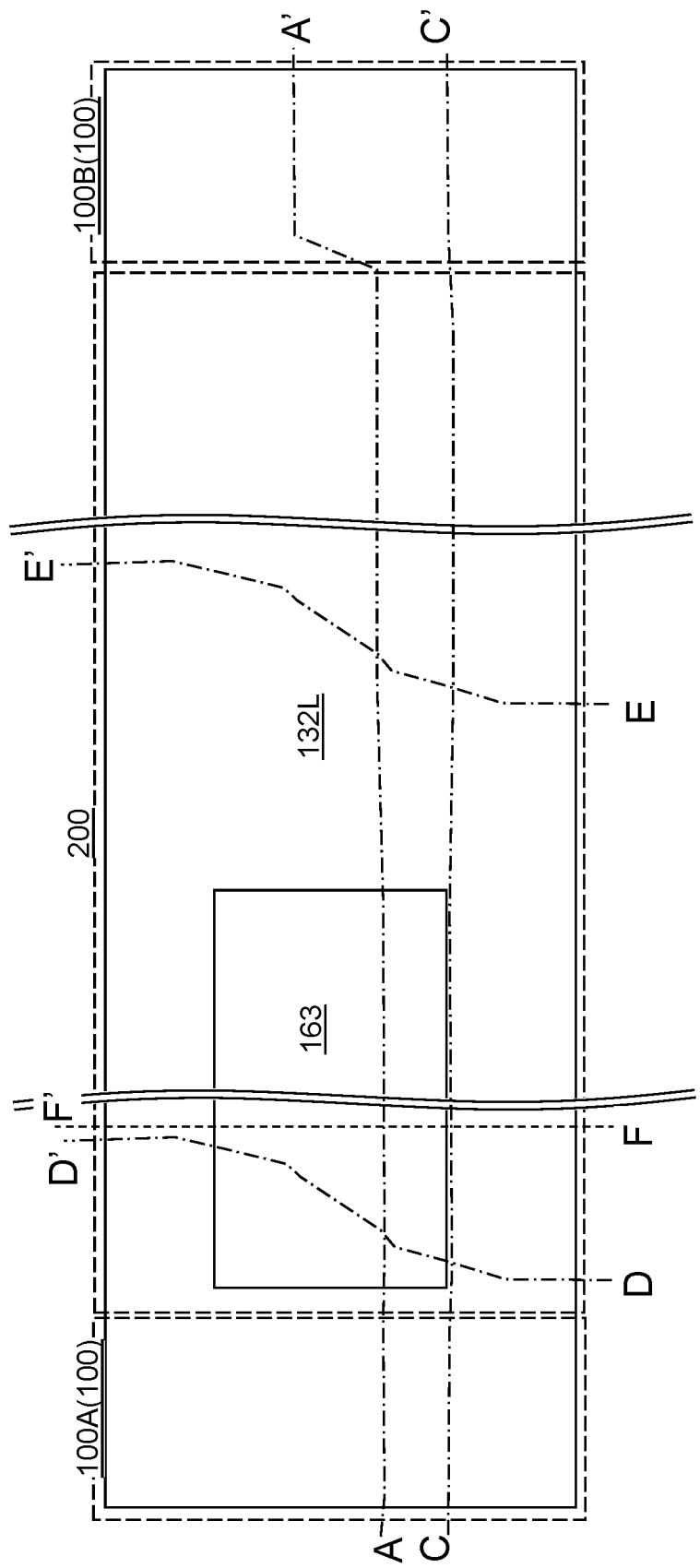
FIG. 3B is a top-down cross-sectional view of the first exemplary structure of FIG. 3A. The hinged vertical plane A-A' is the plane of the vertical cross-sectional view of FIG. 3A.
Figure 3D:
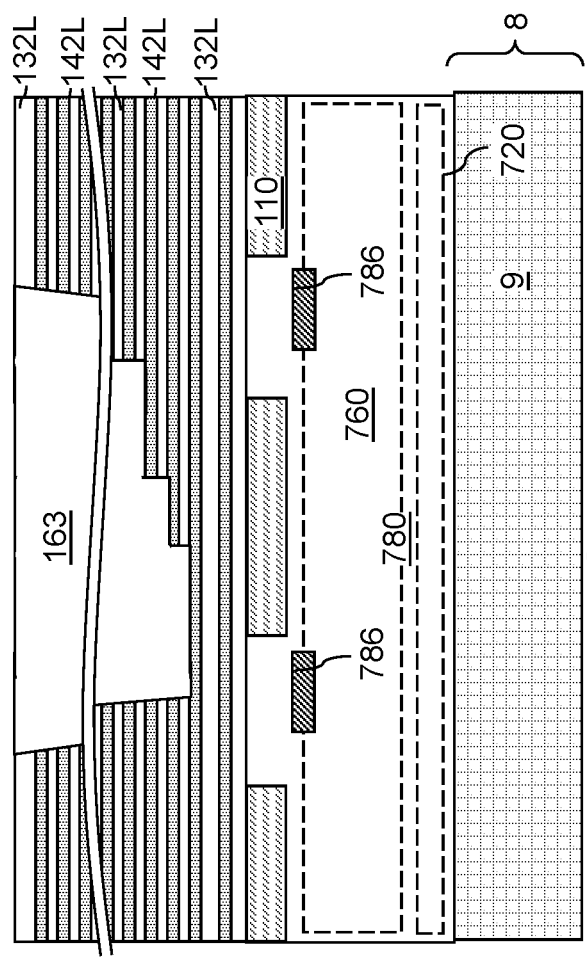
FIG. 3D is a vertical cross-sectional view along the vertical plane D-D' of FIG. 3B.
Figure 3E:
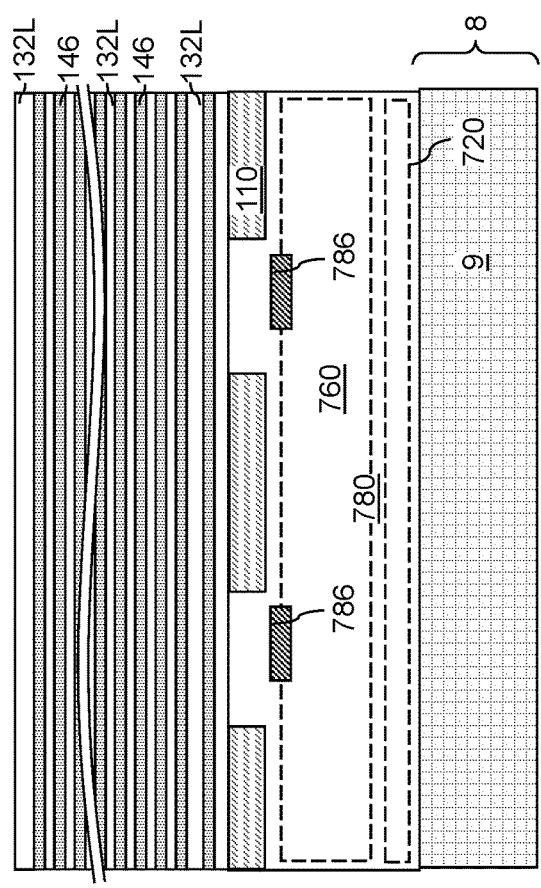
FIG. 3E is a vertical cross-sectional view along the vertical plane E-E' of FIG. 3B.
Figure 3F:
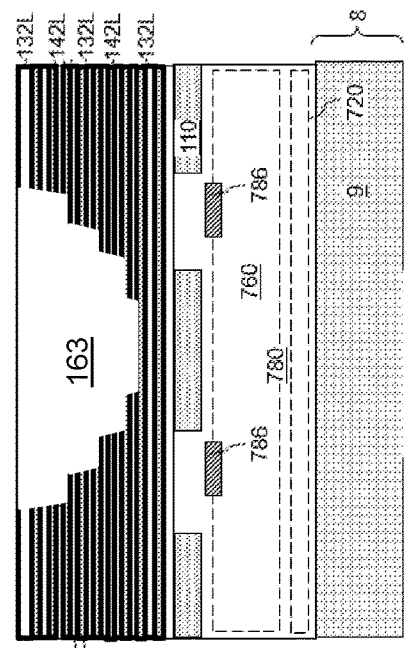
FIG. 3F is a vertical cross-sectional view along the vertical plane F-F' of FIG. 3B.

A first stepped cavity can be formed within each area of the rectangular opening in the hard mask layer. Each first stepped cavity can include a cliff region in which a tapered sidewall of the first alternating layer stack vertically extends from the bottommost layer of the first alternating layer stack (132L, 142L) to the topmost layer of the first alternating layer stack (132L, 142L). Each first stepped cavity has respective first stepped surfaces as stepped bottom surfaces. Each first stepped cavity has a pair of stepped sidewalls that laterally extend along the first horizontal direction hd1. Each stepped sidewall of the first stepped cavity adjoins the first stepped surfaces at the bottom edge, and extends to the top surface of the topmost layer of the first alternating layer stack (132L, 142L). First stepped surfaces underlie each first stepped cavity. Generally, the first stepped surfaces can be formed by patterning the first alternating layer stack (132L, 142L) in each inter-array region 200, which is located between a respective first memory array region 100A and a second memory array region 100B. A first dielectric fill material (such as undoped silicate glass (i.e., silicon oxide) or a doped silicate glass) can be deposited in each first stepped cavity. The first dielectric fill material can be planarized to remove excess portions of the first dielectric fill material from above the horizontal plane including the topmost surface of the first alternating layer stack (132L, 142L). Each remaining portion of the first dielectric fill material that fills a respective first stepped cavity constitutes a first-tier dielectric cavity fill material portion 163. Each first-tier dielectric cavity fill material portion 163 is formed over first stepped surfaces of the first alternating layer stack (132L, 142L). It should be noted that the first stepped cavity may be symmetrical, as shown in FIG. 3F. However, the first stepped cavity appears non-symmetrical in FIG. 3D because FIG. 3D represents a view along a curved plane D-D' in FIG. 3D. The curved view plane makes the first stepped cavity appear non-symmetrical in FIG. 3D.

Referring to FIGS. 4A-4E, various first-tier moat trenches (175, 185) and first-tier support openings 19 can be formed through the first alternating layer stack (132L, 142L) within the inter-array regions 200. For example, a photoresist layer (not shown) can be applied over the first alternating layer stack (132L, 142L), and can be lithographically patterned to form moat-shaped openings and discrete openings (which may be circular openings). As used herein, a "moat-shaped" element refers to an element having a closed outer sidewall and a closed inner sidewall such that the element extends only between the closed outer sidewall and the closed inner sidewall and the closed outer sidewall has a shape that follows the general contour of the closed inner sidewall. In some embodiments, the lateral spacing between the closed outer sidewall and the closed inner sidewall may be uniform.

An anisotropic etch process can be performed to transfer the pattern of the moat-shaped openings and the discrete openings through the first alternating layer stack (132L, 142L) and the first-tier dielectric cavity fill material portions 163. The first-tier moat trenches (175, 185) are formed underneath the moat-shaped openings in the photoresist layer. First-tier support openings 19 are formed underneath the discrete openings in the photoresist layer. Generally, the first-tier support openings 19 are formed within the area of the inter-array regions 200 that are not filled with the first-tier moat trenches (175, 185). The first-tier support openings 19 may be cylindrical and have a circular horizontal cross sectional shape. Optionally, additional first-tier support openings (not shown) may be formed in portions of the memory array regions 100 in which memory stack structures are not to be subsequently formed. In an alternative embodiment, the first-tier support openings 19 may be formed in a separate earlier or later lithography and etching step from the first-tier moat trenches (175, 185).

A top surface of the semiconductor material layer 110 may be physically exposed at the bottom of each first-tier moat trench (175, 185) and at the bottom of each first-tier support opening 19. Each of the first-tier moat trenches (175, 185) can be formed within an inter-array region 200, and can have a pair of lengthwise outer sidewalls and a pair of lengthwise inner sidewalls that laterally extend along the first horizontal direction hd1, and a pair of widthwise outer sidewalls and a pair of widthwise inner sidewalls that laterally extend along the second horizontal direction hd2. In some embodiments, the lengthwise sidewalls and the widthwise sidewall of a first-tier moat trench (175, 185) may be directly adjoined to each other, or may be indirectly adjoined through curved sidewall segments. The lateral distance between facing pairs of a first-tier moat trench (175, 185) may be in a range from 50 nm to 1,000 nm, such as from 100 nm to 500 nm, although lesser and greater lateral distances may also be employed.

The first-tier moat trenches (175, 185) can include first-type first-tier moat trenches 175 that intersect a respective one of the first-tier dielectric cavity fill material portions 163. In one embodiment, each first-tier dielectric cavity fill material portion 163 may be intersected by a pair of first-type first-tier moat trenches 175 such that each first-tier dielectric cavity fill material portion 163 is divided into three dielectric material portions. Each remaining portion of a first-tier dielectric cavity fill material portion 163 that is laterally enclosed by a first-type first-tier moat trenches 175 is herein referred to as a first dielectric fill material portion 165'. Each remaining portion of a first-tier dielectric cavity fill material portion 163 that is located outside of the first-type first-tier moat trenches 175 is herein referred to as a first-tier retro-stepped dielectric material portion 165. In one embodiment, each first-tier retro-stepped dielectric material portion 165 can laterally extend along and border two first-type first-tier moat trenches 175.

The first-tier moat trenches (175, 185) can optionally include second-type first-tier moat trenches 185 that do not intersect the first-tier dielectric cavity fill material portions 163. In one embodiment, the second-type first-tier moat trenches 185 may be laterally offset from the first-type first-tier moat trenches 175 within a same inter-array region 200 along the first horizontal direction hd1. Generally, the dimensions and shapes of second-type first-tier moat trenches 185 can be comparable to the dimensions and shapes of the first-type first-tier moat trenches 175.

In one embodiment, a first-type first-tier moat trench 175 may laterally enclose a patterned portion of the first alternating layer stack (132L, 142L). In one embodiment, the first continuous sacrificial material layers 142L include a dielectric material such as silicon nitride. In this case, each patterned portion of a first continuous insulating layer 132L is herein referred to as a first insulating plate 132', and each patterned portion of a first continuous sacrificial material layer 142L is herein referred to as a first dielectric material plate 142'. A vertically alternating sequence of first insulating plates 132' and first dielectric material plates 142' may be formed within each first-type first-tier moat trench 175. The first insulating plates 132' and the first continuous insulating layers 132L have a same material composition. Each horizontal surface of the first continuous insulating layers 132L can be located within a horizontal plane including a horizontal surface of a respective one of the first insulating plates 132' within a vertically alternating sequence of first insulating plates 132' and first dielectric material plates 142'.

Figure 4B:
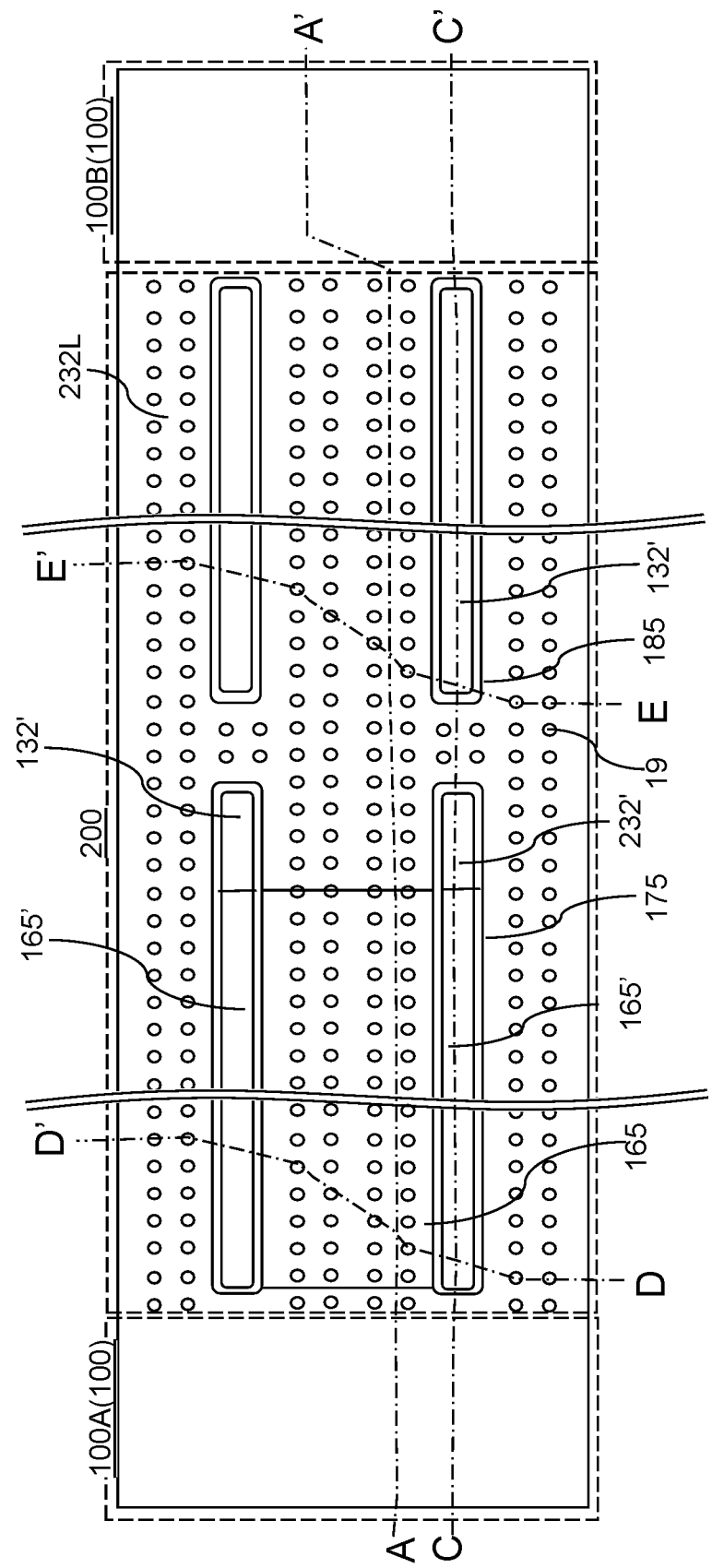
FIG. 4B is a top-down cross-sectional view of the first exemplary structure of FIG. 4A. The hinged vertical plane A-A' is the plane of the vertical cross-sectional view of FIG. 4A.
Figure 4C:
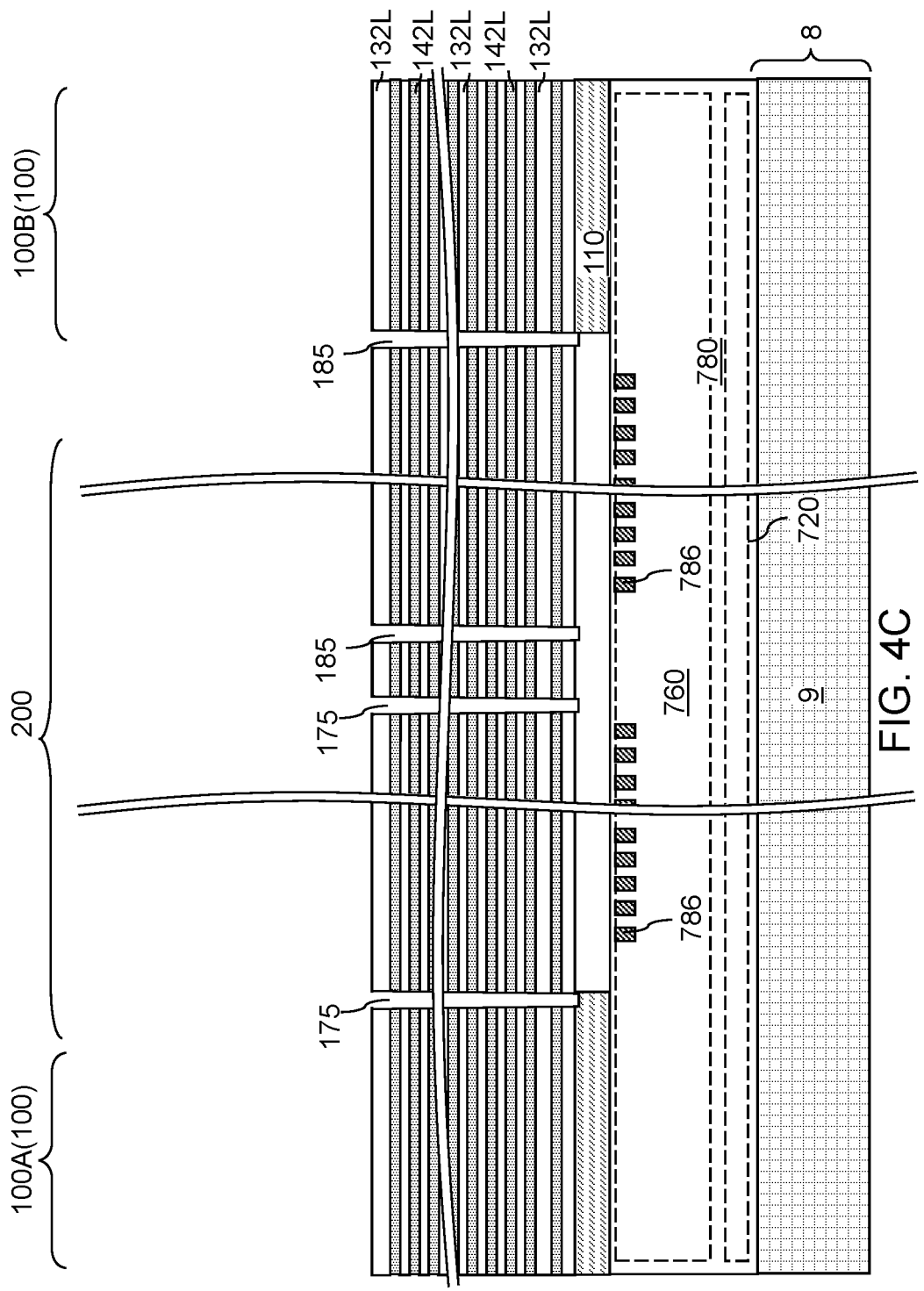
FIG. 4C is a vertical cross-sectional view along the vertical plane C-C' of FIG. 4B.
Figure 4D:
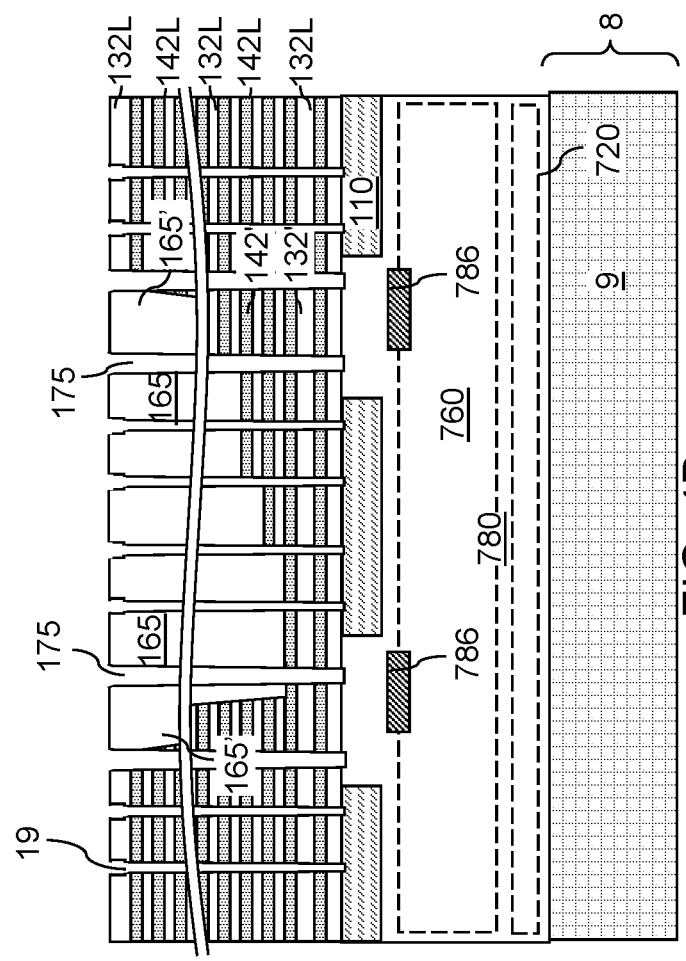
FIG. 4D is a vertical cross-sectional view along the vertical plane D-D' of FIG. 4B.
Figure 4E:
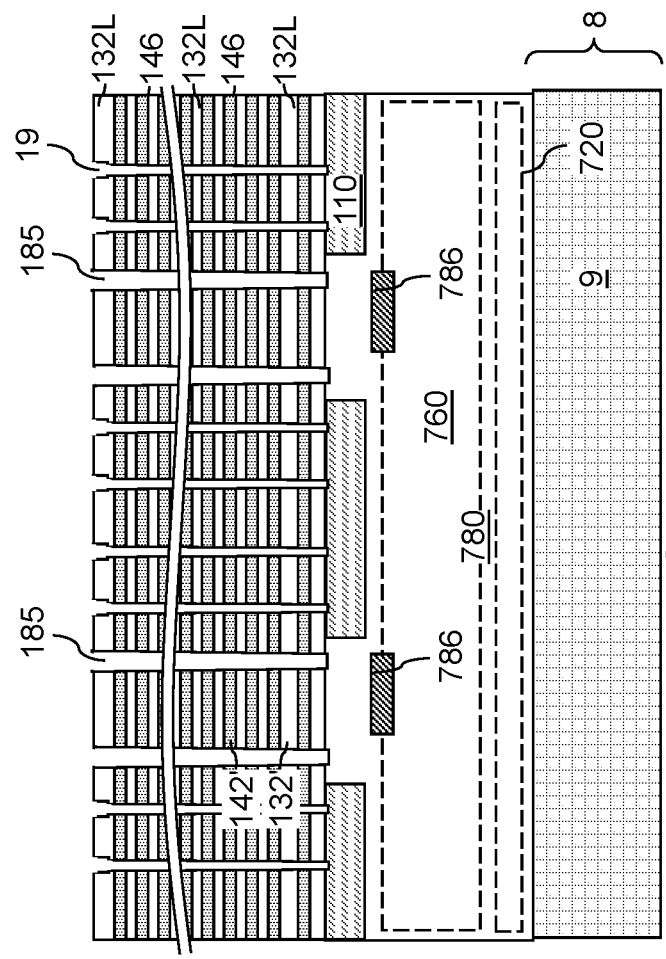
FIG. 4E is a vertical cross-sectional view along the vertical plane E-E' of FIG. 4B.

Generally, the sidewalls of each first dielectric fill material portion 165' that do not contact the first-type first-tier moat trenches 175 are tapered such that the horizontal cross-sectional area of each first dielectric fill material portion 165' increases with a vertical distance from the substrate 8, as shown in FIG. 4D. This is because the anisotropic etch process that forms the first stepped cavities etch sidewalls of the first alternating layer stack (132L, 142L) with a taper angle, which may be in a range from 1 degree to 15 degrees, such as from 2 degrees to 8 degrees. Thus, the first insulating plates 132' and the first dielectric material plates 142' within each first-type first-tier moat trench 175 may have first lateral extents along the first horizontal direction hd1 that decreases with a vertical distance from the substrate 8. Further, the first insulating plates 132' and the first dielectric material plates 142' within each first-type first-tier moat trench 175 may have second lateral extents along the second horizontal direction hd2 that decreases with the vertical distance from the substrate 8. In one embodiment, at least one widthwise sidewall of each first dielectric fill material portion 165' is not in contact with a first-type first-tier moat trench 175, and is in contact with a respective first vertically alternating sequence of first insulating plates 132' and first dielectric material plates 142'.

A first dielectric fill material portion 165' can overlie, and contact, a first vertically alternating sequence of first insulating plates 132' and first dielectric material plates 142'. The first dielectric fill material portion 165' can laterally extend between a pair of inner lengthwise sidewalls of a first-type first-tier moat trench 175. A larger surface area of a first dielectric fill material portion 165' can be physically exposed to one lengthwise segment of a first-type first-tier moat trench 175 than to another lengthwise segment of the first-type first-tier moat trench due to the taper angle in the lengthwise sidewalls of each first dielectric fill material portion 165' that laterally extend along the first horizontal direction.

Referring to FIGS. 5A-5E, a first dielectric fill material such as silicon oxide can be deposited in the first-tier moat trenches (175, 185) and in the first-tier support openings 19 by a conformal deposition process such as a chemical mechanical deposition process. Excess portions of the first dielectric fill material can be removed from above the topmost layer of the first alternating layer stack (132L, 142L). Each remaining portion of the first dielectric fill material that fills the first-tier moat trenches (175, 185) comprise a first-tier moat-shaped dielectric wall structure (176, 186). Each remaining portion of the first dielectric fill material that fills the first-tier support openings 19 comprise a first-tier support pillar structure 201. The first-tier moat-shaped dielectric wall structures (176, 186) include first-type first-tier moat-shaped dielectric wall structure 176 that fill the first-type first-tier moat trenches 175 and second-type first-tier moat-shaped dielectric fill structure 186 that fill the second-type first-tier moat trenches 185. In an alternative embodiment, if the first-tier support openings 19 are formed in a separate earlier or later lithography and etching step from the first-tier moat trenches (175, 185), then the first-tier support pillar structures 201 may be formed before or after forming the first-tier moat trenches (175, 185) and filling the moat trenches to form the first-tier moat-shaped dielectric wall structure (176, 186).

Figure 5A:
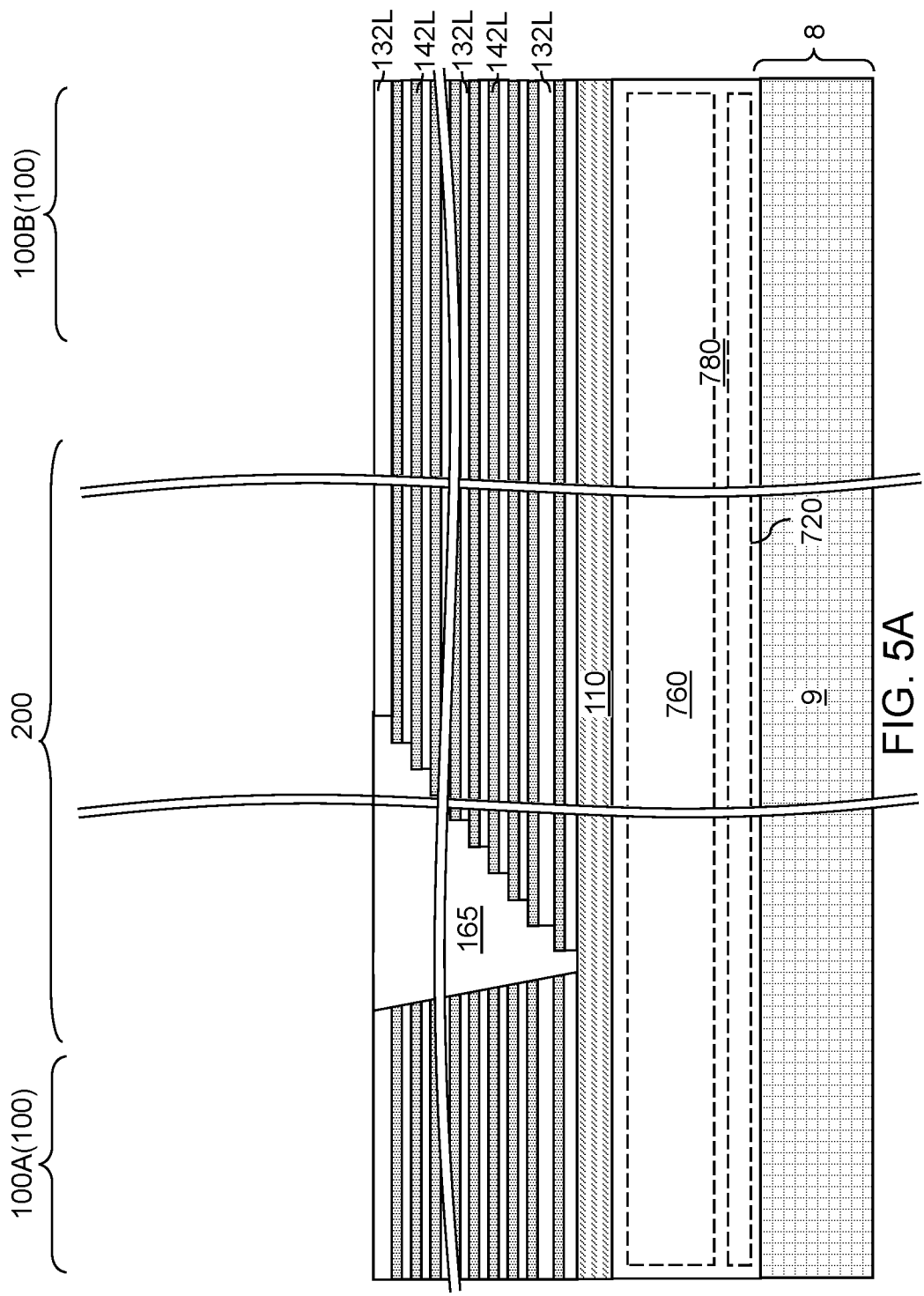
FIG. 5A is a vertical cross-sectional view of the first exemplary structure after formation of first-tier moat-shaped dielectric wall structures according to an embodiment of the present disclosure.
Figure 5B:
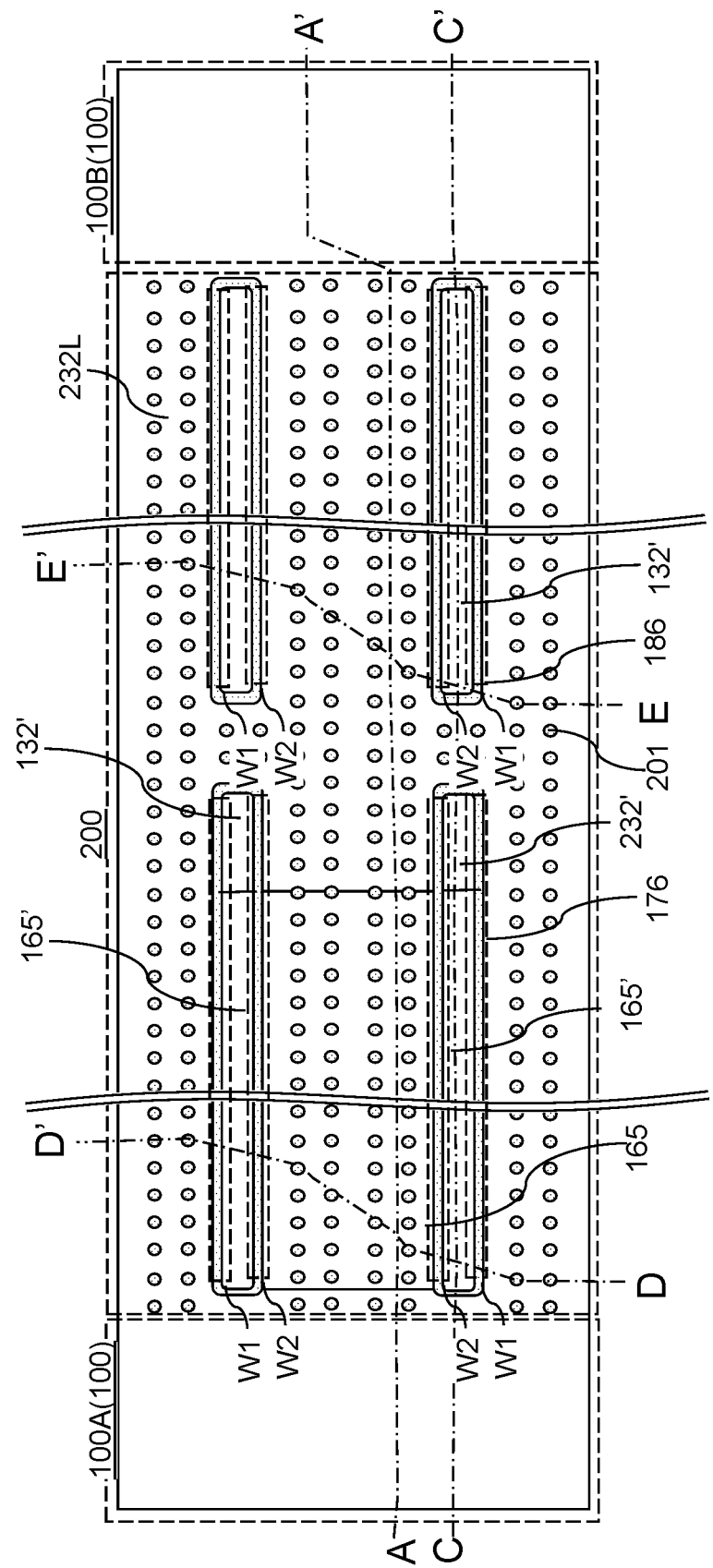
FIG. 5B is a top-down cross-sectional view of the first exemplary structure of FIG. 5A. The hinged vertical plane A-A' is the plane of the vertical cross-sectional view of FIG. 5A.
Figure 5C:
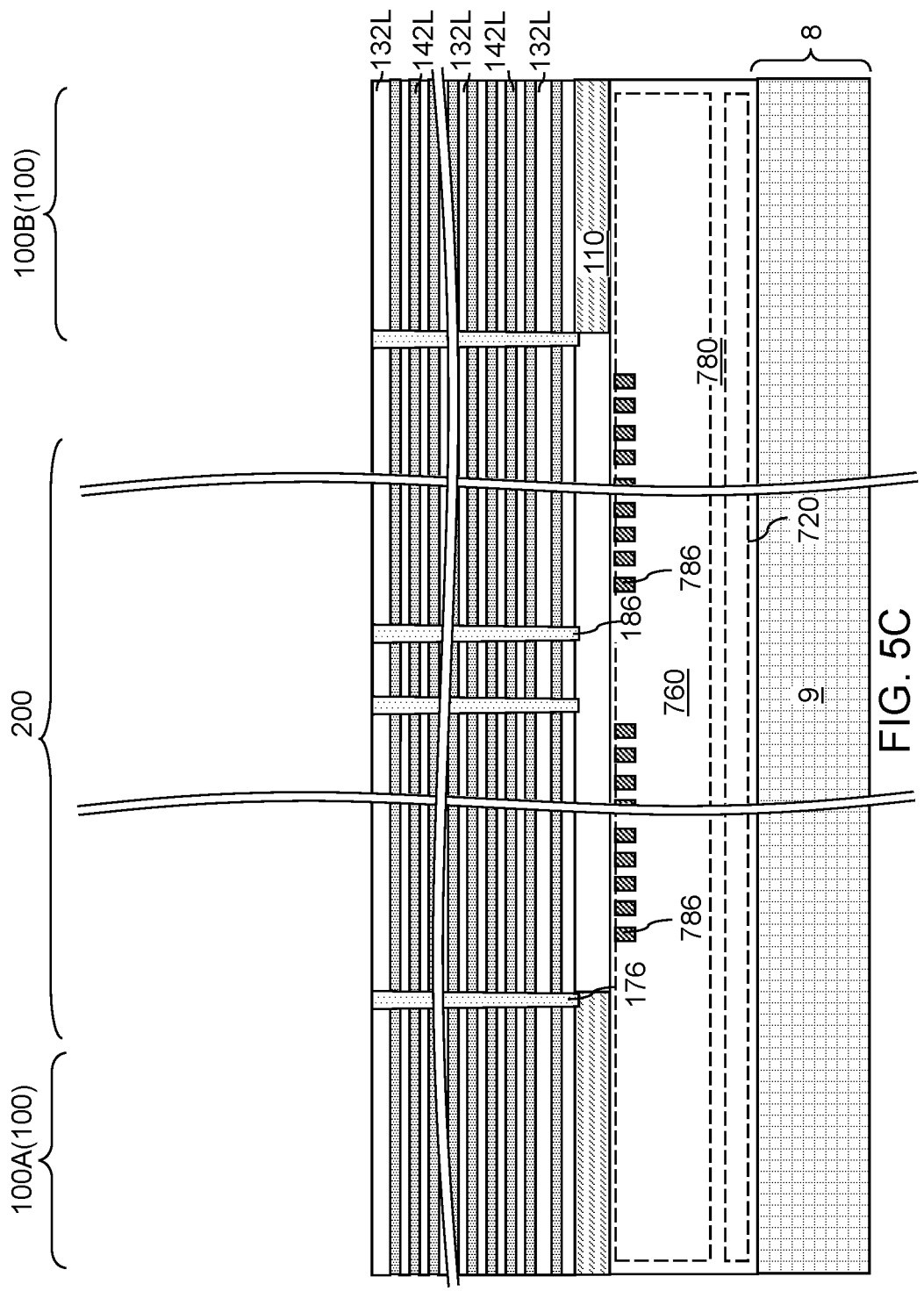
FIG. 5C is a vertical cross-sectional view along the vertical plane C-C' of FIG. 5B.
Figure 5D:
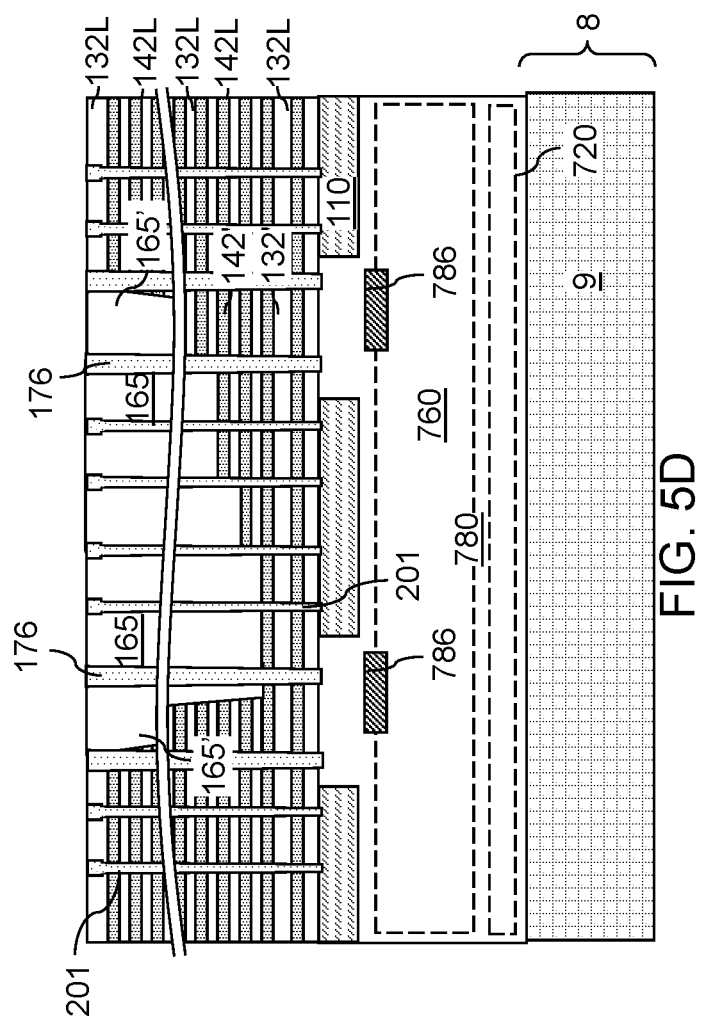
FIG. 5D is a vertical cross-sectional view along the vertical plane D-D' of FIG. 5B.
Figure 5E:
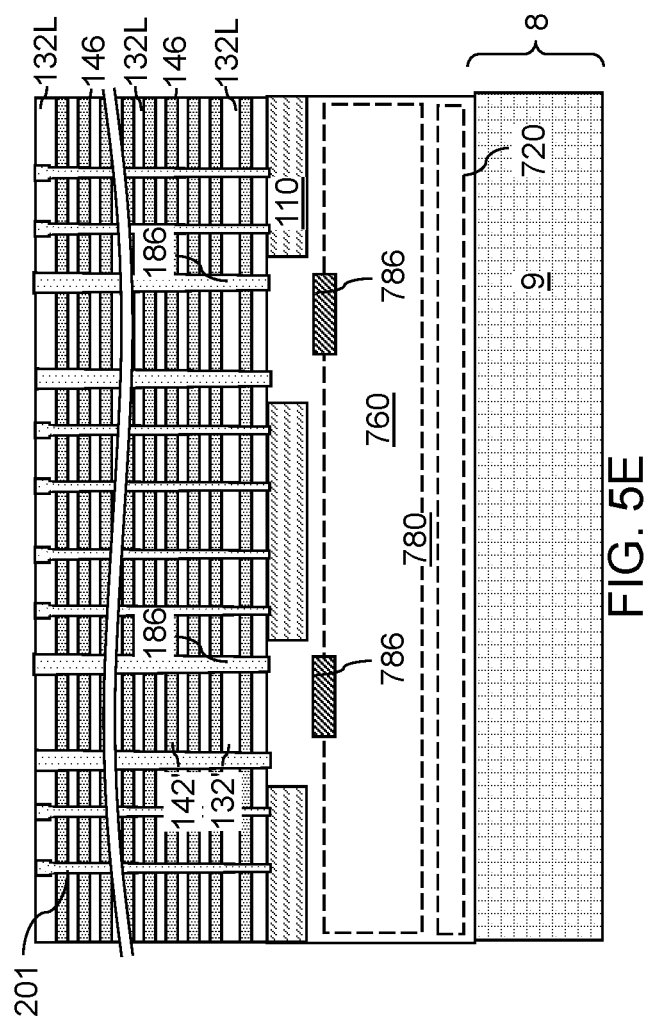
FIG. 5E is a vertical cross-sectional view along the vertical plane E-E' of FIG. 5B.
Figure 6A:
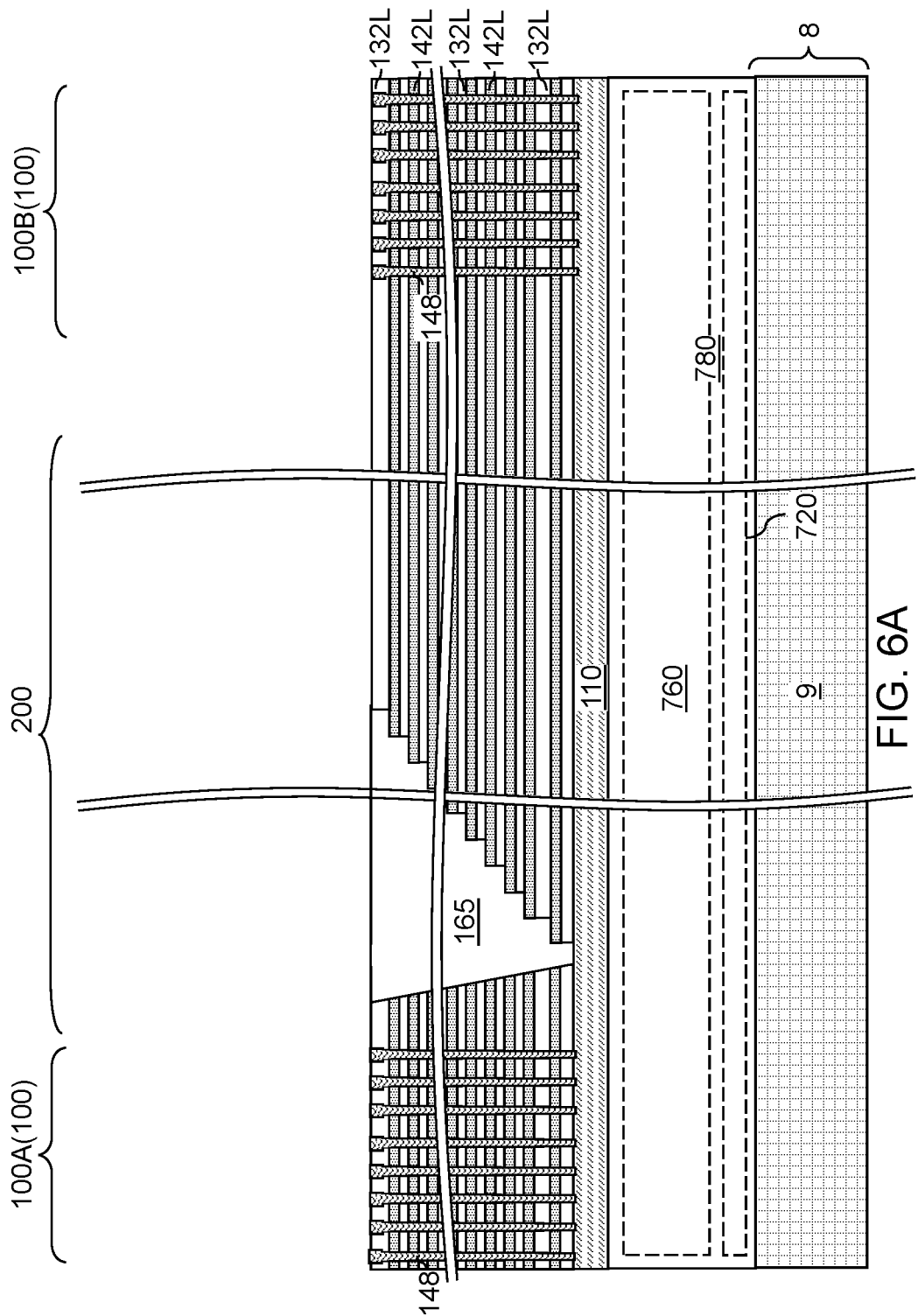
FIG. 6A is a vertical cross-sectional view of the first exemplary structure after formation of first-tier memory opening fill structures and first-tier support pillar structures according to an embodiment of the present disclosure.
Figure 6B:
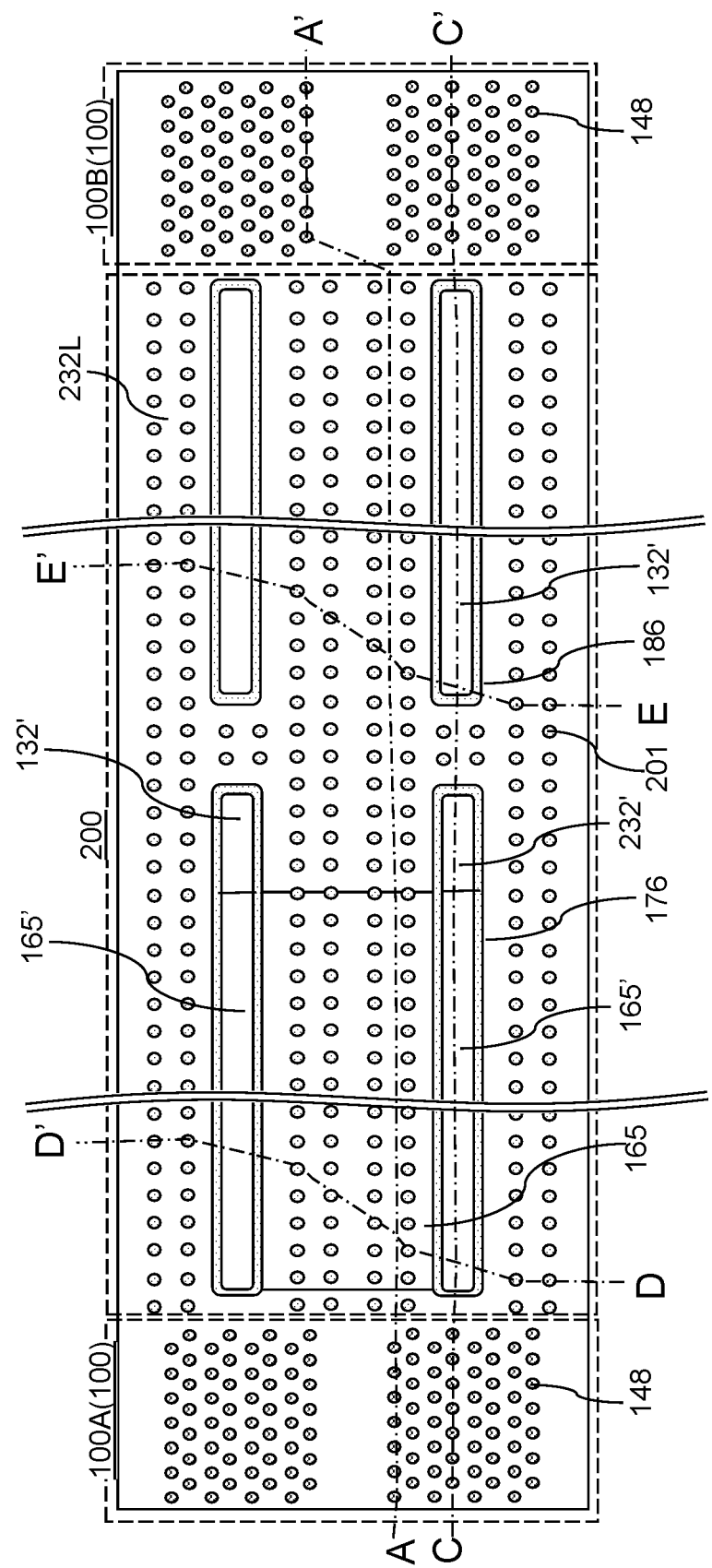
FIG. 6B is a top-down cross-sectional view of the first exemplary structure of FIG. 6A. The hinged vertical plane A-A' is the plane of the vertical cross-sectional view of FIG. 6A.
Figure 6D:
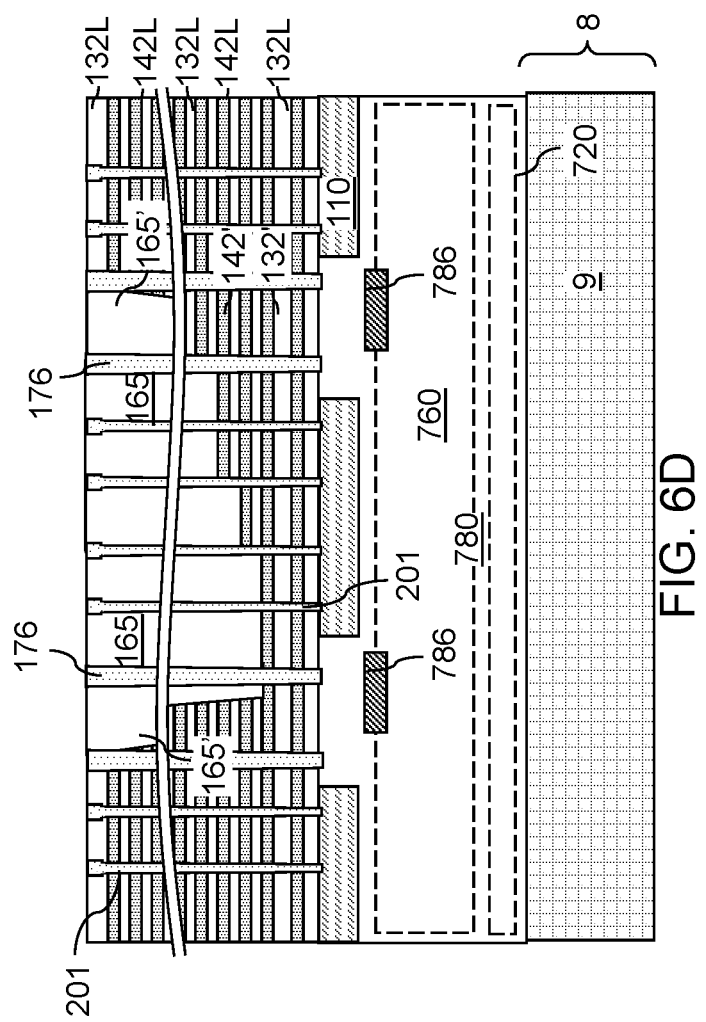
FIG. 6D is a vertical cross-sectional view along the vertical plane D-D' of FIG. 6B.
Figure 6E:
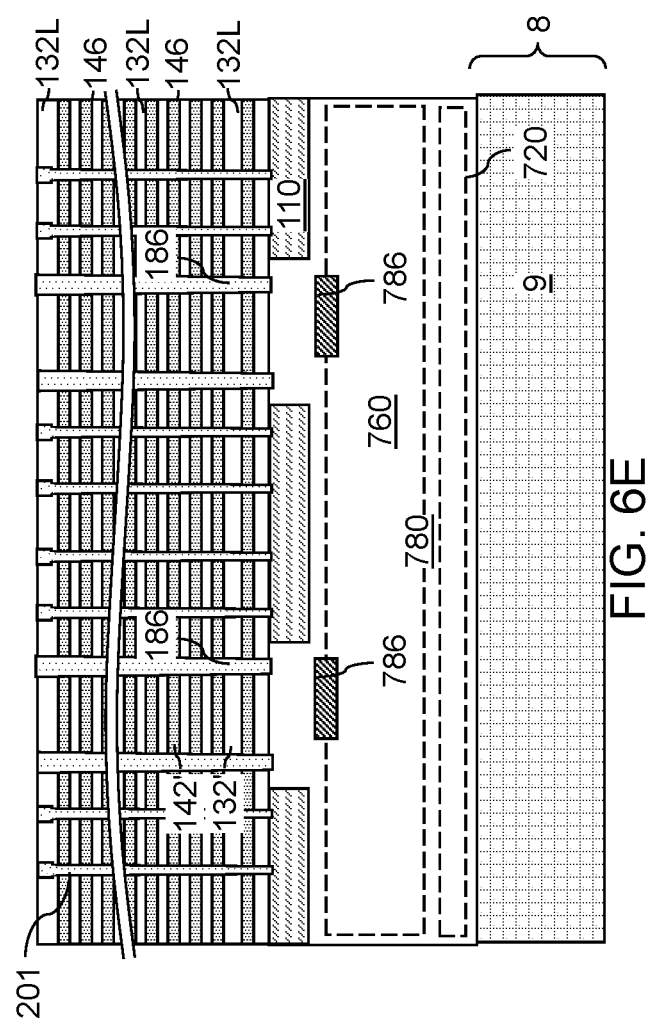
FIG. 6E is a vertical cross-sectional view along the vertical plane E-E' of FIG. 6B.
Figure 7A:
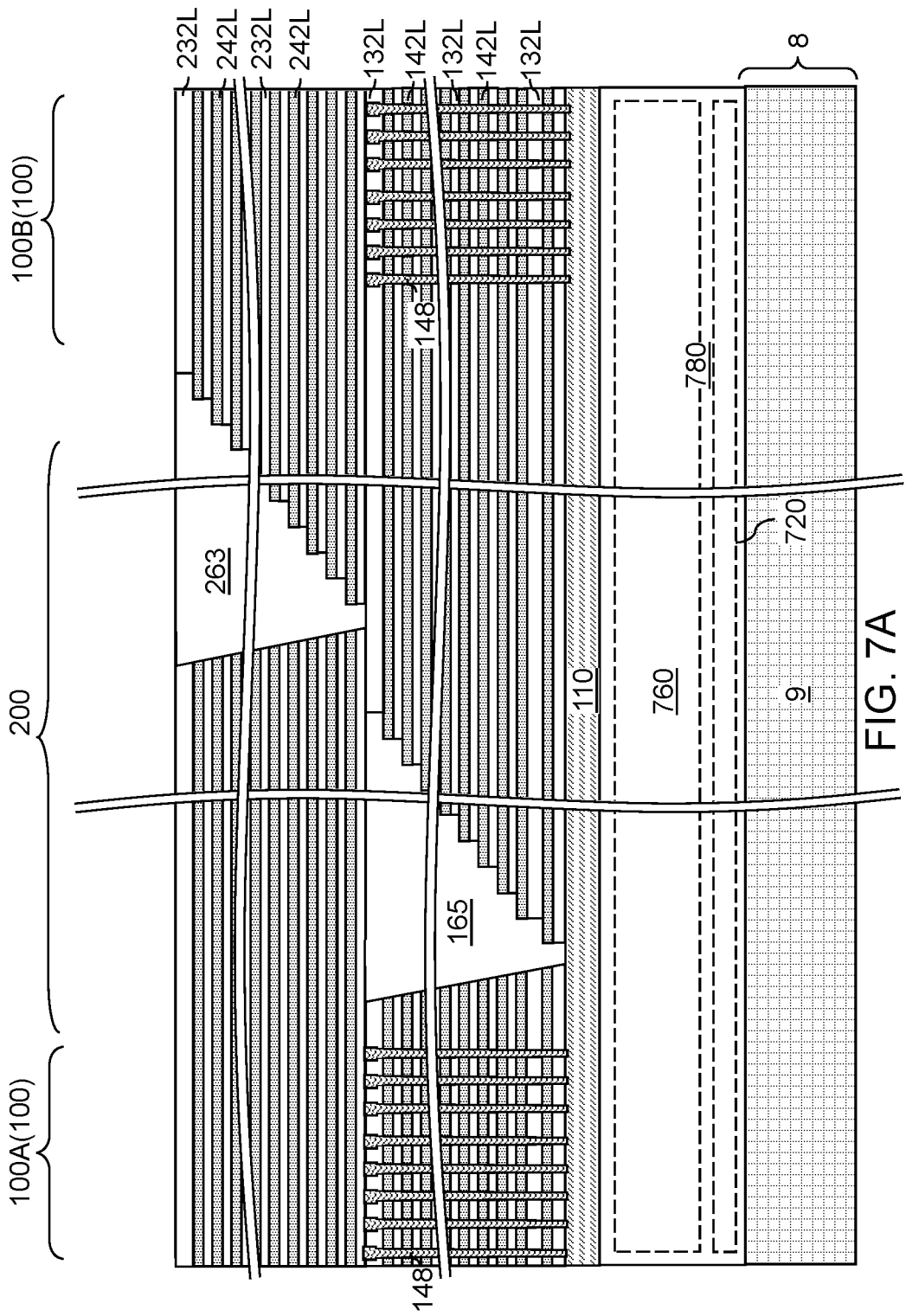
FIG. 7A is a vertical cross-sectional view of the first exemplary structure after formation of a second alternating layer stack of second continuous insulating layers and second continuous sacrificial material layers and second-tier dielectric cavity fill material portions according to an embodiment of the present disclosure.
Figure 7B:
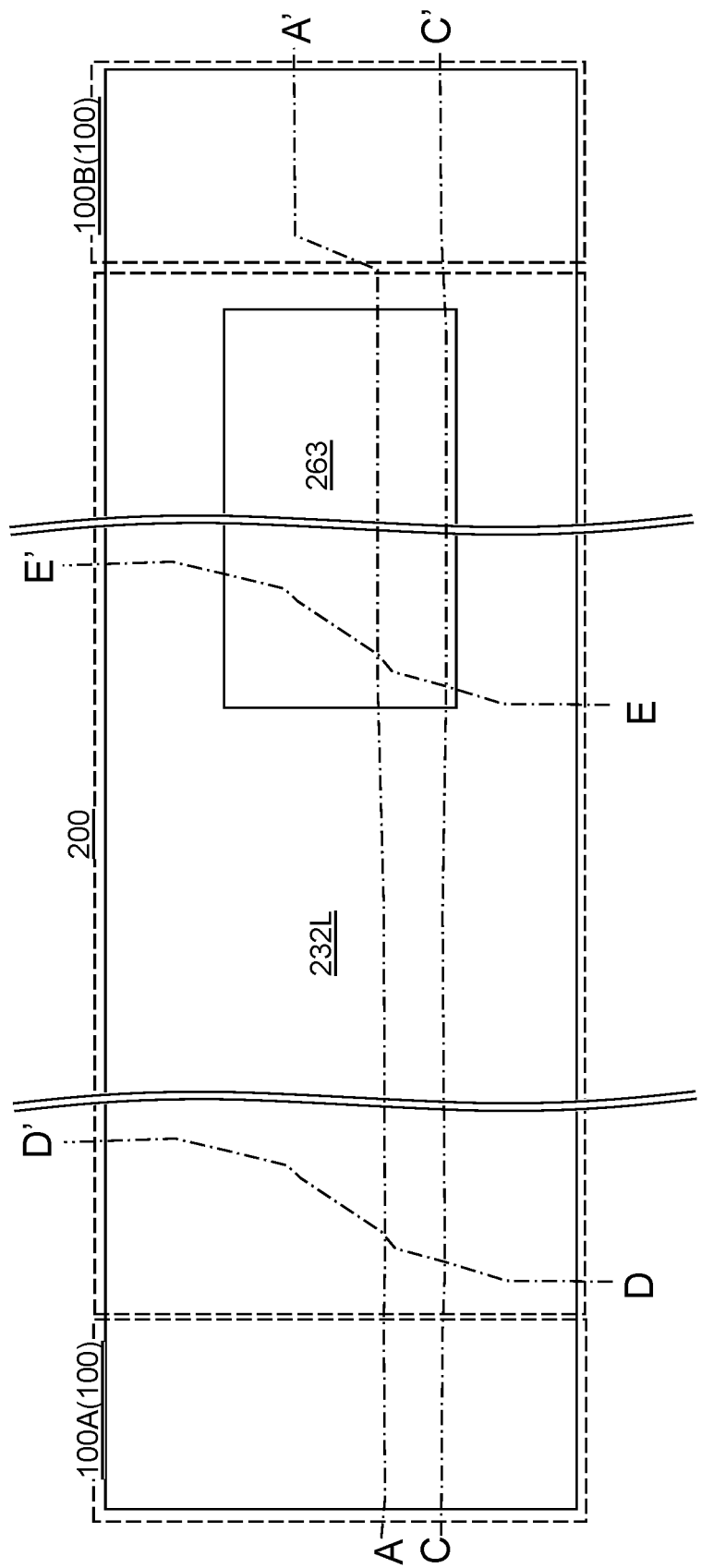
FIG. 7B is a top-down cross-sectional view of the first exemplary structure of FIG. 7A. The hinged vertical plane A-A' is the plane of the vertical cross-sectional view of FIG. 7A.
Figure 7C:
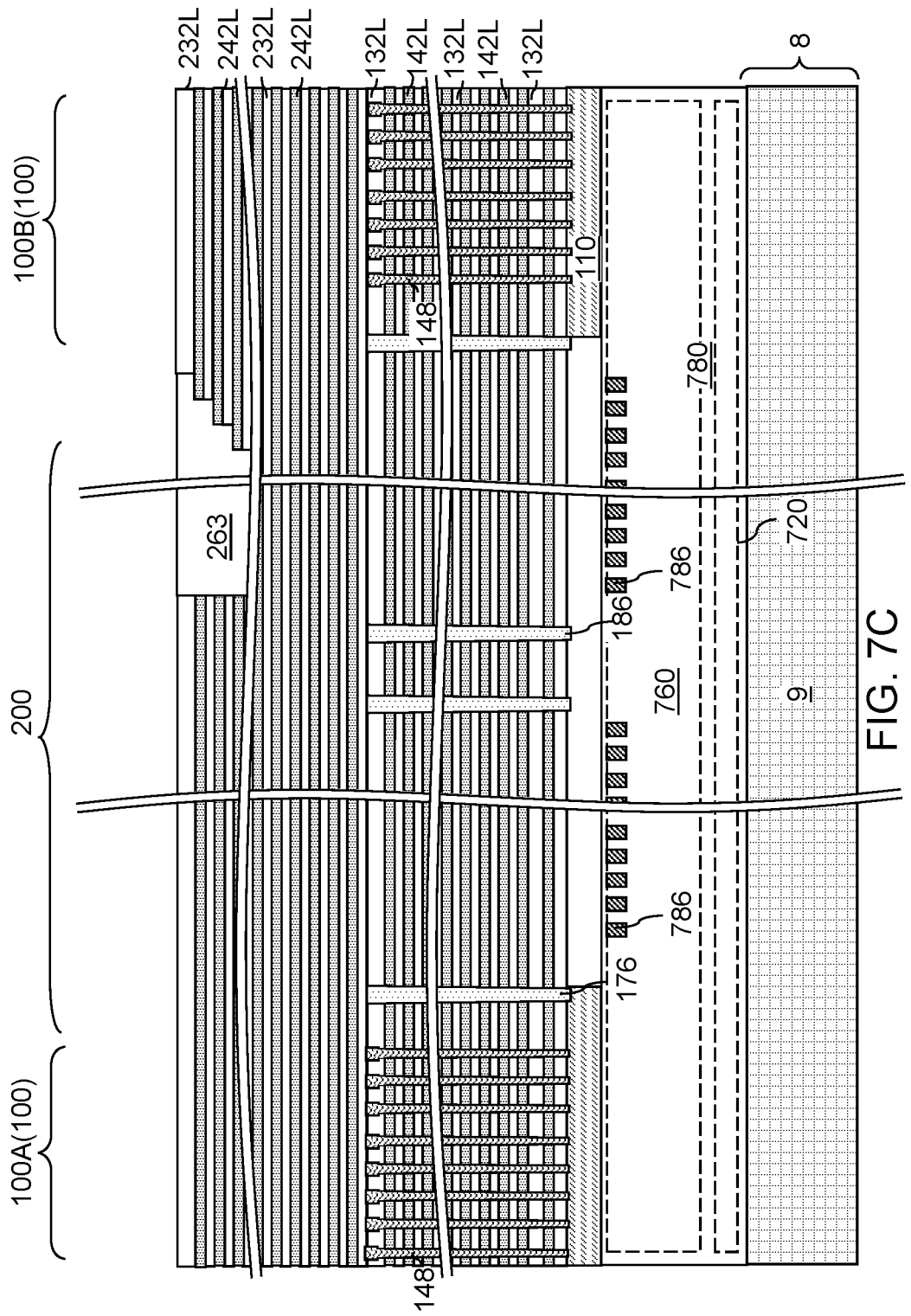
FIG. 7C is a vertical cross-sectional view along the vertical plane C-C' of FIG. 7B.
Figure 7D:
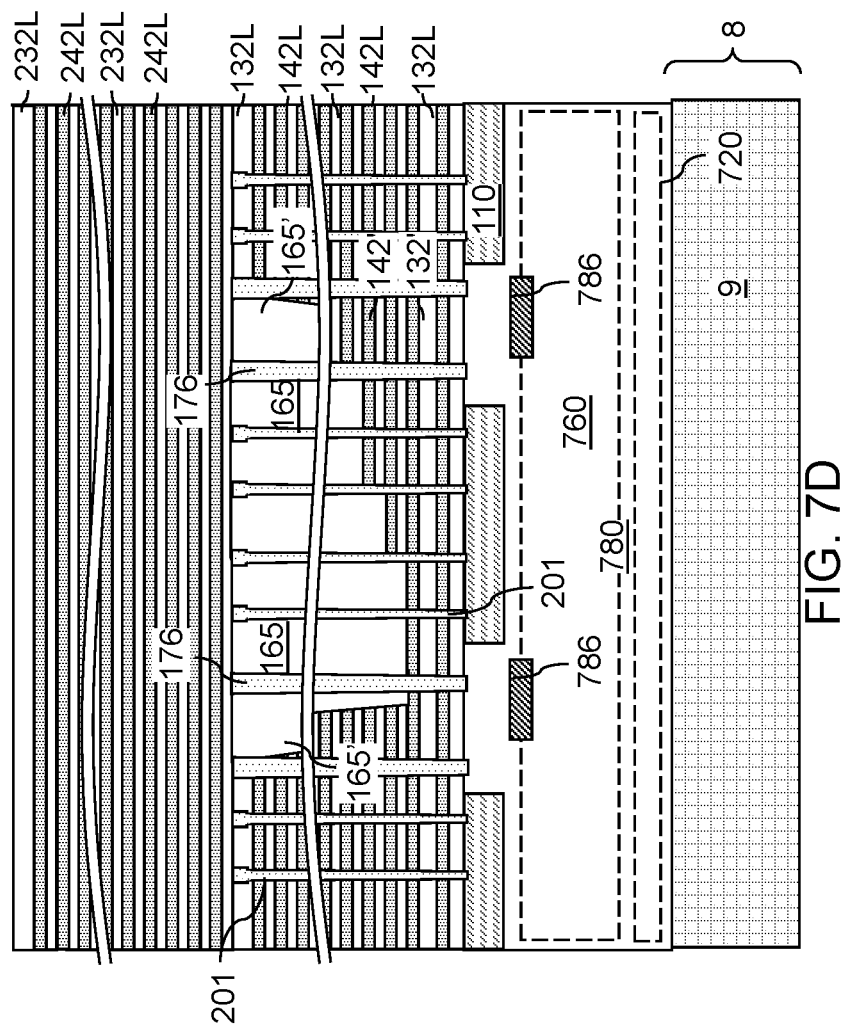
FIG. 7D is a vertical cross-sectional view along the vertical plane D-D' of FIG. 7B.
Figure 7E:
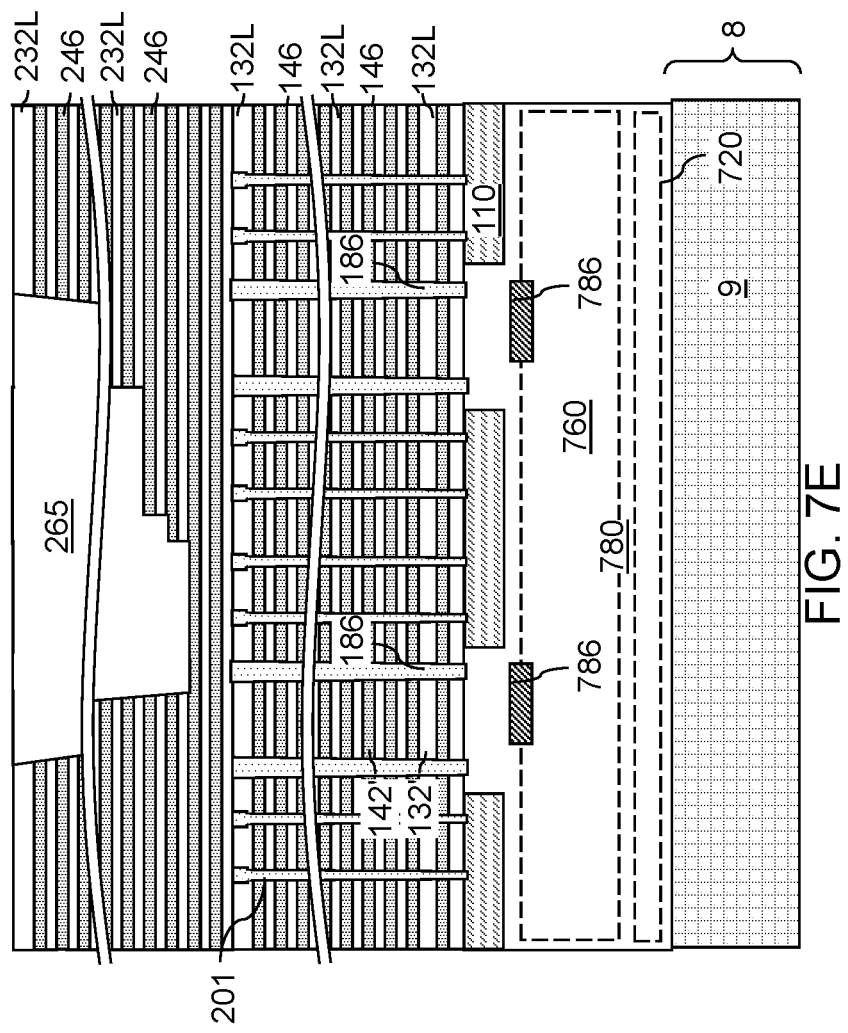
FIG. 7E is a vertical cross-sectional view along the vertical plane E-E' of FIG. 7B.
Figure 8A:
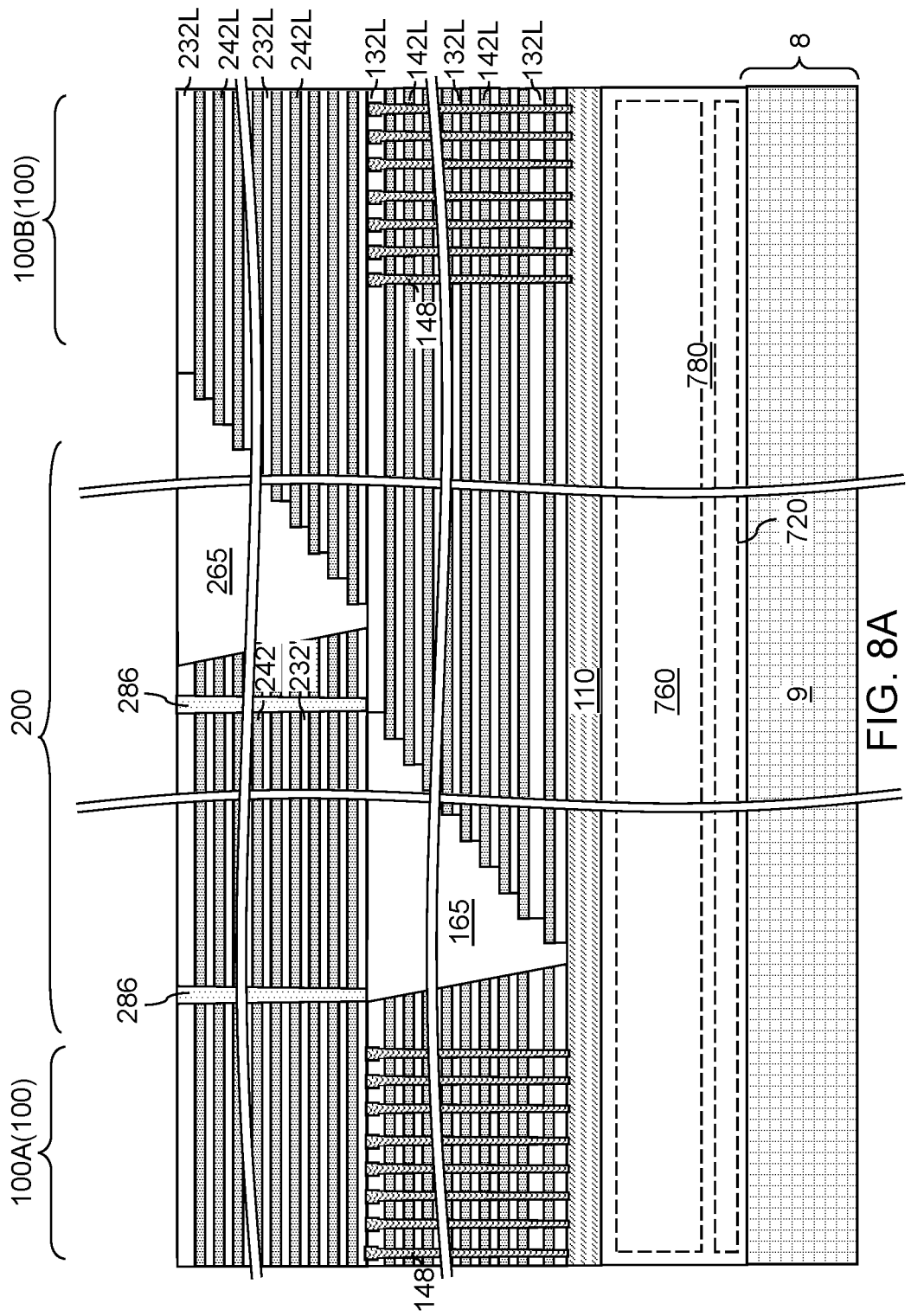
FIG. 8A is a vertical cross-sectional view of the first exemplary structure after formation of second-tier moat-shaped dielectric wall structures according to an embodiment of the present disclosure.
Figure 8B:
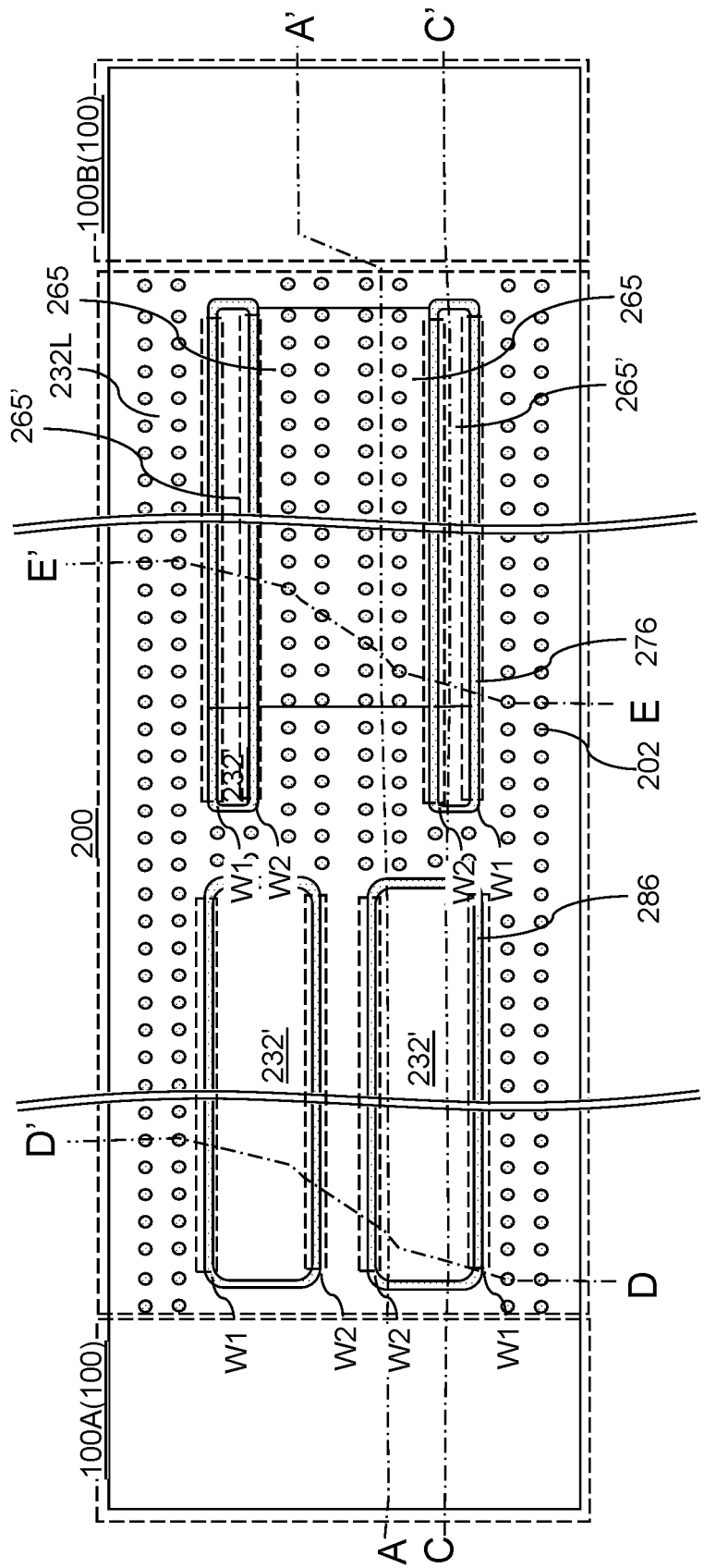
FIG. 8B is a top-down cross-sectional view of the first exemplary structure of FIG. 8A. The hinged vertical plane A-A' is the plane of the vertical cross-sectional view of FIG. 8A.
Figure 8C:
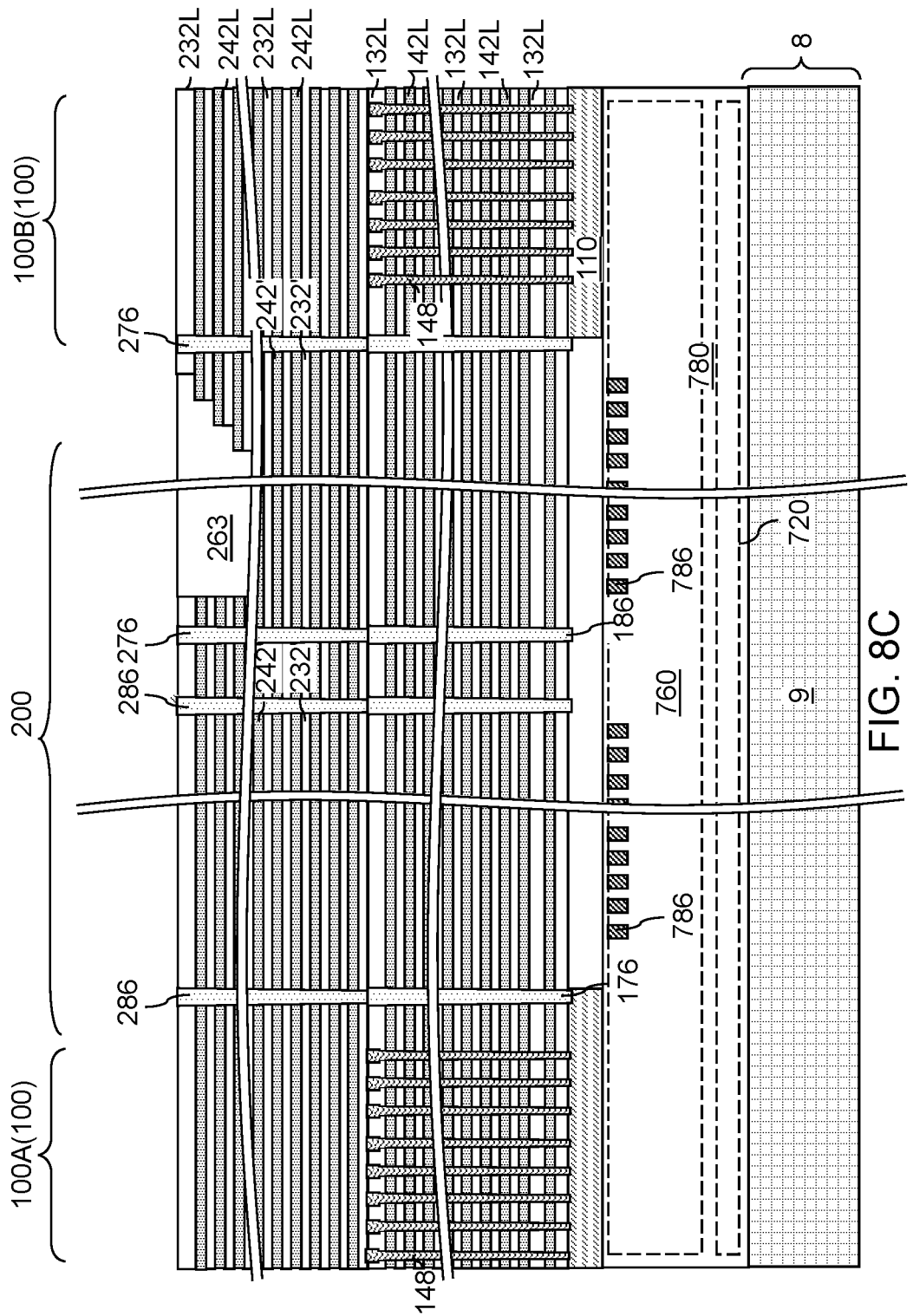
FIG. 8C is a vertical cross-sectional view along the vertical plane C-C' of FIG. 8B.
Figure 8D:
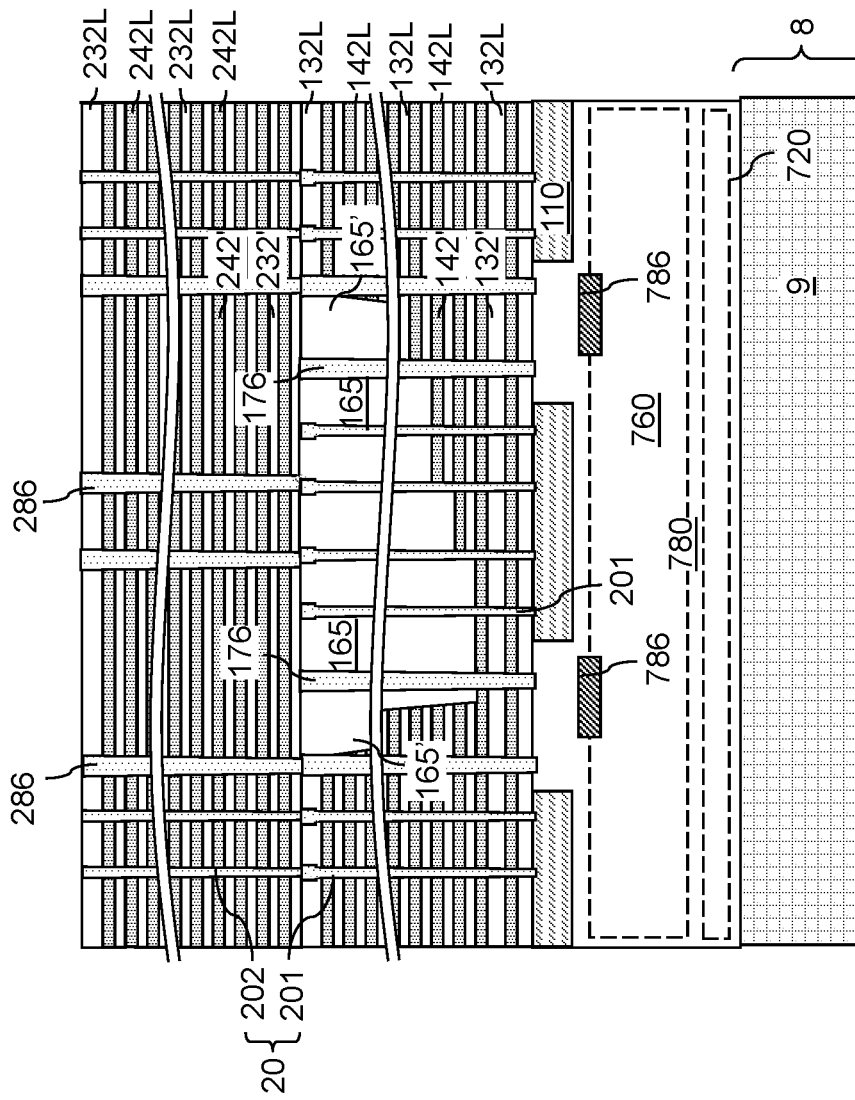
FIG. 8D is a vertical cross-sectional view along the vertical plane D-D' of FIG. 8B.
Figure 8E:
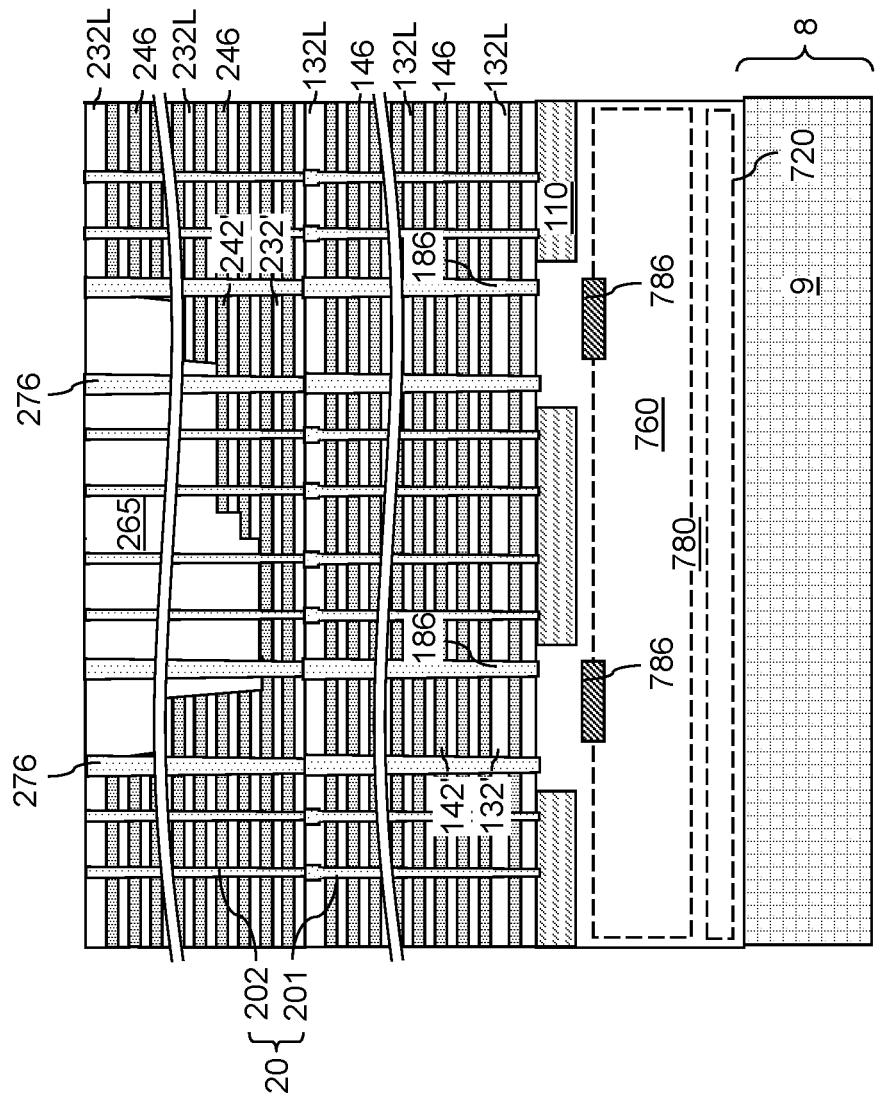
FIG. 8E is a vertical cross-sectional view along the vertical plane E-E' of FIG. 8B.
Figure 9A:
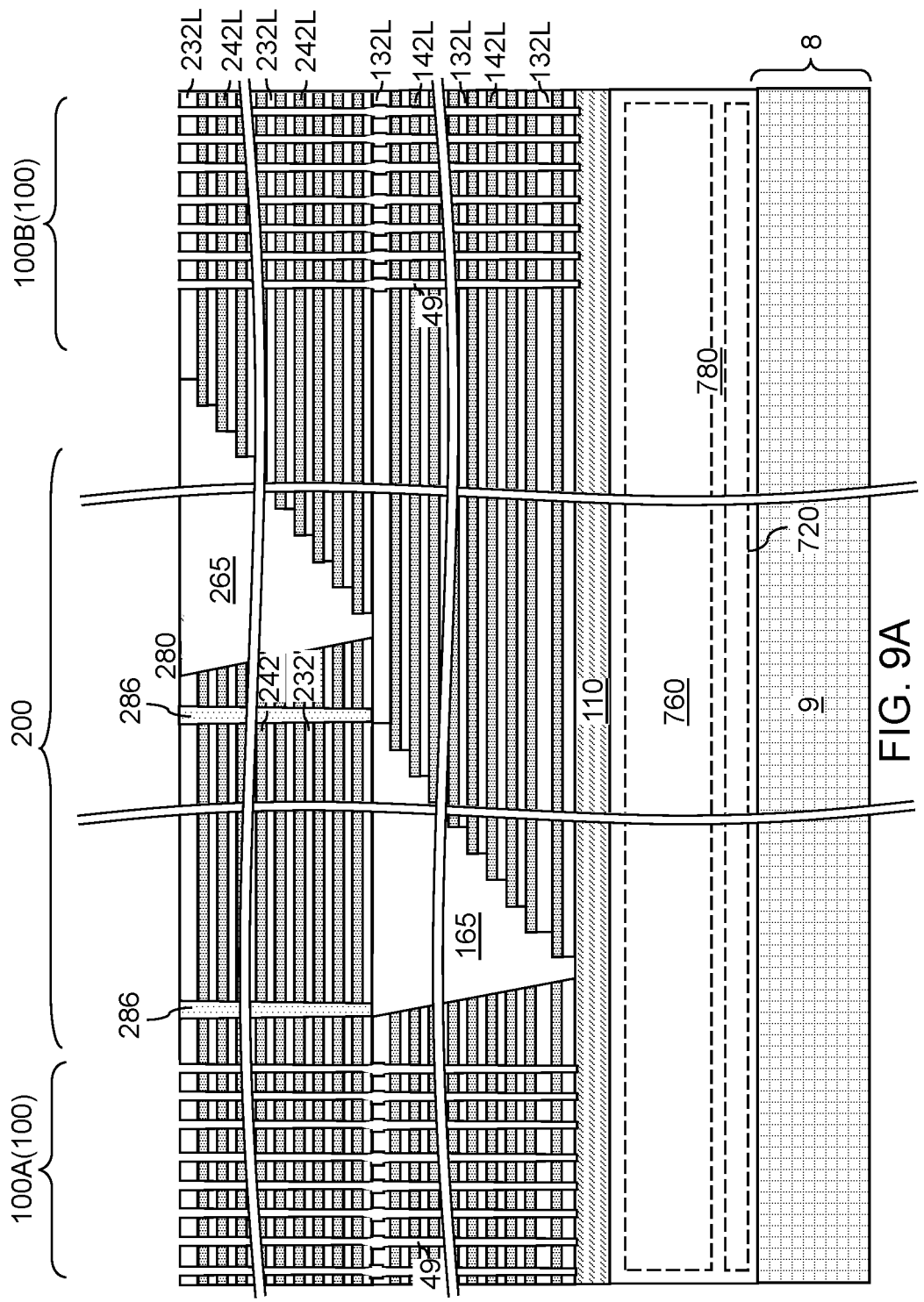
FIG. 9A is a vertical cross-sectional view of the first exemplary structure after formation of inter-tier memory openings and support openings according to an embodiment of the present disclosure.
Figure 9B:
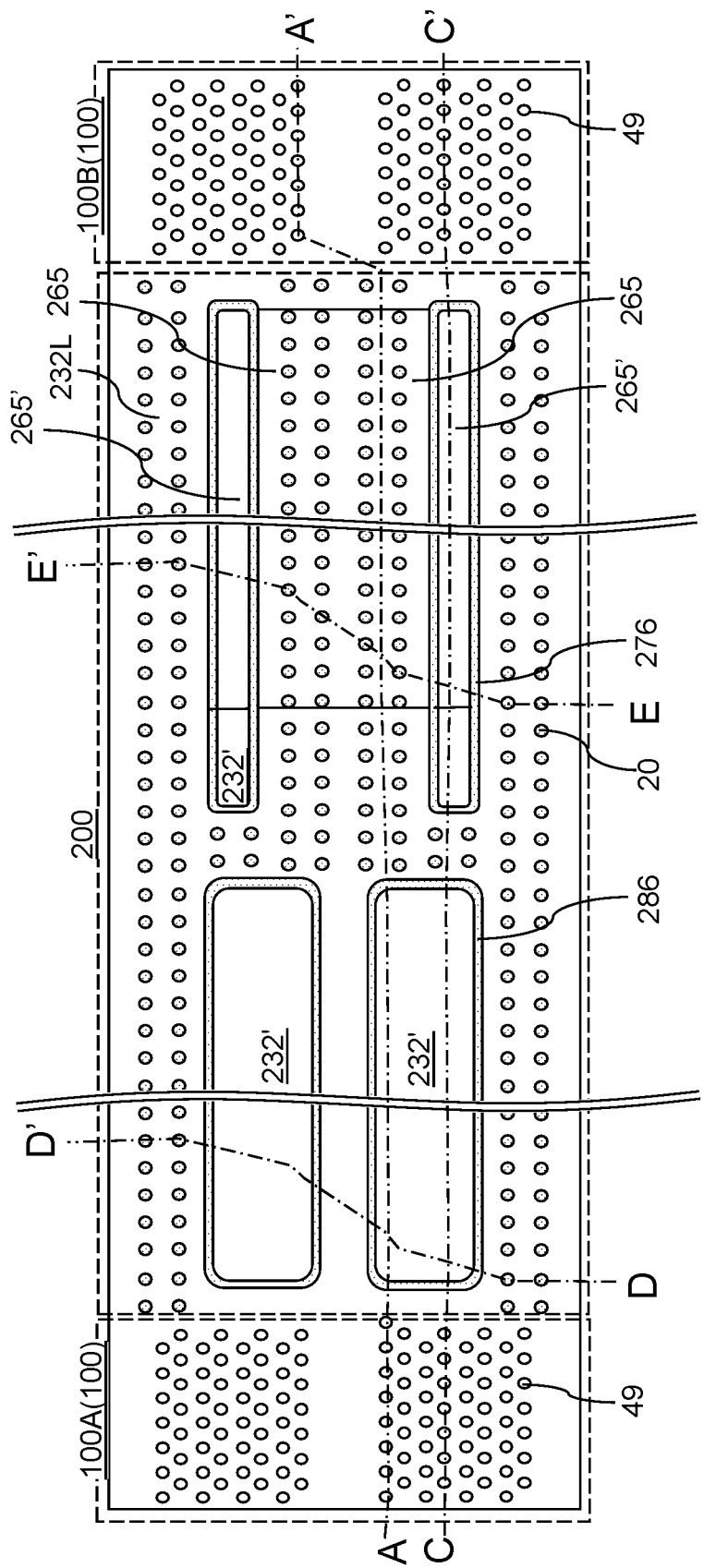
FIG. 9B is a top-down cross-sectional view of the first exemplary structure of FIG. 9A. The hinged vertical plane A-A' is the plane of the vertical cross-sectional view of FIG. 9A.
Figure 9C:
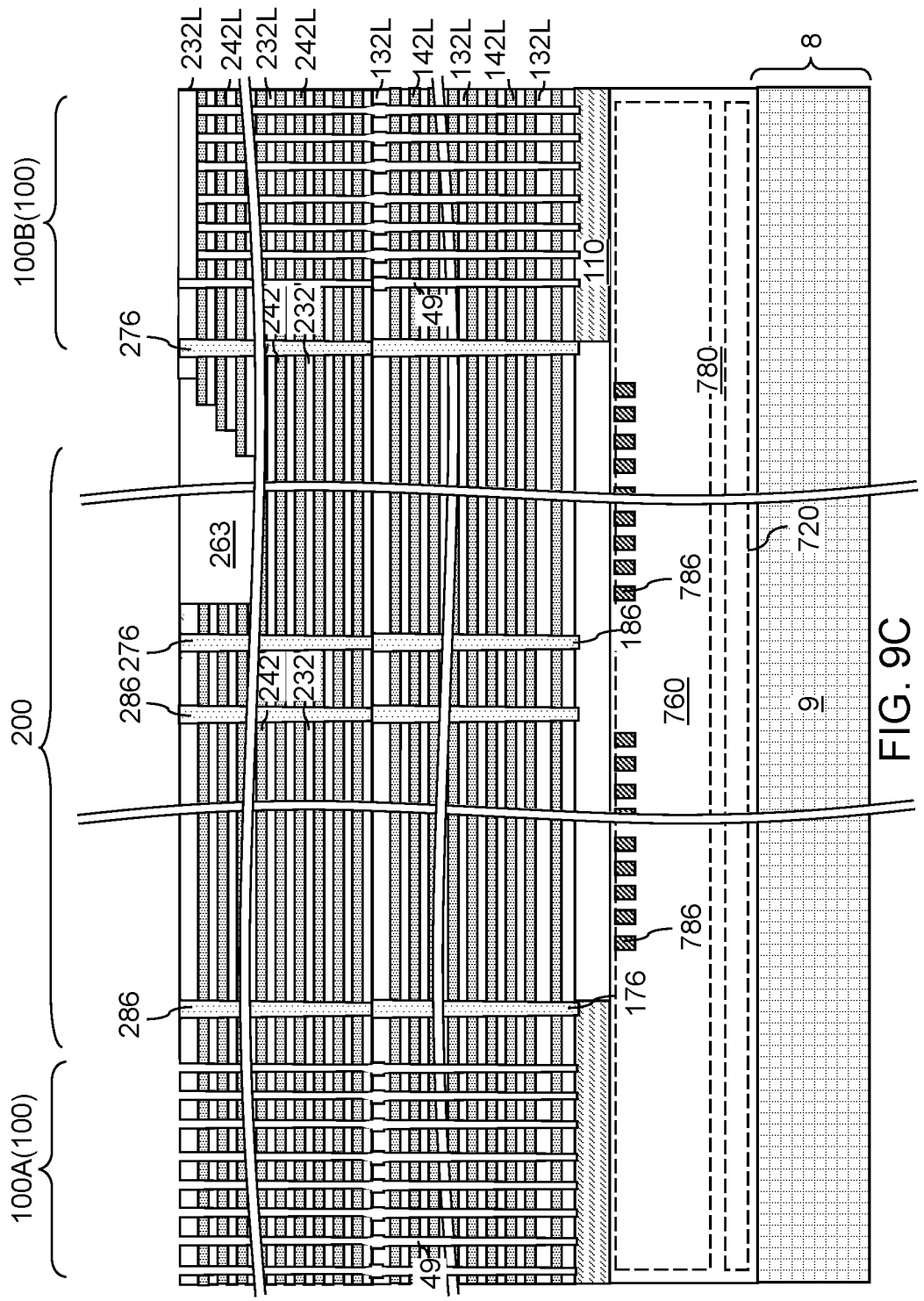
FIG. 9C is a vertical cross-sectional view along the vertical plane C-C' of FIG. 9B.
Figure 9D:
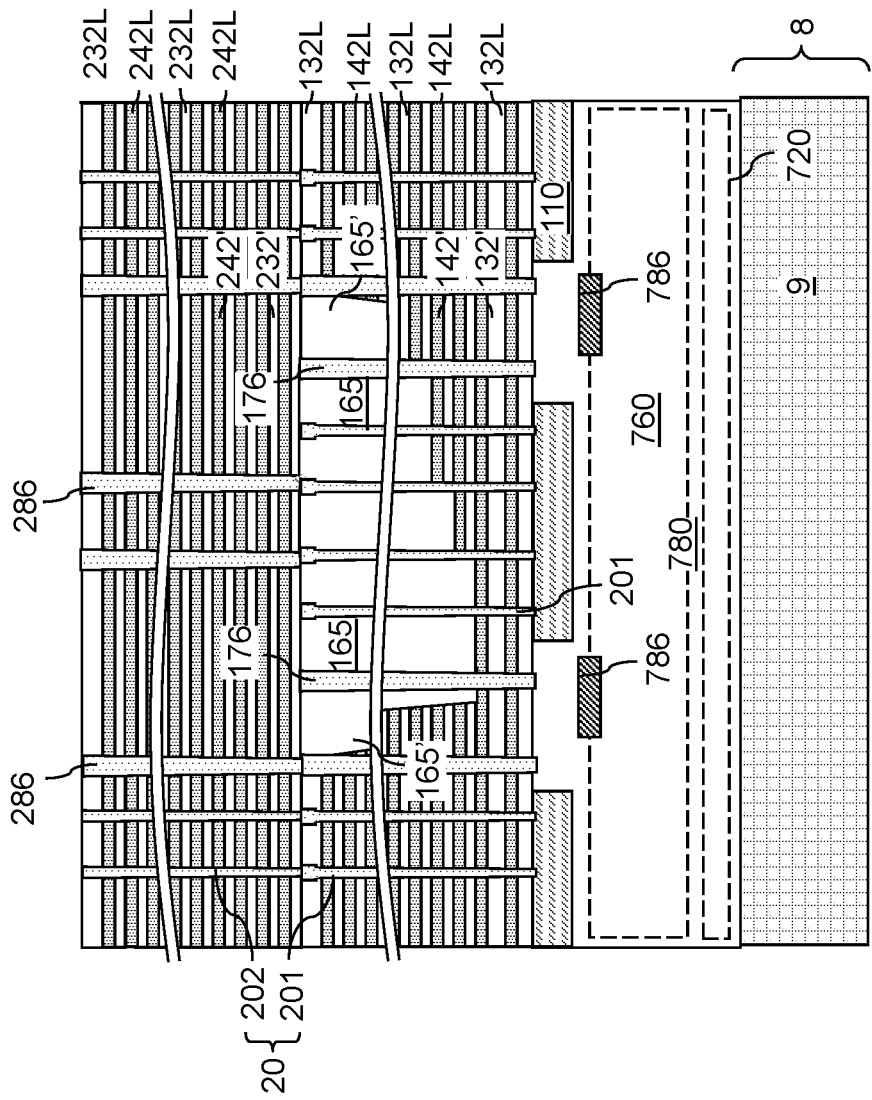
FIG. 9D is a vertical cross-sectional view along the vertical plane D-D' of FIG. 9B.
Figure 9E:
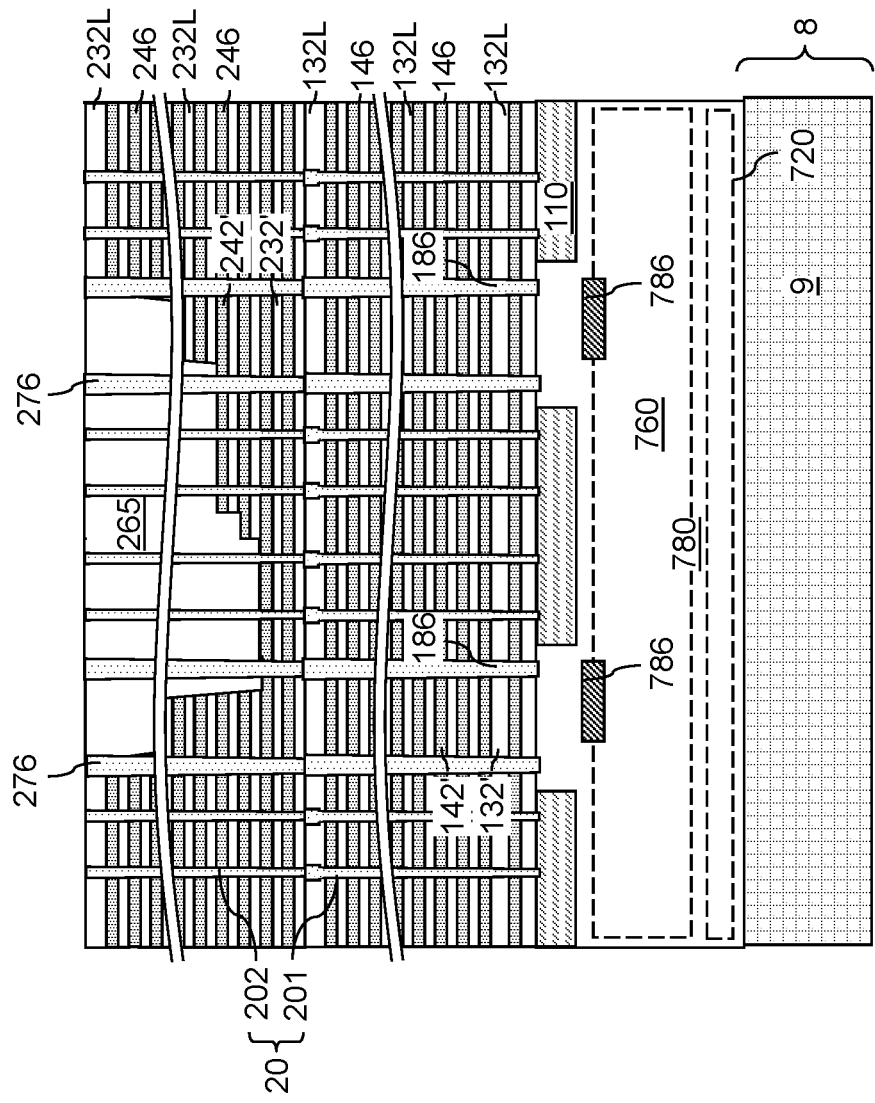
FIG. 9E is a vertical cross-sectional view along the vertical plane E-E' of FIG. 9B.

The first-tier support pillar structures 201 may have a cylindrical shape (or a tapered cylindrical, such as truncated conical shape), and the first-tier moat-shaped dielectric wall structure (176, 186) have a non-cylindrical and non-truncated conical shape, such as a toroidal polygon shape or another suitable shape. For example, each first-tier moat-shaped dielectric wall structure (176, 186) includes four segments, which include two lengthwise dielectric wall structures that laterally extend along the first horizontal direction hd1 and two widthwise dielectric wall structures that laterally extend along the second horizontal direction hd2. The two lengthwise dielectric wall segments of each first-tier moat-shaped dielectric wall structure (176, 186) are herein referred to as a first dielectric wall structure W1 and a second dielectric wall structure W2, as shown in FIG. 5B. The first dielectric wall structure W1 and the second dielectric wall structure W2 comprise portions of a first-tier moat-shaped dielectric wall structure (176, 186) that laterally extend along the first horizontal direction hd2 are connected to each other by a pair of widthwise dielectric wall portions of the first-tier moat-shaped dielectric wall structure (176, 186). Generally, a first dielectric wall structure W1 and a second dielectric wall structure W2 that laterally extend along the first horizontal direction hd1 can be formed through materials of the first alternating layer stack (132L, 142L) and the first dielectric cavity fill material portions 163 within an area of the inter-array region 200. Each first dielectric cavity fill material portion 163 can be divided into at least a first retro-stepped dielectric material portion 165 overlying stepped surfaces of the alternating layer stack (132L, 142L) and a first dielectric fill material portion 165' located between the first dielectric wall structure W1 and the second dielectric wall structure W2. The first dielectric wall structure W1 and the second dielectric wall structure W2 can be portions of a moat-shaped dielectric material that fill two-laterally extending portions of a moat trench, and can be connected to each other by a pair of widthwise dielectric wall portions.

Referring to FIGS. 6A-6E, a photoresist layer can be applied over the first alternating layer stack (132L, 142L), and can be lithographically patterned to form an array of discrete openings within each memory array region 100. The pattern of openings in the photoresist layer may be transferred through the first alternating layer stack (132L, 142L) and into an upper portion of the semiconductor material layer 110 by a first anisotropic etch process to form the first-tier memory openings. First-tier memory openings are formed in the memory array regions 100. Each cluster of first-tier memory openings may be formed as a two-dimensional array of first-tier memory openings.

A sacrificial first-tier fill material can be deposited in the each of the first-tier memory openings. The sacrificial first-tier fill material includes a material that may be subsequently removed selective to the materials of the first continuous insulating layers 132L and the first continuous sacrificial material layers 142L. In one embodiment, the sacrificial first-tier fill material may include a semiconductor material such as silicon (e.g., a-Si or polysilicon), a silicon-germanium alloy, germanium, a III-V compound semiconductor material, or a combination thereof. Optionally, a thin etch stop liner (such as a silicon oxide layer or a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In another embodiment, the sacrificial first-tier fill material may include a silicon oxide material having a higher etch rate than the materials of the first continuous insulating layers 132L. For example, the sacrificial first-tier fill material may include borosilicate glass or porous or non-porous organosilicate glass having an etch rate that is at least 100 times higher than the etch rate of densified TEOS oxide (i.e., a silicon oxide material formed by decomposition of tetraethylorthosilicate glass in a chemical vapor deposition process and subsequently densified in an anneal process) in a 100:1 dilute hydrofluoric acid. In this case, a thin etch stop liner (such as a silicon nitride layer having a thickness in a range from 1 nm to 3 nm) may be used prior to depositing the sacrificial first-tier fill material. The sacrificial first-tier fill material may be formed by a non-conformal deposition or a conformal deposition method. In yet another embodiment, the sacrificial first-tier fill material may include carbon-containing material (such as amorphous carbon or diamond-like carbon) that may be subsequently removed by ashing, or a silicon-based polymer that may be subsequently removed selective to the materials of the first alternating layer stack (132L, 142L).

Portions of the deposited sacrificial material may be removed from above the topmost layer of the first alternating layer stack (132L, 142L), such as from above the topmost first continuous insulating layer 132L. For example, the sacrificial first-tier fill material may be recessed to a top surface of the topmost first continuous insulating layer 132L using a planarization process. The planarization process may include a recess etch, chemical mechanical planarization (CMP), or a combination thereof. The top surface of the topmost first continuous insulating layer 132L may be used as an etch stop layer or a planarization stop layer.

Remaining portions of the sacrificial first-tier fill material comprise sacrificial first-tier memory opening fill portions 148. The top surfaces of the sacrificial first-tier memory opening fill portions 148 may be coplanar with the top surface of the topmost first continuous insulating layer 132L. Each of the sacrificial first-tier memory opening fill portions 148 may, or may not, include cavities therein. The set of all structures located between the bottommost surface of the first alternating layer stack (132L, 142L) and the topmost surface of the first alternating layer stack (132L, 142L) or embedded within the first alternating layer stack (132L, 142L) constitutes a first-tier structure.

Referring to FIGS. 7A-7E, a second alternating layer stack of second continuous insulating layers 232L and second continuous sacrificial material layers 242L can be formed. Each of the second continuous insulating layers 232L is an insulating layer that continuously extends over the entire area of the substrate 8, and may have a uniform thickness throughout. Each of the second continuous sacrificial material layers 242L includes is a sacrificial material layer that includes a dielectric material and continuously extends over the entire area of the substrate 8, and may have a uniform thickness throughout. The second continuous insulating layers 232L can have the same material composition and the same thickness as the first continuous insulating layers 132L. The second continuous sacrificial material layers 242L can have the same material composition and the same thickness as the first continuous sacrificial material layers 142L.

Generally, at least one additional alternating layer stack of additional continuous insulating layers and additional continuous sacrificial material layers can be optionally formed over the first alternating layer stack (132L, 142L) and the first-tier dielectric cavity fill material portions 163.

Second stepped surfaces can be formed within the inter-array region 200 simultaneously. The areas of the second stepped surfaces are laterally offset from respective proximal first stepped surfaces along the first horizontal direction hd1 so that a set of first stepped surfaces and a set of second stepped surfaces that are laterally spaced along the first horizontal direction hd1 and are not offset along the second horizontal direction hd2 can provide a continuously ascending staircase or a continuously descending staircase. For example, a hard mask layer (not shown) such as a metallic or dielectric mask material layer can be formed over the second alternating layer stack, and can be patterned to form multiple rectangular openings that are laterally offset from a respective first-tier dielectric cavity fill material portion 163 along the first horizontal direction hd1 and are aligned to (i.e., not laterally offset from) the respective first-tier dielectric cavity fill material portion 163 along the second horizontal direction hd2. The areas of openings within the hard mask layer correspond to areas in which second stepped surfaces are to be subsequently formed. Each opening through the hard mask layer may be rectangular, and may have a pair of sides that are parallel to the first horizontal direction hd1 and a pair of sides that are parallel to the second horizontal direction hd2. The rectangular openings through the hard mask layer may be arranged along the second horizontal direction hd1, and may be alternately staggered along the second horizontal direction hd2. Thus, upon sequentially numbering the rectangular openings along the second horizontal direction hd2, every odd-numbered rectangular opening through the hard mask layer can be formed as a first one-dimensional array arranged along the second horizontal direction hd2 and aligned along the first horizontal direction hd1 (i.e., having a same lateral extent along the first horizontal direction), and every even-numbered rectangular openings through the hard mask layer can be formed as a second one-dimensional array arranged along the second horizontal direction hd2 aligned along the first horizontal direction hd1.

A trimmable mask layer (not shown) can be applied over the second alternating layer stack. The trimmable mask layer can include a trimmable photoresist layer that can be controllably trimmed by a timed ashing process. The trimmable mask layer can be patterned with an initial pattern such that a segment of each rectangular opening in the hard mask layer that is most distal from the memory array regions 100 is not masked by the trimmable mask layer, while the rest of each rectangular opening is covered by the trimmable mask layer. For example, the trimmable mask layer can have a rectangular shape having straight edges that are parallel to the second horizontal direction hd2, such that the straight edges are located over a vertical step of respective second stepped surfaces that is most distal from one of the memory array regions 100.

The second stepped surfaces can be formed within the rectangular openings in the hard mask layer by iteratively performing a set of layer patterning processing steps as many times as the total number of second continuous sacrificial material layers 242L within the second alternating layer stack less 1. The set of layer patterning processing steps comprises an anisotropic etch process that etches unmasked portions of a pair of a second continuous insulating layer 232L and a second continuous sacrificial material layer 242L, and a mask trimming process in which the trimmable mask layer is isotropically trimmed to provide shifted sidewalls that are shifted away from the most proximal memory array region 100. A final anisotropic etch process can be performed after the last mask trimming process, and the trimmable mask layer can be removed, for example, by ashing. The hard mask layer can be removed selective to the materials of the second alternating layer stack (232L, 242L), for example, by an isotropic etch process (such as a wet etch process).

A second stepped cavity can be formed within each area of the rectangular opening in the hard mask layer. Each second stepped cavity can include a cliff region in which a tapered sidewall of the second alternating layer stack vertically extends from the bottommost layer of the second alternating layer stack (232L, 242L) to the topmost layer of the second alternating layer stack (232L, 242L). Each second stepped cavity has respective second stepped surfaces as stepped bottom surfaces. Each second stepped cavity has a pair of stepped sidewalls that laterally extend along the first horizontal direction hd1. Each stepped sidewall of the second stepped cavity adjoins the second stepped surfaces at the bottom edge, and extends to the top surface of the topmost layer of the second alternating layer stack (232L, 242L). Each second stepped cavity defines the lateral extent of respective second stepped surfaces.

The array of second staircase regions can be arranged along the second horizontal direction hd2 with an alternating lateral offsets along the first horizontal direction hd1 to provide a staggered configuration for the second staircase regions. In other words, upon sequentially numerically labeling the second staircase regions with positive integers starting with 1 along the second horizontal direction hd2, every even-numbered second staircase region may be closer to the first memory array region 100A than to the second memory array region 100B, and every odd-numbered second staircase region may be closer to the second memory array region 100B than to the first memory array region 100A. The second stepped cavities can extend through each layer within the second alternating layer stack (232L, 242L).

A second dielectric fill material (such as undoped silicate glass or a doped silicate glass) can be deposited in each second stepped cavity. The second dielectric fill material can be planarized to remove excess portions of the second dielectric fill material from above the horizontal plane including the topmost surface of the second alternating layer stack (232L, 242L). Each remaining portion of the second dielectric fill material that fills a respective second stepped cavity constitutes a second-tier dielectric cavity fill material portion 263. Thus, the second-tier dielectric cavity fill material portions 263 are formed through the second alternating layer stack (232L, 242L).

Referring to FIGS. 8A-8E, various second-tier moat trenches and second-tier support openings can be formed through the second alternating layer stack (232L, 242L) within the inter-array regions 200. For example, a photoresist layer (not shown) can be applied over the second alternating layer stack (232L, 242L), and can be lithographically patterned to form moat-shaped openings and discrete openings (which may be circular openings). The second-tier moat trenches and second-tier support openings can be formed during the same photolithography and etching steps or during different photolithography and etching steps.

An anisotropic etch process can be performed to transfer the pattern of the moat-shaped openings and the discrete openings through the second alternating layer stack (232L, 242L) and the second-tier dielectric cavity fill material portions 263. The second-tier moat trenches are formed underneath the moat-shaped openings in the photoresist layer. Second-tier support openings are formed underneath the discrete openings in the photoresist layer. Generally, the second-tier support openings are formed within the area of the inter-array regions 200 that are not filled with the second-tier moat trenches. Optionally, additional second-tier support openings (not shown) may be formed in portions of the memory array regions 100 in which memory stack structures are not to be subsequently formed.

Each second-tier moat trench can vertically extend to a topmost layer of the first alternating layer stack (132L, 142L). Each second-tier support opening can vertically extend to a top surface of a first-tier support pillar structure 201. Each of the second-tier moat trenches can be formed within an inter-array region 200, and can have a pair of lengthwise outer sidewalls and a pair of lengthwise inner sidewalls that laterally extend along the first horizontal direction hd1, and a pair of widthwise outer sidewalls and a pair of widthwise inner sidewalls that laterally extend along the second horizontal direction hd2. In some embodiments, the lengthwise sidewalls and the widthwise sidewall of a second-tier moat trench may be directly adjoined to each other, or may be indirectly adjoined to each other through curved sidewall segments. The lateral distance between facing pairs of a second-tier moat trench may be in a range from 50 nm to 2,000 nm, such as from 200 nm to 500 nm, although lesser and greater lateral distances may also be employed.

The second-tier moat trenches can include first-type second-tier moat trenches that intersects a respective one of the second-tier dielectric cavity fill material portions 263. In one embodiment, each second-tier dielectric cavity fill material portion 263 may be intersected by a pair of first-type second-tier moat trenches such that each second-tier dielectric cavity fill material portion 263 is divided into three dielectric material portions. Each remaining portion of a second-tier dielectric cavity fill material portion 263 that is laterally enclosed by a first-type second-tier moat trenches is herein referred to as a second dielectric fill material portion 265'. Each remaining portion of a second-tier dielectric cavity fill material portion 263 that is located outside of the first-type second-tier moat trenches is herein referred to as a second-tier retro-stepped dielectric material portion 265. In one embodiment, each second-tier retro-stepped dielectric material portion 265 can laterally extend, and border on, two first-type second-tier moat trenches.

The second-tier moat trenches can include second-type second-tier moat trenches that do not intersect the second-tier dielectric cavity fill material portions 263. In one embodiment, the second-type second-tier moat trenches may be laterally offset from the first-type second-tier moat trenches within a same inter-array region 200 along the second horizontal direction hd2. Generally, the dimensions and shapes of second-type second-tier moat trenches can be comparable to the dimensions and shapes of the first-type second-tier moat trenches.

In one embodiment, a first-type second-tier moat trench may laterally enclose a patterned portion of the second alternating layer stack (232L, 242L). In one embodiment, the second continuous sacrificial material layers 242L include a dielectric material such as silicon nitride. In this case, each patterned portion of a second continuous insulating layer 232L is herein referred to as a second insulating plate 232', and each patterned portion of a second continuous sacrificial material layer 242L is herein referred to as a second dielectric material plate 242'. A vertically alternating sequence of second insulating plates 232' and second dielectric material plates 242' may be formed within each first-type second-tier moat trench. The second insulating plates 232' and the second continuous insulating layers 232L have a same material composition. Each horizontal surface of the second continuous insulating layers 232L can be located within a horizontal plane including a horizontal surface of a respective one of the second insulating plates 232' within a vertically alternating sequence of second insulating plates 232' and second dielectric material plates 242'.

Generally, the sidewalls of each second dielectric fill material portion 265' that do not contact the first-type second-tier moat trenches are tapered such that the horizontal cross-sectional area of each second dielectric fill material portion 265' increases with a vertical distance from the substrate 8. This is because the anisotropic etch process that forms the second stepped cavities etch sidewalls of the second alternating layer stack (232L, 242L) with a taper angle, which may be in a range from 2 degree to 25 degrees, such as from 2 degrees to 8 degrees. Thus, the second insulating plates 232' and the second dielectric material plates 242' within each first-type second-tier moat trench may have second lateral extents along the second horizontal direction hd2 that decreases with a vertical distance from the substrate 8. Further, the second insulating plates 232' and the second dielectric material plates 242' within each first-type second-tier moat trench may have second lateral extents along the second horizontal direction hd2 that decreases with the vertical distance from the substrate 8. In one embodiment, at least one widthwise sidewall of each second dielectric fill material portion 265' is not in contact with a first-type second-tier moat trench, and is in contact with a respective second vertically alternating sequence of second insulating plates 232' and second dielectric material plates 242'.

A second dielectric fill material portion 265' can overlie, and contact, a second vertically alternating sequence of second insulating plates 232' and second dielectric material plates 242'. The second dielectric fill material portion 265' can laterally extend between a pair of inner lengthwise sidewalls of a first-type second-tier moat trench. A larger surface area of a second dielectric fill material portion 265' can be physically exposed to one lengthwise segment of a first-type second-tier moat trench than to another lengthwise segment of the first-type second-tier moat trench due to the taper angle in the lengthwise sidewalls of each second dielectric fill material portion 265' that laterally extend along the second horizontal direction.

A second dielectric fill material such as silicon oxide can be deposited in the second-tier moat trenches and in the second-tier support openings by a conformal deposition process such as a chemical mechanical deposition process. Excess portions of the second dielectric fill material can be removed from above the topmost layer of the second alternating layer stack (232L, 242L). Each remaining portion of the second dielectric fill material that fills the second-tier moat trenches comprise a second-tier moat-shaped dielectric wall structure (276, 286). Each remaining portion of the second dielectric fill material that fills the second-tier support openings comprise a second-tier support pillar structure 202. The second-tier moat-shaped dielectric wall structures (276, 286) and the second-tier support pillar structures 202 can be formed during the same or separate deposition steps. Each contiguous combination of a first-tier support pillar structure 201 and a second-tier support pillar structure 202 constitutes an inter-tier support pillar structure 20. A first subset of the second-tier support pillar structures 202 may be a component of a respective inter-tier support pillar structure 20, and a second subset of the second-tier support pillar structures 202 may not contact any first-tier support pillar structure 201. Further, a first subset of the first-tier support pillar structures 201 may be a component of a respective inter-tier support pillar structure 20, and a second subset of the first-tier support pillar structures 201 may not contact any second-tier support pillar structure 202. The second-tier moat-shaped dielectric wall structures (276, 286) include first-type second-tier moat-shaped dielectric wall structure 276 that fill the first-type second-tier moat trenches and second-type second-tier moat-shaped dielectric fill structure 286 that fill the second-type second-tier moat trenches.

Each second-tier moat-shaped dielectric wall structure (276, 286) includes four segments, which include two lengthwise dielectric wall structures that laterally extend along the first horizontal direction hd1 and two widthwise dielectric wall structures that laterally extend along the second horizontal direction hd2. The two lengthwise dielectric wall segments of each second-tier moat-shaped dielectric wall structure (276, 286) are herein referred to as a first dielectric wall structure W1 and a second dielectric wall structure W2. The first dielectric wall structure W1 and the second dielectric wall structure W2 comprise portions of a second-tier moat-shaped dielectric wall structure (276, 286) that laterally extend along the first horizontal direction hd1 are connected to each other by a pair of widthwise dielectric wall portions of the second-tier moat-shaped dielectric wall structure (276, 286). Generally, a first dielectric wall structure W1 and a second dielectric wall structure W2 that laterally extend along the first horizontal direction hd1 can be formed through materials of the second alternating layer stack (232L, 242L) and the second dielectric cavity fill material portions 263 within an area of the inter-array region 200. Each second dielectric cavity fill material portion 263 can be divided into at least a second retro-stepped dielectric material portion 265 overlying stepped surfaces of the alternating layer stack (232L, 242L) and a second dielectric fill material portion 265' located between the first dielectric wall structure W1 and the second dielectric wall structure W2. The first dielectric wall structure W1 and the second dielectric wall structure W2 can be portions of a moat-shaped dielectric material that fill two-laterally extending portions of a moat trench, and can be connected to each other by a pair of widthwise dielectric wall portions.

Referring to FIGS. 9A-9E, a photoresist layer can be applied over the second alternating layer stack (232L, 242L), and can be lithographically patterned to form an array of discrete openings within each memory array region 100. The pattern of openings in the photoresist layer may be the same as the pattern of the first-tier memory openings, which is the same as the pattern of the sacrificial first-tier memory opening fill portions 148. The pattern of openings in the photoresist layer can be transferred through the second alternating layer stack (232L, 242L) by a second anisotropic etch process to form the second-tier memory openings. Second-tier memory openings are formed in the memory array regions 100. Each cluster of second-tier memory openings may be formed as a two-dimensional array of second-tier memory openings.

An etch process can be performed to remove the sacrificial first-tier memory opening fill portions 148 selective to the materials of the first alternating layer stack (132L, 142L) and the second alternating layer stack (232L, 242L). Each cavity that includes a vertical stack of a volume of a second-tier memory opening and a first-tier memory opening is herein referred to as an inter-tier memory opening 49, or as a memory opening 49. The photoresist layer can be subsequently removed, for example, by ashing.

Referring to FIG. 10A, an inter-tier memory opening 49 is illustrated in a magnified view. The memory opening 49 extends through the first-tier structure and the second-tier structure. Generally, memory openings 49 can be formed within each memory array region 100, in which each layer of the first alternating layer stack (132L, 142L) and each layer within the second alternating layer stack (232L, 242L) are present. In other words, each memory opening 49 can vertically extend through, and can have a sidewall laterally bounded by, each layer within the first alternating layer stack (132L, 142L) and each layer within the second alternating layer stack (232L, 242L).

Referring to FIG. 10B, a stack of layers including a blocking dielectric layer 52, a charge storage layer 54, a tunneling dielectric layer 56, and a semiconductor channel material layer 60L may be sequentially deposited in the inter-tier memory openings 49. The blocking dielectric layer 52 may include a single dielectric material layer or a stack of a plurality of dielectric material layers. In one embodiment, the blocking dielectric layer may include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 may include a dielectric metal oxide having a dielectric constant greater than 7.9, i.e., having a dielectric constant greater than the dielectric constant of silicon nitride. The thickness of the dielectric metal oxide layer may be in a range from 1 nm to 20 nm, although lesser and greater thicknesses may also be used. The dielectric metal oxide layer may subsequently function as a dielectric material portion that blocks leakage of stored electrical charges to control gate electrodes. In one embodiment, the blocking dielectric layer 52 includes aluminum oxide. Alternatively or additionally, the blocking dielectric layer 52 may include a dielectric semiconductor compound such as silicon oxide, silicon oxynitride, silicon nitride, or a combination thereof.

Subsequently, the charge storage layer 54 may be formed. In one embodiment, the charge storage layer 54 may be a continuous layer or patterned discrete portions of a charge trapping material including a dielectric charge trapping material, which may be, for example, silicon nitride. Alternatively, the charge storage layer 54 may include a continuous layer or patterned discrete portions of a conductive material such as doped polysilicon or a metallic material that is patterned into multiple electrically isolated portions (e.g., floating gates), for example, by being formed within lateral recesses into continuous sacrificial material layers (142L, 242L). In one embodiment, the charge storage layer 54 includes a silicon nitride layer. In one embodiment, the continuous sacrificial material layers (142L, 242L) and the continuous insulating layers (132L, 232L) may have vertically coincident sidewalls, and the charge storage layer 54 may be formed as a single continuous layer. Alternatively, the continuous sacrificial material layers (142L, 242L) may be laterally recessed with respect to the sidewalls of the continuous insulating layers (132L, 232L), and a combination of a deposition process and an anisotropic etch process may be used to form the charge storage layer 54 as a plurality of memory material portions that are vertically spaced apart. The thickness of the charge storage layer 54 may be in a range from 2 nm to 20 nm, although lesser and greater thicknesses may also be used.

The tunneling dielectric layer 56 includes a dielectric material through which charge tunneling may be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 may include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 may include a stack of a first silicon oxide layer, a silicon oxynitride layer, and a second silicon oxide layer, which is commonly known as an ONO stack. In one embodiment, the tunneling dielectric layer 56 may include a silicon oxide layer that is substantially free of carbon or a silicon oxynitride layer that is substantially free of carbon. The thickness of the tunneling dielectric layer 56 may be in a range from 2 nm to 20 nm, although lesser and greater thicknesses may also be used. The stack of the blocking dielectric layer 52, the charge storage layer 54, and the tunneling dielectric layer 56 constitutes a memory film 50 that stores memory bits.

The semiconductor channel material layer 60L includes a p-doped semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel material layer 60L may have a uniform doping. In one embodiment, the semiconductor channel material layer 60L has a p-type doping in which p-type dopants (such as boron atoms) are present at an atomic concentration in a range from $1.0 \times 10^{12}/cm^3$ to $1.0 \times 10^{18}/cm^3$, such as from $1.0 \times 10^{14}/cm^3$ to $1.0 \times 10^{17}/cm^3$. In one embodiment, the semiconductor channel material layer 60L includes, and/or consists essentially of, boron-doped amorphous silicon or boron-doped polysilicon. In another embodiment, the semiconductor channel material layer 60L has an n-type doping in which n-type dopants (such as phosphor atoms or arsenic atoms) are present at an atomic concentration in a range from $1.0 \times 10^{12}/cm^3$ to $1.0 \times 10^{18}/cm^3$, such as from $1.0 \times 10^{14}/cm^3$ to $1.0 \times 10^{17}/cm^3$. The semiconductor channel material layer 60L may be formed by a conformal deposition method such as low pressure chemical vapor deposition (LPCVD). The thickness of the semiconductor channel material layer 60L may be in a range from 2 nm to 10 nm, although lesser and greater thicknesses may also be used. A cavity 49' is formed in the volume of each inter-tier memory opening 49 that is not filled with the deposited material layers (52, 54, 56, 60L).

Figure 10C:
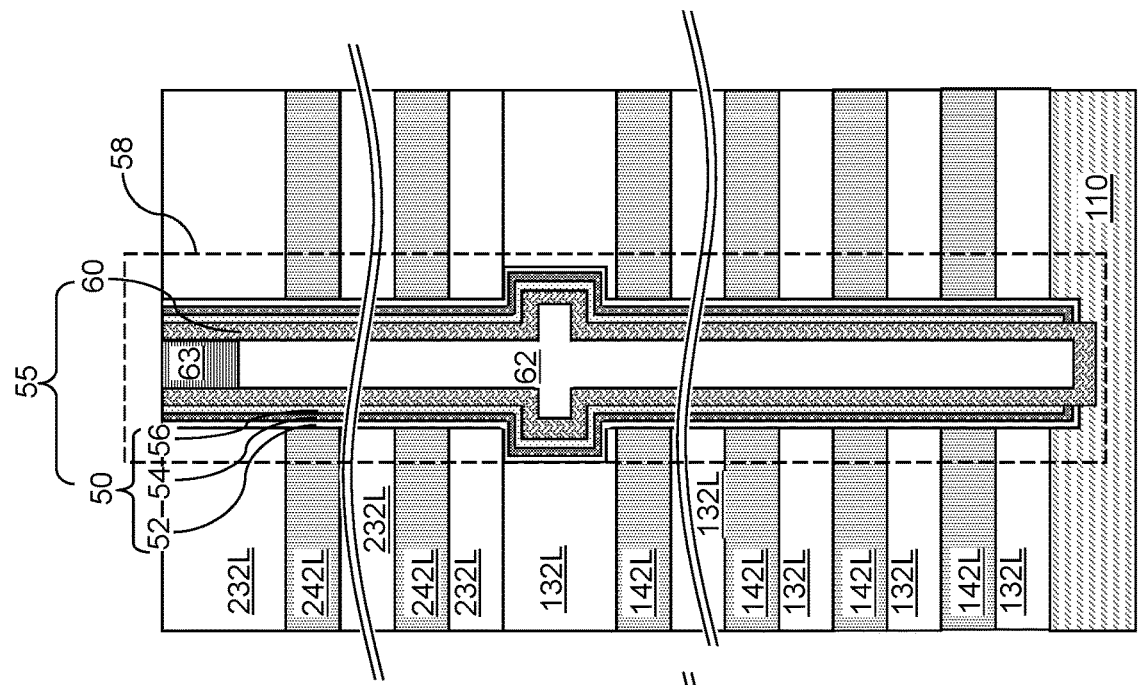

Referring to FIG. 10C, in case the cavity 49' in each memory opening is not completely filled by the semiconductor channel material layer 60L, a dielectric core layer may be deposited in the cavity 49' to fill any remaining portion of the cavity 49' within each memory opening. The dielectric core layer includes a dielectric material such as silicon oxide or organosilicate glass. The dielectric core layer may be deposited by a conformal deposition method such as low pressure chemical vapor deposition (LPCVD), or by a self-planarizing deposition process such as spin coating. The horizontal portion of the dielectric core layer overlying the top second continuous insulating layer 232L may be removed, for example, by a recess etch. The recess etch continues until top surfaces of the remaining portions of the dielectric core layer are recessed to a height between the top and bottom surfaces of the topmost second insulating layer 232L. Each remaining portion of the dielectric core layer constitutes a dielectric core 62.

Figure 10D:
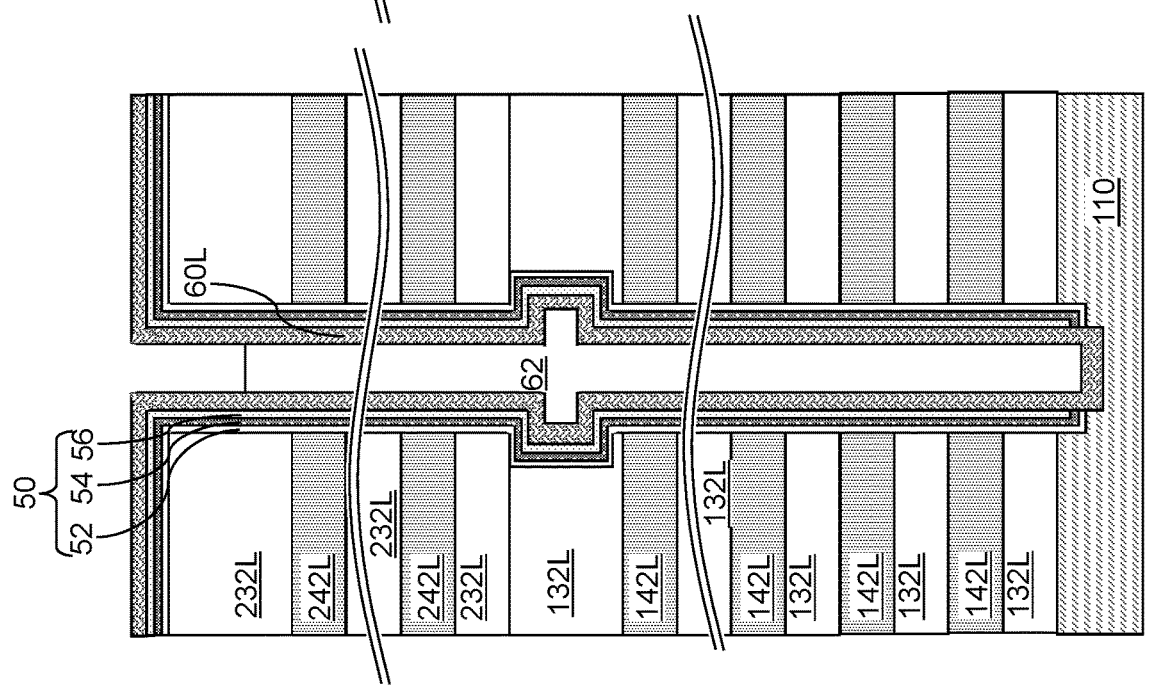
Figure 11A:
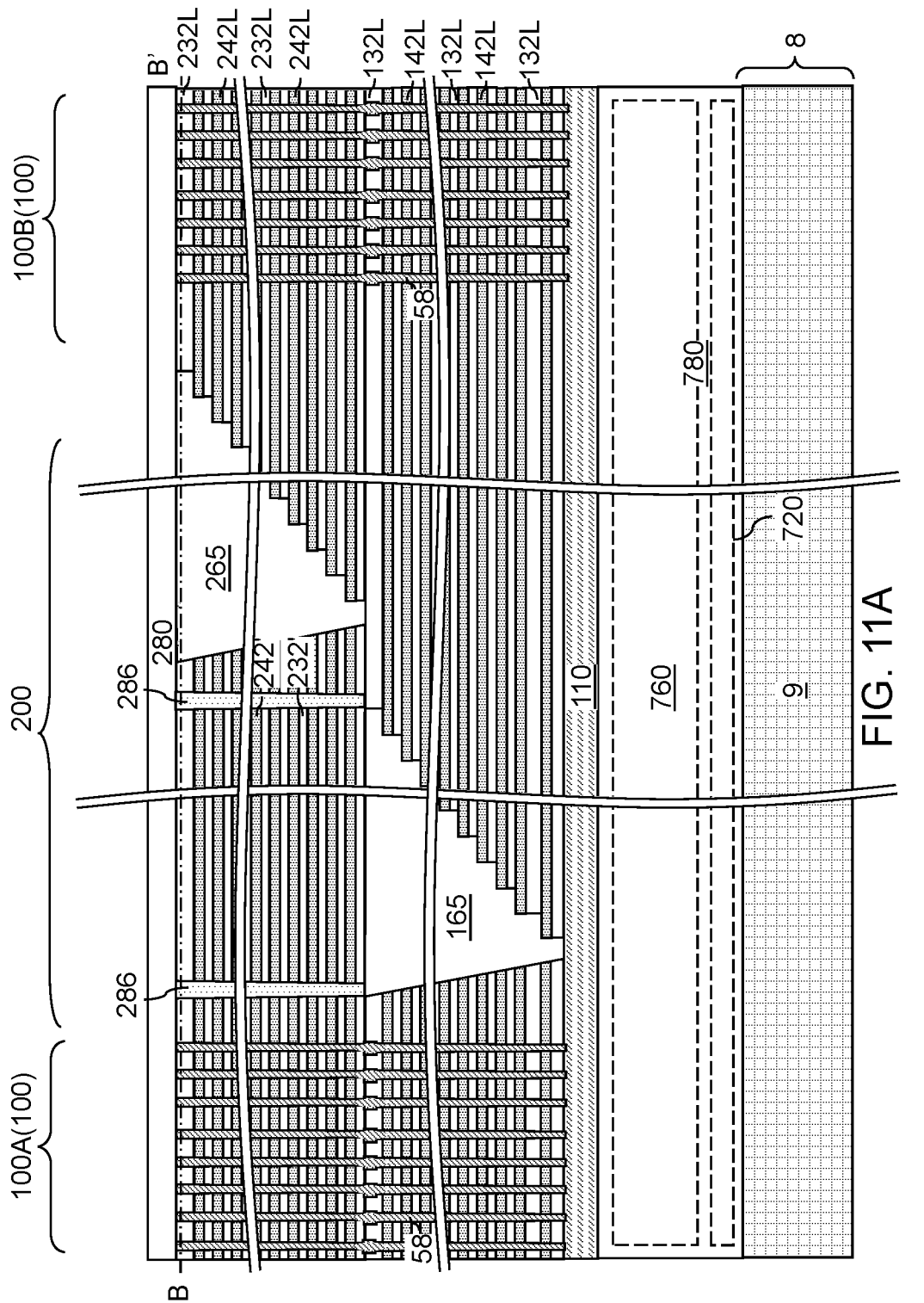
FIG. 11A is a vertical cross-sectional view of the first exemplary structure after formation of memory opening fill structures, support pillar structures, and a contact-level dielectric layer according to an embodiment of the present disclosure.
Figure 11B:
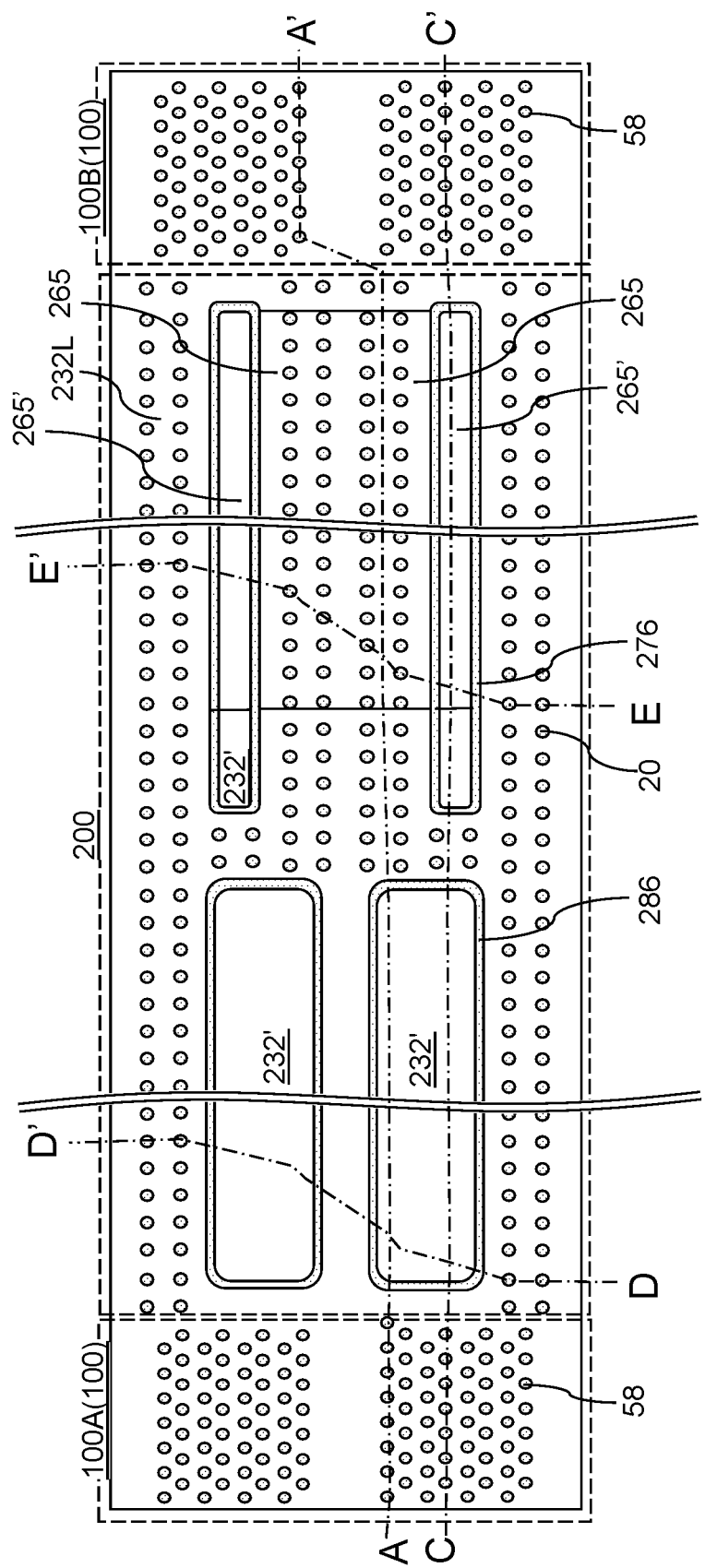
FIG. 11B is a top-down cross-sectional view of the first exemplary structure of FIG. 11A. The hinged vertical plane A-A' is the plane of the vertical cross-sectional view of FIG. 11A.
Figure 11C:
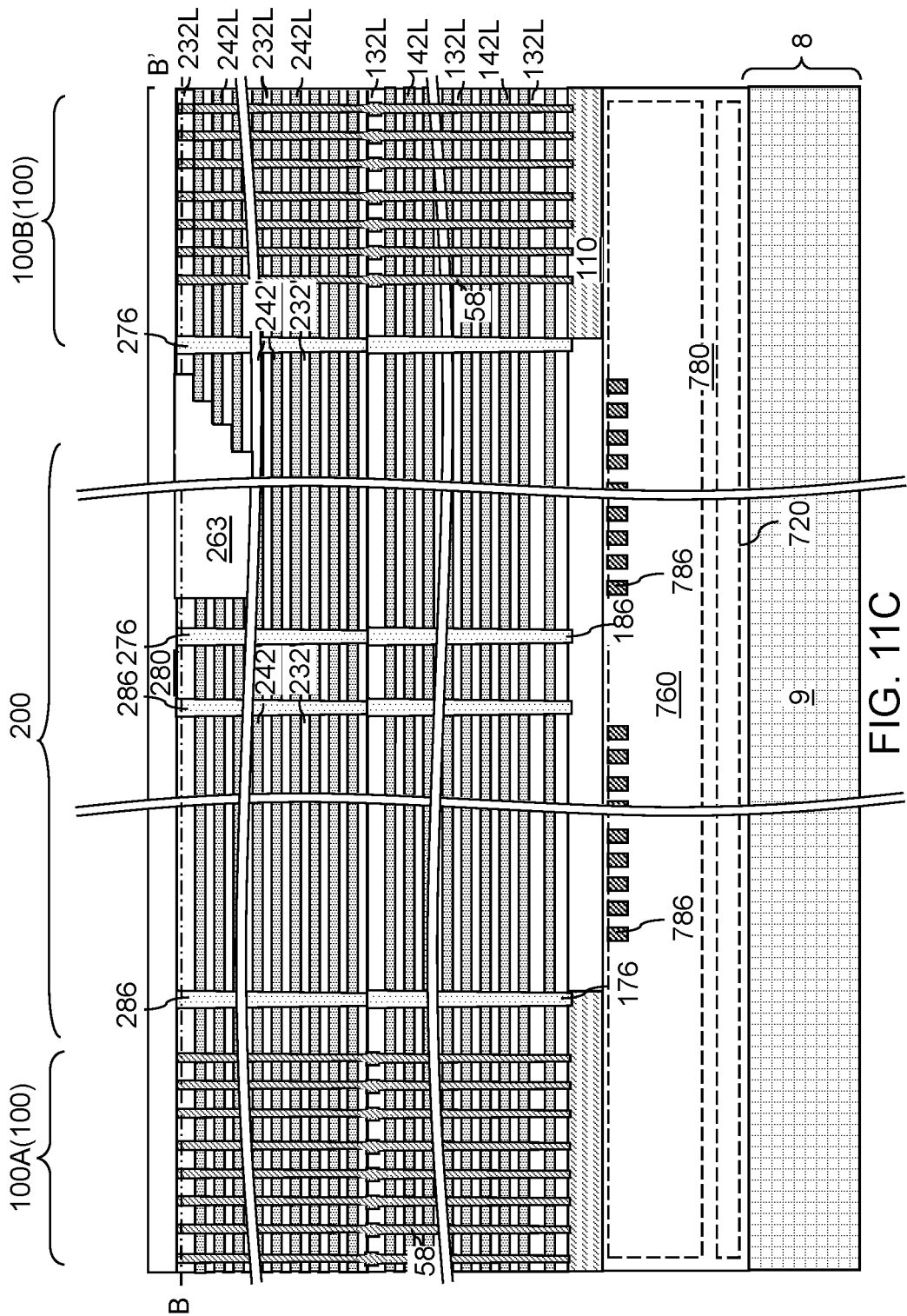
FIG. 11C is a vertical cross-sectional view along the vertical plane C-C' of FIG. 11B.
Figure 11D:
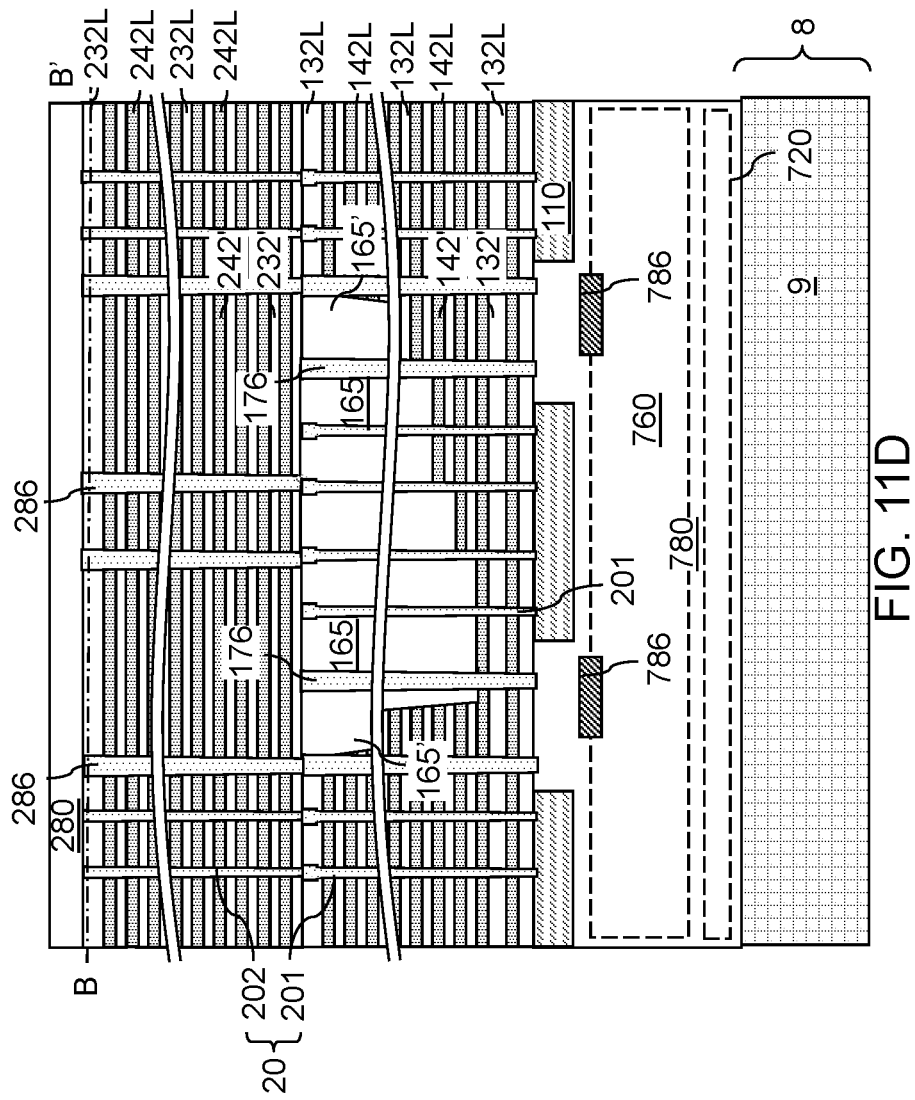
FIG. 11D is a vertical cross-sectional view along the vertical plane D-D' of FIG. 11B.
Figure 11E:
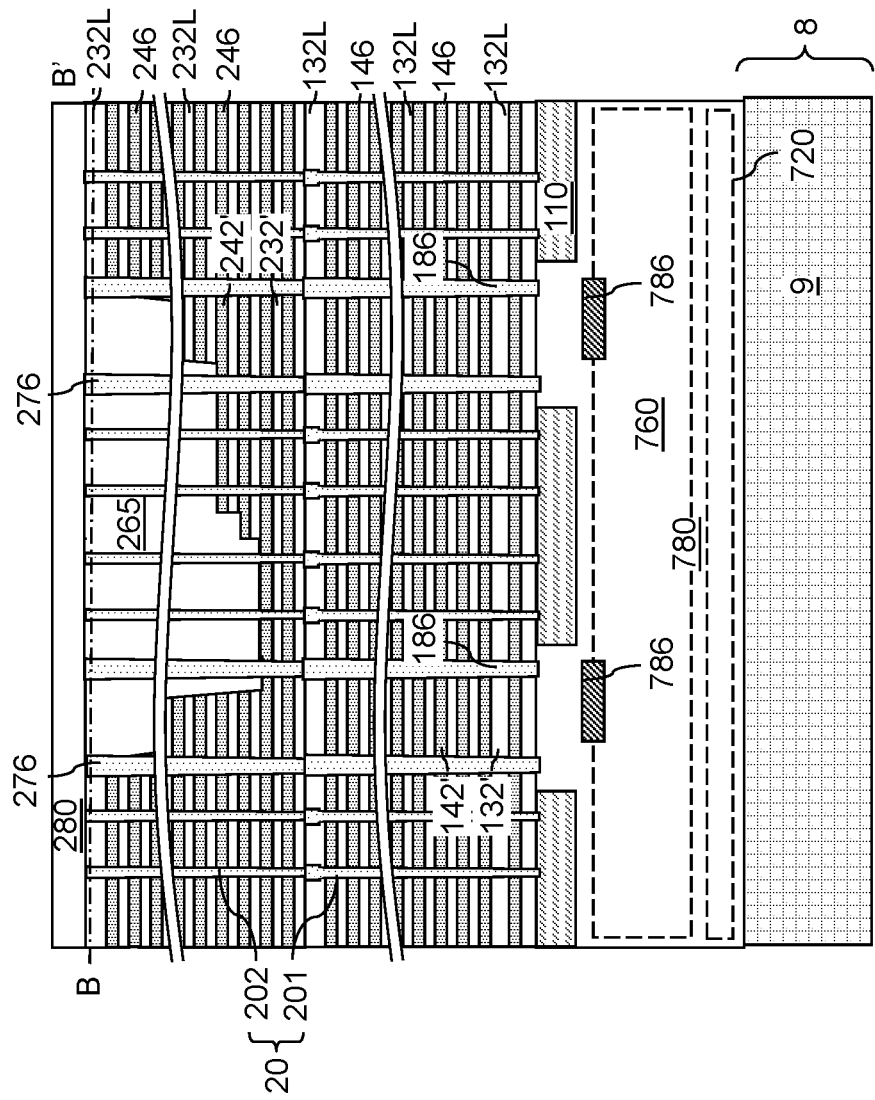
FIG. 11E is a vertical cross-sectional view along the vertical plane E-E' of FIG. 11B.
Figure 12A:
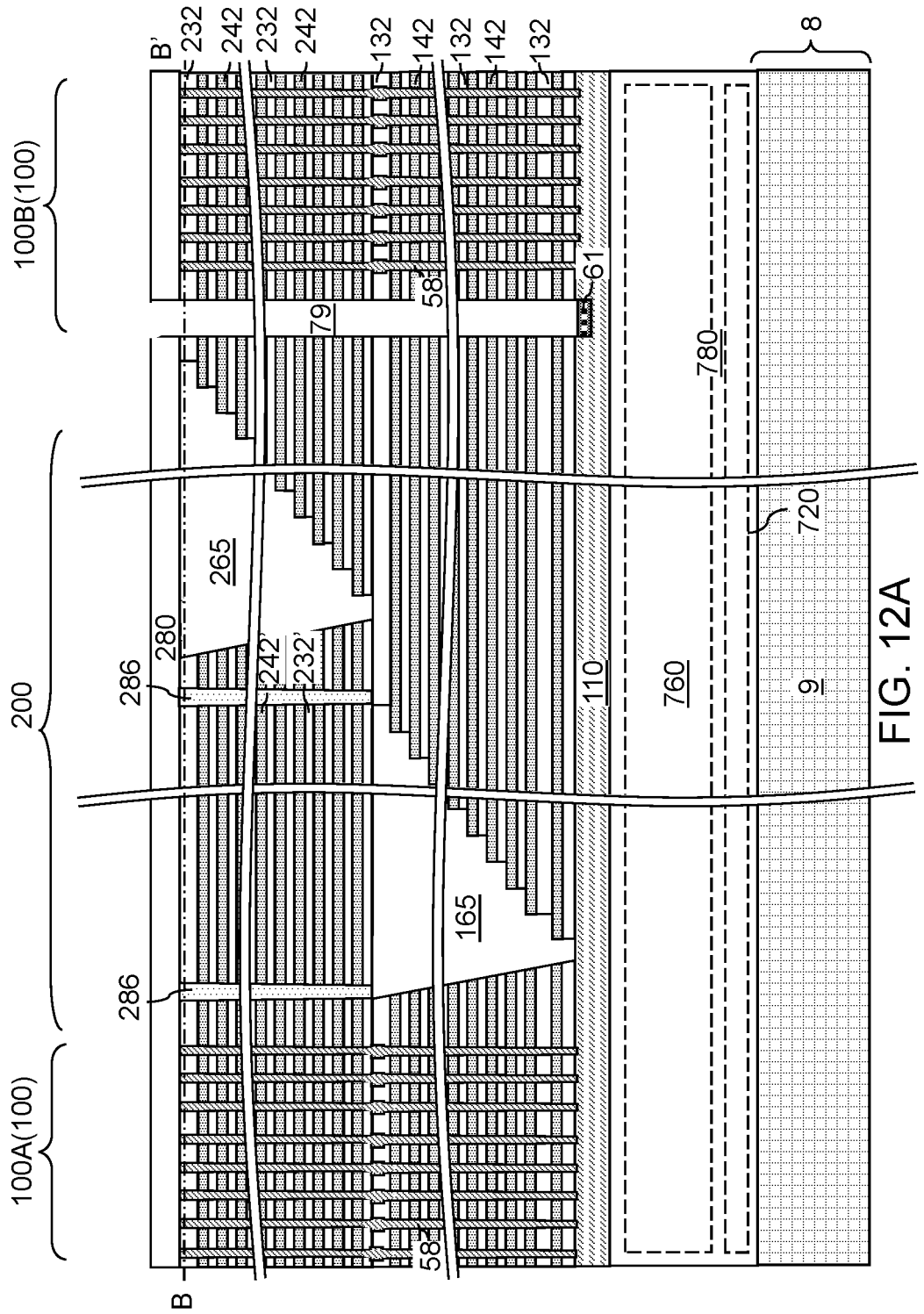
FIG. 12A is a vertical cross-sectional view of the first exemplary structure after formation of line trenches and source regions according to an embodiment of the present disclosure.
Figure 12B:
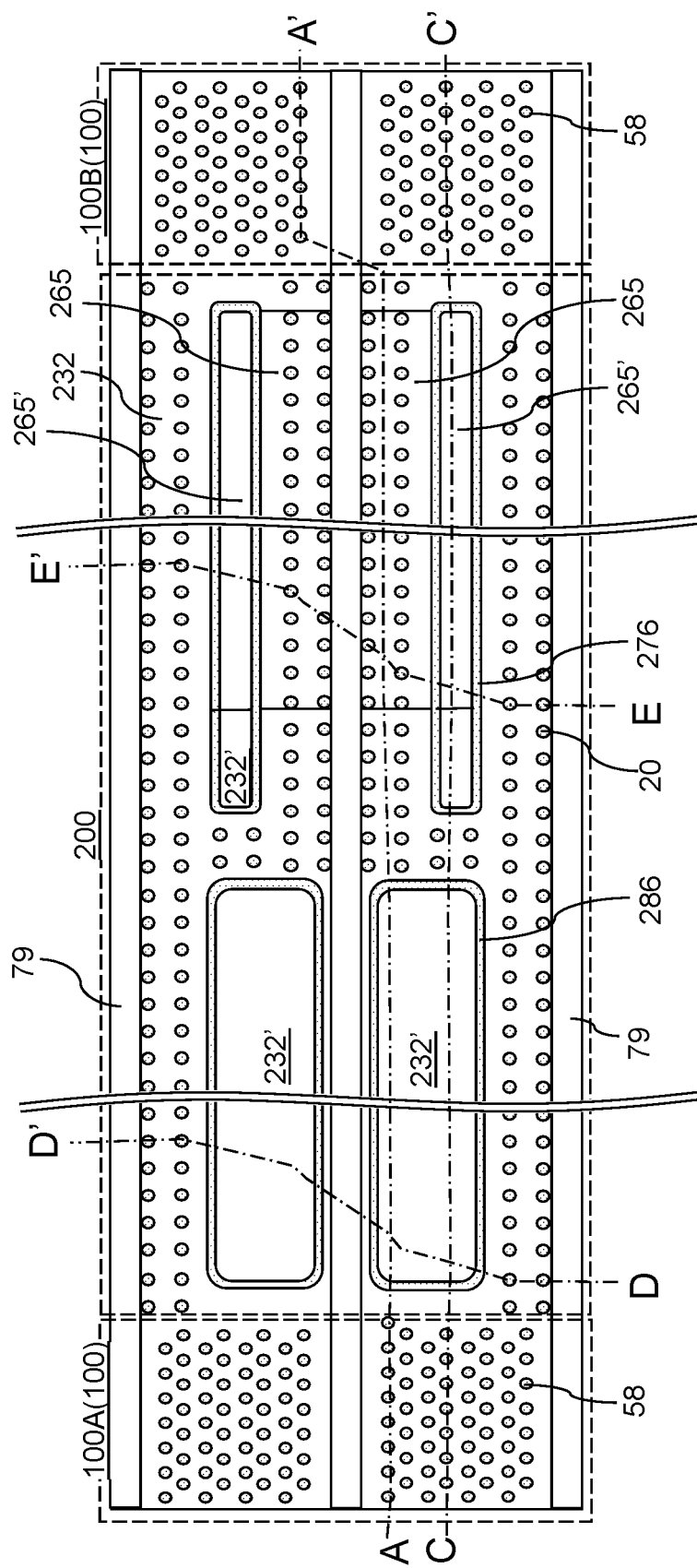
FIG. 12B is a top-down cross-sectional view of the first exemplary structure of FIG. 12A. The hinged vertical plane A-A' is the plane of the vertical cross-sectional view of FIG. 12A.
Figure 12C:
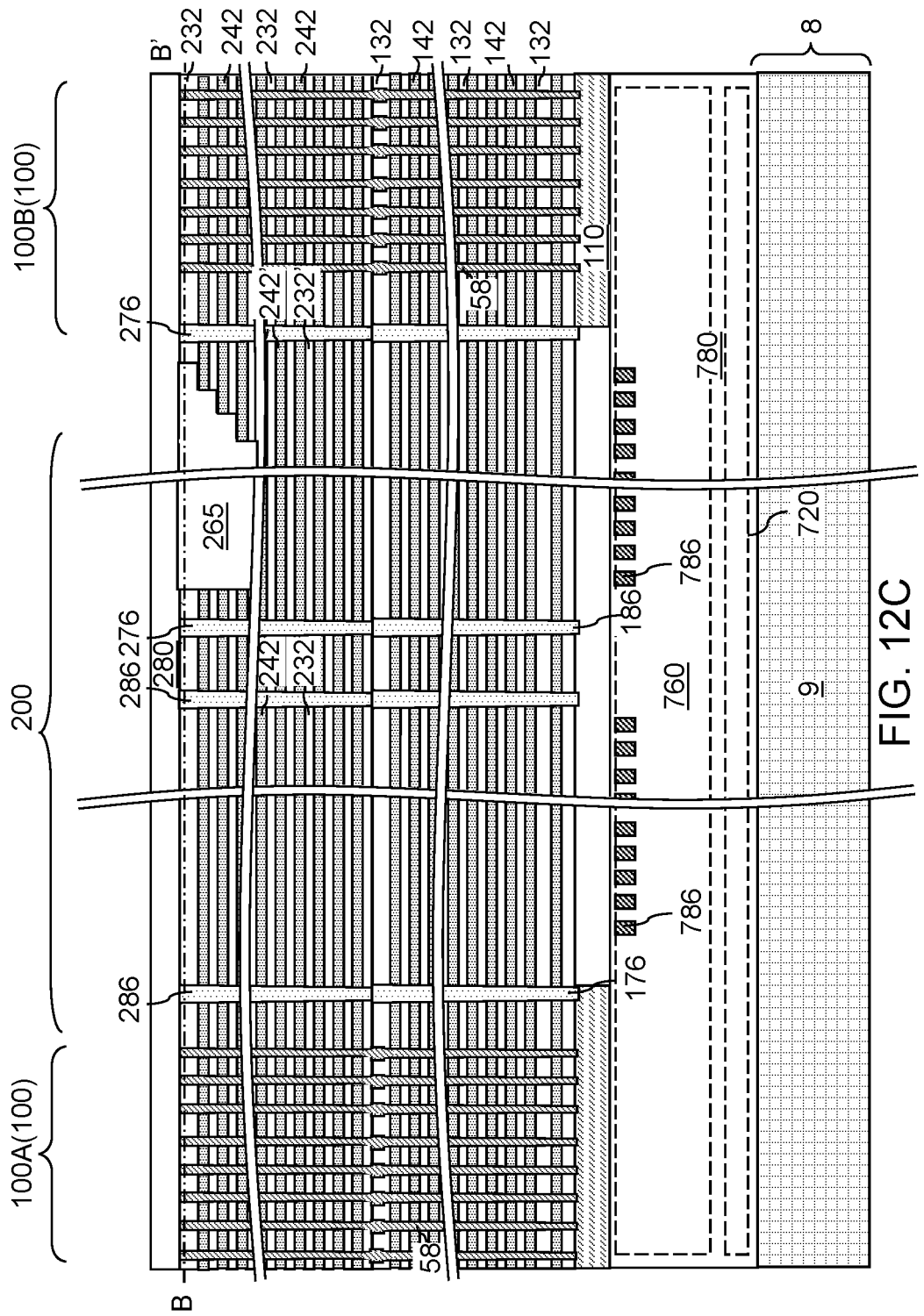
FIG. 12C is a vertical cross-sectional view along the vertical plane C-C' of FIG. 12B.
Figure 12D:
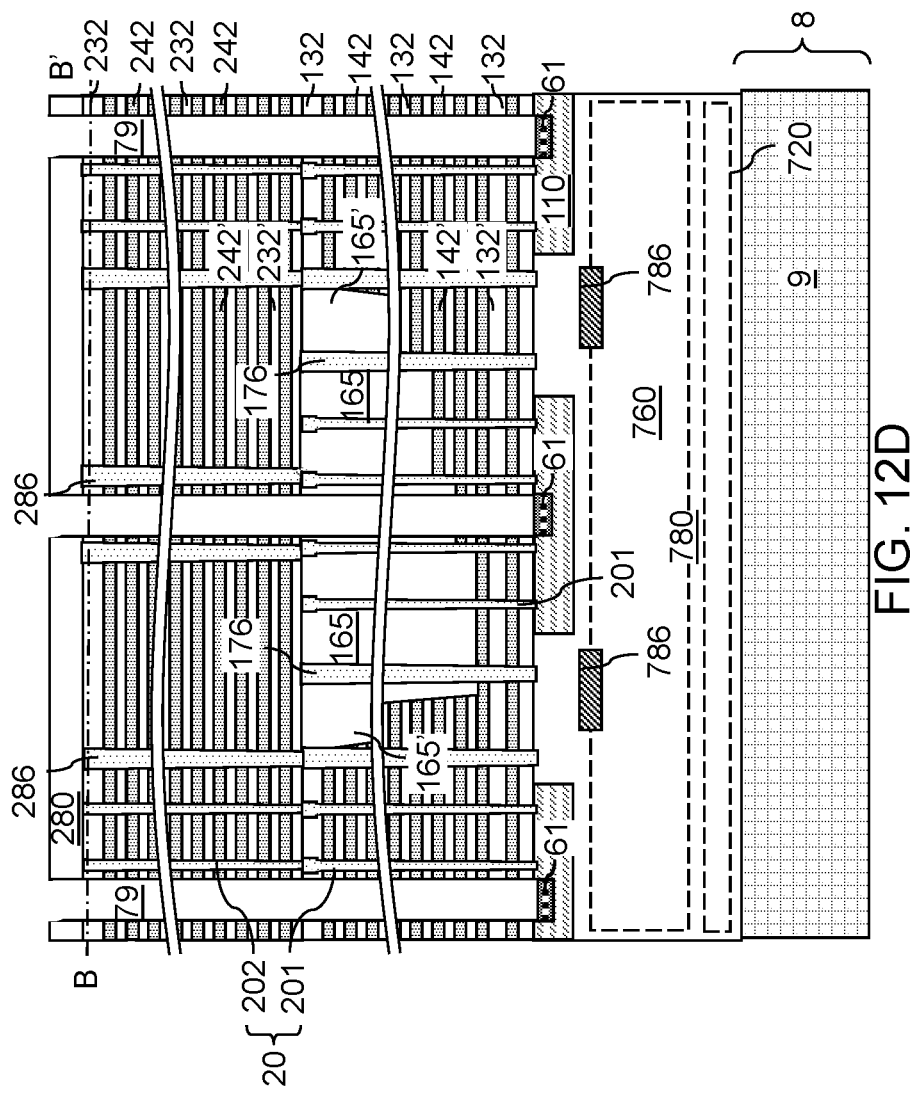
FIG. 12D is a vertical cross-sectional view along the vertical plane D-D' of FIG. 12B.
Figure 12E:
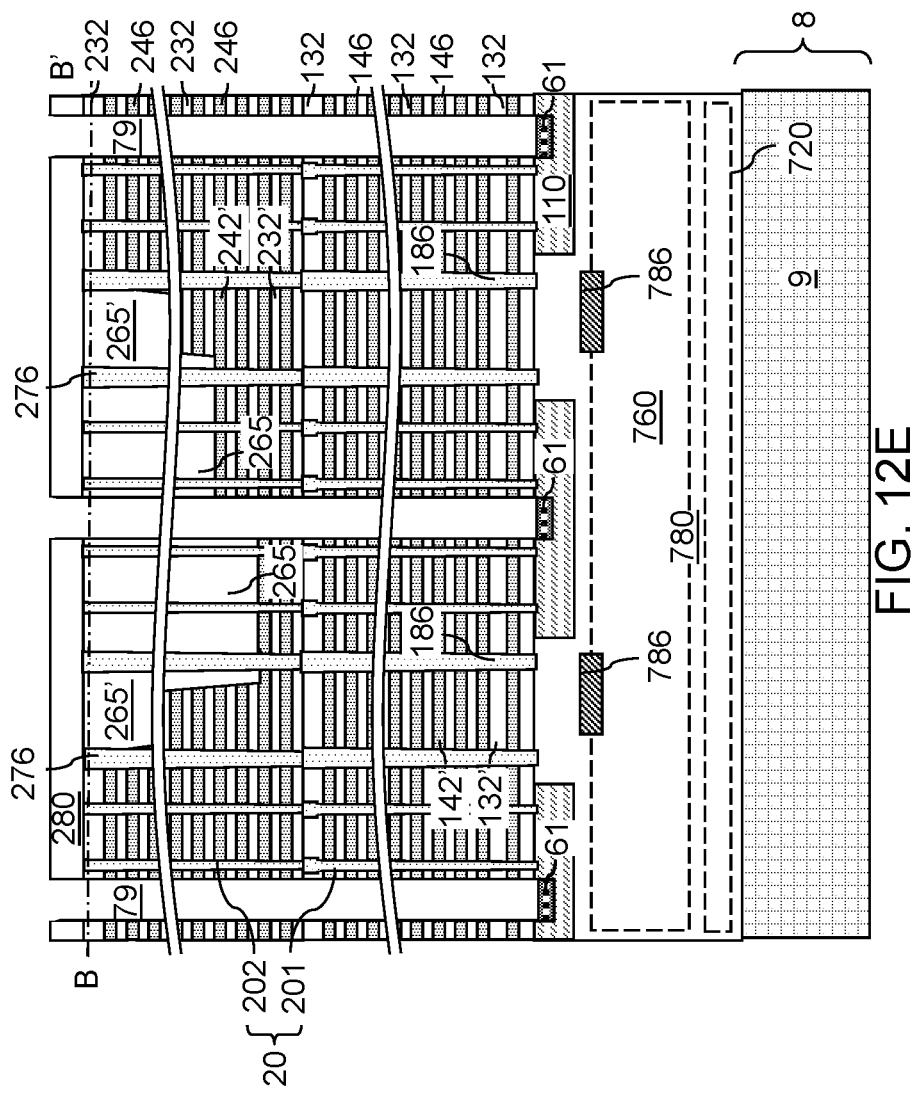
FIG. 12E is a vertical cross-sectional view along the vertical plane E-E' of FIG. 12B.
Figure 13A:
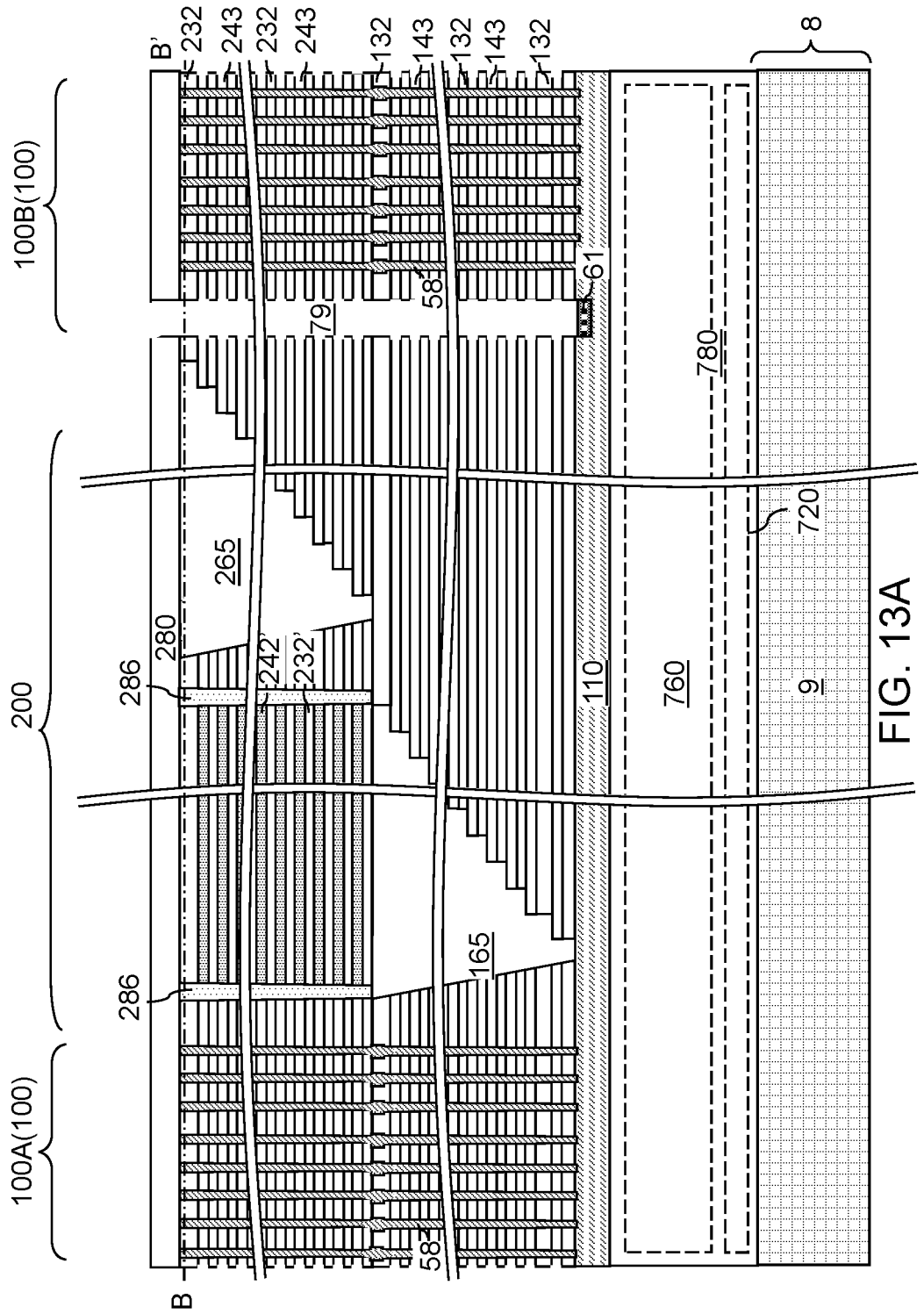
FIG. 13A is a vertical cross-sectional view of the first exemplary structure after formation of backside recesses according to an embodiment of the present disclosure.
Figure 13B:
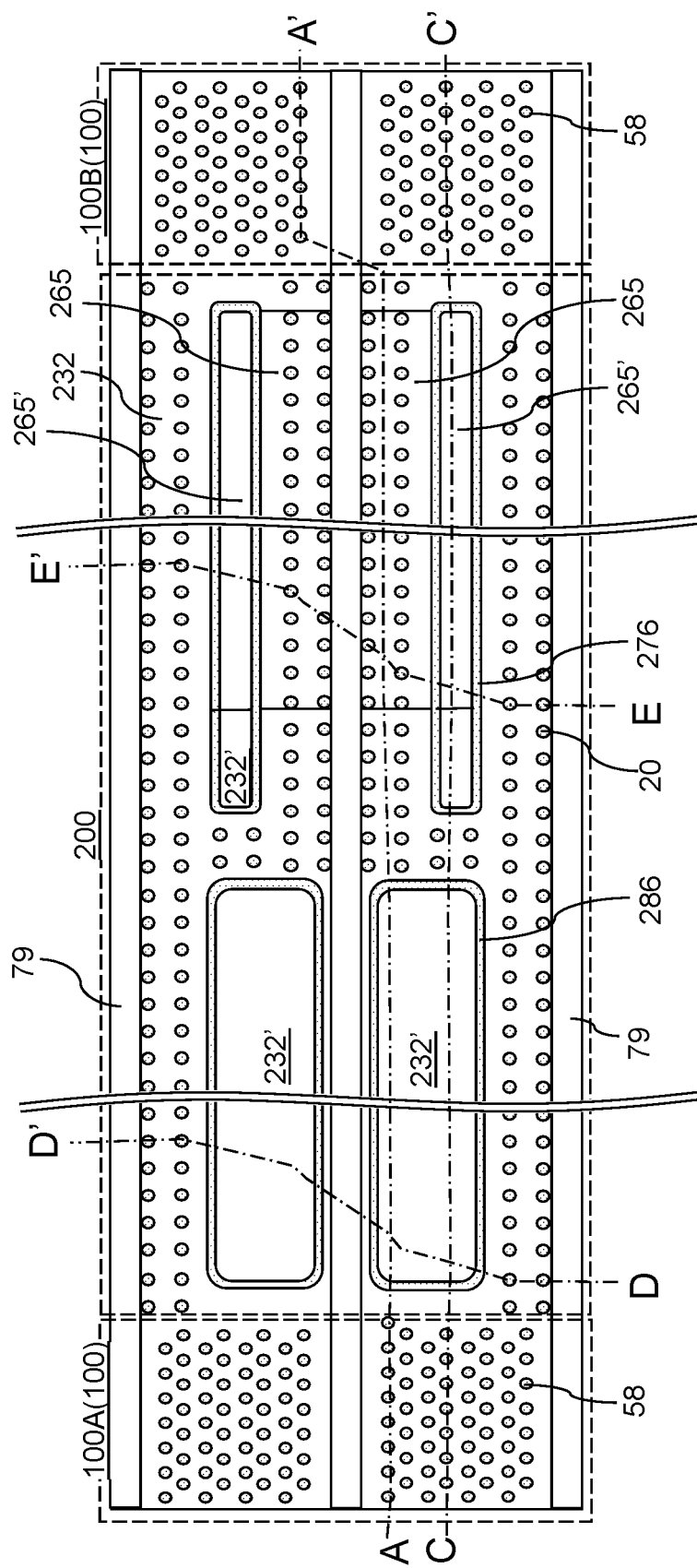
FIG. 13B is a top-down cross-sectional view of the first exemplary structure of FIG. 13A. The hinged vertical plane A-A' is the plane of the vertical cross-sectional view of FIG. 13A.
Figure 13C:
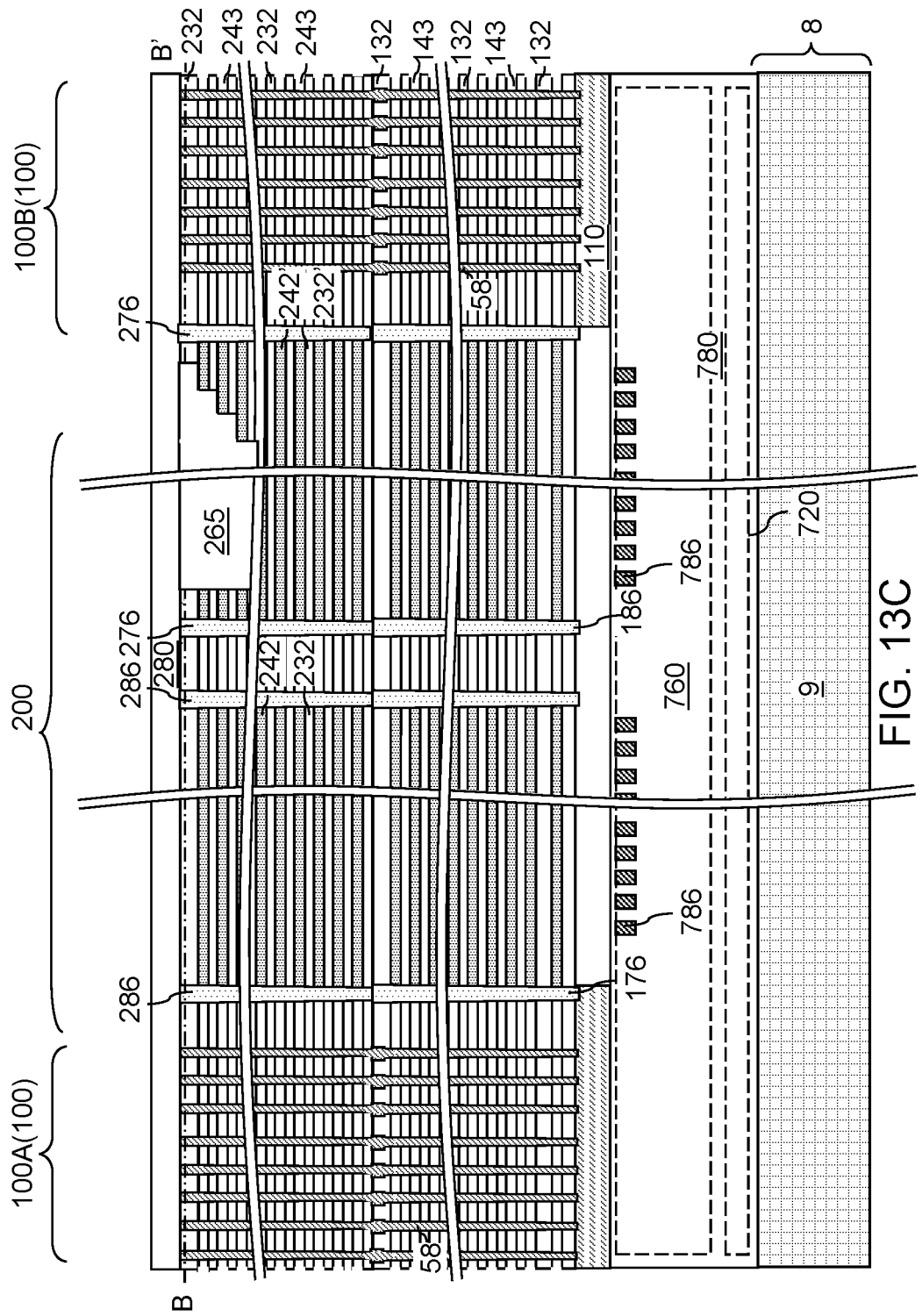
FIG. 13C is a vertical cross-sectional view along the vertical plane C-C' of FIG. 13B.
Figure 13D:
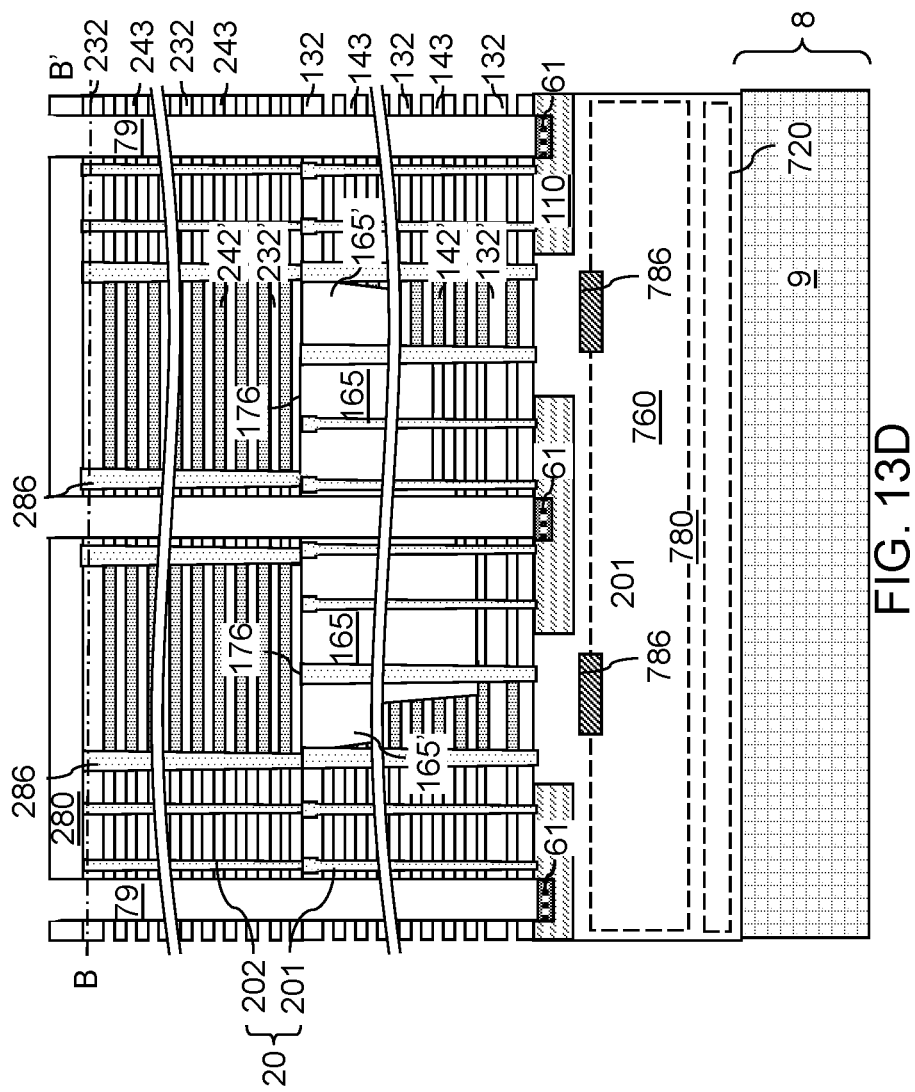
FIG. 13D is a vertical cross-sectional view along the vertical plane D-D' of FIG. 13B.
Figure 13E:
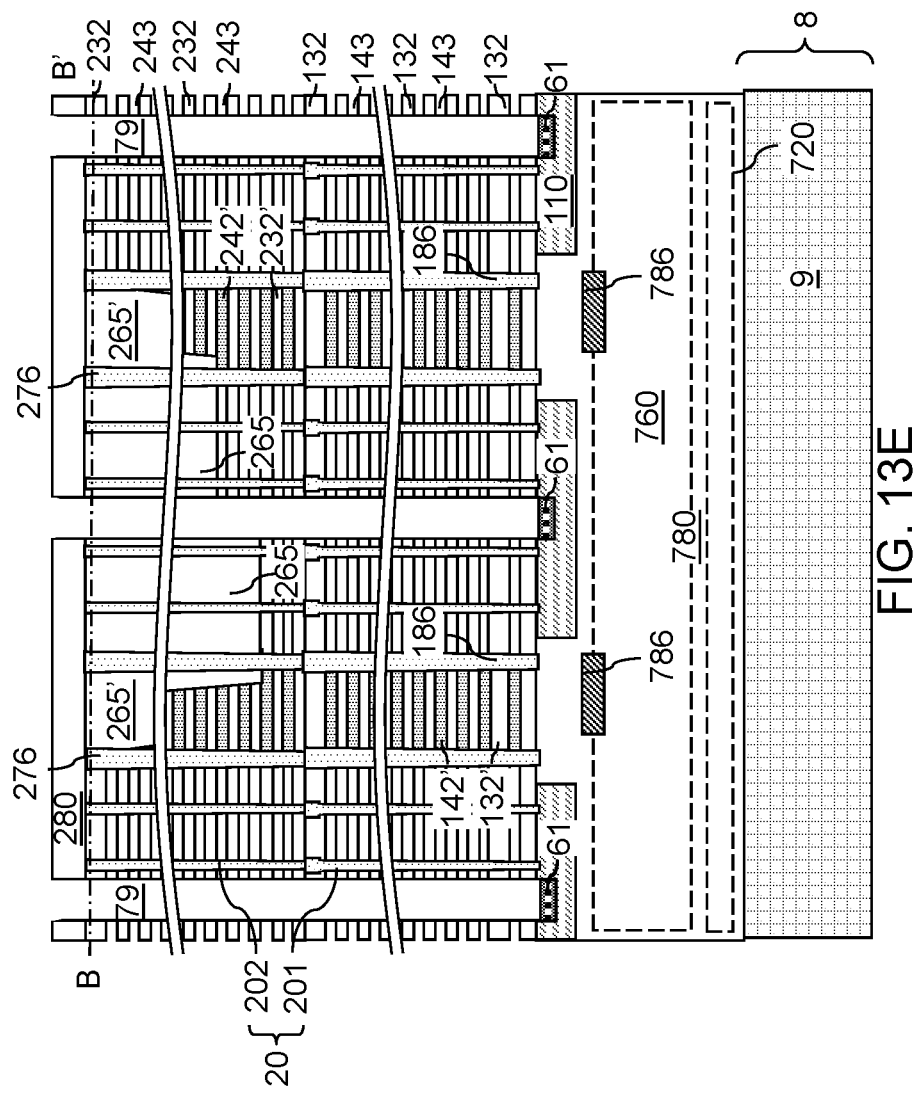
FIG. 13E is a vertical cross-sectional view along the vertical plane E-E' of FIG. 13B.

Referring to FIG. 10D, a doped semiconductor material having a doping of a second conductivity type may be deposited in cavities overlying the dielectric cores 62. The second conductivity type is the opposite of the first conductivity type. For example, if the first conductivity type is p-type, the second conductivity type is n-type, and vice versa. Portions of the deposited doped semiconductor material, the semiconductor channel material layer 60L, the tunneling dielectric layer 56, the charge storage layer 54, and the blocking dielectric layer 52 that overlie the horizontal plane including the top surface of the topmost second continuous insulating layer 232L may be removed by a planarization process such as a chemical mechanical planarization (CMP) process.

Each remaining portion of the doped semiconductor material of the second conductivity type constitutes a drain region 63. The dopant concentration in the drain regions 63 may be in a range from $5.0 \times 10^{19}/cm^3$ to $2.0 \times 10^{21}/cm^3$, although lesser and greater dopant concentrations may also be used. The doped semiconductor material may be, for example, doped polysilicon.

Each remaining portion of the semiconductor channel material layer 60L constitutes a vertical semiconductor channel 60 through which electrical current may flow when a vertical NAND device including the vertical semiconductor channel 60 is turned on. A tunneling dielectric layer 56 is surrounded by a charge storage layer 54, and laterally surrounds a vertical semiconductor channel 60. Each adjoining set of a blocking dielectric layer 52, a charge storage layer 54, and a tunneling dielectric layer 56 collectively constitute a memory film 50, which may store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a memory film 50 and a vertical semiconductor channel 60 (which is a vertical semiconductor channel) within an inter-tier memory opening 49 constitutes a memory stack structure 55. The memory stack structure 55 is a combination of a vertical semiconductor channel 60, a tunneling dielectric layer 56, a plurality of memory elements comprising portions of the charge storage layer 54, and an optional blocking dielectric layer 52. The memory stack structures 55 can be formed through memory array regions 100 of the first and second alternating layer stacks in which all layers of the first and second alternating layer stacks are present. Each combination of a memory stack structure 55, a dielectric core 62, and a drain region 63 within an inter-tier memory opening 49 constitutes a memory opening fill structure 58. Generally, memory opening fill structures 58 are formed within the memory openings 49. Each of the memory opening fill structures 58 comprises a respective memory film 50 and a respective vertical semiconductor channel 60.

The semiconductor material layer 110, the first-tier structure (132L, 142L, 132', 142', 165, 165', 176, 186), the second-tier structure (232L, 242L, 232', 242', 265, 265', 276, 286), the memory opening fill structures 58, and the support pillar structures 20 collectively constitute a memory-level assembly.

Referring to FIGS. 11A-11E, a contact-level dielectric layer 280 may be formed over the second alternating layer stack (232L, 242L). The contact-level dielectric layer 280 includes a dielectric material such as silicon oxide, and may be formed by a conformal or non-conformal deposition process. For example, the contact-level dielectric layer 280 may include undoped silicate glass and may have a thickness in a range from 100 nm to 600 nm, although lesser and greater thicknesses may also be used.

Referring to FIGS. 12A-12E, a photoresist layer (not shown) may be applied over the contact-level dielectric layer 280, and may be lithographically patterned to form linear openings laterally extending along the first horizontal direction hd1 and laterally spaced apart along the second horizontal direction hd2. The linear openings in the photoresist layer can be formed within areas in which memory opening fill structures 58 or the support pillar structures 20 are not present.

Line trenches 79 be formed by transferring the pattern in the photoresist layer (not shown) through the contact-level dielectric layer 280, the second-tier structure (232L, 242L, 232', 242', 265, 265', 276, 286), the first-tier structure (132L, 142L, 132', 142', 165, 165', 176, 186), and into the semiconductor material layer 110. Portions of the contact-level dielectric layer 280, the first-tier structure (132L, 142L, 132', 142', 165, 165', 176, 186), the second-tier structure (232L, 242L, 232', 242', 265, 265', 276, 286), and the semiconductor material layer 110 that underlie the linear openings in the photoresist layer may be removed by an anisotropic etch process to form the line trenches 79. In one embodiment, the line trenches 79 may be formed between clusters of memory stack structures 55. The clusters of the memory stack structures 55 may be laterally spaced apart along the second horizontal direction hd2 by the line trenches 79.

The line trenches 79 can be formed as a periodic one-dimensional array with a periodicity along the second horizontal direction hd2. The line trenches 79 can be sequentially numerically numbered with positive integers from one side to another along the second horizontal direction hd2. In one embodiment, every odd-numbered line trench 79 can extend through the second alternating layer stack (232L, 242L) and the first alternating layer stack (132L, 142L) without etching through the first retro-stepped dielectric material portions 165 or the second retro-stepped dielectric material portions 265. Every even-numbered line trench 79 can extend through the second alternating layer stack (232L, 242L) and the first alternating layer stack (132L, 142L) and cut through a respective first retro-stepped dielectric material portion 165 and a respective second retro-stepped dielectric material portion 265. While the drawings illustrate only two odd-numbered line trenches 79 and one even-numbered line trench 79, it is understood that the pattern illustrated in FIG. 12B can be repeated along the second horizontal direction hd2 in a manner that provides the semiconductor die 1000 illustrated in FIG. 1.

Each alternating layer stack {(132L, 142L), (232L, 242L)} is divided into a plurality of alternating stacks of insulating layers (132 or 232) and sacrificial material layers (142, 242) (which correspond to volumes of memory blocks) by the line trenches 79. Each line trench 79 can laterally extend along the first horizontal direction hd1 through am inter-array region 200 and a pair of memory array regions 100 that are adjoined to inter-array region 200. Further, each line trench 79 can vertically extend through an entire thickness of the alternating layer stacks {(132L, 142L), (232L, 242L)}. Each patterned portion of the first alternating layer stack (132L, 142L) located between a neighboring pair of line trenches 79 constitutes a first-tier alternating stack of first insulating layers 132 and first sacrificial material layers 142. Each patterned portion of the second alternating layer stack located between a neighboring pair of line trenches 79 constitutes a second-tier alternating stack of second continuous insulating layers 232L and second continuous sacrificial material layers 242. A plurality of alternating stacks of insulating layers (132 or 232) and sacrificial material layers (which may be first sacrificial material layers 142 or second sacrificial material layers 242) can be formed.

Each first retro-stepped dielectric material portion 165 may be divided into two disjoined first-tier dielectric cavity fill material portions 163 by a line trench 79. Each second retro-stepped dielectric material portion 265 may be divided into two disjoined second-tier dielectric cavity fill material portions 265 by a line trench 79. Each contiguous combination of a first-tier alternating stack (132, 142) and a second-tier alternating stack (232, 242) can be laterally bounded by a neighboring pair of line trenches 79. One of the neighboring pair of line trenches 79 can divide a first retro-stepped dielectric material portion 165 into two discrete dielectric material portions, such as a first portion of the first retro-stepped dielectric material portion 165 and a second portion of the first retro-stepped dielectric material portion 165. Further, one of the neighboring pair of line trenches 79 can divide a second retro-stepped dielectric material portion 265 into two discrete dielectric material portions, such as a first portion of the second retro-stepped dielectric material portion 265 and a second portion of the second retro-stepped dielectric material portion 265.

In one embodiment, the semiconductor material layer 110 can have a doping of the same conductivity type as the vertical semiconductor channels 60, i.e., a first conductivity type, and a source region 61 having a doping of a second conductivity type (which is the same conductivity type as the doping of the drain regions 63) can be formed underneath each line trench 79 by implantation of dopants of the second conductivity type.

Referring to FIGS. 13A-13E, the sacrificial material layers (142, 242) are removed selective to the insulating layers (132, 232), the contact-level dielectric layer 280, and the semiconductor material layer 110. For example, an etchant that selectively etches the materials of the sacrificial material layers (142, 242) with respect to the materials of the insulating layers (132, 232), the retro-stepped dielectric material portions (165, 265), and the material of the outermost layer of the memory films 50 may be introduced into the line trenches 79, for example, using an isotropic etch process. For example, the sacrificial material layers (142, 242) may include silicon nitride, the materials of the insulating layers (132, 232), the retro-stepped dielectric material portions (165, 265), and the outermost layer of the memory films 50 may include silicon oxide materials.

The isotropic etch process may be a wet etch process using a wet etch solution, or may be a gas phase (dry) etch process in which the etchant is introduced in a vapor phase into the line trench 79. For example, if the sacrificial material layers (142, 242) include silicon nitride, the etch process may be a wet etch process in which the first exemplary structure is immersed within a wet etch tank including phosphoric acid, which etches silicon nitride selective to silicon oxide, silicon, and various other materials used in the art.

Backside recesses (143, 243) are formed in volumes from which the sacrificial material layers (142, 242) are removed. The backside recesses (143, 243) include first backside recesses 143 that are formed in volumes from which the first sacrificial material layers 142 are removed and second backside recesses 243 that are formed in volumes from which the second sacrificial material layers 242 are removed. Each of the backside recesses (143, 243) may be a laterally extending cavity having a lateral dimension that is greater than the vertical extent of the cavity. In other words, the lateral dimension of each of the backside recesses (143, 243) may be greater than the height of the respective backside recess. A plurality of backside recesses (143, 243) may be formed in the volumes from which the material of the sacrificial material layers (142, 242) is removed. Each of the backside recesses (143, 243) may extend substantially parallel to the top surface of the substrate semiconductor layer 9. A backside recess (143, 243) may be vertically bounded by a top surface of an underlying insulating layer (132, 232) and a bottom surface of an overlying insulating layer (132, 232). In one embodiment, each of the backside recesses (143, 243) may have a uniform height throughout.

Generally, the backside recesses (143, 243) can be formed by removing the patterned portions of the first continuous sacrificial material layers 142L and the second continuous sacrificial material layers 242L selective to patterned portions of the first continuous insulating layers 132L and the second continuous insulating layers 232L after formation of the line trenches 79. The backside recesses (143, 243) can be formed by performing an isotropic etch process that supplies an isotropic etchant that etches the patterned portions of the first continuous sacrificial material layers 142L and the second continuous sacrificial material layers 242L selective to patterned portions of the first continuous insulating layers 132L and the second continuous insulating layers 232L and selective to the moat-shaped dielectric wall structures (176, 186, 276, 286). Surfaces of the moat-shaped dielectric wall structures (176, 186, 276, 286) are physically exposed to the backside recesses (143, 243) after the isotropic etch process.

Referring to FIGS. 14A-14E, an optional backside blocking dielectric layer (not shown) may be optionally deposited in the backside recesses (143, 243) and the line trenches 79 and over the contact-level dielectric layer 280. The backside blocking dielectric layer includes a dielectric material such as a dielectric metal oxide (e.g., aluminum oxide), silicon oxide, or a combination thereof.

At least one conductive material may be deposited in the plurality of backside recesses (143, 243), on the sidewalls of the line trenches 79, and over the contact-level dielectric layer 280. The at least one conductive material may be deposited by a conformal deposition method, which may be, for example, chemical vapor deposition (CVD), atomic layer deposition (ALD), electroless plating, electroplating, or a combination thereof. The at least one conductive material may include an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof.

In one embodiment, the at least one conductive material may include at least one metallic material, i.e., an electrically conductive material that includes at least one metallic element. Non-limiting exemplary metallic materials that may be deposited in the backside recesses (143, 243) include tungsten, tungsten nitride, titanium, titanium nitride, tantalum, tantalum nitride, cobalt, and ruthenium. For example, the at least one conductive material may include a conductive metallic nitride liner that includes a conductive metallic nitride material such as TiN, TaN, WN, or a combination thereof, and a conductive fill material such as W, Co, Ru, Mo, Cu, or combinations thereof. In one embodiment, the at least one conductive material for filling the backside recesses (143, 243) may be a combination of titanium nitride layer and a tungsten fill material.

Electrically conductive layers (146, 246) may be formed in the backside recesses (143, 243) by deposition of the at least one conductive material. A plurality of first electrically conductive layers 146 may be formed in the plurality of first backside recesses 143, a plurality of second electrically conductive layers 246 may be formed in the plurality of second backside recesses 243, and a continuous metallic material layer (not shown) may be formed on the sidewalls of each line trench 79 and over the contact-level dielectric layer 280. Each of the first electrically conductive layers 146 and the second electrically conductive layers 246 may include a respective conductive metallic nitride liner and a respective conductive fill material. Thus, the first and second sacrificial material layers (142, 242) may be replaced with the first and second electrically conductive layers (146, 246), respectively. Specifically, each first sacrificial material layer 142 may be replaced with an optional portion of the backside blocking dielectric layer and a first electrically conductive layer 146, and each second sacrificial material layer 242 may be replaced with an optional portion of the backside blocking dielectric layer and a second electrically conductive layer 246. A backside cavity is present in the portion of each line trench 79 that is not filled with the continuous metallic material layer.

Residual conductive material may be removed from inside the line trenches 79. Specifically, the deposited metallic material of the continuous metallic material layer may be etched back from the sidewalls of each line trench 79 and from above the contact-level dielectric layer 280, for example, by an anisotropic or isotropic etch. Each remaining portion of the deposited metallic material in the first backside recesses constitutes a first electrically conductive layer 146. Each remaining portion of the deposited metallic material in the second backside recesses constitutes a second electrically conductive layer 246. Sidewalls of the first electrically conductive layers 146 and the second electrically conductive layers 246 may be physically exposed to a respective line trench 79. The line trenches 79 may have a pair of curved sidewalls having a non-periodic width variation along the first horizontal direction hd1 and a non-linear width variation along the vertical direction.

Each electrically conductive layer (146, 246) may be a conductive sheet including openings therein. A first subset of the openings through each electrically conductive layer (146, 246) may be filled with memory opening fill structures 58. A second subset of the openings through each electrically conductive layer (146, 246) may be filled with the support pillar structures 20.

A subset of the electrically conductive layers (146, 246) may comprise word lines for the memory elements. The semiconductor devices in the underlying semiconductor devices 720 may comprise word line switch devices configured to control a bias voltage to respective word lines, and/or bit line driver devices, such as sense amplifiers. The memory-level assembly is located over the substrate semiconductor layer 9. The memory-level assembly includes at least one alternating stack (132, 146, 232, 246) and memory stack structures 55 vertically extending through the at least one alternating stack (132, 146, 232, 246). Each of the memory stack structures 55 comprises a vertical stack of memory elements located at each level of the electrically conductive layers (146, 246).

Generally, the patterned portions of the first continuous sacrificial material layers 142L and the second continuous sacrificial material layers 242L are replaced with the electrically conductive layers (146, 246). A first-tier alternating stack of first insulating layers 132 and first electrically conductive layers 146 can be formed between each neighboring pair of line trenches 79. The first insulating layers 132 comprise patterned portions of the first continuous insulating layers 132L, and the first electrically conductive layers 146 comprise the first subset of the electrically conductive layers (146, 246) and are interlaced with the first insulating layers 132. A second-tier alternating stack of second insulating layers 232 and second electrically conductive layers 246 is formed between the neighboring pair of line trenches 79. The second insulating layers 232 comprise patterned portions of the second continuous insulating layers 232L, and the second electrically conductive layers 246 comprise a second subset of the electrically conductive layers (146, 246) that is interlaced with the second insulating layers 246.

Generally, remaining portions of the continuous sacrificial material layers (142L, 242L) located outside a region between the first dielectric wall structure W1 and the second dielectric wall structure W2 of each moat-shaped dielectric wall structure (176, 186, 276, 286) that remain after formation of the line trenches 79 can be replaced with electrically conductive layers (146, 246). Remaining portions of each alternating layer stack within the region between the first dielectric wall structure W1 and the second dielectric wall structure W2 of each moat-shaped dielectric wall structure (176, 186, 276, 286) that remain after formation of the line trenches 79 comprise a vertically alternating sequence of insulating plates (132' or 232') and dielectric material plates (142' or 242'). Remaining portions of the continuous insulating layers (132L, 232L) and the electrically conductive layers (146, 246) after formation of the electrically conductive layers (146, 246) comprise an alternating stack of insulating layers (132 and/or 232) and electrically conductive layers (146, 246). Each layer within an alternating stack {(132, 146) and/or (232, 246)} is present in a connection region located between the first dielectric wall structure W1 and a first line trench 791 which is the most proximal line trenches 79 for the first dielectric wall structure W1. Portions of the electrically conductive layers (146, 246) can be located in a staircase region, which is located between the second dielectric wall structure W2 and a second line trench 792 that is most proximal line trench 79 for the second dielectric wall structure W2. The staircase region can have lateral extents that decrease with a vertical distance from the substrate 8.

A line trench fill structure 76 can be formed in each line trench 79. In one embodiment, a dielectric liner layer including a dielectric material (such as silicon oxide) can be conformally deposited at a periphery of each line trench 79, and can be anisotropically etched to form a dielectric spacer 76A within each line trench 79. At least one conductive material can be deposited in remaining volumes of the line trenches 79, and excess portions of the at least one conductive material can be removed from above the top surface of the contact-level dielectric layer 280 by a planarization process. Each remaining portion of the at least one conductive material contacting a source region 61 and laterally surrounded by a respective dielectric spacer 76A constitutes a source contact via structure 76B, which laterally extends along the first horizontal direction hd1. Each contiguous combination of a dielectric spacer 76A and a source contact via structure 76B that fills a line trench 79 constitutes a line trench fill structure 76.

Alternatively, at least one dielectric material, such as silicon oxide, may be conformally deposited in the line trenches 79 by a conformal deposition process. Each portion of the deposited dielectric material that fills a line trench 79 constitutes a line trench fill structure 76. In this case, each line trench fill structure may fill the entire volume of a line trench 79 and may consist essentially of at least one dielectric material. In this alternative embodiment, the source region 61 may be omitted, and a horizontal source line (e.g., a direct strap contact layer) may contact a side of the lower portion of the semiconductor channel 60.

In one embodiment, each first retro-stepped dielectric material portion 165, each second retro-stepped dielectric material portion 265, and each moat-shaped dielectric wall structure (176, 186, 276, 286) can be located between a neighboring pair of the line trench fill structures 76.

Referring to FIGS. 15A-15E, various metal via structures (88, 86A, 86B, 486A, 486B) can be formed through the contact-level dielectric layer 280 and optionally through underlying material portions onto a respective underlying conductive structure. The various contact via structures (88, 86A, 86B, 486A, 486B) can include drain contact via structures 88 that are formed in the memory array regions 100 through the contact-level dielectric layer 280 on a top surface of a respective drain region 63. The various contact via structures (88, 86A, 86B, 486A, 486B) can include layer contact via structures (e.g., word line and select gate contact via structures) (86A, 86B) that are formed in the inter-array region 200. The layer contact via structures (86A, 86B) can include first contact via structures 86A that contact a respective first electrically conductive layer (e.g., lower word line or source select gate electrode) 146 and second contact via structures 86B that contact a respective second electrically conductive layer (e.g., upper word line or drain select gate electrode) 246. Further, the various contact via structures (88, 86A, 86B, 486A, 486B) can include connection via structures (486A, 486B) that are formed in the inter-array region 200. The connection via structures (486A, 486B) vertically extend through the second-tier structure, the first-tier structure, and an opening in the semiconductor material layer 110, and contacts a top surface of a lower-level metal interconnect structure such as a metal pad 786.

The metal via structures (88, 86A, 86B, 486A, 486B) can be formed by forming via cavities vertically extending down to a respective conductive structure through the contact-level dielectric layer 280, and/or the second-tier structure, and/or the first-tier structure, and/or an opening in the semiconductor material layer 110, and by filling the via cavities with at least one conductive material. The various via cavities may be formed employing a single lithographic patterning process that forms a patterned photoresist layer as an etch mask and a single anisotropic etch process that removes unmasked portions of the first exemplary structure selective to underlying conductive structures (which can be metallic structures such as the electrically conductive layers (146, 246) or metal pads 786 or may be drain regions 63). Alternatively, the various via cavities may be formed employing multiple combinations of a lithographic patterning process and an anisotropic etch process. The via cavities include drain contact via cavities that extend to a top surface of a respective one of the drain regions 63, layer contact via cavities that extend to a top surface of a respective one of the electrically conductive layers (146, 246), and connection via cavities that extend to a top surface of a respective one of the metal pads 786. The at least one conductive material that fills the via cavities can include, for example, a combination of a metallic nitride liner (which may include TiN, TaN, and/or WN) and a metallic fill material (such as W, Cu, Co, Ru, Mo, and/or another metal).

Each layer contact via structure (86A, 86B) vertically extends through a respective retro-stepped dielectric material portion (165 or 265) and contacts a top surface of one of the electrically conductive layers (146, 246). Each first layer contact via structure 86A can vertically extend through a vertically alternating sequence of second insulating plates 232' and second dielectric material plates 242' and through a first retro-stepped dielectric material portion 165 and can contact a top surface of a respective first electrically conductive layer 146. Each second layer contact via structure 86B can vertically extend through a second retro-stepped dielectric material portion 265 and can contact a top surface of a respective second electrically conductive layer 246 within an area of a staircase region SR shown in FIG. 15B.

Each connection via structure (486A, 486B) vertically extends through a respective vertically alternating sequence of insulating plates and dielectric material plates and can contact a top surface of a respective metal pad 786. For example, each first connection via structure 486A can vertically extend through each plate within a vertically alternating sequence of second insulating plates 232' and second dielectric material plates 242', a first dielectric fill material portion 165', and a subset of plates within a vertically alternating sequence of first insulating plates 132' and first dielectric material plates 142'. Each second connection via structure 486B can vertically extend through a second dielectric fill material portion 265', a subset of plates within a vertically alternating sequence of second insulating plates 232' and second dielectric material plates 242', and each plate within a vertically alternating sequence of first insulating plates 132' and first dielectric material plates 142'.

Generally, connection via structures (486A, 486B) vertically extend through a respective vertically alternating sequence of insulating plates (132' or 232') and dielectric material plates (142' or 242') and contact a respective one of the lower-level metal interconnect structures 780. In case the first exemplary structure includes multiple tiers, an additional alternating stack of additional insulating layers (132 or 232) and additional electrically conductive layers (146 or 246) can be located between a first line trench 791 and a second line trench 792 between which a respective connection via structure (486A, 486B) is located. The additional alternating stack of additional insulating layers (132 or 232) and additional electrically conductive layers (146 or 246) may overlie, or underlie, the alternating stack of insulating layers (132 or 232) and electrically conductive layers (146 or 246) that laterally surrounds the respective vertically alternating sequence of insulating plates (132' or 232') and dielectric material plates (142' or 242'). For example, if a connection via structure such as a first connection via structure 486A vertically extend through a subset of plates within a respective vertically alternating sequence of first insulating plates 132' and first dielectric material plates 142' that is laterally surrounded by a first alternating stack of first insulating layers 132 and first electrically conductive layers 146, the additional alternating stack can be the second alternating stack (232, 246) of the second insulating layers 232 and the second electrically conductive layers 246. If a connection via structure such as a second connection via structure 486B vertically extend through a subset of plates within a respective vertically alternating sequence of second insulating plates 232' and second dielectric material plates 242' that is laterally surrounded by a second alternating stack of second insulating layers 232 and second electrically conductive layers 246, the additional alternating stack can be the first alternating stack (132, 146) of the first insulating layers 132 and the first electrically conductive layers 146.

An additional vertically alternating sequence of additional insulating plates (132' or 232') and additional dielectric material plates (142' or 242') can be embedded within the additional alternating stack of additional insulating layers (132 or 232) and additional electrically conductive layers (146 or 246). The connection via structures (486A or 486B) can vertically extend through each of the additional insulating plates (132' or 232') and each of the additional dielectric material plates (142' or 242'). For example, a first connection via structure 486A can vertically extend through, and contact, each plate within a vertically alternating sequence of second insulating plates 232' and second dielectric material plates 242'. A second connection via structure 486B can vertically extend through, and contact, each plate within a vertically alternating sequence of first insulating plates 132' and first dielectric material plates 142'.

Figure 15A:
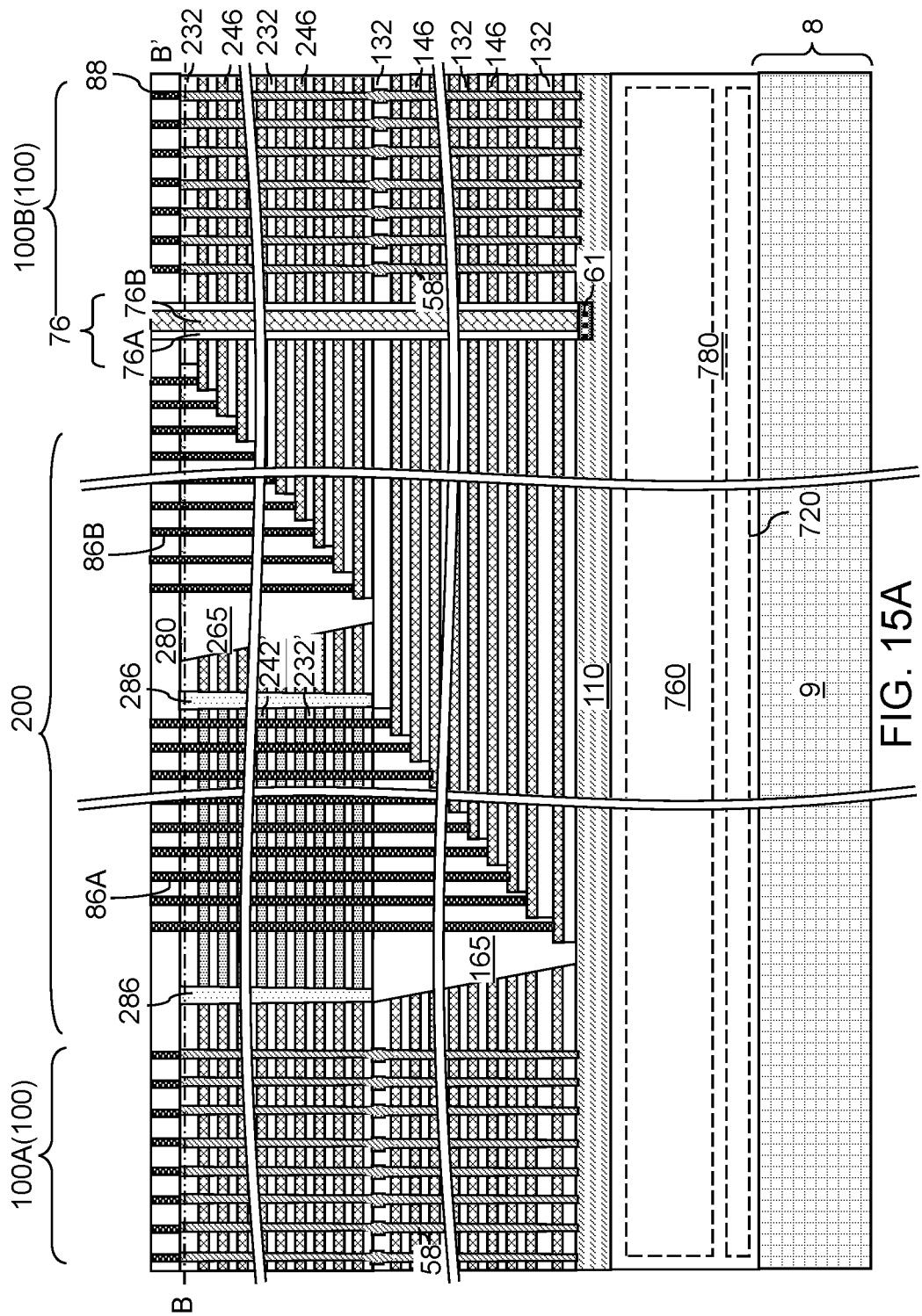
FIG. 15A is a vertical cross-sectional view of the first exemplary structure after formation of conductive via structures according to an embodiment of the present disclosure.
Figure 15B:
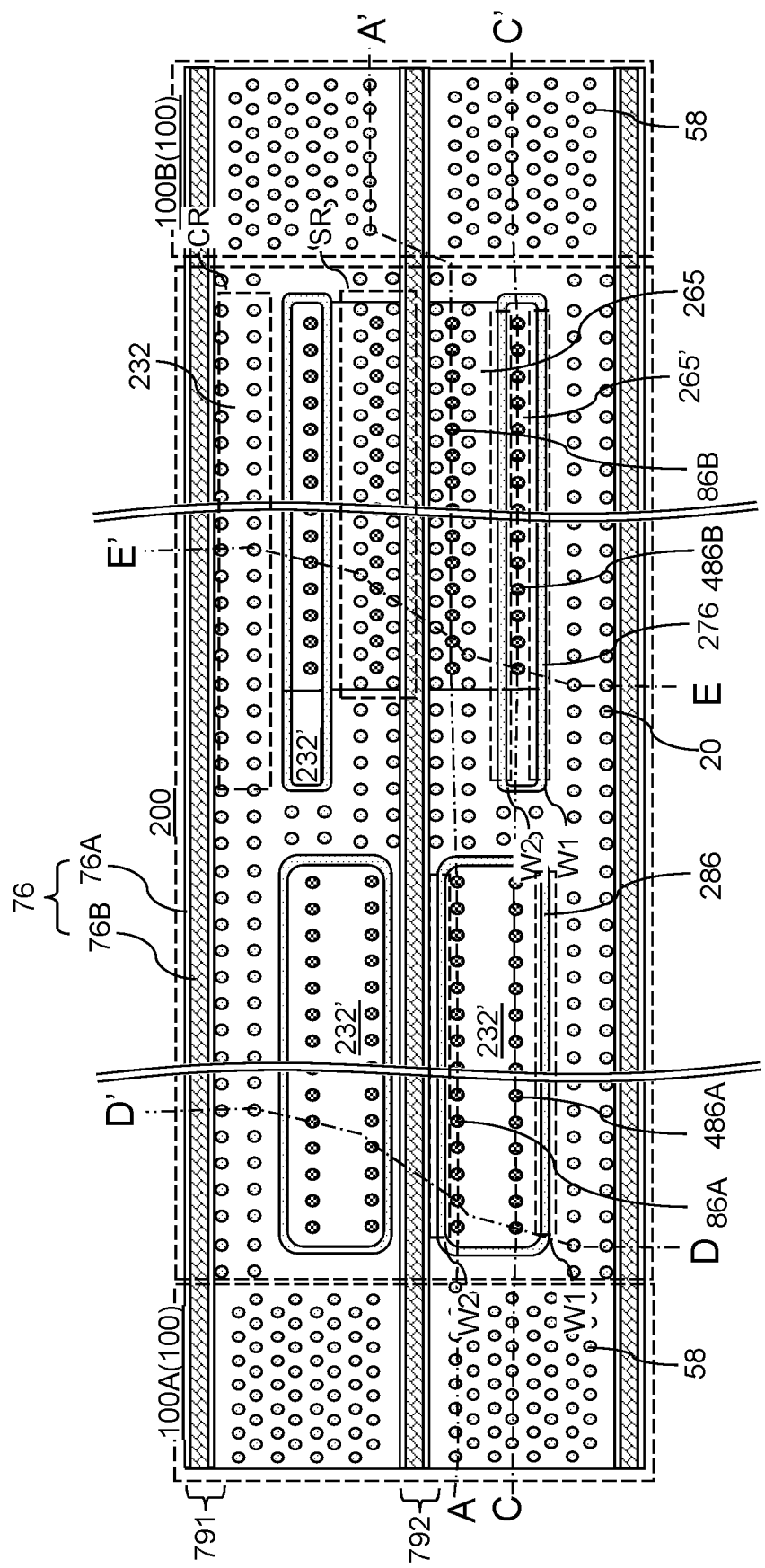
FIG. 15B is a top-down cross-sectional view of the first exemplary structure of FIG. 15A. The hinged vertical plane A-A' is the plane of the vertical cross-sectional view of FIG. 15A.
Figure 15C:
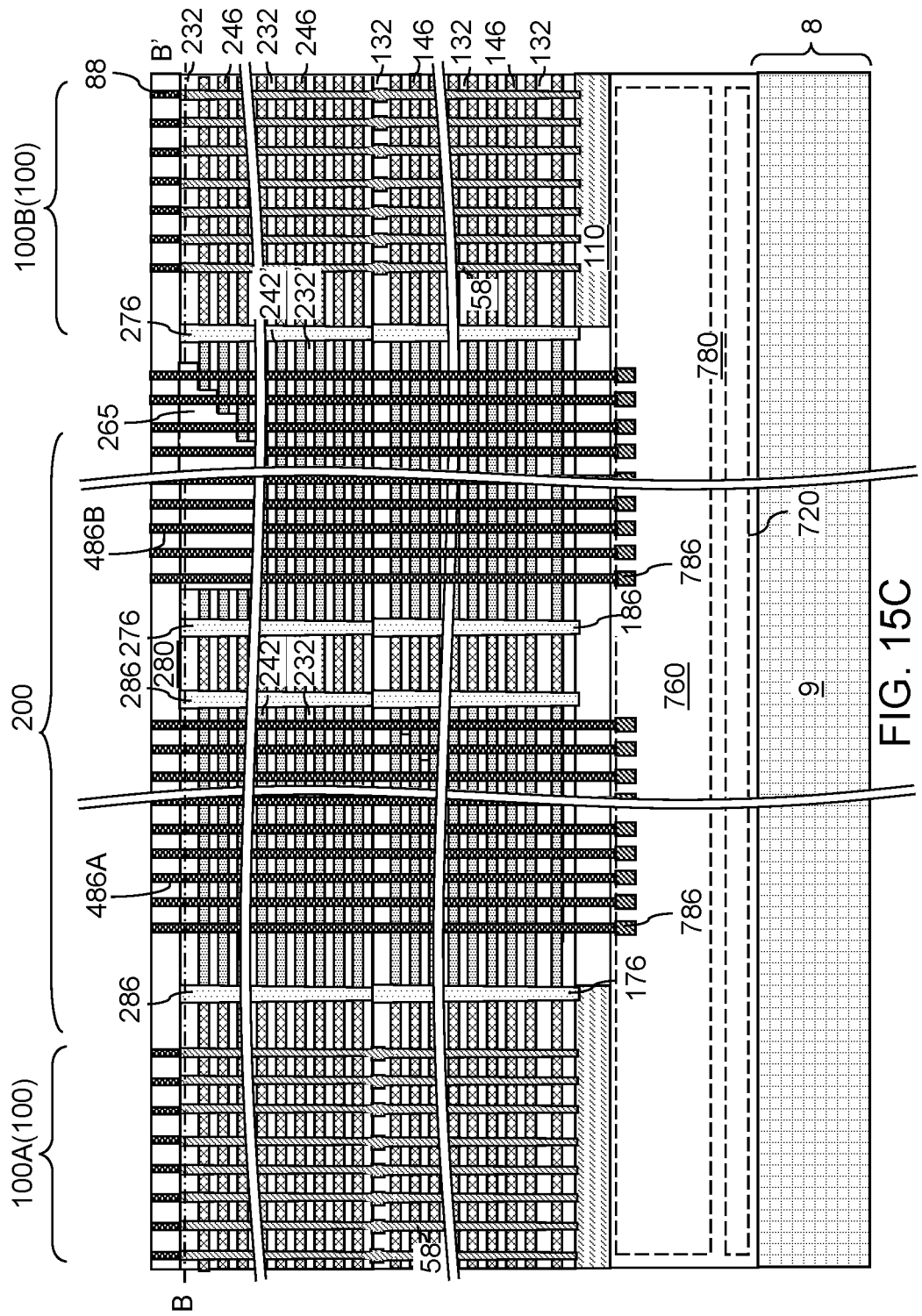
FIG. 15C is a vertical cross-sectional view along the vertical plane C-C' of FIG. 15B.

Each moat-shaped dielectric wall structure (176, 186, 276, 286) can include a respective first dielectric wall structure W1 and a second dielectric wall structure W2 that are located between a first line trench 791 and a second line trench 792. The first line trench 791 is the most proximal line trench to the respective first dielectric wall structure W1, and the second line trench 792 is the most proximal line trench to the respective second dielectric wall structure W2. The pair of the first dielectric wall structure W1 and the second dielectric wall structure W2 can be located between a first memory array region 100A and a second memory array region 100B, and can laterally extend along the first horizontal direction hd1, and can have a lesser lateral extent that the first line trench 791 and the second line trench 792 along the first horizontal direction hd1. As shown in FIG. 15B, a connection region CR is located between the first line trench 791 and the first dielectric wall structure W1, and each layer within an alternating stack of insulating layers (132 or 232) and electrically conductive layers (146 or 246) continuously extends between the first memory array region 100A and the second memory array region 100B in the connection region CR. A staircase region SR is located between the second line trench 792 and the second dielectric wall structure W2, and the electrically conductive layers (146 or 246) of the alternating stack have lateral extents along the first horizontal direction hd1 that decrease with a distance from the substrate 8 due to the presence of stepped surfaces.

Figure 15D:
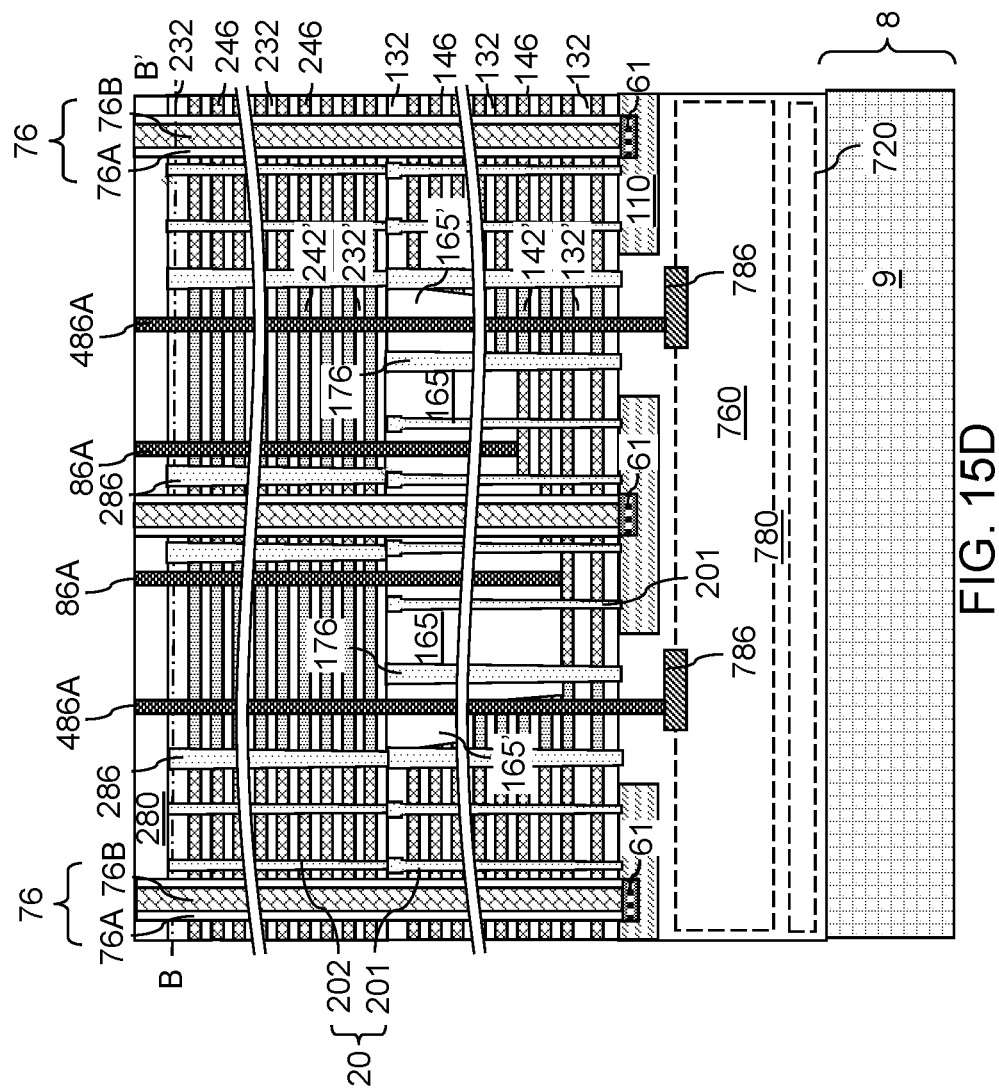
FIG. 15D is a vertical cross-sectional view along the vertical plane D-D' of FIG. 15B.
Figure 15E:
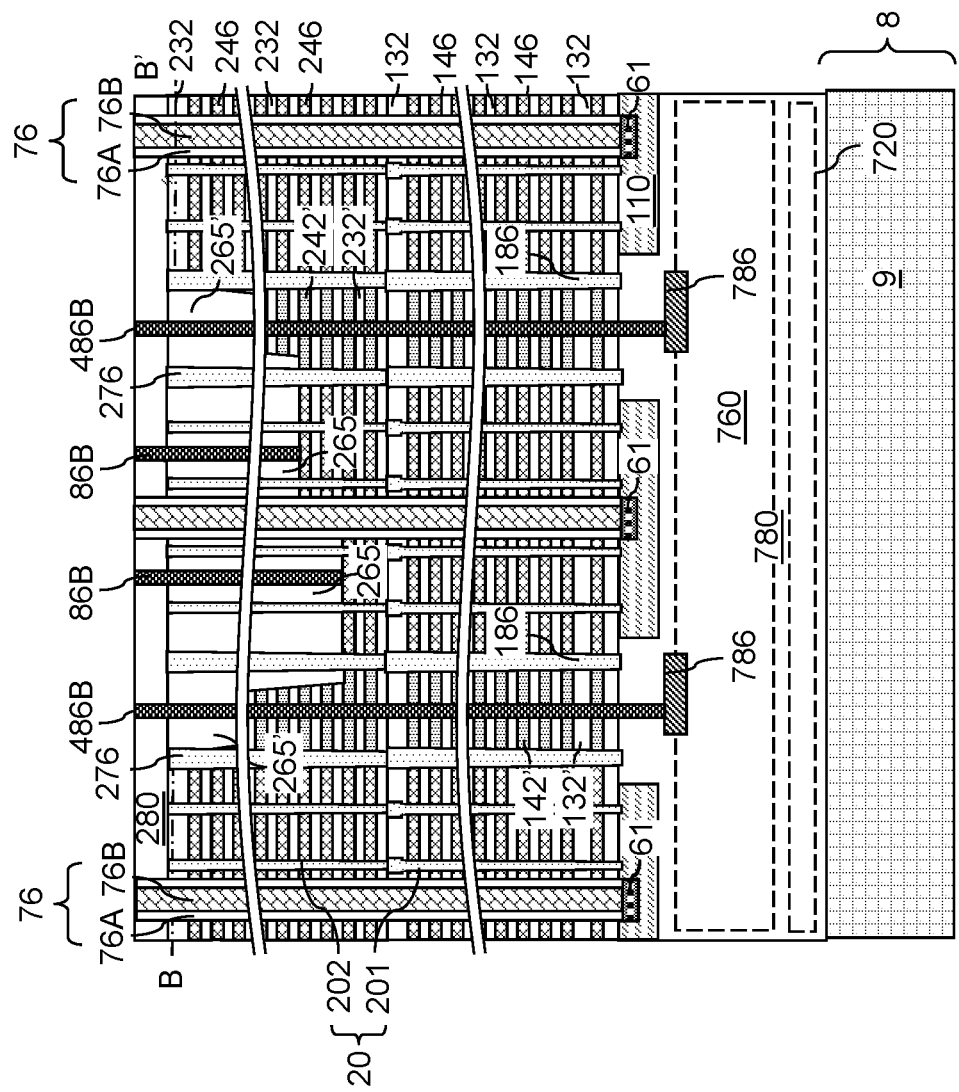
FIG. 15E is a vertical cross-sectional view along the vertical plane E-E' of FIG. 15B.
Figure 16A:
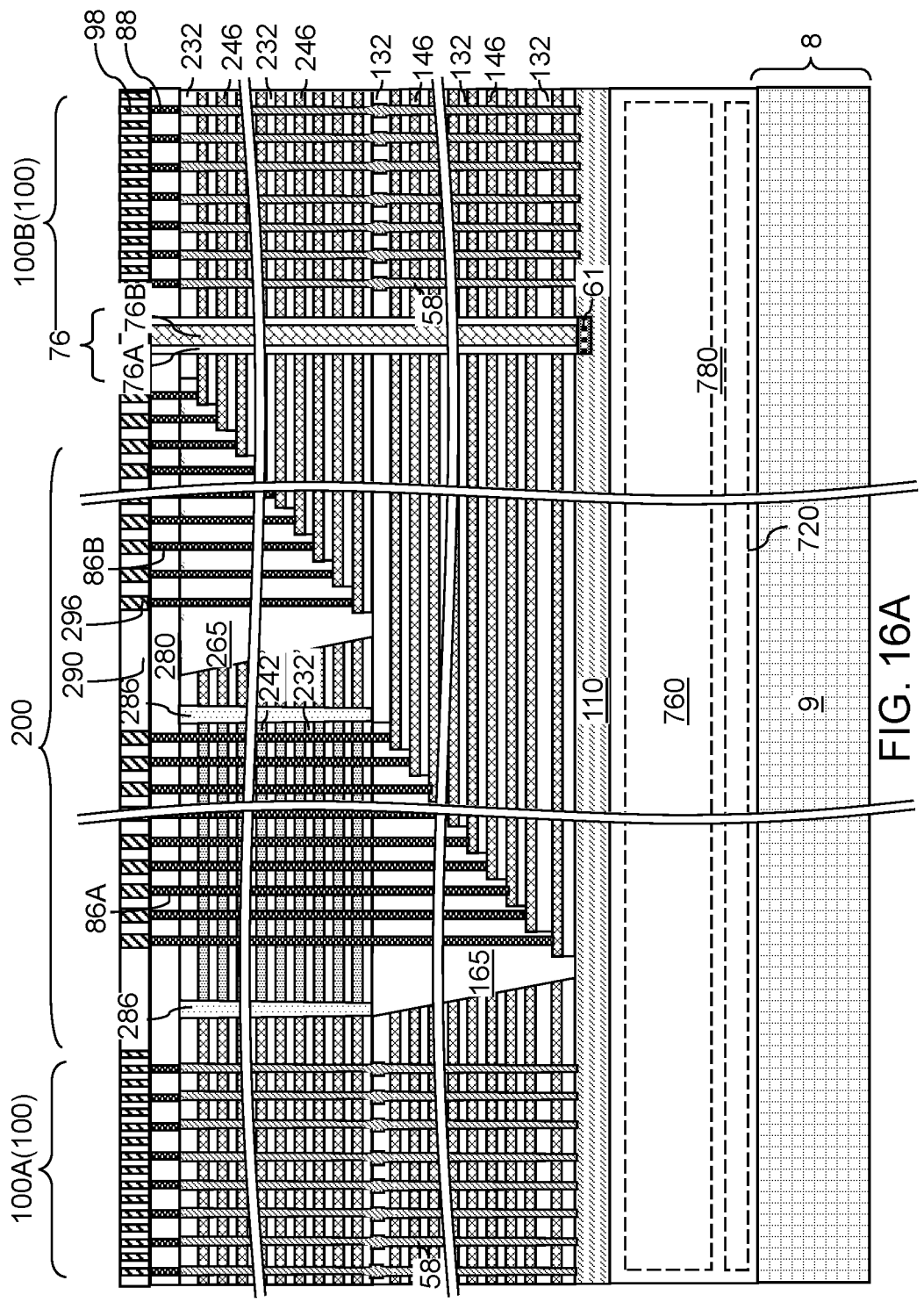
FIG. 16A is a vertical cross-sectional view of the first exemplary structure after formation of upper-level metal interconnect structures including metal lines according to an embodiment of the present disclosure.
Figure 16B:
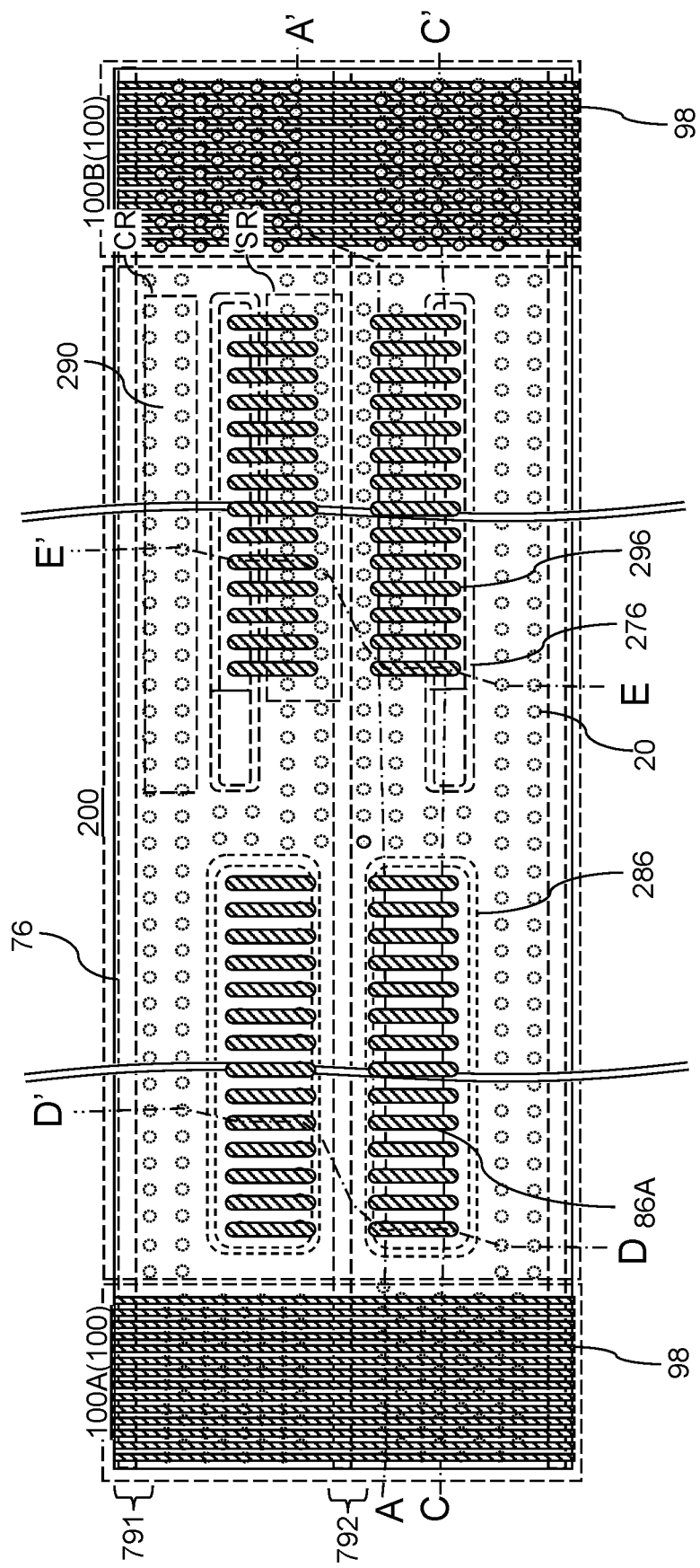
FIG. 16B is a top-down cross-sectional view of the first exemplary structure of FIG. 16A. The hinged vertical plane A-A' is the plane of the vertical cross-sectional view of FIG. 16A.
Figure 16C:
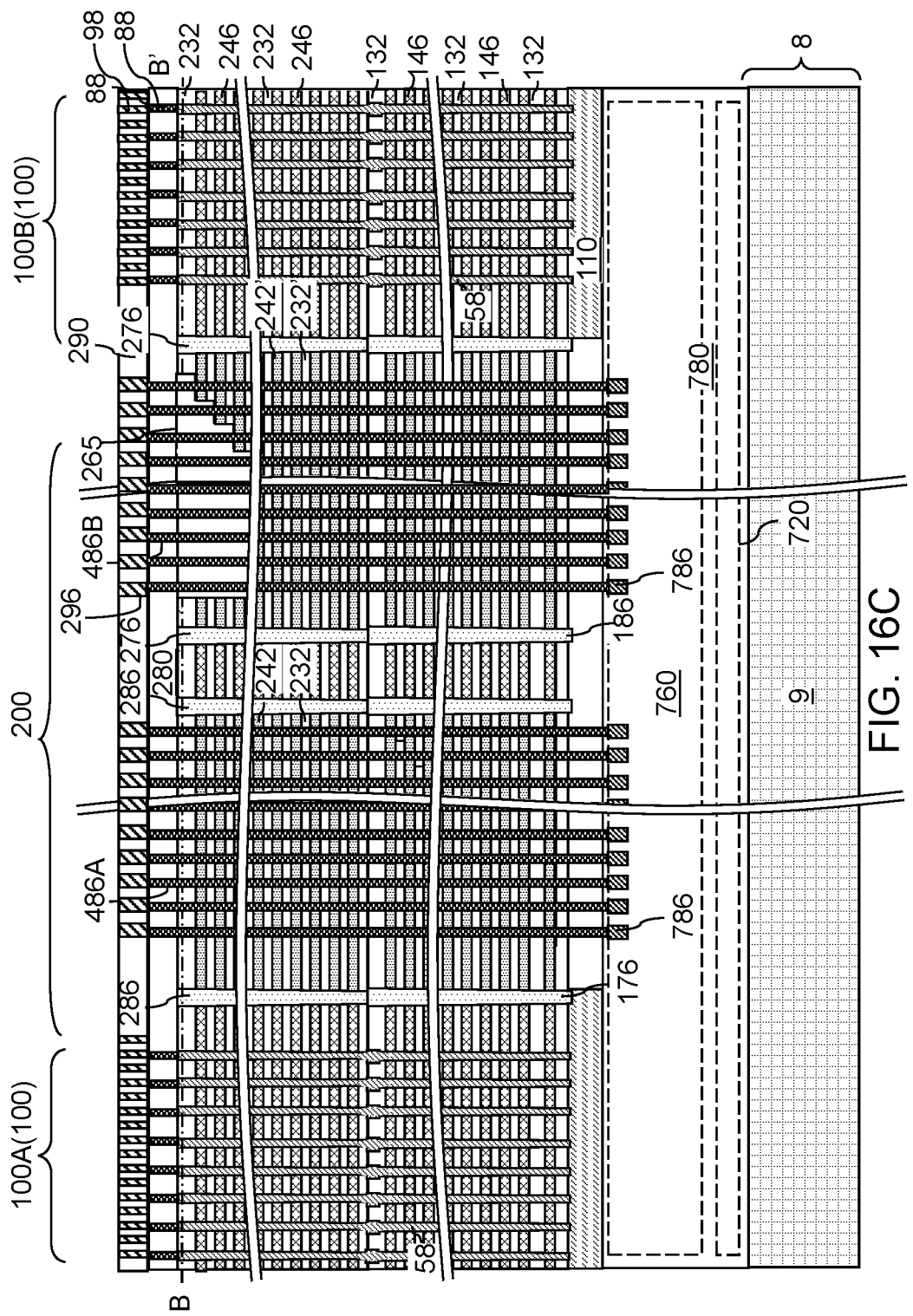
FIG. 16C is a vertical cross-sectional view along the vertical plane C-C' of FIG. 16B.
Figure 16D:
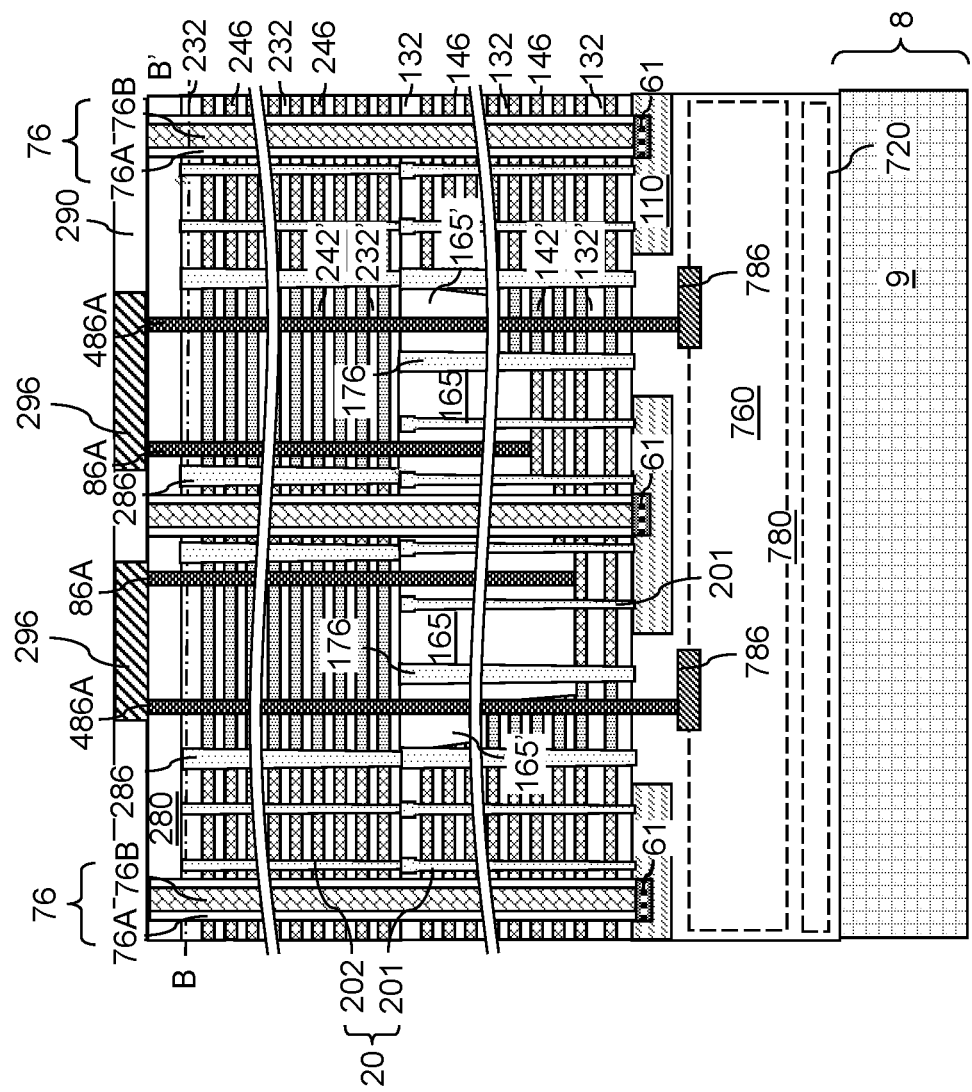
FIG. 16D is a vertical cross-sectional view along the vertical plane D-D' of FIG. 16B.
Figure 16E:
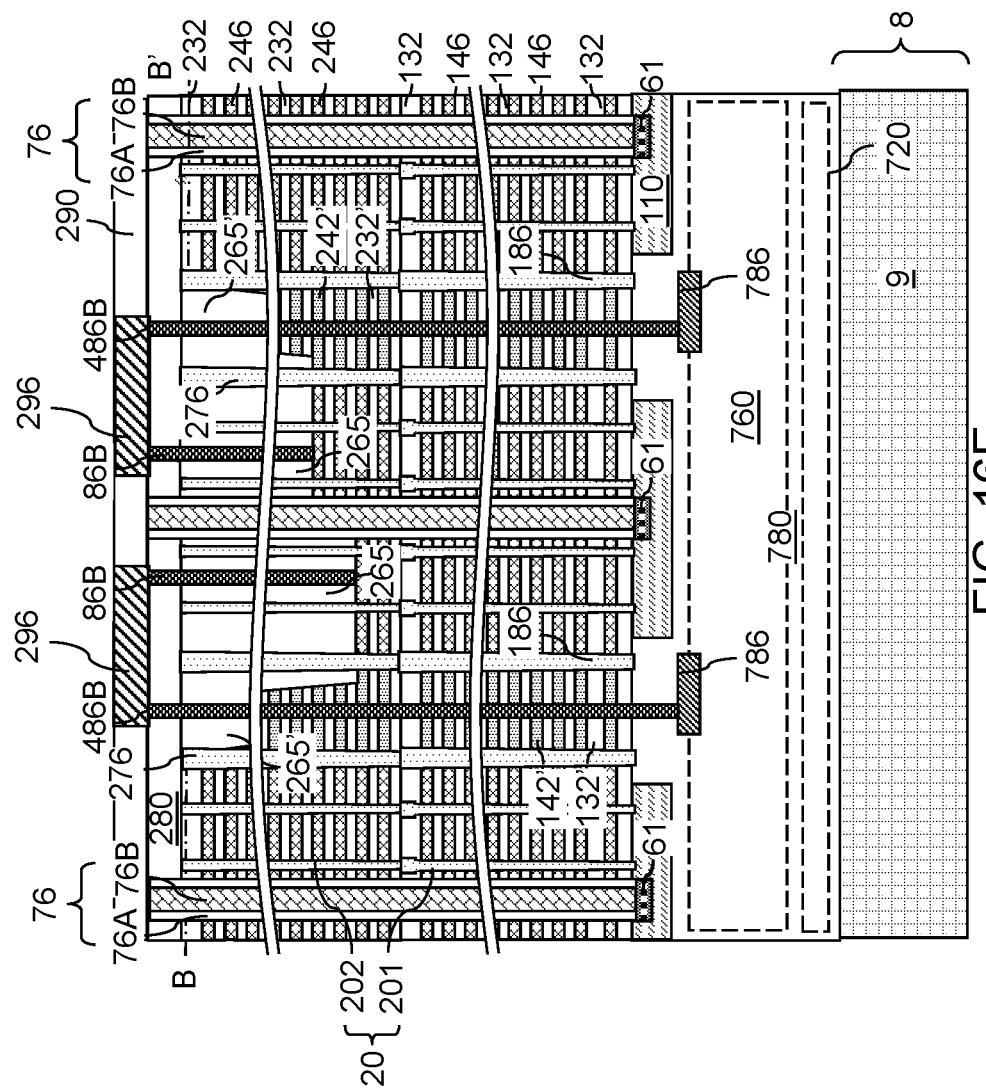
FIG. 16E is a vertical cross-sectional view along the vertical plane E-E' of FIG. 16B.

In case multiple tiers are present within the first exemplary structure, an additional alternating stack of additional insulating layers (132 or 232) and additional electrically conductive layers (146 or 246) overlie or underlie the alternating stack that embeds the first dielectric wall structure W1 and the second dielectric wall structure W2. A first additional dielectric wall structure and a second additional dielectric wall structure can be provided within the overlying tier structure or the underlying tier structure, and can contact the additional alternating stack and an additional vertically alternating sequence of additional insulating plates (132' or 232') and additional dielectric material plates (142' or 242'). The additional vertical alternating sequence can be laterally bounded along the second horizontal direction hd2 (which is perpendicular to the first horizontal direction hd1) by the first additional dielectric wall structure and the second additional dielectric wall structure. In one embodiment, the additional vertically alternating sequence of the additional insulating plates 232' and the additional dielectric material plates 242' overlies the staircase region of the alternating stack (132, 146), and layer contact via structures 86A vertically extend through each of the additional insulating plates 232' and each of the additional dielectric material plates 242' as illustrated in FIG. 15D.

Referring to FIGS. 16A-16E, upper-level metal interconnect structures can be formed above the contact-level dielectric layer 280. The upper-level metal interconnect structures can include many levels of metal lines and many levels of metal via structures. The upper-level metal interconnect structures are embedded in upper-level dielectric material layers such as a first line-level dielectric material layer 290. While only first metal lines (98, 296) located at a first metal line level are illustrated, it is understood that additional metal lines and additional metal via structures can be provided as needed. The first metal lines (98, 296) can include bit lines 98 electrically contacting the drain contact via structures 88, and word-line-connection metal lines 296 that electrically connect a respective pair of a layer contact via structure (86A or 86B) and a connection via structure (486A or 486B). The word-line-connection metal lines 296 extend a relatively short distance between the respective pair of a layer contact via structure (86A or 86B) and a connection via structure (486A or 486B), which reduces the overall resistance of the electrical connections. For example, the connection via structure (486A or 486B) may connect the respective word line (86A or 86B) with its word line switch circuit device (e.g., transistor) 720 located below the alternating stacks.

The first metal lines may include additional metal lines that can provide electrical connection to various additional via structures (not illustrated) extending through the contact-level dielectric layer 280. Generally, upper-level dielectric material layers are formed over the alternating stack(s) of insulating layers (132, 232) and electrically conductive layers (146, 246), the vertically alternating sequences of insulating plates (132', 232') and dielectric material plates (142', 242') and over the connection via structures (486A, 486B) and the layer contact via structures (86A, 86B). In one embodiment, the layer contact via structures (86A, 86B) can be electrically connected to a respective one of the connection via structures (486A, 486B) through a respective metal line (such as a word-line-connection metal line 296) of the upper-level metal interconnect structures.

Referring to FIGS. 17A-17E, a first alternative configuration of the first exemplary structure is illustrated. In the alternative configuration of the first exemplary structure, a moat-shaped dielectric wall structure (176, 186, 276, 286) may be replaced with a pair of discrete dielectric wall structures {(376A, 376B) or (366A, 366B)}. In this case, a pair of line-shaped openings that are laterally spaced from each other and disjoined from each other along the second horizontal direction hd2 can be formed in lieu of one, each, or all, of the moat-shaped openings through a respective alternating layer stack of continuous insulating layers (132L or 232L) and continuous sacrificial material layers (142L or 242L). A first dielectric wall structure (376A or 366A) and the second dielectric wall structure (376B or 366B) can be formed by filling the pair of line-shaped openings with a dielectric fill material concurrently with formation of first-tier support pillar structures 201 or second-pillar support pillar structures 202.

Each pair of a first dielectric wall structure (376A or 366A) and a second dielectric wall structure (376B or 366B) can laterally extend along the first horizontal direction hd1 through a respective alternating layer stack {(132L, 142L) or (232L, 242L)} and a respective dielectric cavity fill material portion (163 or 263) within an area of an inter-array region 200. The dielectric cavity fill material portion (163 or 263) is divided into a retro-stepped dielectric material portion (165 or 265) overlying the stepped surfaces of the alternating layer stack and a dielectric fill material portion (165' or 265') located between the first dielectric wall structure (376A or 366A) and the second dielectric wall structure (376B or 366B). In this case, the first dielectric wall structure (376A or 366A) and the second dielectric wall structure (376B or 366B) are two disjoined material portions that are not in direct contact with each other.

During processing steps of FIGS. 13A-13E that form backside recesses (143, 243), the duration of the isotropic etch process that removes the materials of the continuous sacrificial material layers (142L, 242L) is controlled such that portions of the continuous sacrificial material layers (142L, 242L) located between each neighboring pair of a first dielectric wall structure (376A or 366A) and a second dielectric wall structure (376B or 366B) are not removed by the isotropic etch process. Each remaining portion of the continuous sacrificial material layers (142L, 242L) constitutes a dielectric material plate (142', 242'), which include first dielectric material plates 142' and second dielectric material plates 142'. Each portion of an insulating layer (132, 232) that has an areal overlap with an immediately overlying one of the dielectric material plates (142', 242') or with an immediately underlying one of the dielectric material plate (142', 242') constitutes an insulating plate (132' or 232'). In this case, each insulating plate (132' or 232') is directly adjoined to a respective one of the insulating layers (132, 232). A vertically alternating sequence of insulating plates 132' and dielectric material plates 142' can be embedded within an alternating stack of insulating layers (132, 232) and electrically conductive layers (146, 246). The electrically conductive layers (146, 246) of the alternating stack {(132, 146) or (232, 246)} and the dielectric material plates (142', 242') of the vertically alternating sequence {(132', 142') or (232', 242')} can be in contact with each other at vertical interfaces located within two vertically-extending planes that are laterally spaced apart along the first horizontal direction hd1.

Figure 18:
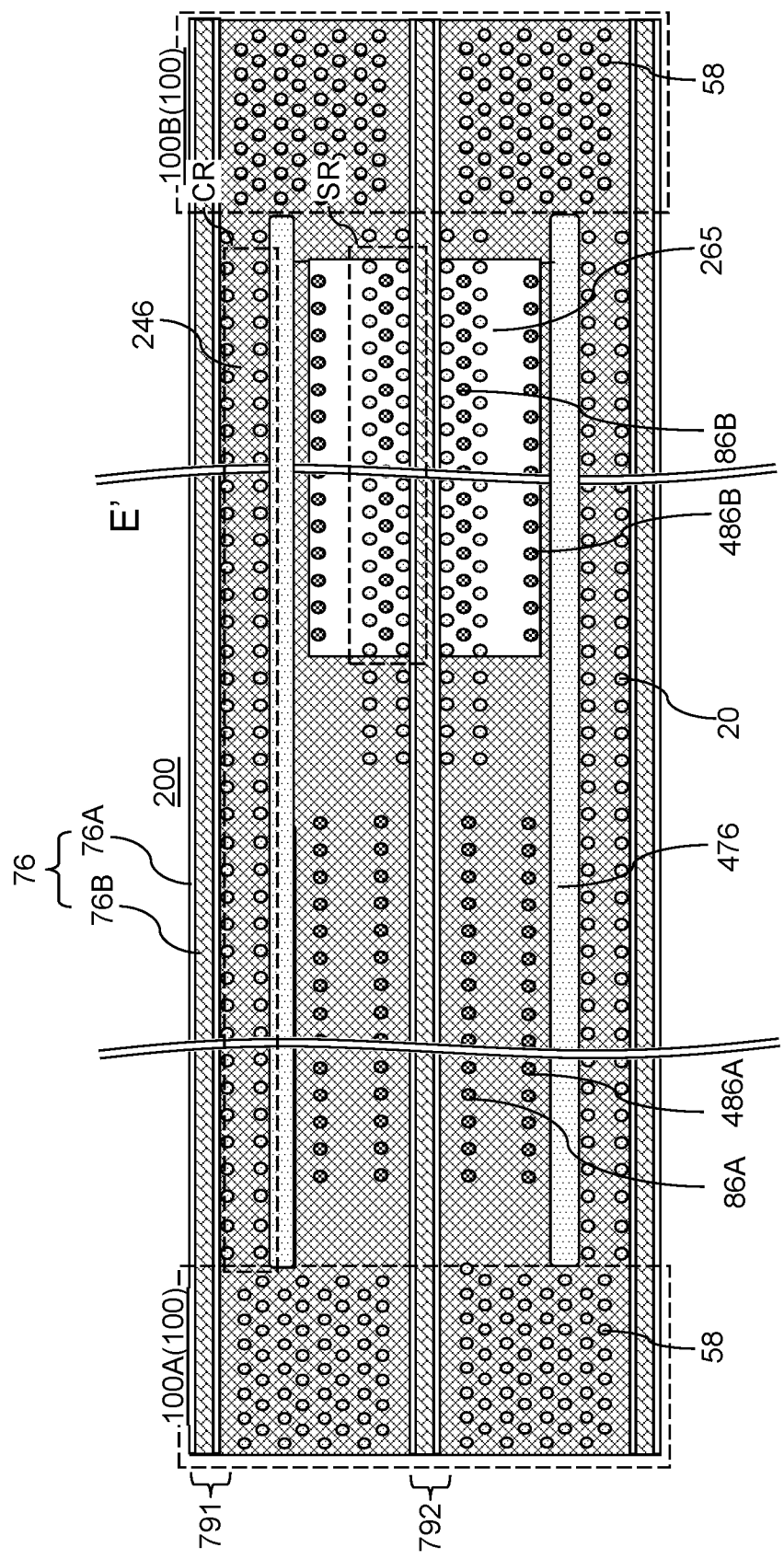
FIG. 18 is a top-down cross-sectional view of a second alternative configuration of the first exemplary structure containing a monolithic dielectric wall structure according to an embodiment of the present disclosure.

Referring to FIG. 18, a second alternative configuration of the first exemplary structure is illustrated. In the second alternative configuration of the first exemplary structure, the pair of discrete dielectric wall structures {(376A, 376B) or (366A, 366B)} may be replaced with a single dielectric wall structure 476. The single dielectric wall structure 476 may have the same thickness as one of the pair of discrete dielectric wall structures, or may be thicker than one of the pair of discrete dielectric wall structures. The single dielectric wall structure 476 provides additional support to the insulating layers (132, 232) after removal of the sacrificial material layers (142, 242). The monolithic dielectric wall structure 476 has an elongated shape having a horizontal length in one horizontal direction (e.g., the first horizontal direction hd1) that is at least 3 times longer, such as 5 to 100 times longer than its horizontal width in a perpendicular horizontal direction (e.g., hd2). Thus, the dielectric wall structure 476 has a non-cylindrical and non-truncated conical shape. In this embodiment, the layer contact via structures 86A may be surrounded by a dielectric spacer to avoid electrically contacting all electrically conductive layers except a respective one electrically conductive layer.

The monolithic dielectric wall structure 476 has a higher mechanical strength than the cylindrical support pillar structures 20. The dielectric wall structure 476 does not buckle under compressive stress and can suppress compressive stress and permits a wider spacing of the support pillar structures 20 without buckling of the insulating layers (132, 232) after removal of the sacrificial material layers (142, 242). The wider spacing (i.e., pitch) support pillar structures 20 reduces the likelihood that the layer contact via structures 86 will overlap with and interfere with the support pillar structures 20, and permits a higher volume of the electrically conductive layers (146, 246) to the present in the inter-array region 200. This reduces the overall resistivity of the electrically conductive layers. Furthermore, the total area of the staircase regions in the inter-array region 200 can be reduced, which decreases the chip area.

While the various dielectric wall structures are described above as being located in the inter-array region 200, the dielectric wall structures may be located in other staircase regions. For example, the dielectric wall structures may be located in a staircase region at the edge of the die, near the end of the last memory array region 100 of the die.

Referring to all drawings and according to all embodiments of the present disclosure, three-dimensional memory device comprises an alternating stack of insulating layers (132, 232) and electrically conductive layers (146, 246) located between a first line trench 791 and a second line trench 792 that laterally extend along a first horizontal direction hd1 and over a substrate 8;

a first memory array region 100A and a second memory array region 100B that are laterally spaced apart along the first horizontal direction hd1 and including each layer of the alternating stack, wherein a respective set of memory stack structures 55 each comprising a vertical semiconductor channel 60 and a memory film 50 vertically extends through the alternating stack within each of the first memory array region 100A and the second memory array region 100B; at least one dielectric wall structure (W1, 376A, 366A or 476) that is located between the first line trench and the second line trench and between the first memory array region and the second memory array region, extending through all layers of the alternating stack, laterally extending along the first horizontal direction hd1, having a lesser lateral extent that the first line trench and the second line trench along the first horizontal direction hd1, and having a length along the first horizontal direction hd1 that is at least three times longer than its width extending along a second horizontal direction hd2 that is perpendicular to the first horizontal direction; and a staircase region SR is located between the second line trench 792 and the at least one dielectric wall structure, and the electrically conductive layers (146, 246) of the alternating stack have lateral extents along the first horizontal direction that decrease with a distance from the substrate in the staircase region.

In the embodiment of FIGS. 16A-16E, the at least one dielectric wall structure comprises a portion of a moat-shaped dielectric material, an alternating stack of dielectric material plates (142', 242') and insulating plates (132', 232') is surrounded by the moat-shaped dielectric material, and connection via structures (486A, 486B) vertically extend through the alternating stack of dielectric material plates and insulating plates, and contacting a respective one of lower-level metal interconnect structures 786 and a respective one of upper-level metal interconnect structures 296.

In the embodiment of FIGS. 17A-17E, the at least one dielectric wall structure comprises a pair of dielectric wall structures, an alternating stack of dielectric material plates (142', 242') and insulating layers (132, 232) is located between the pair of dielectric wall structures, and connection via structures (486A, 486B) vertically extend through the alternating stack of dielectric material plates and insulating layers, and contacting a respective one of lower-level metal interconnect structures and a respective one of upper-level metal interconnect structures.

In the embodiment of FIG. 18, the at least one dielectric wall structure comprises a monolithic dielectric wall structure 476, a plurality of support pillar structures 20 having a cylindrical or truncated cone shape are located between the monolithic dielectric wall structure 476 and the second line trench 792.

Referring to FIGS. 1 to 17E and according to some embodiments of the present disclosure, a three-dimensional memory device is provided, which comprises: an alternating stack of insulating layers (132 or 232) and electrically conductive layers (146 or 246) located between a first line trench 791 and a second line trench 792 that laterally extend along a first horizontal direction hd1 and over a substrate 8; a first memory array region 100A and a second memory array region 100B that are laterally spaced apart along the first horizontal direction hd1 and including each layer of the alternating stack {(132, 146) or (232, 246)}, wherein a respective set of memory stack structures 55 each comprising a vertical semiconductor channel 60 and a memory film 50 vertically extends through the alternating stack {(132, 146) or (232, 246)} within each of the first memory array region 100A and the second memory array region 100B; a first dielectric wall structure (W1, 376A, or 366A) and a second dielectric wall structure (W2, 376B, or 366B) that are located between the first line trench 791 and the second line trench 792 and between the first memory array region 100A and the second memory array region 100B, laterally extending along the first horizontal direction hd1, and having a lesser lateral extent that the first line trench 791 and the second line trench 792, wherein a connection region CR is located between the first line trench 791 and the first dielectric wall structure (W1, 376A, or 366A) and each layer within the alternating stack {(132, 146) or (232, 246)} continuously extends between the first memory array region 100A and the second memory array region 100B in the connection region, and a staircase region SR is located between the second line trench 792 and the second dielectric wall structure (W2, 376B, or 366B), and the electrically conductive layers (146 or 246) of the alternating stack {(132, 146) or (232, 246)} have lateral extents along the first horizontal direction hd1 that decrease with a distance from the substrate 8; and an alternating stack dielectric material plates (142', 242') and insulating plates (132', 232') or layers (132, 232) located between the first dielectric wall structure (W1, 376A, or 366A) and the second dielectric wall structure (W2, 376B, or 366B), wherein the dielectric material plates (142' or 242') have horizontal cross-sectional areas that decrease with the vertical distance from the substrate 8.

In one embodiment, the dielectric material plates (142', 242') have first lateral extents along the first horizontal direction hd1 that decrease with the vertical distance from the substrate 8. In one embodiment, the dielectric material plates (142' or 2142') have second lateral extents along a second horizontal direction hd2 that decrease with the vertical distance from the substrate 8, wherein the second horizontal direction hd2 is perpendicular to the first horizontal direction hd1. In one embodiment, the three-dimensional memory device comprises a dielectric fill material portion (165' or 265') overlying the dielectric material plates (142' or 242') and contacting the first dielectric wall structure (W1, 376A, or 366A) and the second dielectric wall structure (W2, 376B, or 366B), wherein the dielectric fill material portion (165' or 265') has a greater contact area with the second dielectric wall structure (W2, 376B, or 366B) than with the first dielectric wall structure (W1, 376A, or 366A) (due to the taper angle in a stepped cavity and in a dielectric cavity fill material portion (163 or 263) employed during the manufacturing process).

In one embodiment, the three-dimensional memory device comprises: lower-level dielectric material layers 760 located between the substrate 8 and a combination of the alternating stack {(132, 146) or (232, 246)} and the dielectric material plates (142' or 242') and embedding lower-level metal interconnect structures 780; upper-level dielectric material layers (which can include a first line-level dielectric material layer 290) located above the combination of the alternating stack {(132, 146) or (232, 246)} and the dielectric material plates (142' or 242') and embedding upper-level metal interconnect structures (such as first metal lines (98, 296)); and connection via structures (486A, 486B) that vertically extend through the dielectric material plates (142' or 242') and contacting a respective one of the lower-level metal interconnect structures 780 (such as metal pads 786) and a respective one of the upper-level metal interconnect structures (such as a word-line-connection metal line 296).

In one embodiment, the three-dimensional memory device comprises layer contact via structures (86A, 86B) contacting a top surface of a respective one of the electrically conductive layers (146 or 246) within an area of the staircase region SR. In one embodiment, the layer contact via structures (86A, 86B) are electrically connected to a respective one of the connection via structures (486A, 486B) through a respective metal line (such as a word-line-connection metal line 296) among the upper-level metal interconnect structures.

In one embodiment, the three-dimensional memory device comprises: an additional alternating stack {(232, 246) or (132, 146)} of additional insulating layers (132 or 232) and additional electrically conductive layers (146 or 246) located between the first line trench 791 and the second line trench 792 and overlying, or underlying, the alternating stack {(132, 146) or (232, 246)}; and additional dielectric material plates (242' or 142') that are embedded within the additional alternating stack {(232, 246) or (132, 146)}, wherein the connection via structures (486A, 486B) vertically extend through each of the additional dielectric material plates (242' or 142'). In one embodiment, the three-dimensional memory device comprises a first additional dielectric wall structure (W1, 376A, or 366A) and a second additional dielectric wall structure (W2, 376B, or 366B) that contact the additional dielectric material plates (242' or 142'), wherein the additional dielectric material plates (242' or 242') contact, and are laterally bounded along a second horizontal direction hd2 that is perpendicular to the first horizontal direction hd1 by, the additional dielectric wall structure (W1, 376A, or 366A) and the second additional dielectric wall structure (W2, 376B, or 366B).

In one embodiment, the additional dielectric material plates 242' overlie the staircase region SR of the alternating stack (132, 146); and the layer contact via structures 86A vertically extend through each of the additional dielectric material plates 242'. In one embodiment, the three-dimensional memory device comprises a moat trench laterally surrounding the dielectric material plates (142' or 242') and laterally surrounded by the alternating stack {(132, 146) or 9232, 246}}, wherein the first dielectric wall structure W1 and the second dielectric wall structure W2 are portions of a moat-shaped dielectric material that fill two-laterally extending portions of the moat trench, and are directly or indirectly connected to each other by a pair of widthwise dielectric wall portions.

Figure 17A:
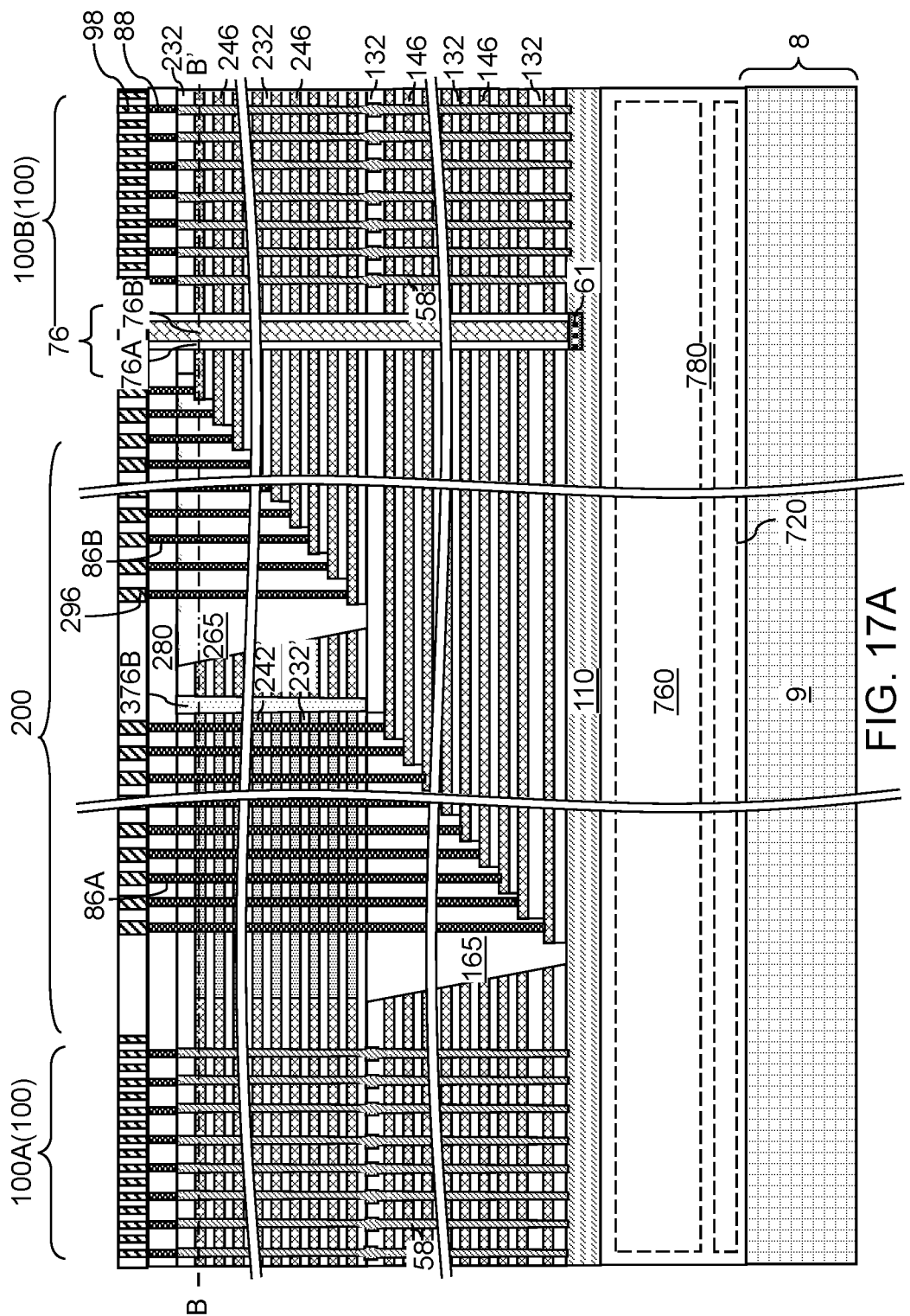
FIG. 17A is a vertical cross-sectional view of a first alternative configuration of the first exemplary structure in which each moat-shaped dielectric wall structure is replaced with a pair of discrete dielectric wall structures according to an embodiment of the present disclosure.
Figure 17B:
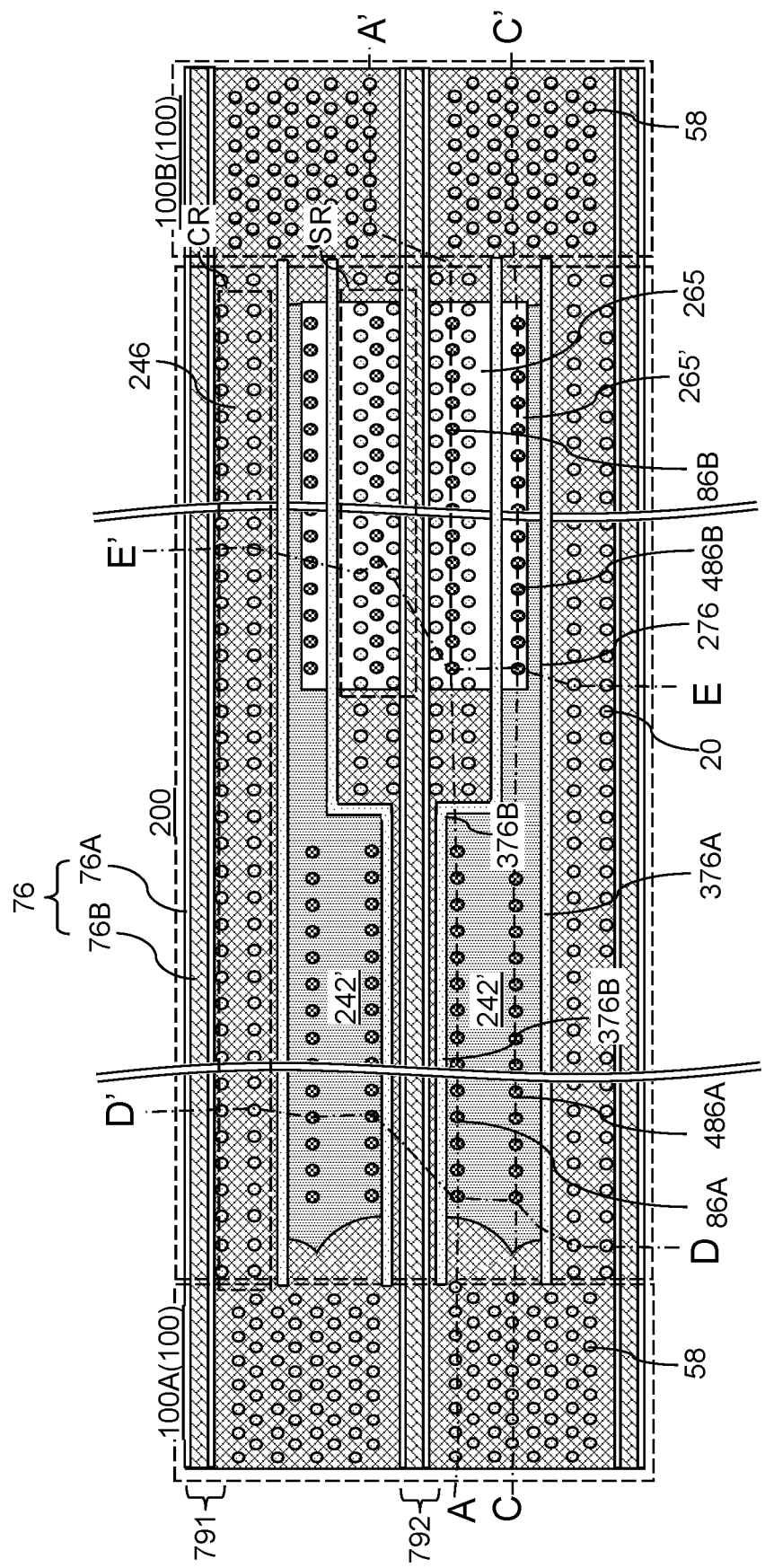
FIG. 17B is a top-down cross-sectional view of the first exemplary structure of FIG. 17A. The hinged vertical plane A-A' is the plane of the vertical cross-sectional view of FIG. 17A.
Figure 17C:
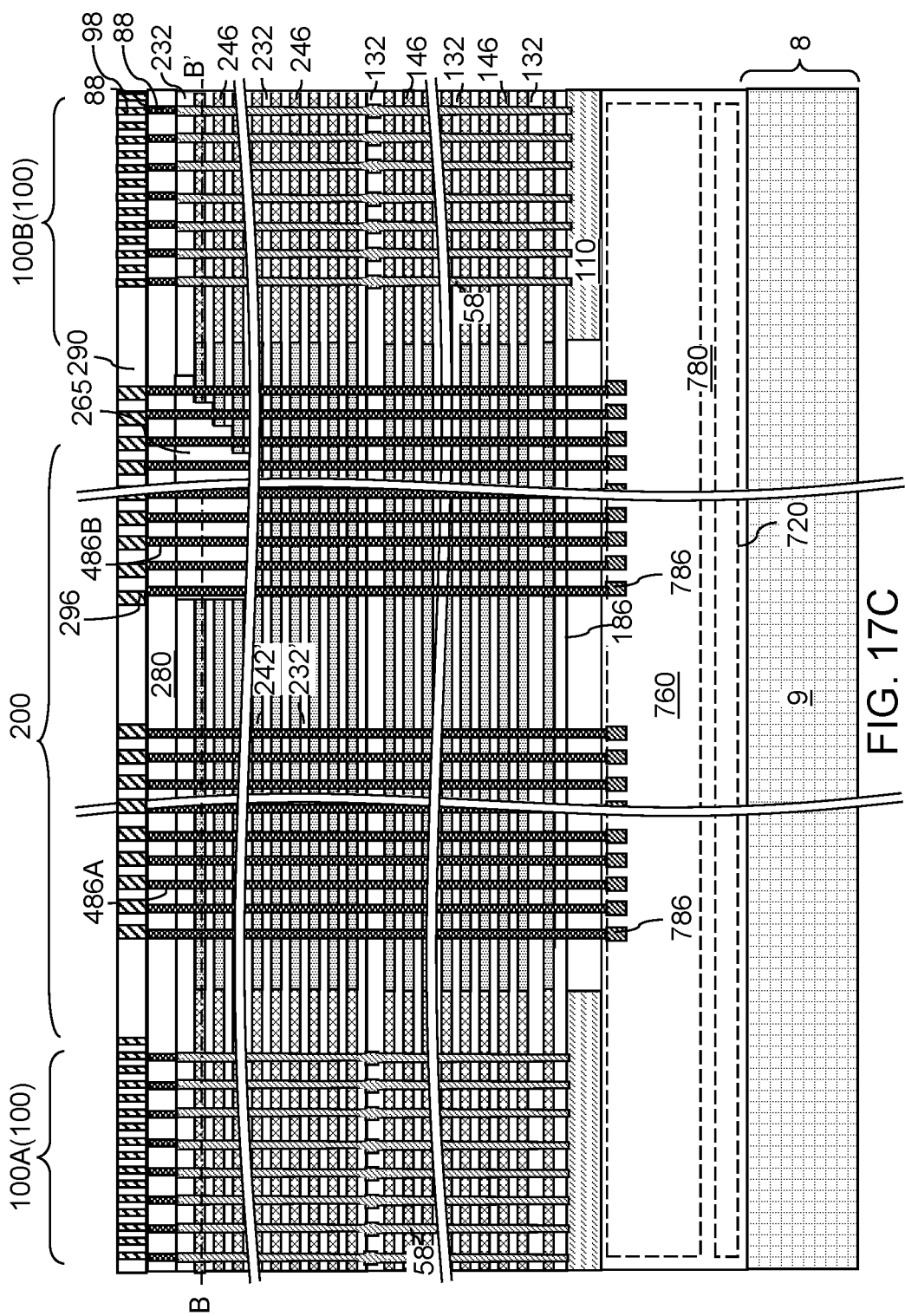
FIG. 17C is a vertical cross-sectional view along the vertical plane C-C' of FIG. 17B.
Figure 17D:
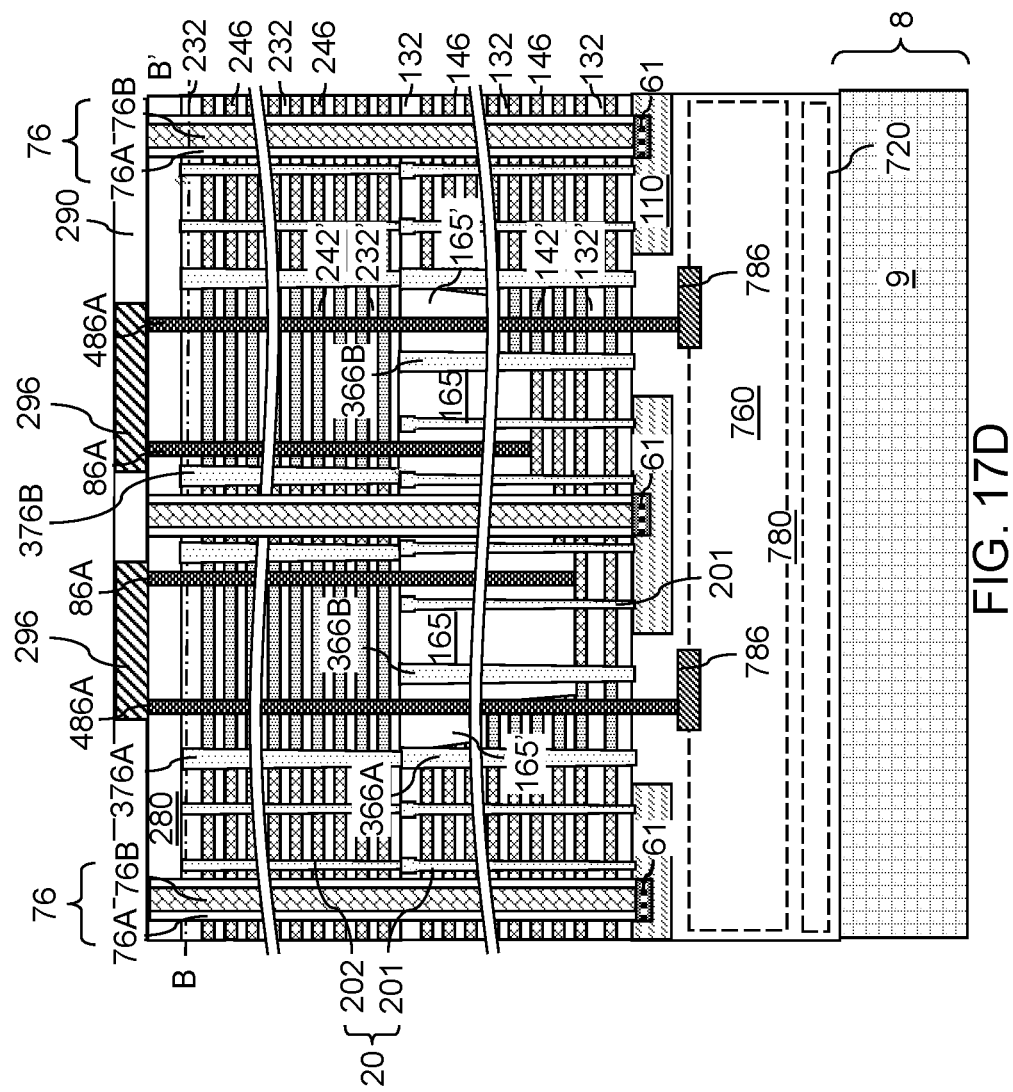
FIG. 17D is a vertical cross-sectional view along the vertical plane D-D' of FIG. 17B.
Figure 17E:
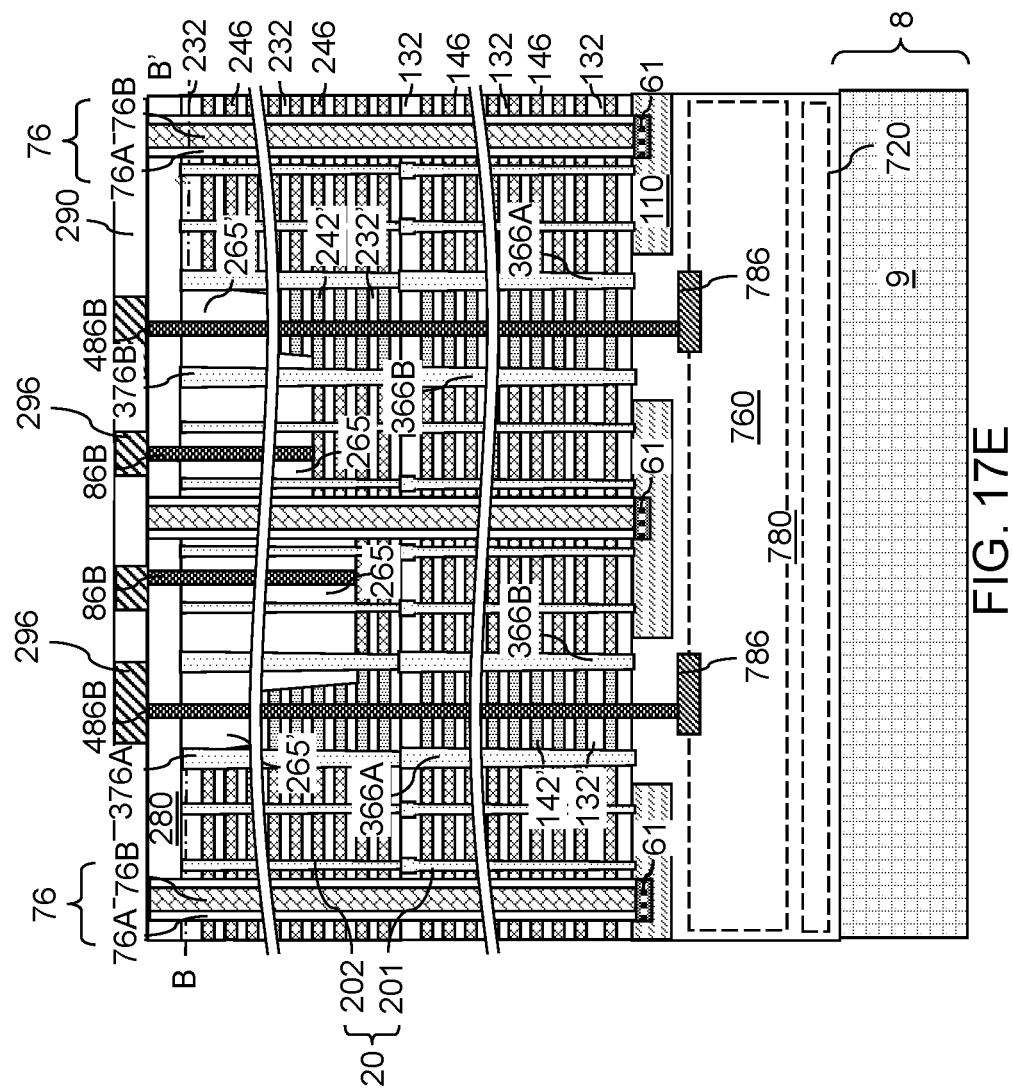
FIG. 17E is a vertical cross-sectional view along the vertical plane E-E' of FIG. 17B.

In one embodiment, the first dielectric wall structure (376A, 366A) and the second dielectric wall structure (376B, 366B) are two disjoined material portions that are not in direct contact with each other; and the electrically conductive layers (146 or 246) of the alternating stack {(132, 146) or (232, 246)} and the dielectric material plates (142' or 242') are in contact at vertical interfaces located within two vertically-extending planes that are laterally spaced apart along the first horizontal direction hd1. The vertically-extending planes may have a curvature in a horizontal cross-sectional view as illustrated in FIG. 17B.

In one embodiment, the dielectric material plates (142' or 242') are interlaced with insulating plates (132' or 232') along a vertical direction; the insulating layers (132 or 232) and the insulating plates (132' or 232') have a same material composition; and each horizontal surface of the insulating layers (132 or 232) is located within a horizontal plane including a horizontal surface of a respective one of the insulating plates (132' or 232').

The various embodiments of the present disclosure can be employed to provide wider electrically conductive paths in the connection region CR by employing dielectric wall structures {(W1, W2), (376A, 366A, 376B, 366B) and/or 476} in lieu of some of the discrete support pillar structures 20 around each region through which layer contact via structures (86A, 86B) or connection via structures (486A, 486B) are formed. The dielectric wall structures provide more structural support per length along the first horizontal direction hd1 and reduces the change of collapse of the insulating layers (132, 242) after removal of the sacrificial material layers (142, 242). Thus, the total number and the density of support pillar structures 20 that are located within the connection regions CR and the staircase regions SR can be reduced, and a greater percentage of the inter-array region 200 can be utilized to provide electrically conductive paths comprising strip portions of the electrically conductive layers (146, 246) that are present within the connection regions CR. This lowers the overall resistance of the electrically conductive layers (e.g., word lines) (146, 246) and decreases the likelihood that the support pillar structures 20 will interfere with and overlap with layer contact structures 86.

Referring to FIGS. 19A-19E, a second exemplary structure according to an embodiment of the present disclosure can be derived from the first exemplary structure illustrated in FIGS. 6A-6E by omitting formation of the first-tier moat trenches (175, 185) at the processing steps of FIGS. 4A-4E. As a consequence, the first insulating plate 132', the first dielectric material plate 142', the first dielectric fill material portion 165', and the first-tier moat-shaped dielectric wall structure (176, 186) are not formed in the second exemplary structure.

A photoresist layer can be applied over the first-tier structure (132L, 142L, 165), and can be lithographically patterned to form openings therein. The pattern of the openings in the photoresist layer include the patterns for the first-tier memory openings and first-tier support openings. According to an aspect of the present disclosure, the pattern in the photoresist layer includes sets of additional discrete openings arranged in a respective cluster laterally surrounding a respective area. Specifically, the patterns in the photoresist layer can be modified to include clusters of discrete openings arranged along a periphery of a respective area in the inter-array region 200. Each cluster of openings include a set of discrete openings that collectively enclose a respective area. The clusters of discrete openings formed in the photoresist layer may have lateral dimensions on par (e.g., within 20% of) with lateral dimensions of openings for forming the first-tier memory openings and the first-tier support openings. Therefore, this step does not limit the lithographic process window for patterning the first-tier memory openings and the first-tier support openings unlike addition of line patterns. Thus, formation of line structures may be avoided at this processing step to ensure sufficient process window for lithographic patterning of the photoresist layer.

Figure 19A:
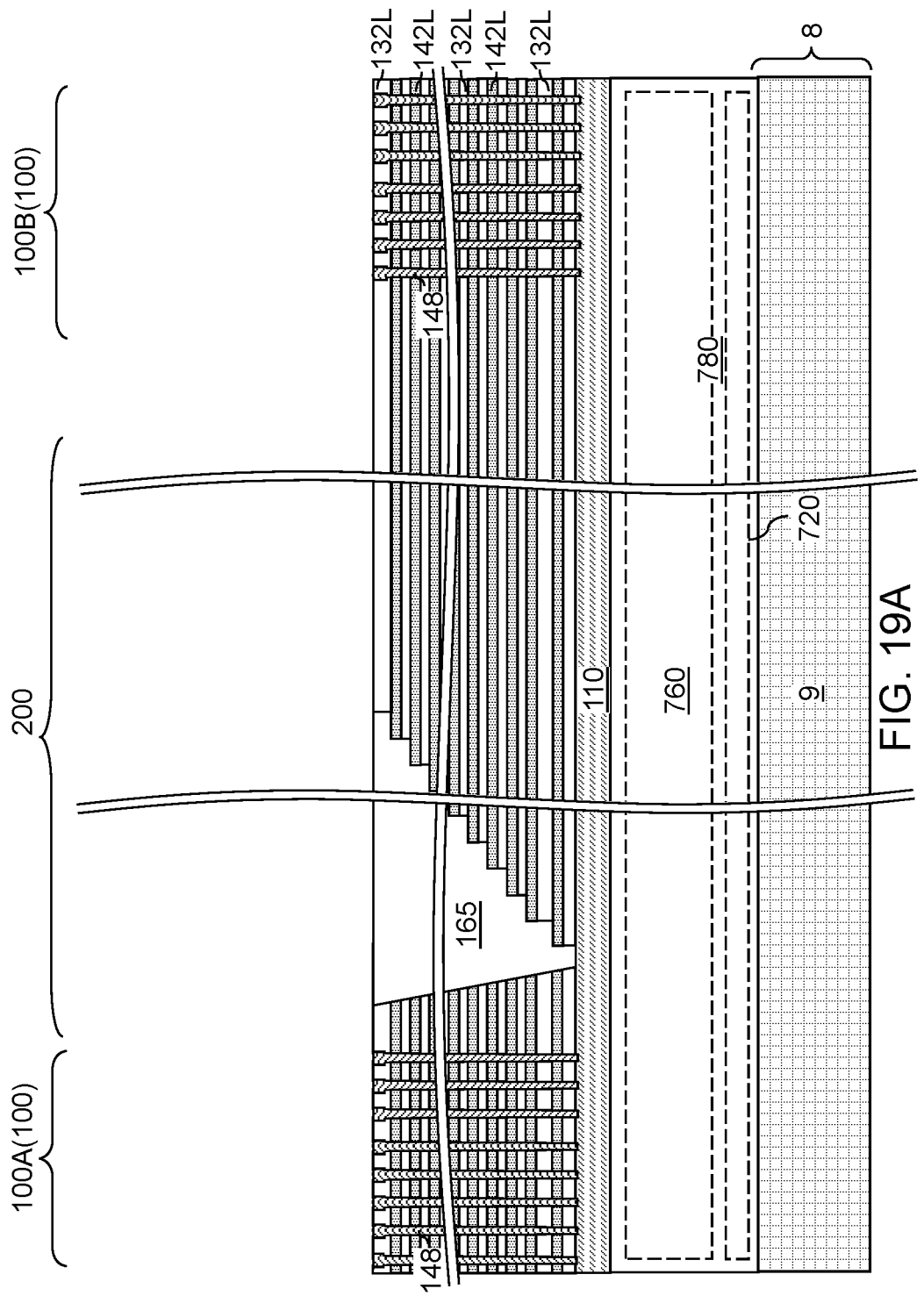
FIG. 19A is a vertical cross-sectional view of a second exemplary structure after formation of a first-tier structure including a first alternating layer stack, first-tier memory opening fill portions, first-tier support opening fill portions, and first-tier columnar opening fill portions according to an embodiment of the present disclosure.
Figure 19B:
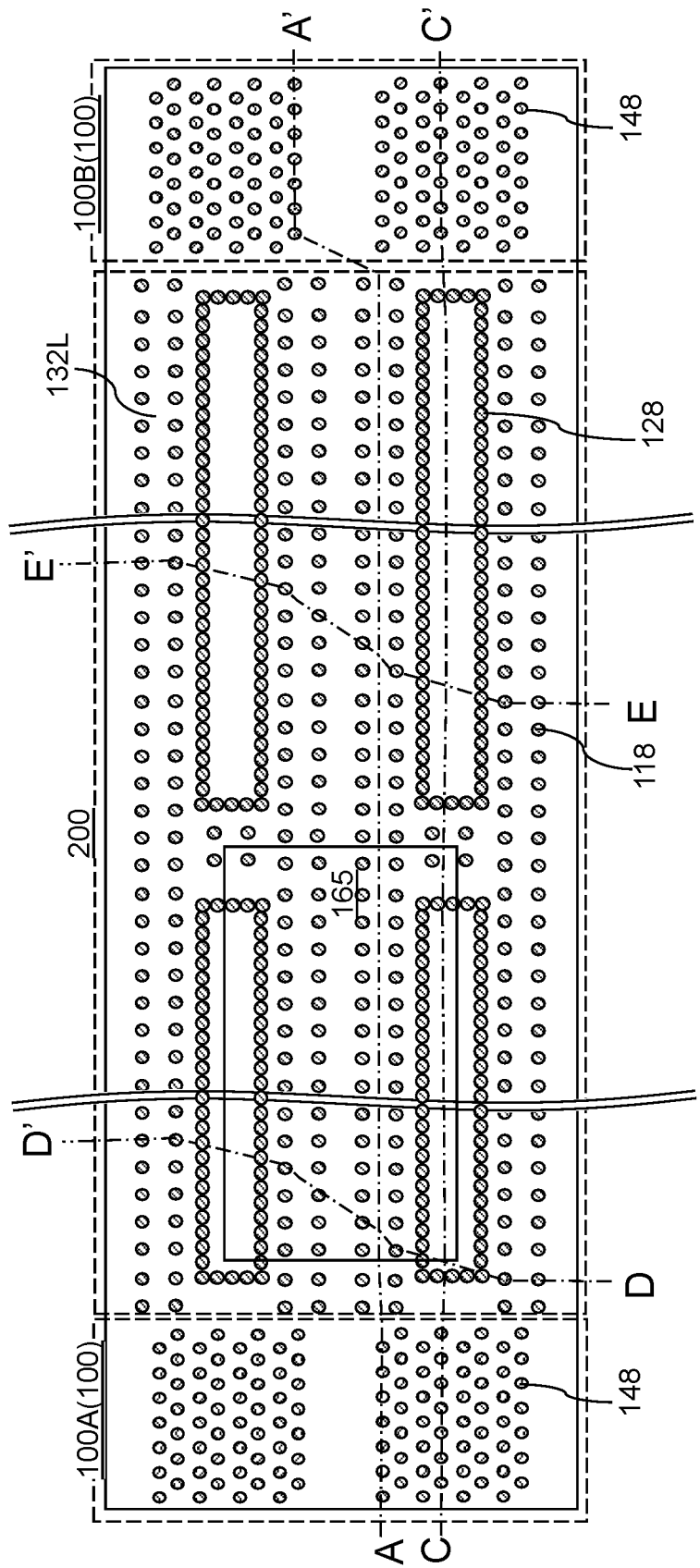
FIG. 19B is a top-down cross-sectional view of the second exemplary structure of FIG. 19A. The hinged vertical plane A-A' is the plane of the vertical cross-sectional view of FIG. 19A.
Figure 19C:
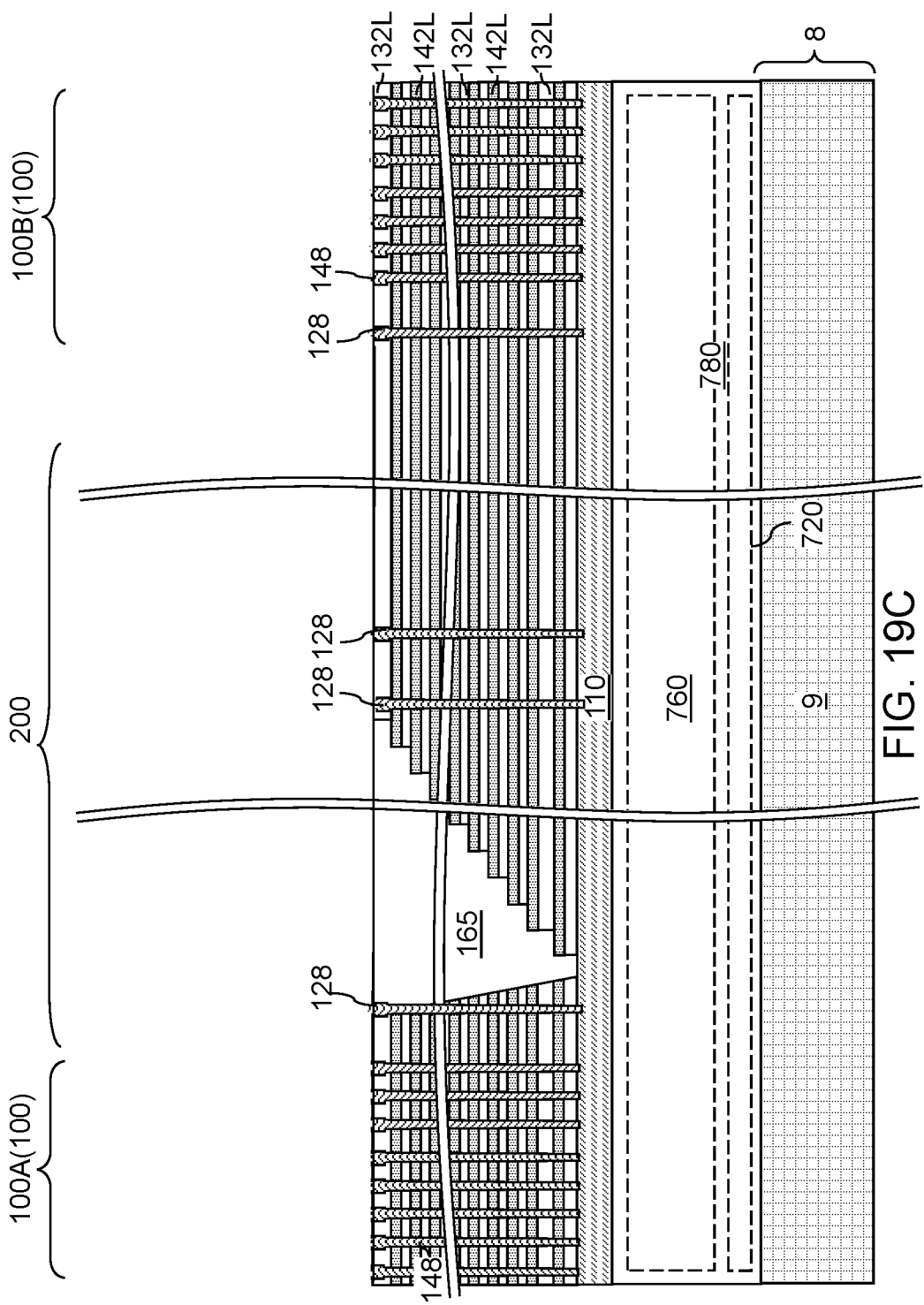
FIG. 19C is a vertical cross-sectional view along the vertical plane C-C' of FIG. 19B.
Figure 19D:
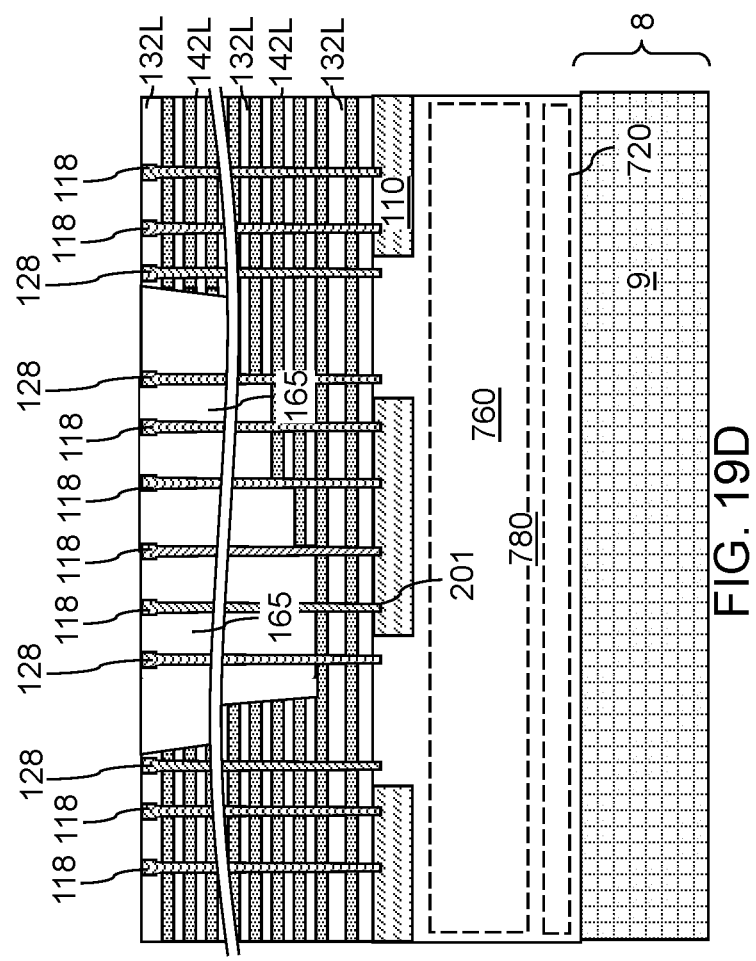
FIG. 19D is a vertical cross-sectional view along the vertical plane D-D' of FIG. 19B.
Figure 19E:
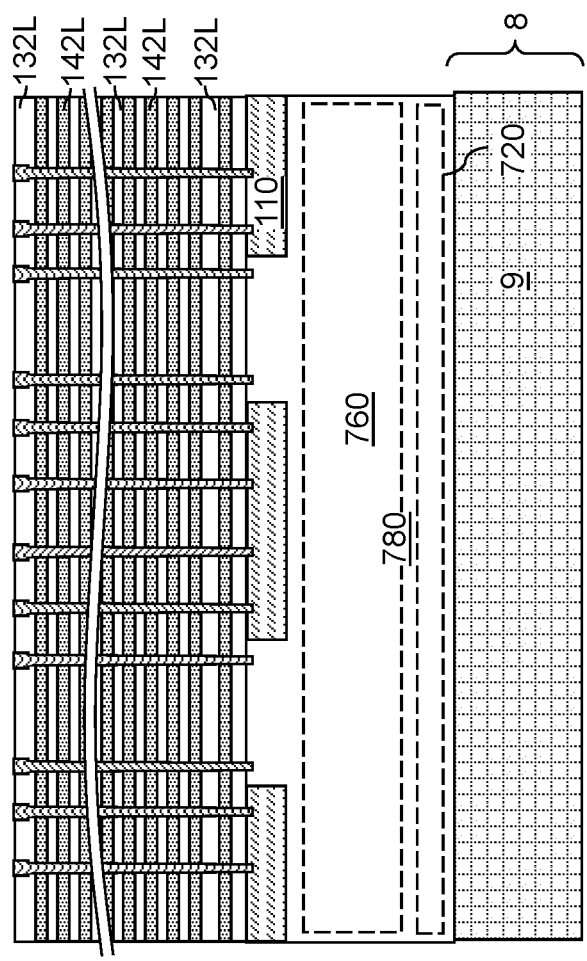
FIG. 19E is a vertical cross-sectional view along the vertical plane E-E' of FIG. 19B.
Figure 20B:
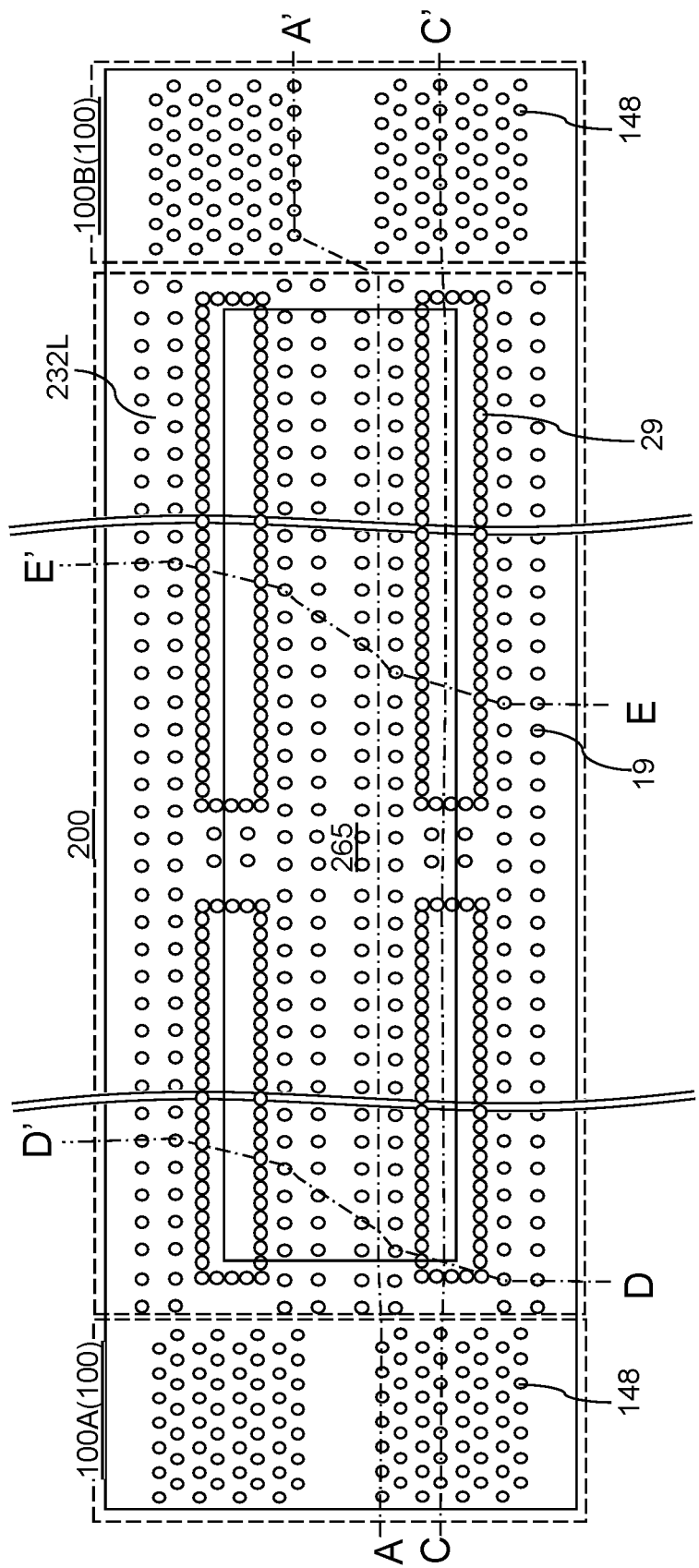
FIG. 20B is a top-down cross-sectional view of the second exemplary structure of FIG. 20A. The hinged vertical plane A-A' is the plane of the vertical cross-sectional view of FIG. 20A.
Figure 20C:
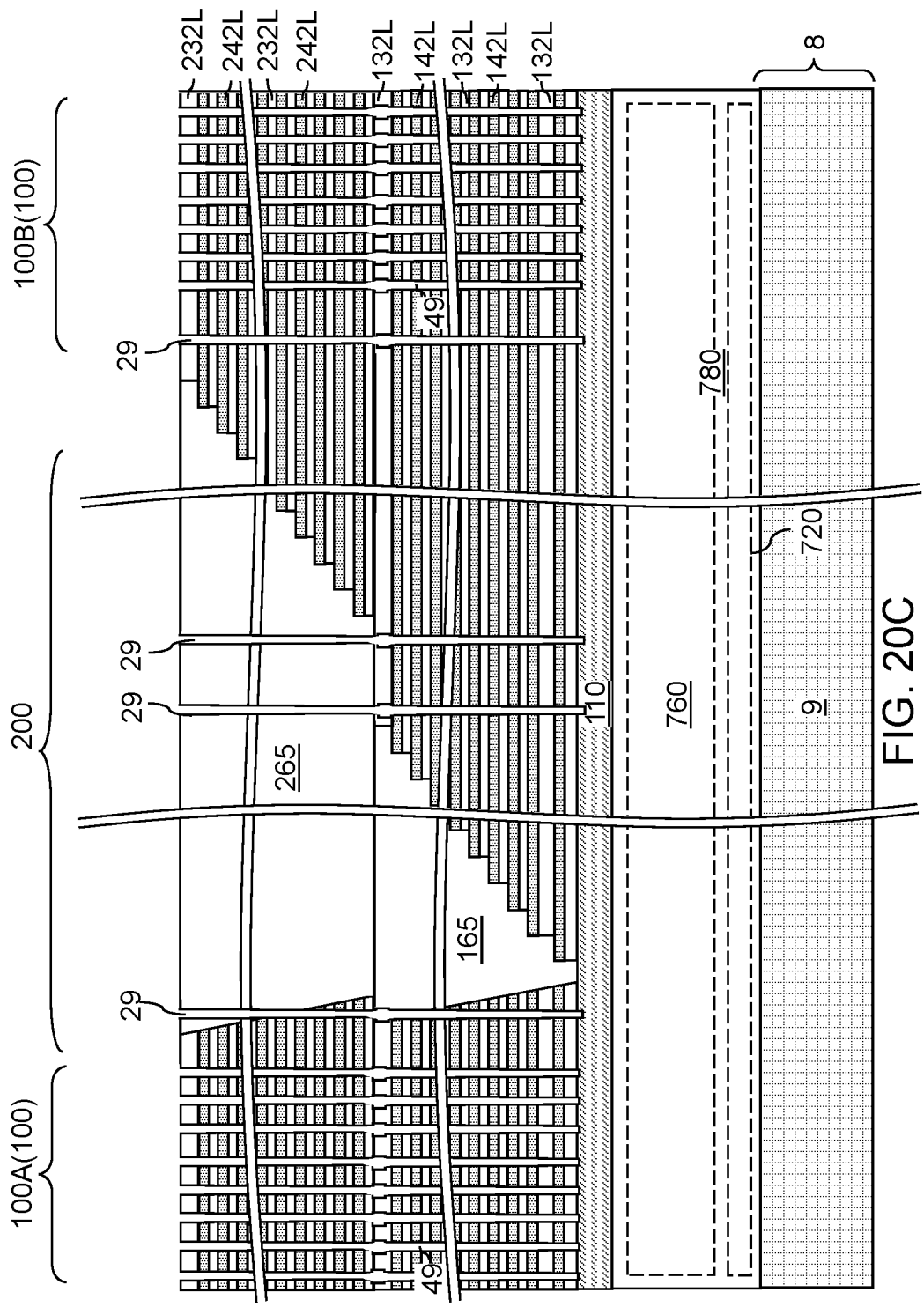
FIG. 20C is a vertical cross-sectional view along the vertical plane C-C' of FIG. 20B.
Figure 20D:
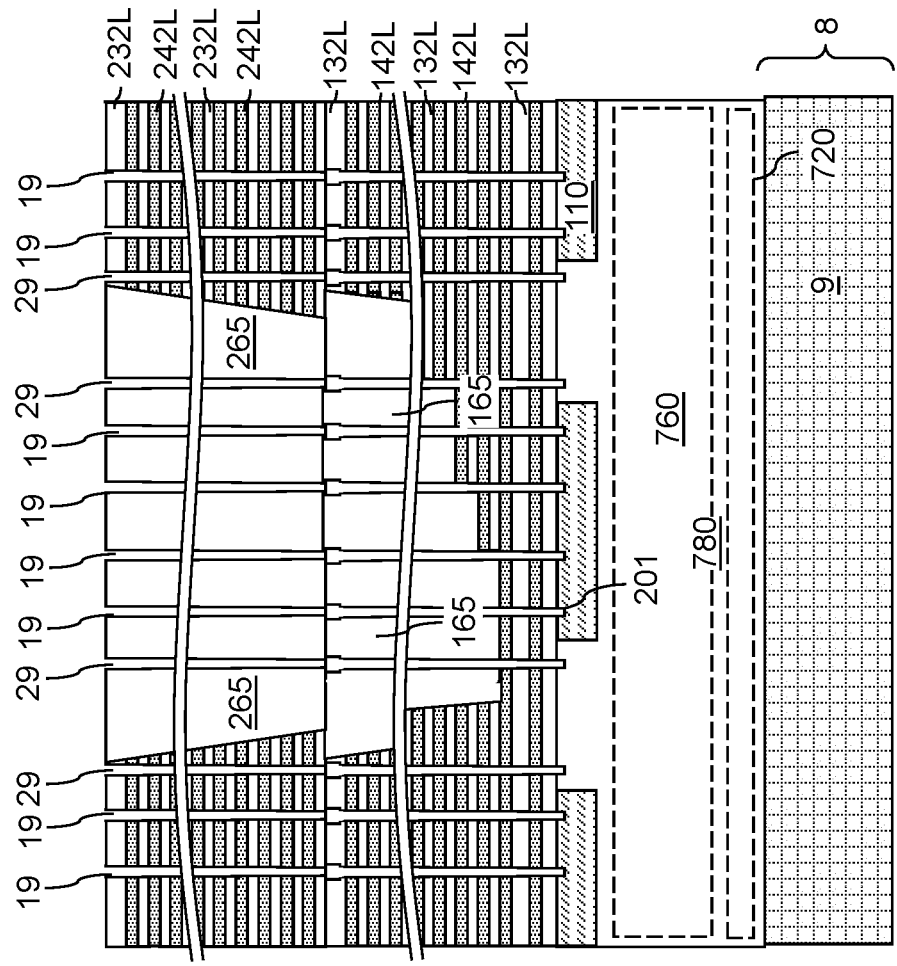
FIG. 20D is a vertical cross-sectional view along the vertical plane D-D' of FIG. 20B.
Figure 20E:
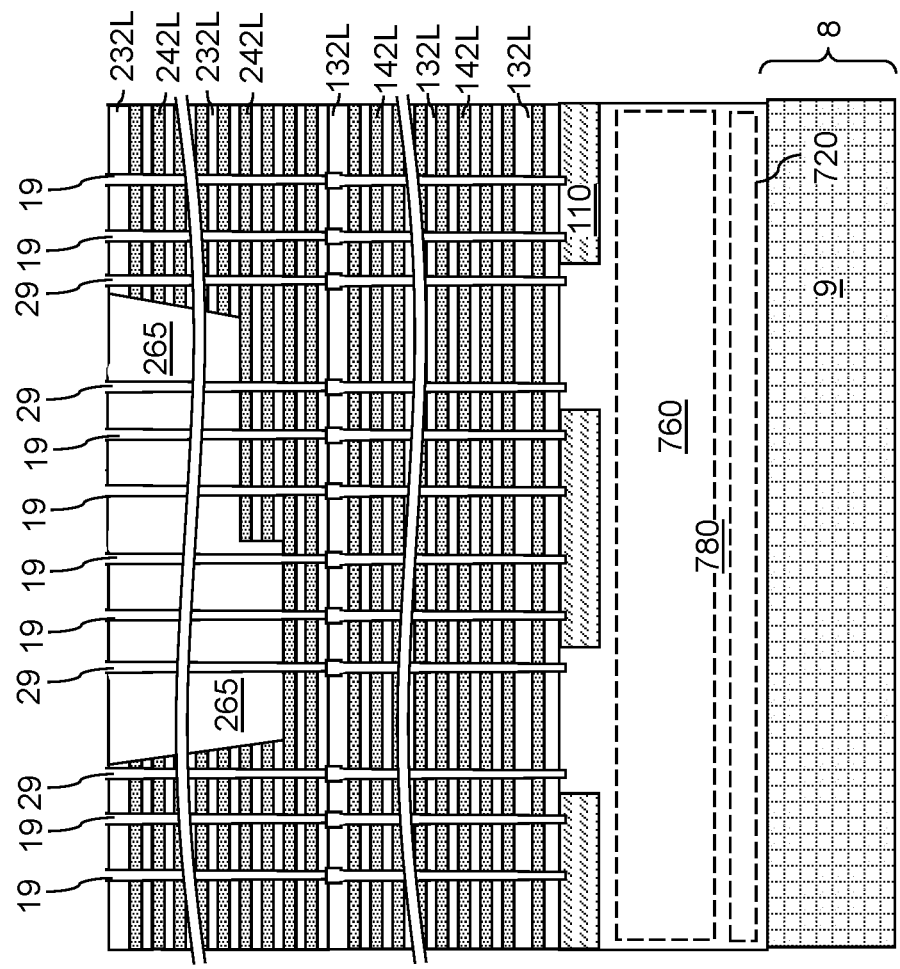
FIG. 20E is a vertical cross-sectional view along the vertical plane E-E' of FIG. 20B.
Figure 21A:
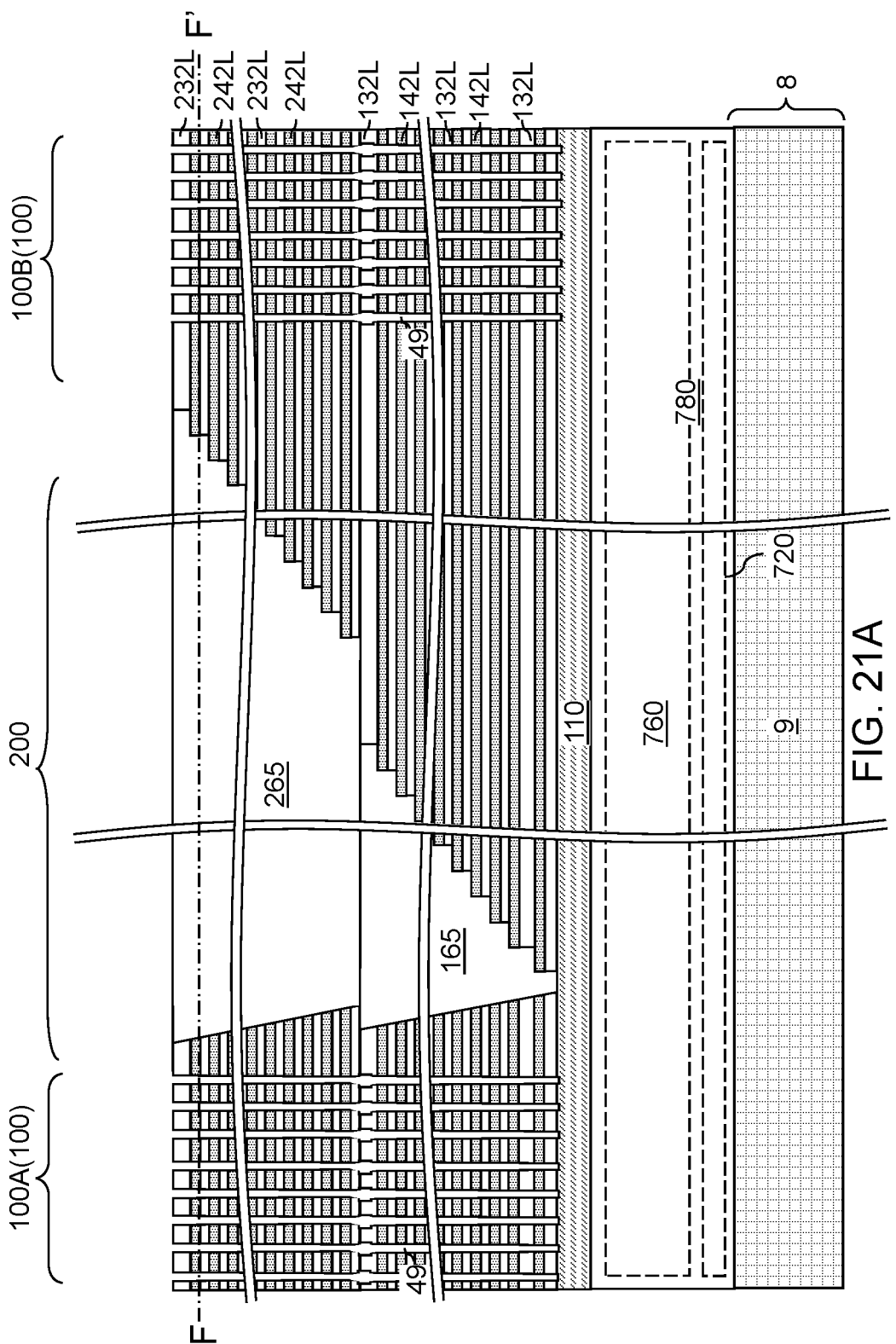
FIG. 21A is a vertical cross-sectional view of the second exemplary structure after formation of continuous perforated cavities according to an embodiment of the present disclosure.
Figure 21B:
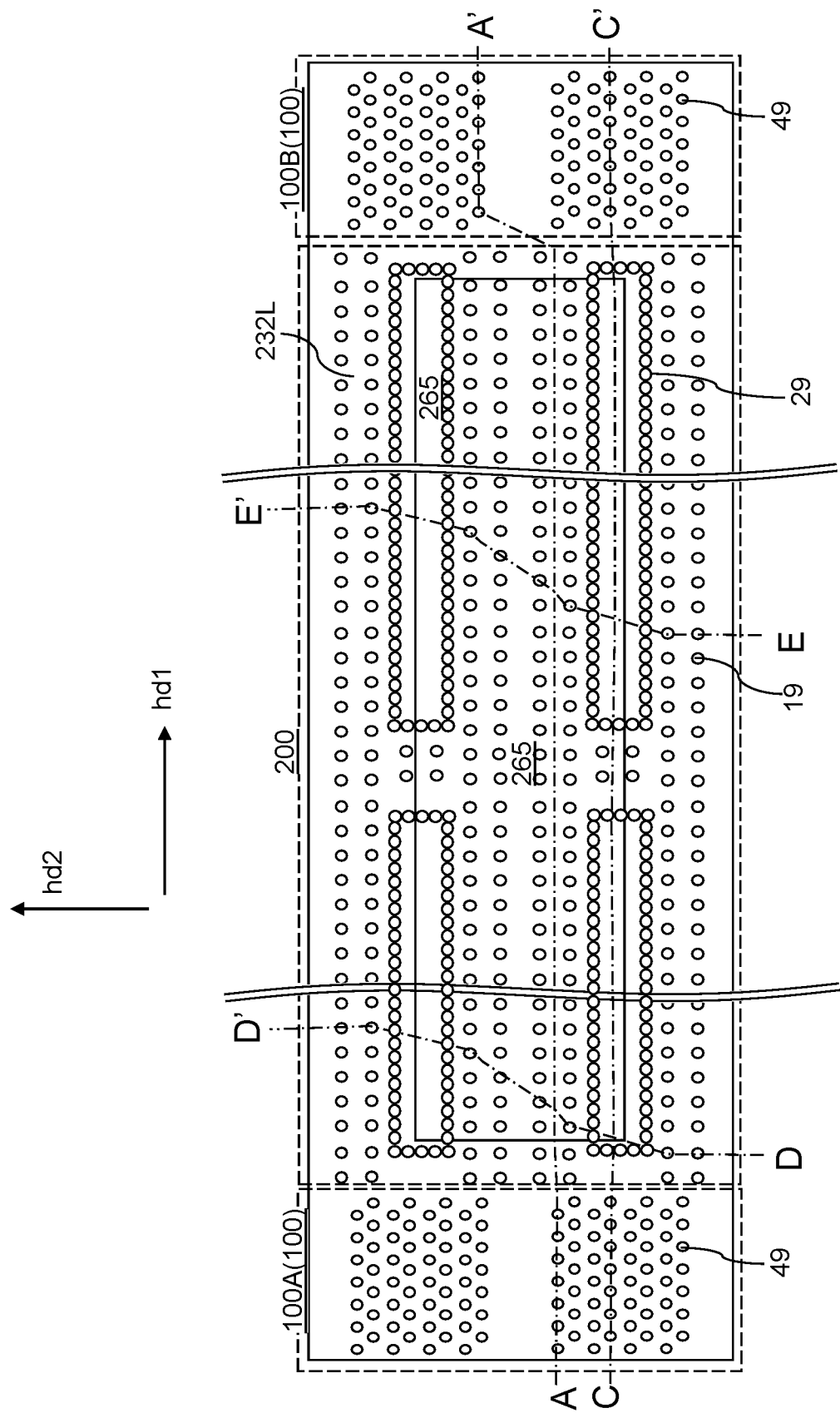
FIG. 21B is a top-down cross-sectional view of the second exemplary structure of FIG. 21A. The hinged vertical plane A-A' is the plane of the vertical cross-sectional view of FIG. 21A.
Figure 21C:
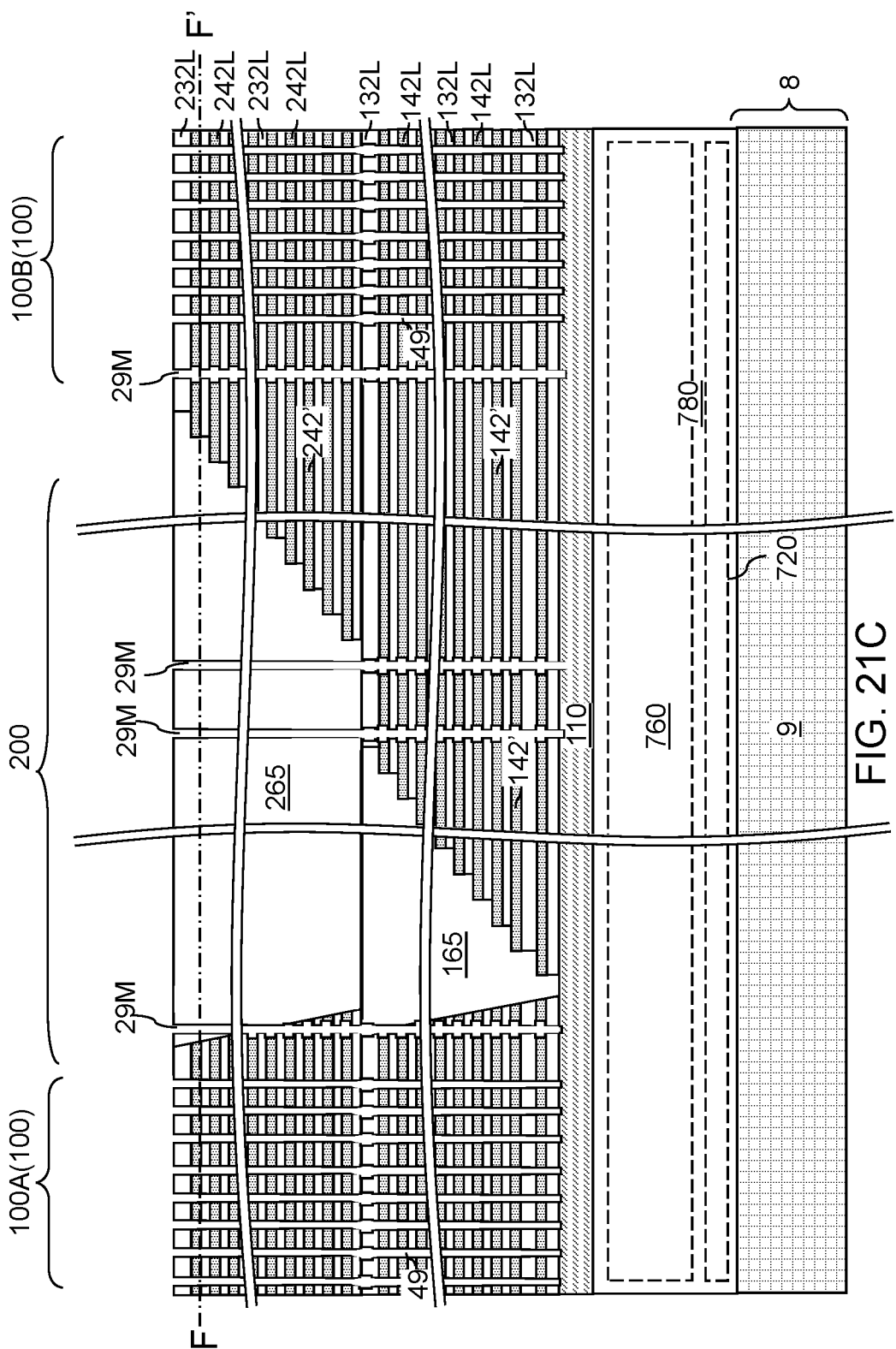
FIG. 21C is a vertical cross-sectional view along the vertical plane C-C' of FIG. 21B.
Figure 21D:
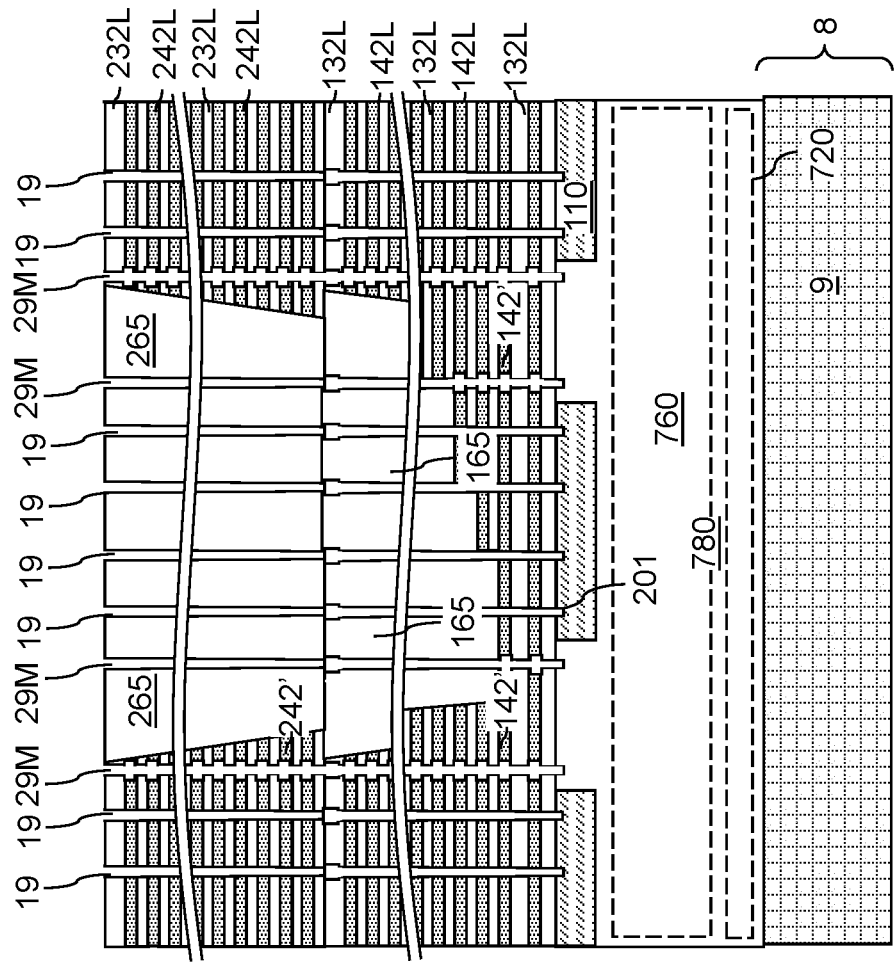
FIG. 21D is a vertical cross-sectional view along the vertical plane D-D' of FIG. 21B.
Figure 21F:
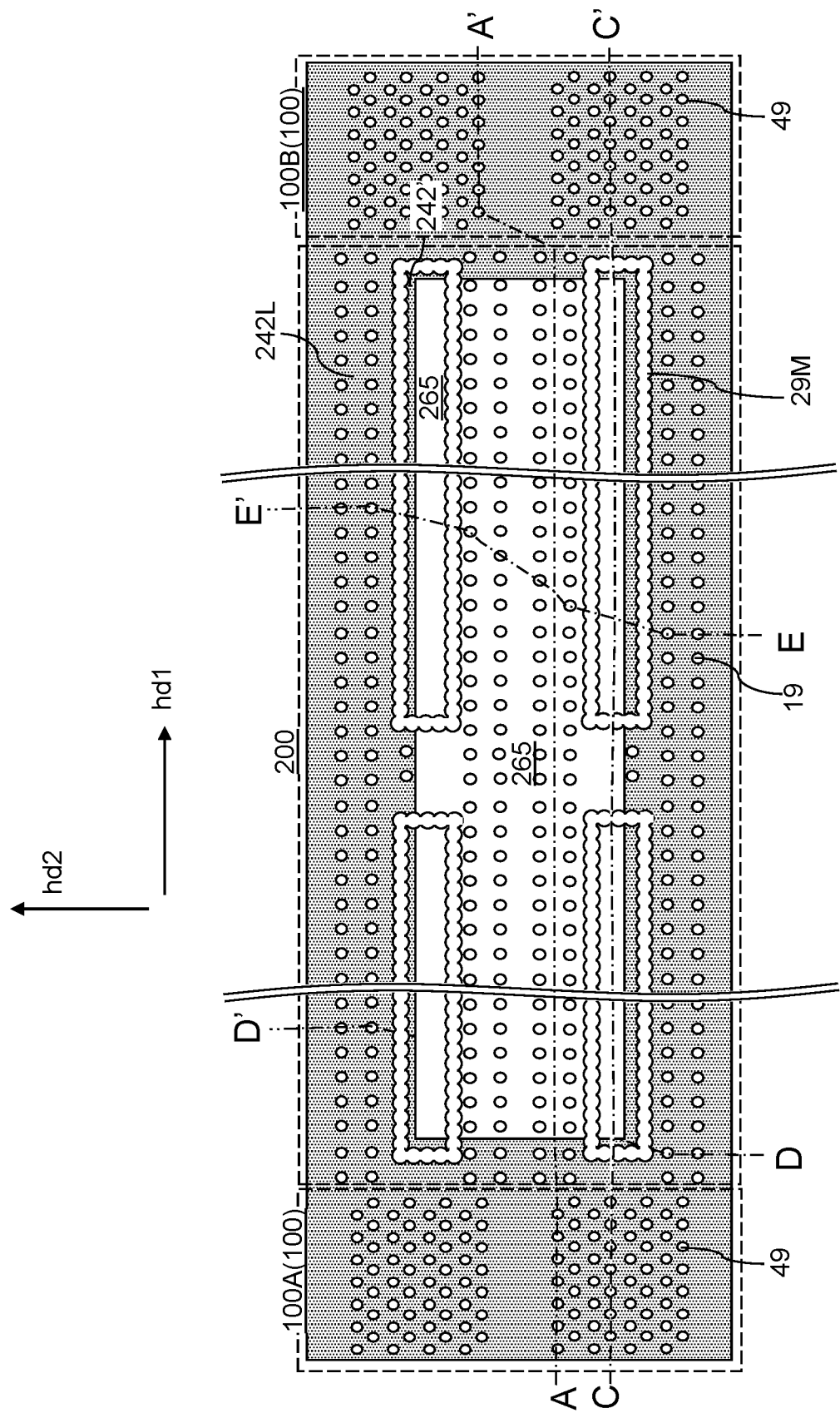
FIG. 21F is a horizontal cross-sectional view along the horizontal plane F-F' of FIGS. 21A and 21C.

The anisotropic etch process that forms the first-tier memory openings 49 and the first-tier support openings 19 forms additional openings, which are herein referred to as first-tier columnar openings. Each set of first-tier columnar openings laterally enclose an area with gaps between neighboring pairs of first-tier columnar openings. In one embodiment, a set of first-tier columnar openings may be arranged along a periphery of a rectangular area. Each set of first-tier columnar openings may be formed entirely inside areas of the first retro-stepped dielectric material portions 165, or may include a first subset of first-tier columnar openings vertically extending through a first retro-stepped dielectric material portion 165 and a second subset of first-tier columnar openings located outside the first retro-stepped dielectric material portion 165, as shown in FIG. 19B. The photoresist layer can be subsequently removed, for example, by ashing.

The processing steps of FIGS. 6A-6E can be performed to deposit a sacrificial first-tier fill material in each of the first-tier memory openings, the first-tier support openings, and the first-tier columnar openings. Excess portions of the sacrificial first-tier fill material can be removed from above the horizontal plane including a top surface of a topmost first continuous insulating layer 132L by performing a planarization process, which may include a chemical mechanical polishing (CMP) process or a recess etch process. Each remaining portion of the sacrificial first-tier fill material in the first-tier memory openings constitute a sacrificial first-tier memory opening fill portions 148. Each remaining portion of the sacrificial first-tier fill material in the first-tier support openings constitute a sacrificial first-tier support opening fill portions 118. Each remaining portion of the sacrificial first-tier fill material in the first-tier columnar openings constitute a sacrificial first-tier columnar opening fill portions 128.

According to an aspect of the present disclosure, each neighboring pair of sacrificial first-tier columnar opening fill portions 128 within each set of sacrificial first-tier columnar opening fill portions 128 laterally enclosing an area may be laterally spaced apart by a lateral spacing that is less than a maximum lateral dimension of each sacrificial first-tier columnar opening fill portions 128. For example, each sacrificial first-tier columnar opening fill portions 128 may have a maximum lateral dimension (such as a maximum diameter) in a range from 50 nm to 500 nm, such as from 100 nm to 300 nm, and each neighboring pair of sacrificial first-tier columnar opening fill portions 128 within each set of sacrificial first-tier columnar opening fill portions 128 may have a nearest neighbor spacing that is less than 500 nm, such as less than 300 nm and/or less than 200 nm.

Referring to FIGS. 20A-20E, the processing steps of FIGS. 7A-7E can be performed to form a second-tier structure including a second-tier alternating stack (232L, 242L) of second continuous insulating layers 232L and second continuous sacrificial material layers 242L, and second retro-stepped dielectric material portions 265. In one embodiment, the layout of the second retro-stepped dielectric material portions 265 may be modified such that each of the first retro-stepped dielectric material portion 165 is covered with a portion of a second retro-stepped dielectric material portion 265 having a thickness that is the same as the thickness of the second-tier structure (232L, 242L, 265).

Processing steps of FIGS. 8A-8E can be omitted. Thus, second-tier pillar structure 202 or second-tier moat trenches (275, 285) may be omitted in the second exemplary structure.

A photoresist layer can be applied over the second exemplary structure, and can be patterned in the same pattern as the pattern of the photoresist layer employed to pattern the first-tier memory openings, the first-tier support openings, and the first-tier columnar openings. An anisotropic etch process can be performed to transfer the pattern in the photoresist layer through the second-tier structure (232L, 242L, 265), thereby forming second-tier memory openings, second-tier support openings, and second-tier columnar openings. Each of the second-tier memory openings can be formed directly on top of a sacrificial first-tier memory opening fill portions 148. Each of the second-tier support openings can be formed directly on top of a sacrificial first-tier support opening fill portions 118. Each of the second-tier columnar openings can be formed directly on top of a sacrificial first-tier columnar opening fill portions 128.

An etch process can be performed to remove the sacrificial fill materials of the sacrificial first-tier memory opening fill portions 148, the sacrificial first-tier support opening fill portions 118, and the sacrificial first-tier columnar opening fill portions 128 selective to the materials of the first alternating layer stack (132L, 142L) and the second alternating layer stack (232L, 242L). Each cavity that includes a vertical stack of a volume of a second-tier memory opening and a first-tier memory opening is herein referred to as an inter-tier memory opening 49, or as a memory opening 49. Each cavity that includes a vertical stack of a volume of a second-tier support opening and a first-tier support opening is herein referred to as an inter-tier support opening 19, or as a support opening 19. Each cavity that includes a vertical stack of a volume of a second-tier columnar opening and a first-tier columnar opening is herein referred to as an inter-tier columnar opening 29, or as a columnar opening 29. The photoresist layer can be subsequently removed, for example, by ashing.

Generally, at least one stepped cavity can be formed by patterning at least one alternating layer stack {(132L, 142L) and/or (232L, 242L)}. Stepped surfaces of a respective alternating layer stack {(132L, 142L) and/or (232L, 242L)} are physically exposed underneath each of the at least one stepped cavity. A retro-stepped dielectric material portion (165 or 265) can be formed over the stepped surfaces of each of the at least one alternating layer stack {(132L, 142L) and/or (232L, 242L)}. In one embodiment, all columnar openings 29 may vertically extend through the at least one retro-stepped dielectric material portion (165, 265) and an underlying portion of the at least one alternating layer stack {(132L, 142L) and/or (232L, 242L)}. In another embodiment shown in FIGS. 20B-20E, a first subset of the columnar openings 29 within a set of columnar openings 29 that laterally enclose an area may be formed through the at least one alternating layer stack {(132L, 142L) and/or (232L, 242L)}, and may be spaced from, and thus, does not contact, the at least one retro-stepped dielectric material portion (165, 265). A second subset of the columnar openings of the set of columnar openings 29 may vertically extend through the at least one retro-stepped dielectric material portion (165, 265) and an underlying portion of the at least one alternating layer stack {(132L, 142L) and/or (232L, 242L)}.

Referring to FIGS. 21A-21F, the memory openings 49 and the support openings 19 may be covered with a patterned etch mask layer (not illustrated), which may comprise a patterned photoresist layer. The patterned etch mask layer comprises an opening overlying the columnar openings 29. Thus, the patterned etch mask layer covers the memory openings 49 and the support openings 19, and does not cover the columnar openings 29. The patterned etch mask layer may fill the memory openings 49 and the support openings 19 fully or partially.

According to an aspect of the present disclosure, an isotropic etch process can be performed laterally recesses the continuous sacrificial material layers (142L, 242L) around the columnar openings 29 selective to the continuous insulating layers (132L, 232L). For example, if the continuous insulating layers (132L, 232L) comprise undoped silicate or a doped silicate glass, and if the continuous sacrificial material layers (142L, 242L) comprise silicon nitride, the isotropic etch process may comprise a wet etch process employing hot phosphoric acid or a combination of buffered hydrofluoric acid and phosphoric acid. Portions of the continuous sacrificial material layers (142L, 242L) are isotropically etched around the columnar openings 29, while the continuous insulating layers (132L, 232L) and the retro-stepped dielectric material portions (165, 265) are not etched.

The duration of the isotropic etch process can be selected such that the recessed sidewalls of the continuous sacrificial material layers (142L, 242L) merge around each cluster of columnar openings 29 that laterally surrounds a respective area. Thus, each cluster of columnar openings 29 that laterally surrounds a respective area become a single continuous cavity, which is herein referred to as a continuous perforated cavity 29M, as shown in FIGS. 21C-21F. The isotropic etch process can be selective to the materials of the continuous insulating layers (132L, 232L) and the retro-stepped dielectric material portions (165, 265) so that sidewalls of the continuous insulating layers (132L, 232L) are not etched by the isotropic etch process. Thus, each continuous perforated cavity 29M includes a single interconnected volume at each level of the continuous sacrificial material layers (142L, 242L), and includes a plurality of discrete volumes that are laterally spaced among one another at each level of the continuous insulating layers (132L, 232L) and within each of the retro-stepped dielectric material portions (165, 265).

In an illustrative example, each columnar opening 29 may have a maximum lateral dimension (such as a maximum diameter) in a range from 50 nm to 500 nm, such as from 100 nm to 300 nm, and each neighboring pair of columnar openings 29 within each cluster of columnar openings 29 may have a nearest neighbor spacing that is less than 500 nm, such as less than 300 nm and/or less than 200 nm. In this case, the lateral recess distance of the isotropic etch process may be in a range from 55% to 100% of the nearest neighbor spacing within each cluster of columnar openings 29. Generally, each continuous perforated cavity 29M can be formed by isotropically etching portions of the continuous sacrificial material layers (142L, 242L) around a set of columnar openings 29 that laterally surrounds an area within the inter-array region 200. Volumes of the columnar openings 29 expand at levels of the continuous sacrificial material layers (142L, 242L) and merge to form a continuous perforated cavity 29M. Each continuous perforated cavity 29M comprises a plurality of pillar cavity segments that are located at levels of the continuous insulating layers (132L, 232L).

Each patterned portion of the continuous sacrificial material layers (142L, 242L) that is laterally enclosed by a laterally-extending portion of a continuous perforated cavity 29M, or by a combination of a laterally-extending portion of a continuous perforated cavity 29M and a retro-stepped dielectric material portion (165, 265) constitutes a dielectric material plate (142', 242'). The dielectric material plates (142', 242') include first dielectric material plates 142' that are patterned portions of the first continuous sacrificial material layers 142L, and second dielectric material plates 242' that are patterned portions of the second continuous sacrificial material layers 242L.

Referring to FIGS. 22A-22F, the processing steps of FIGS. 10A-10D can be subsequently performed to form memory opening fill structures 58 in the memory openings 49. The processing steps of FIGS. 10A-10D collaterally form support pillar structures 18 within each of the support openings 19 and a perforated wall structure 28 within each continuous perforated cavity 29M. Thus, the support pillar structures 18 and the perforated wall structures 28 can be formed simultaneously with formation of the memory opening fill structures 58 by deposition of a same set of fill materials within each of the memory openings 49, each of the support openings 19, and within the continuous perforated cavities 29M.

Thus, each of the memory opening fill structures 58 comprises a memory film 50, a vertical semiconductor channel 60, and a dielectric core 62, each of the support pillar structures 18 comprises a dummy memory film, a semiconductor material layer (e.g., semiconductor liner), and a dielectric fill material portion, and each of the perforated wall structure 28 comprises a dummy memory film, a semiconductor liner, and a dielectric fill material portion. Each dummy memory film of the support pillar structures 18 and the perforated wall structures 28 has a respective layer stack having a same set of materials and a same thickness as a memory film 50. Each semiconductor liner of the support pillar structures 18 and the perforated wall structures 28 has a respective layer stack having a same set of materials and a same thickness as a vertical semiconductor channel. Each dielectric fill material portion of the support pillar structures 18 and the perforated wall structures 28 has a same material composition as the dielectric core 62.

In one embodiment, each of the perforated wall structures 28 may include lateral openings at levels of the continuous insulating layers (132L, 232L), through which a respective continuous insulating layer (132L, 232L) laterally extends from outside the perforated wall structure 28 into inside the perforated wall structure 28.

In one embodiment, each perforated wall structure 28 may comprise a dummy memory film having a set of material compositions and a same total thickness as a memory film 50, a semiconductor liner having a same thickness and a same material composition as a vertical semiconductor channel 60, and a dielectric fill material portion having a same material composition as a dielectric core 62. In one embodiment, a topmost surface of each perforated wall structure 28 may be located within a same horizontal plane as top surfaces of the memory opening fill structures 58. In one embodiment, each perforated wall structure 28 may comprises a plurality of pillar portions that are laterally spaced apart at each level of the continuous insulating layers (132L, 232L). Each of the pillar portions may vertically extend between a horizontal plane including a bottom surface of a respective continuous insulating layer (132L, 232L) to a horizontal plane including a top surface of the respective continuous insulating layer (132L, 232L). In one embodiment, each perforated wall structure 28 may comprise a laterally-extending portion that underlies, and is adjoined to, a respective plurality of pillar portions of the respective perforated wall structure 28 at each level of the continuous sacrificial material layers (142L, 242L).

In one embodiment, a retro-stepped dielectric material portion (165, 265) may overlie stepped surfaces of at least one alternating layer stack {(132L, 142L), (232L, 242L)}. A perforated wall structure 28 may vertically extend through the retro-stepped dielectric material portion (165, 265). In one embodiment shown in FIGS. 22E and 22F, the perforated wall structure 28 comprises a plurality of columnar portions 28C that are laterally spaced apart and vertically extend through the retro-stepped dielectric material portion (165, 265) with a respective uniform or substantially uniform horizontal cross-sectional area. In one embodiment, the plurality of columnar portions 28C is adjoined to a laterally-extending portion 28L of the perforated wall structure 28 that underlies the retro-stepped dielectric material portion (165, 265).

In one embodiment, portions of the perforated wall structure 28 located at a level of one of the continuous sacrificial material layers (142L, 242L), i.e., located between a horizontal plane including a bottom surface of one of the continuous sacrificial material layers (142L, 242L) and a horizontal plane including a top surface of the one of the continuous sacrificial material layers (142L, 242L), comprises a laterally-extending portion 28L located outside an area of the retro-stepped dielectric material portion (165, 265) and continuously extends from a sidewall of the retro-stepped dielectric material portion (165, 265) and another sidewall of the retro-stepped dielectric material portion (165, 265), and comprises segments of a plurality of columnar portions 28C that are laterally spaced apart and embedded within the retro-stepped dielectric material portion. In an alternative embodiment, the entire perforated wall structure 28 is located inside the area of the retro-stepped dielectric material portion (165, 265).

Figure 22A:
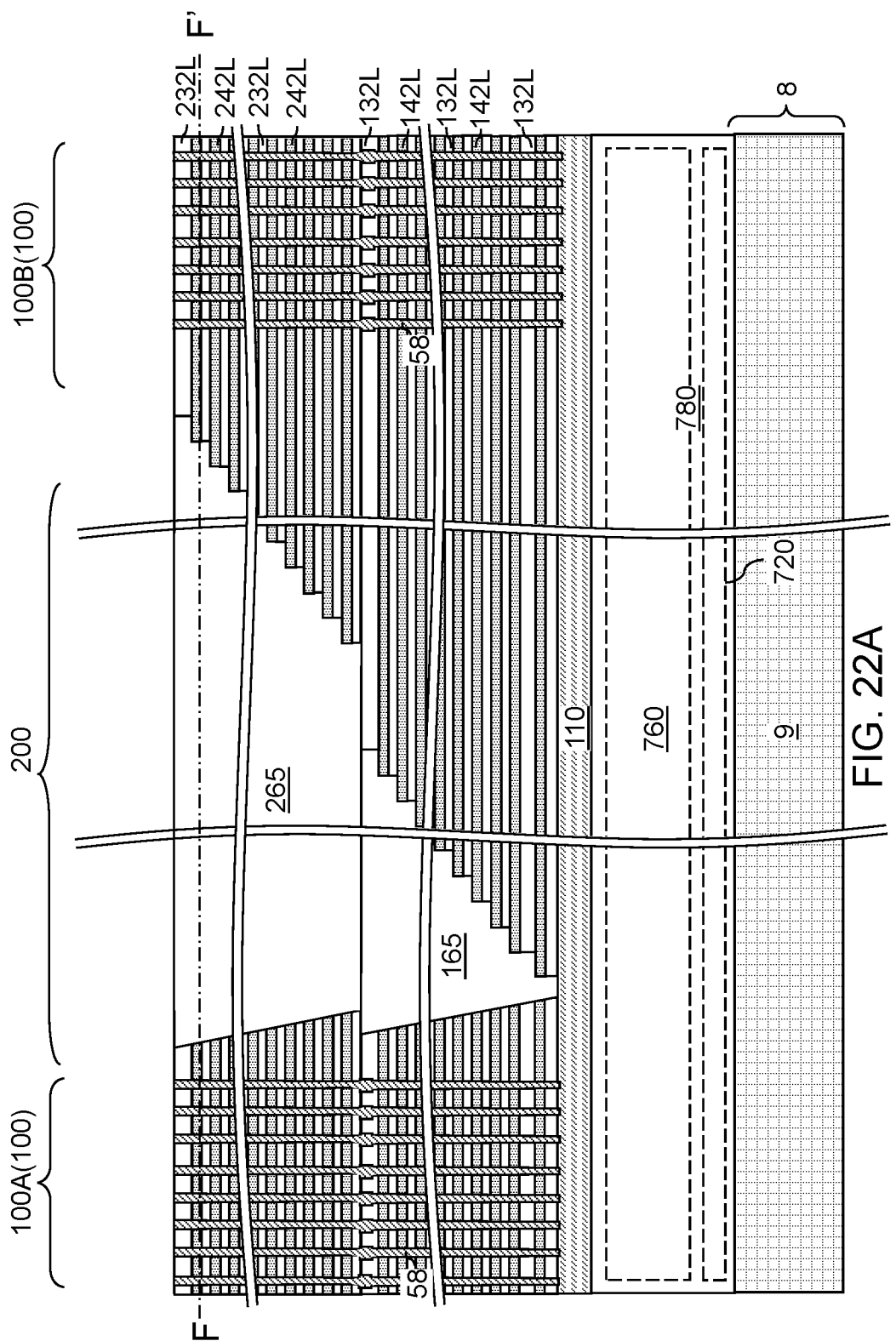
FIG. 22A is a vertical cross-sectional view of the second exemplary structure after formation of memory opening fill structures, support pillar structures, and perforated wall structures according to an embodiment of the present disclosure.
Figure 22B:
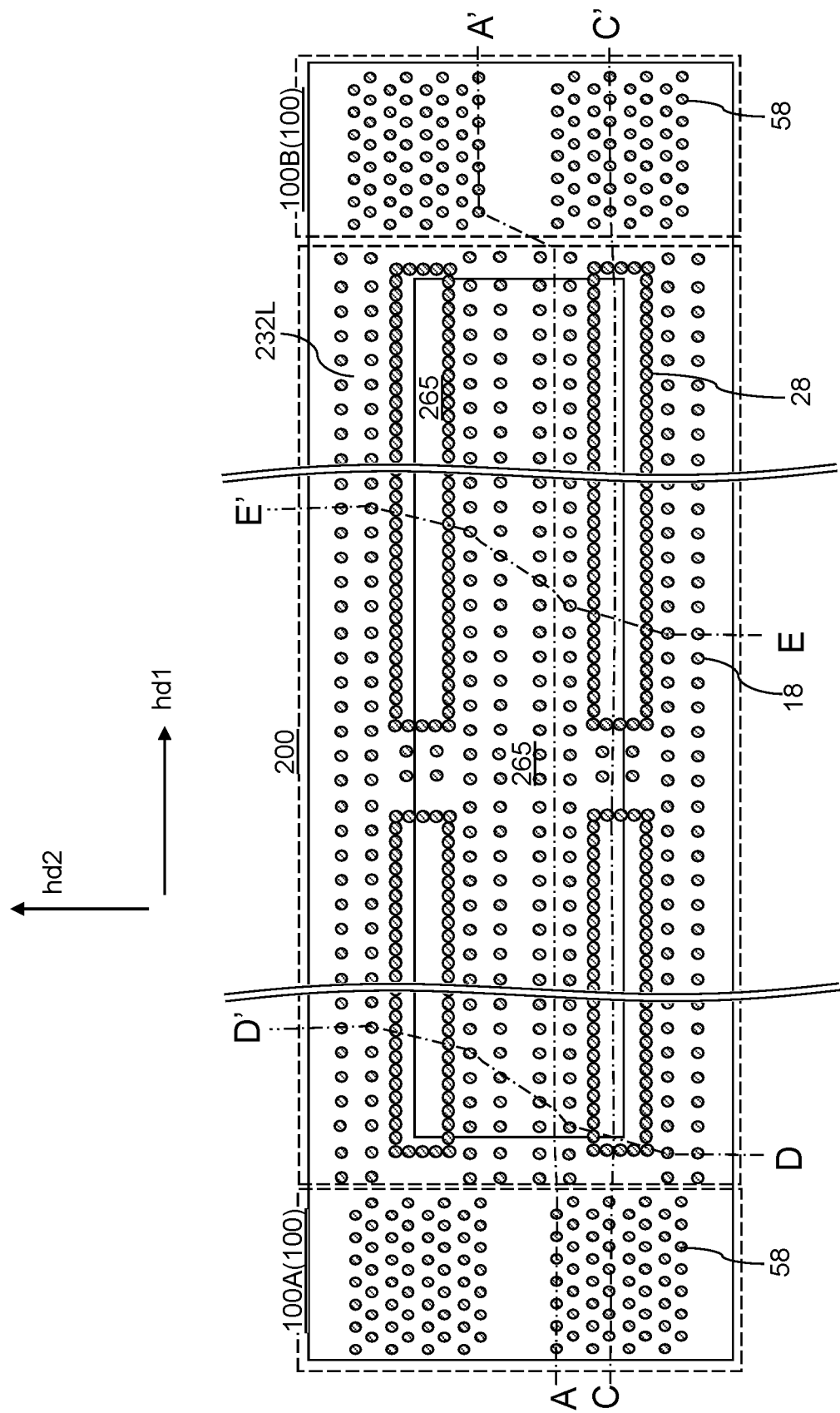
FIG. 22B is a top-down cross-sectional view of the second exemplary structure of FIG. 22A. The hinged vertical plane A-A' is the plane of the vertical cross-sectional view of FIG. 22A.
Figure 22C:
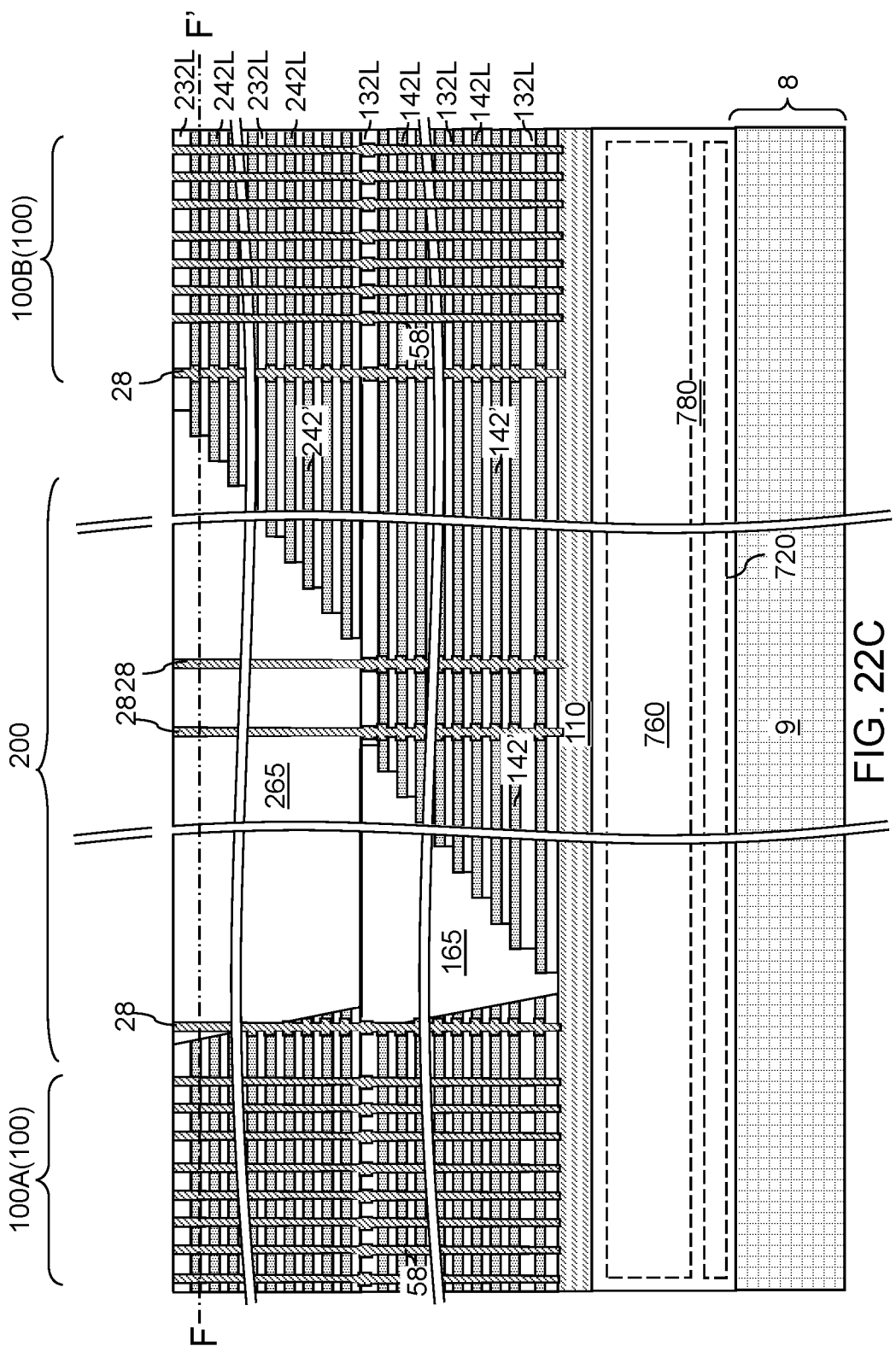
FIG. 22C is a vertical cross-sectional view along the vertical plane C-C' of FIG. 22B.
Figure 22D:
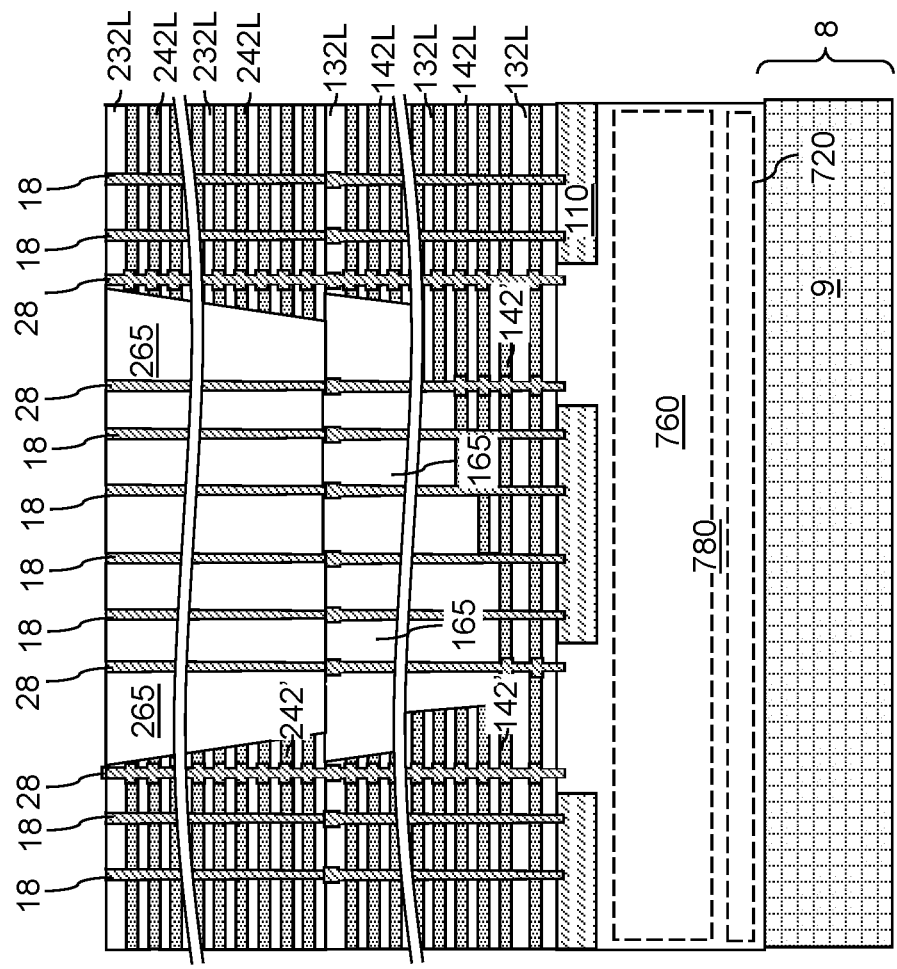
FIG. 22D is a vertical cross-sectional view along the vertical plane D-D' of FIG. 22B.
Figure 22E:
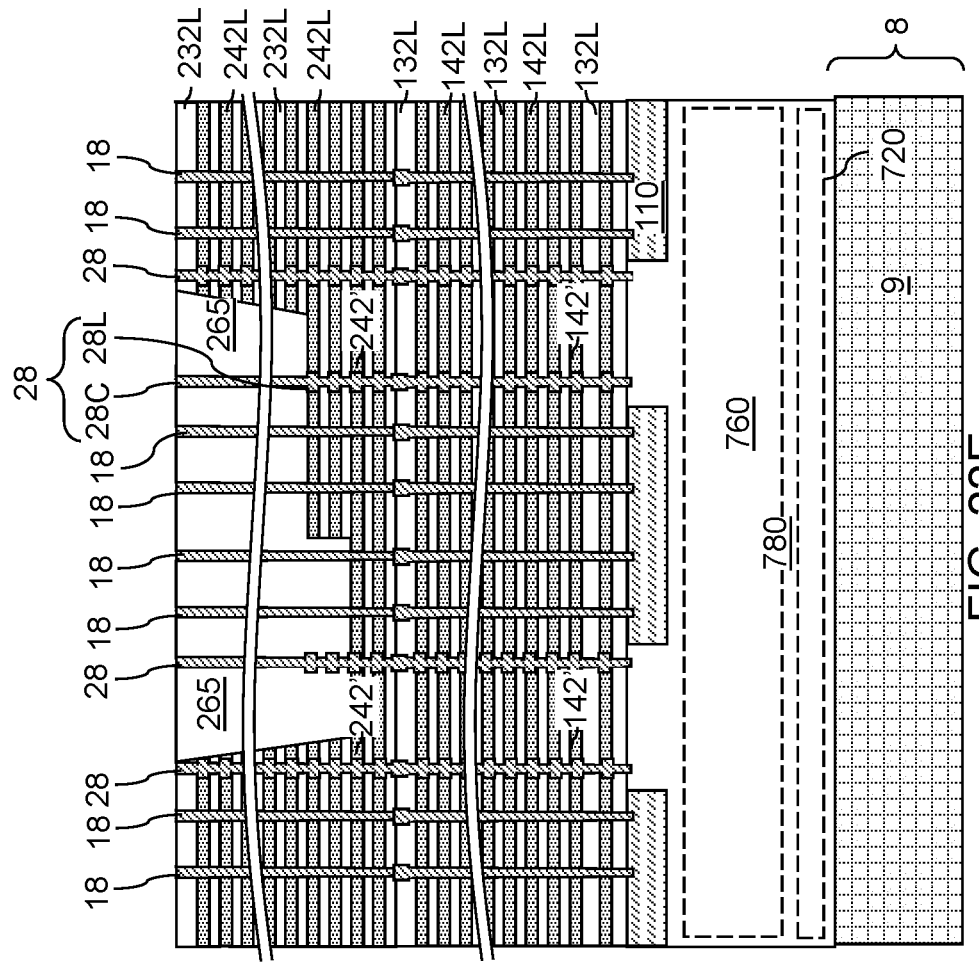
FIG. 22E is a vertical cross-sectional view along the vertical plane E-E' of FIG. 22B.
Figure 22F:
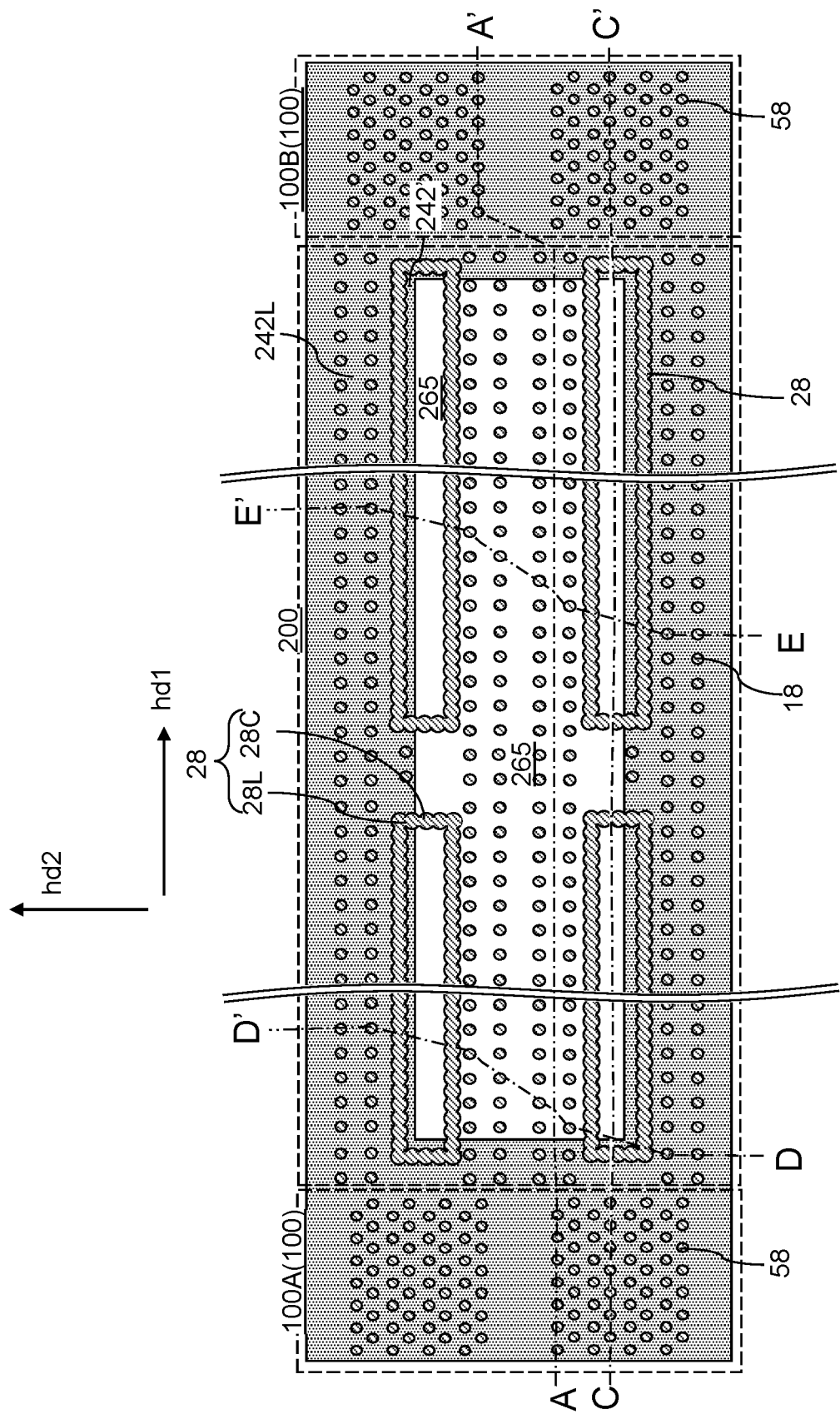
FIG. 22F is a horizontal cross-sectional view along the horizontal plane F-F' of FIGS. 22A and 22C.
Figure 23B:
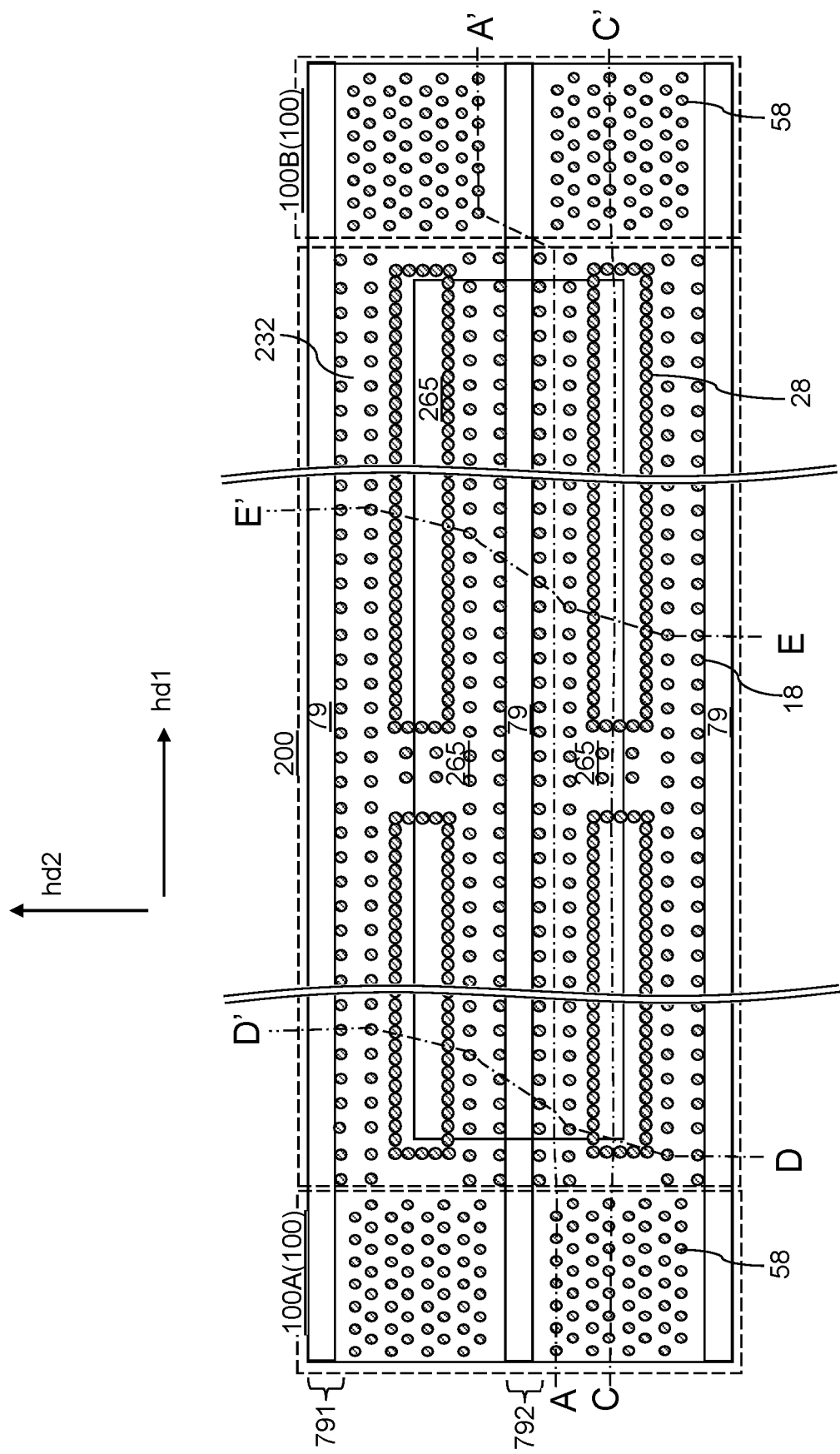
FIG. 23B is a horizontal cross-sectional view along the horizontal plane B-B' of FIG. 23A. The hinged vertical plane A-A' is the plane of the vertical cross-sectional view of FIG. 23A.
Figure 23D:
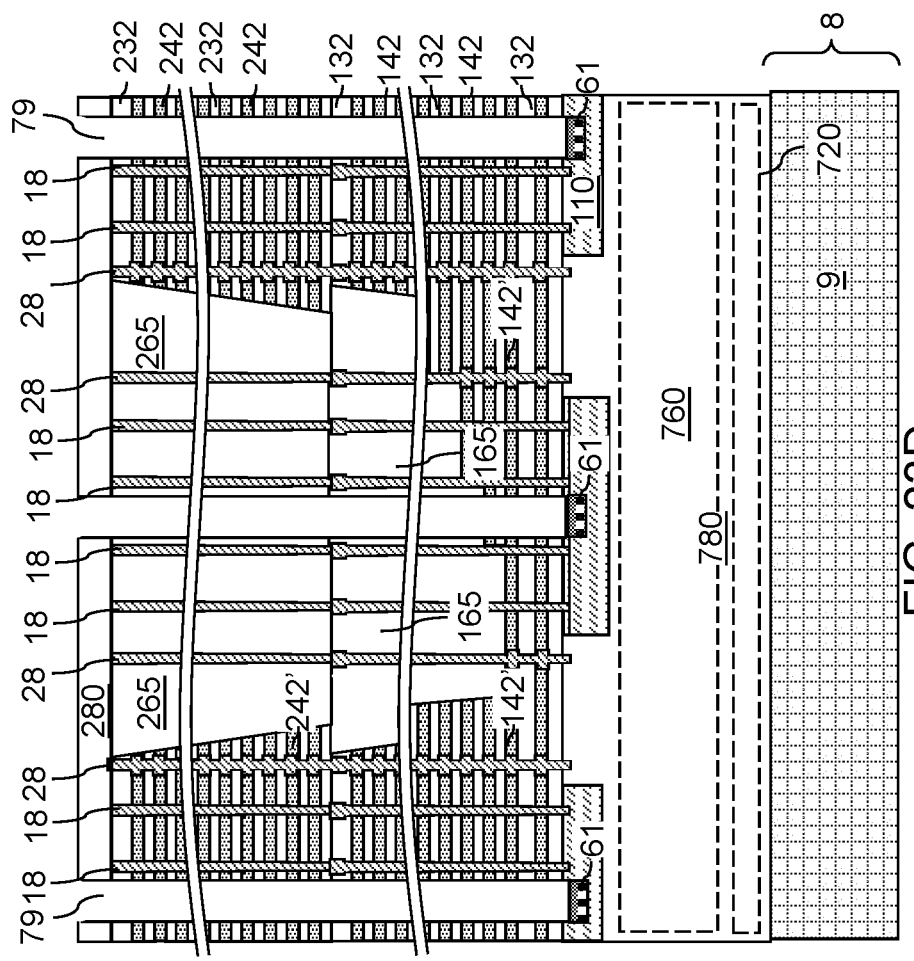
FIG. 23D is a vertical cross-sectional view along the vertical plane D-D' of FIG. 23B.
Figure 23E:
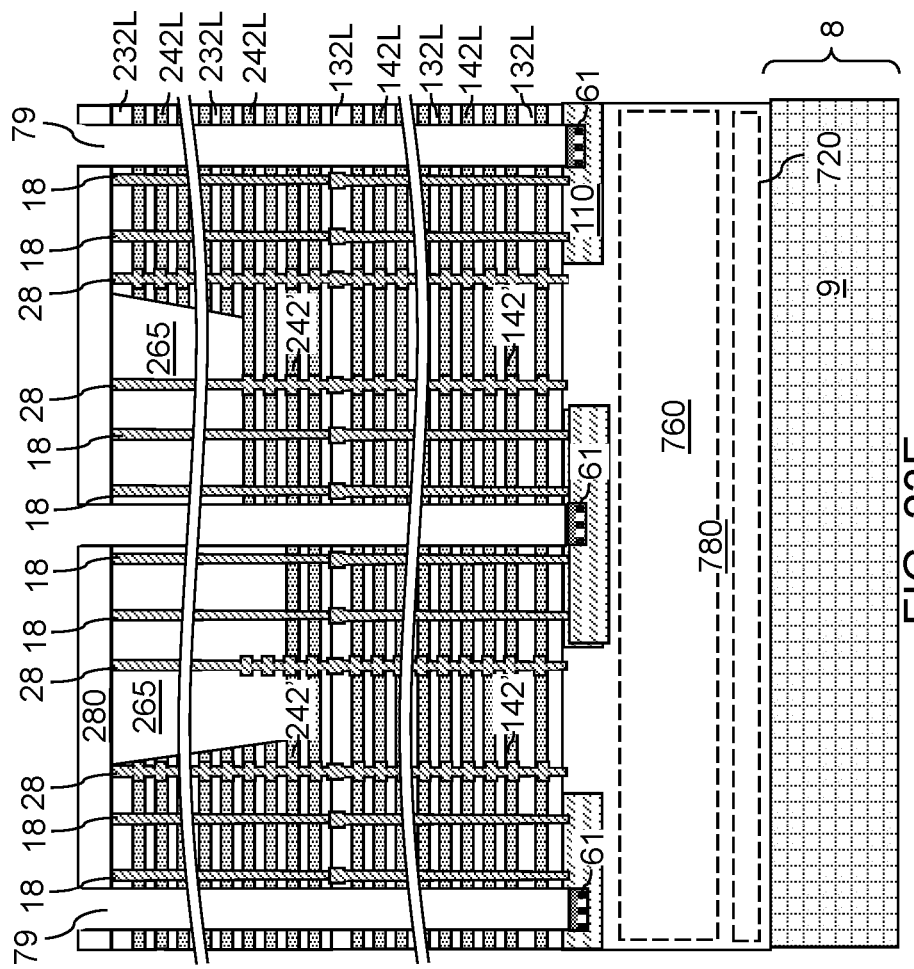
FIG. 23E is a vertical cross-sectional view along the vertical plane E-E' of FIG. 23B.
Figure 23F:
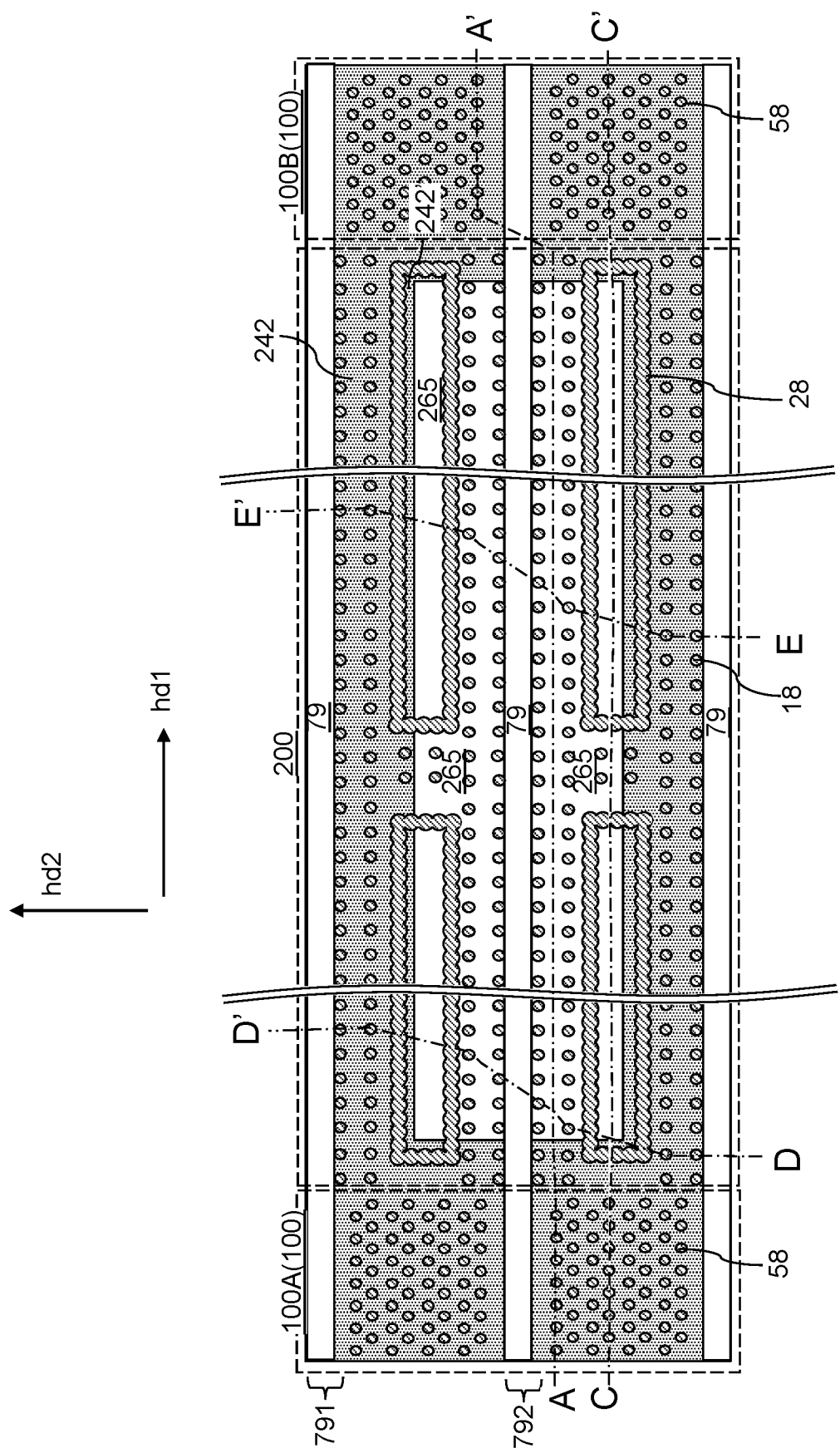
FIG. 23F is a horizontal cross-sectional view along the horizontal plane F-F' of FIGS. 23A and 23C.
Figure 24B:
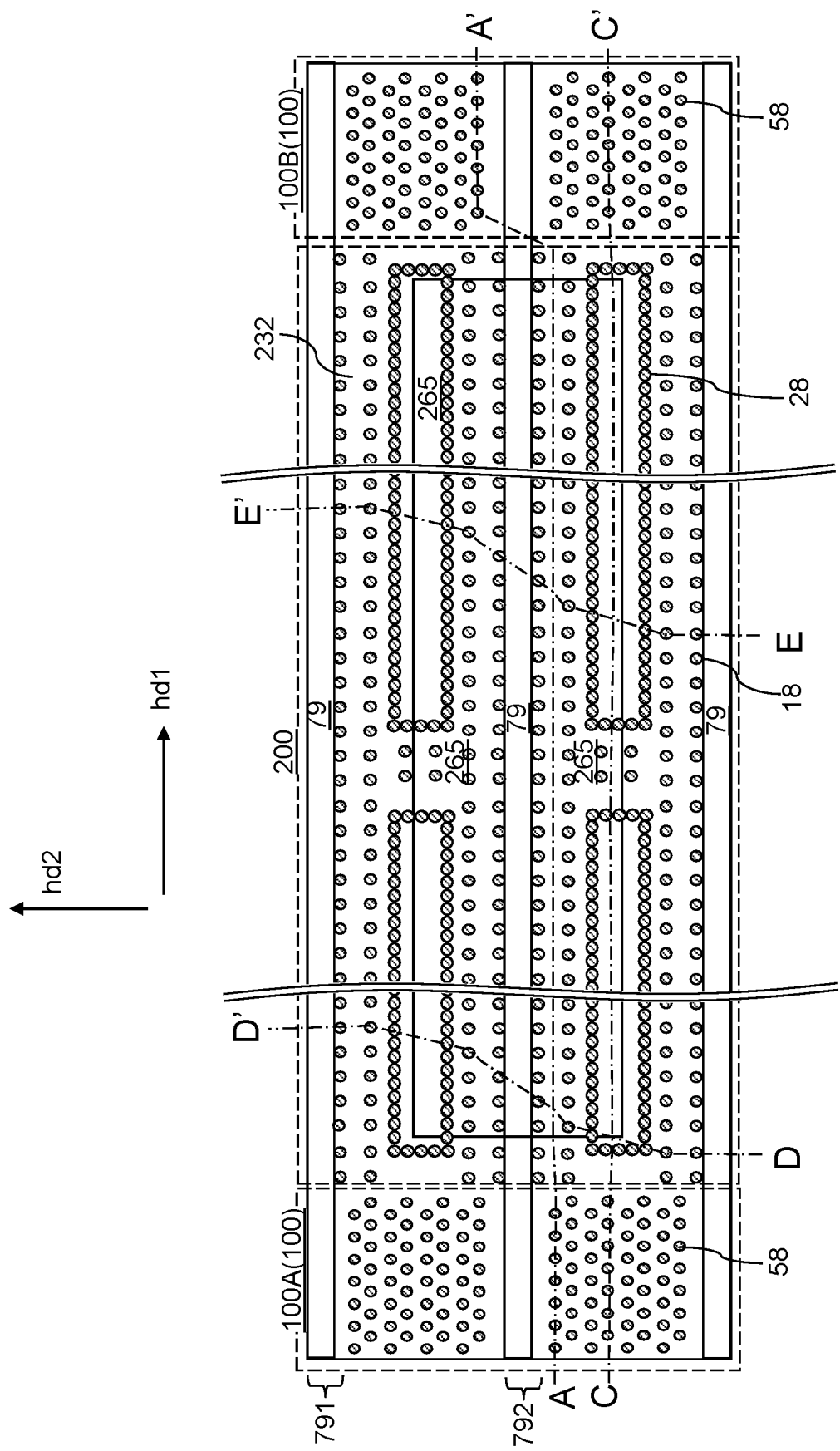
FIG. 24B is a horizontal cross-sectional view along the horizontal plane B-B' of FIG. 24A. The hinged vertical plane A-A' is the plane of the vertical cross-sectional view of FIG. 24A.
Figure 24C:
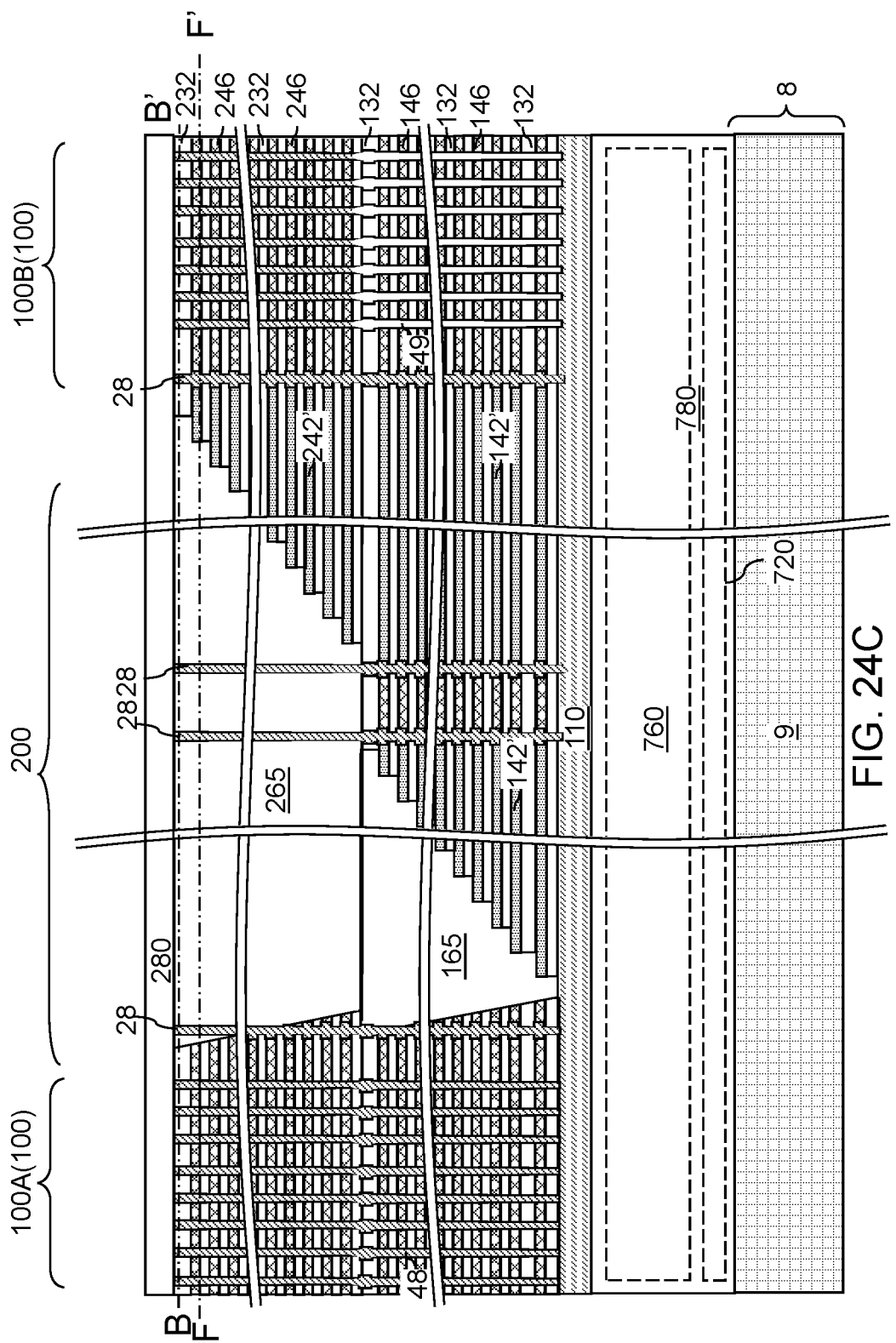
FIG. 24C is a vertical cross-sectional view along the vertical plane C-C' of FIG. 24B.
Figure 24D:
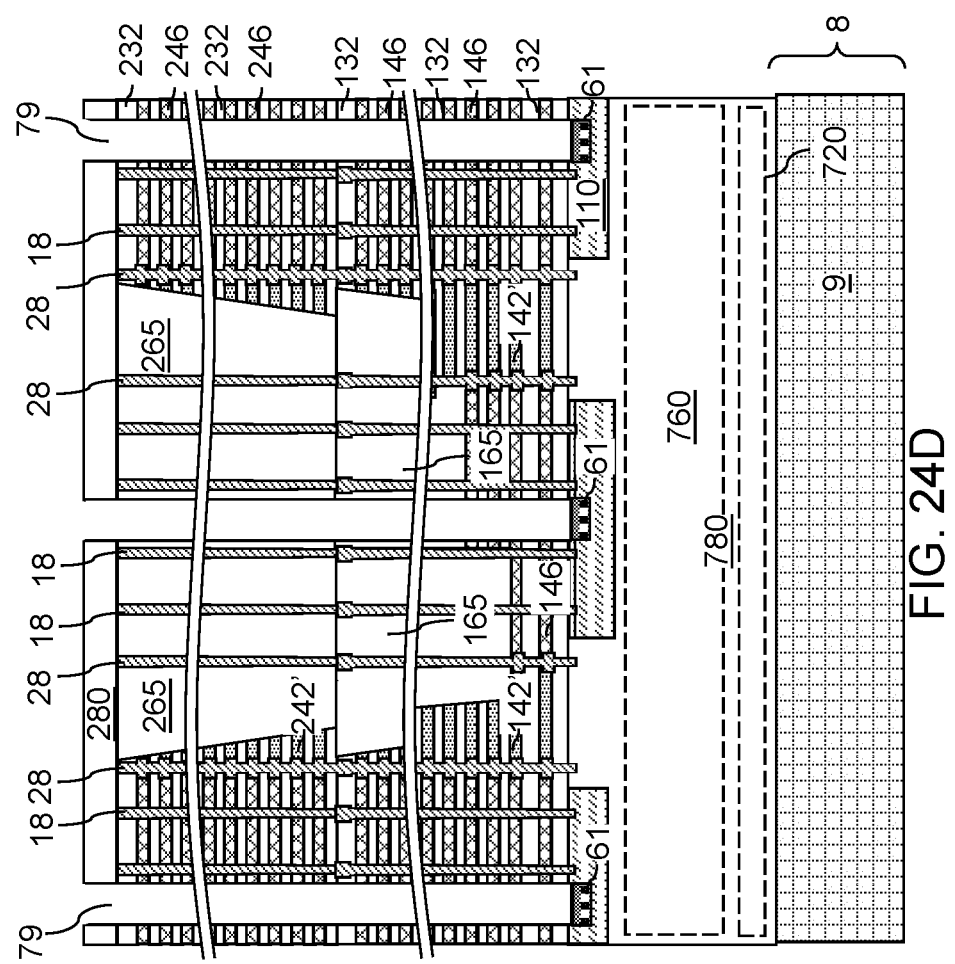
FIG. 24D is a vertical cross-sectional view along the vertical plane D-D' of FIG. 24B.
Figure 24E:
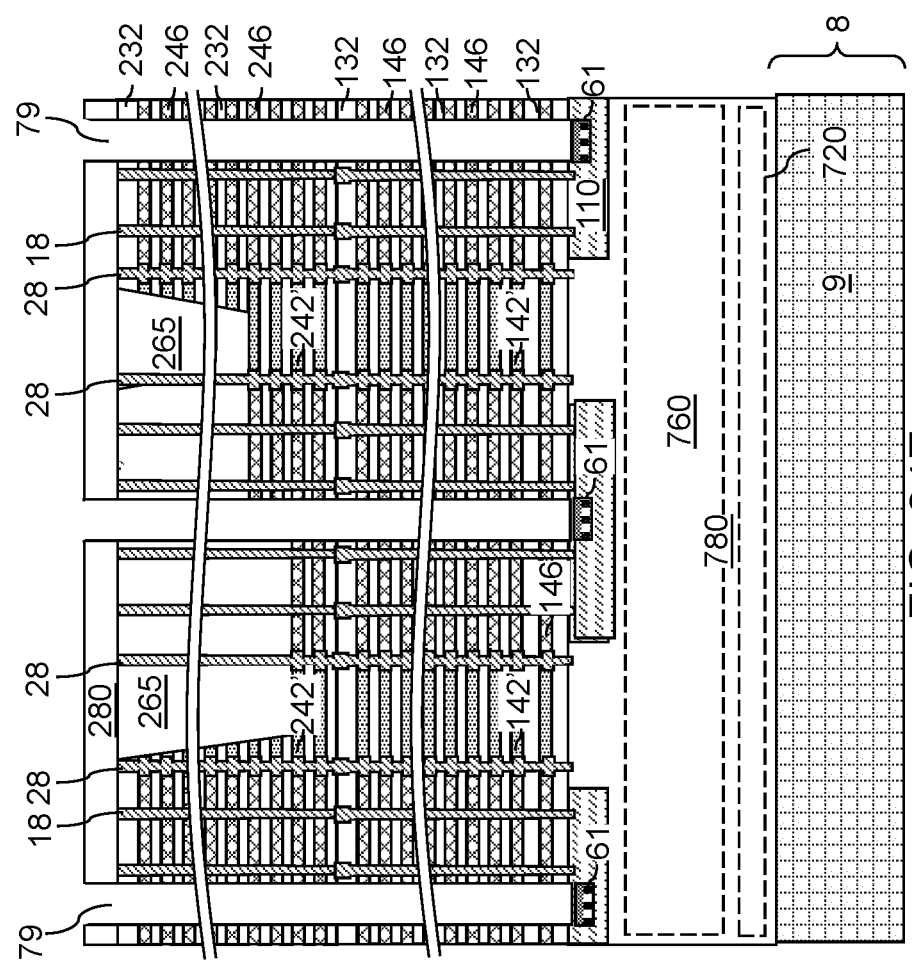
FIG. 24E is a vertical cross-sectional view along the vertical plane E-E' of FIG. 24B.
Figure 24F:
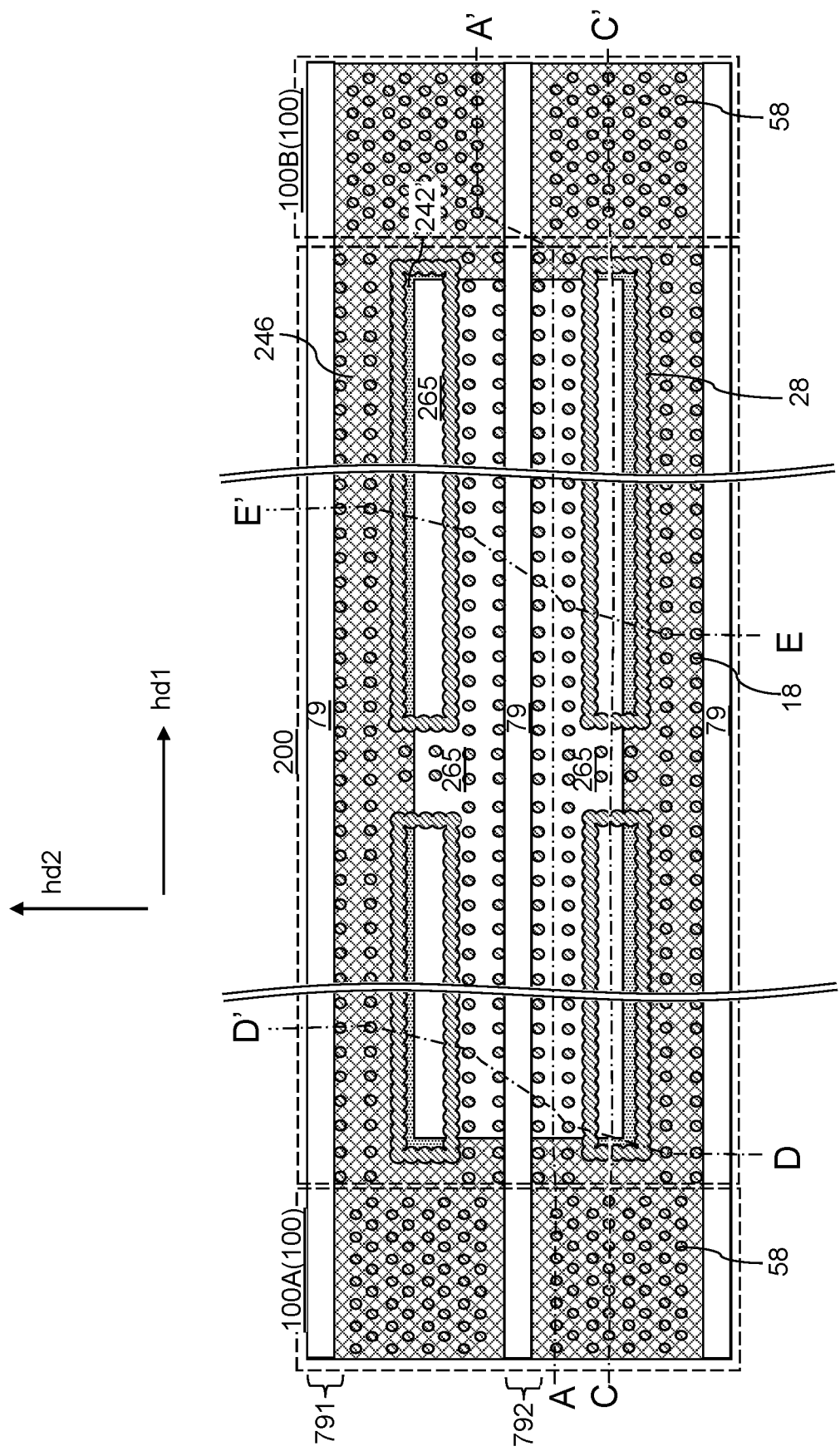
FIG. 24F is a horizontal cross-sectional view along the horizontal plane F-F' of FIGS. 24A and 24C.
Figure 25A:
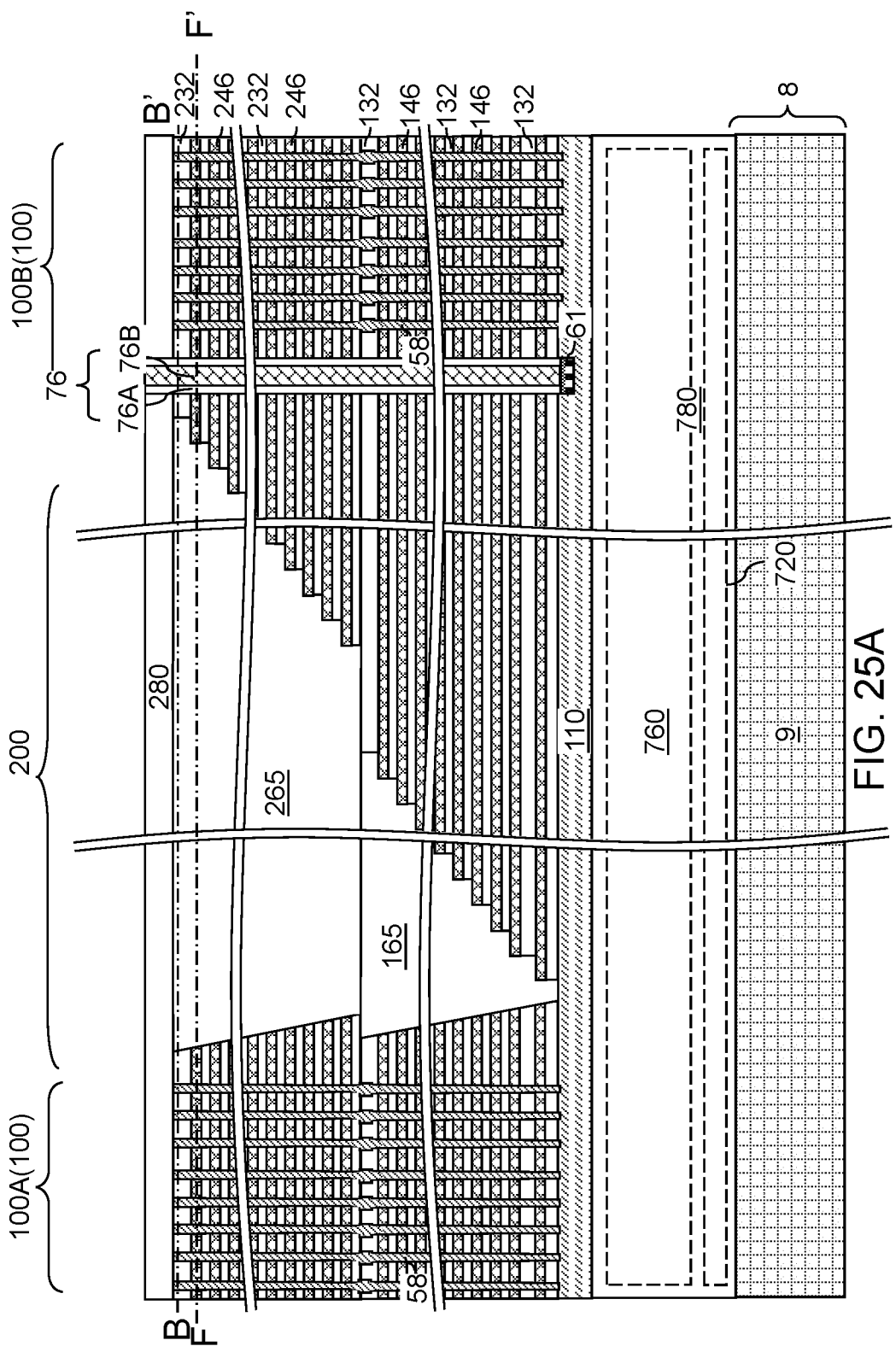
FIG. 25A is a vertical cross-sectional view of the second exemplary structure after formation of line trench fill structures according to an embodiment of the present disclosure.
Figure 25B:
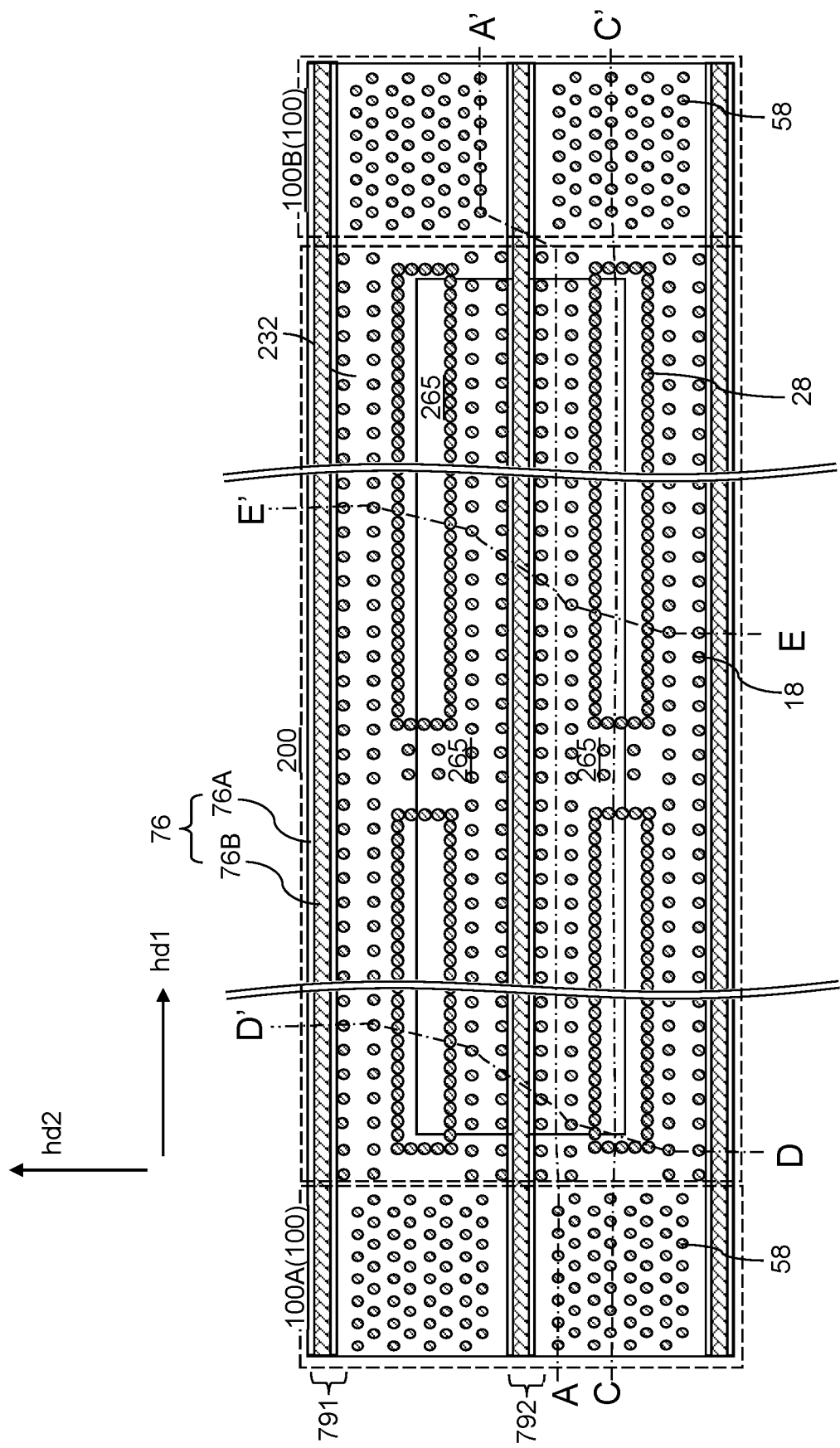
FIG. 25B is a horizontal cross-sectional view along the horizontal plane B-B' of FIG. 25A. The hinged vertical plane A-A' is the plane of the vertical cross-sectional view of FIG. 25A.
Figure 25C:
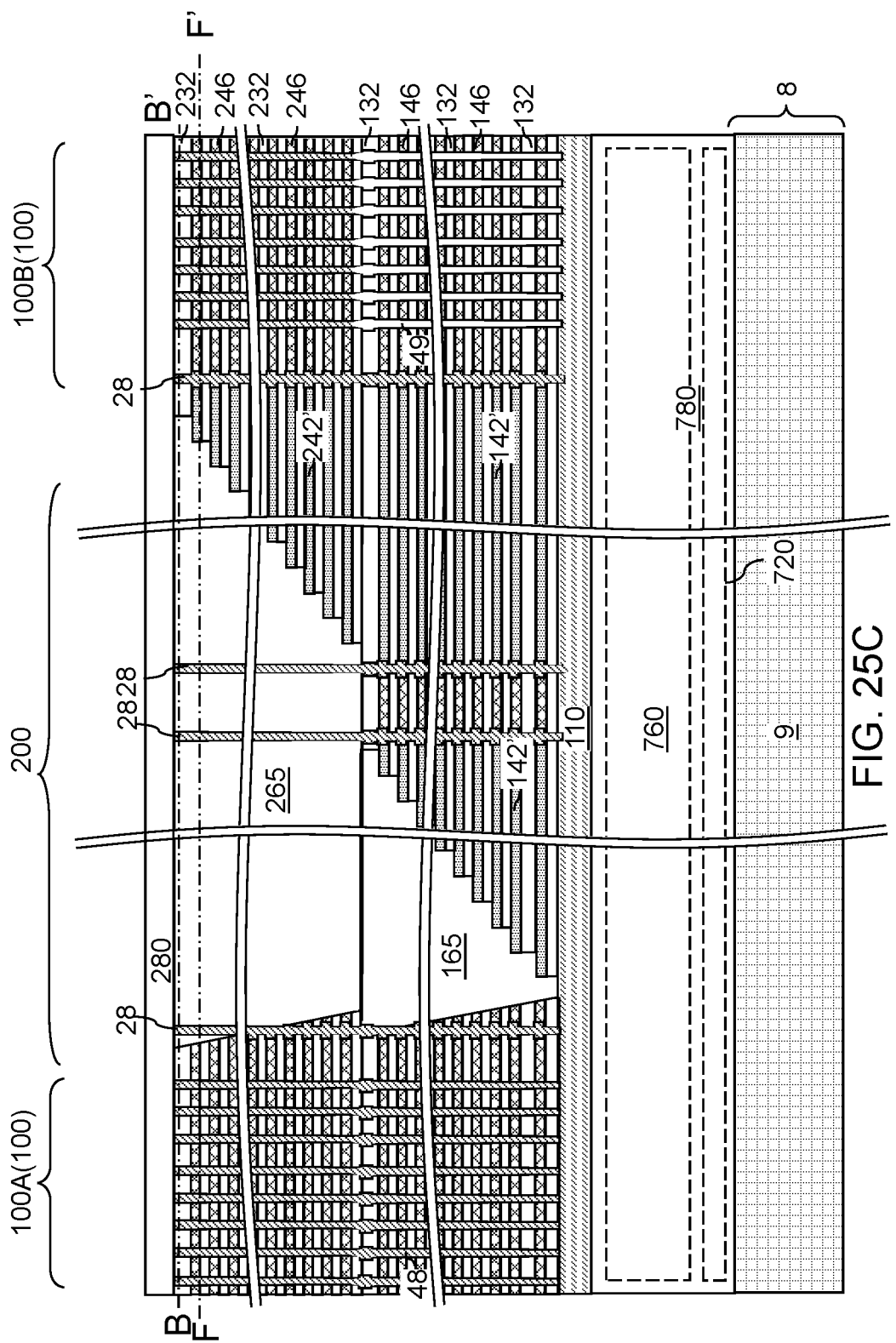
FIG. 25C is a vertical cross-sectional view along the vertical plane C-C' of FIG. 25B.
Figure 25D:
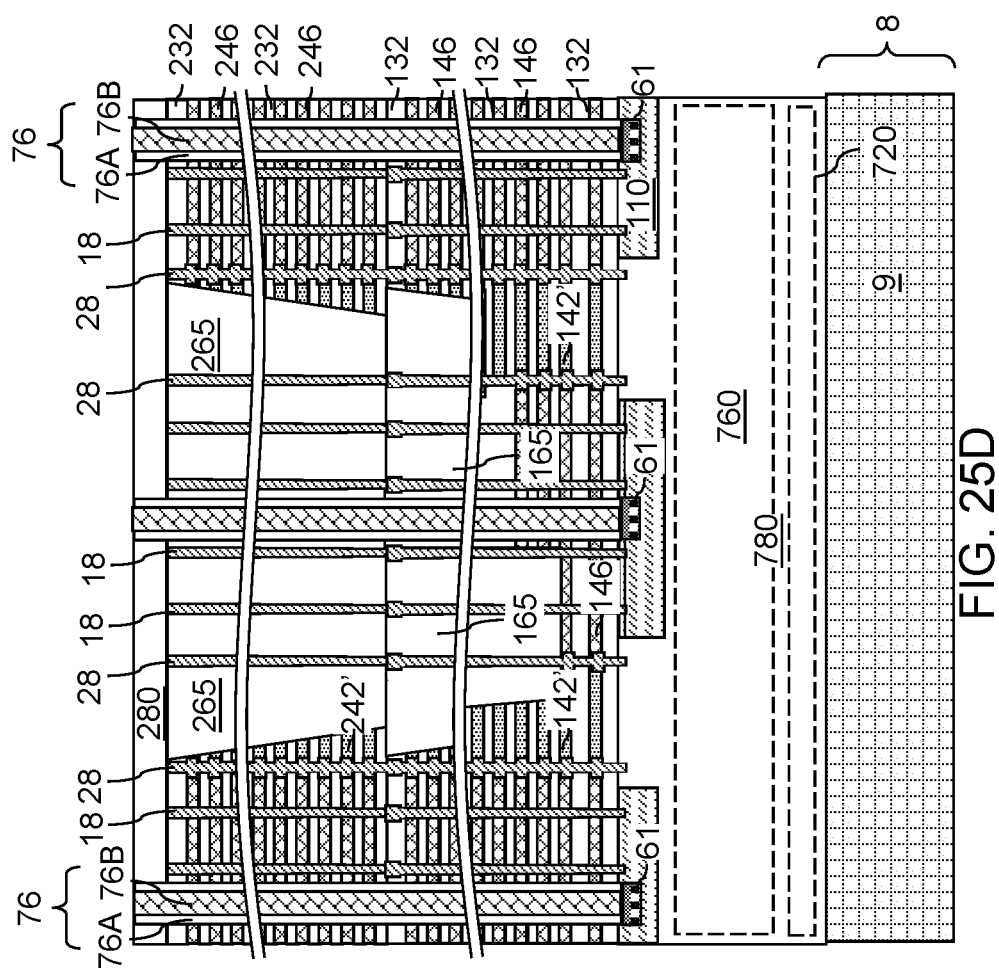
FIG. 25D is a vertical cross-sectional view along the vertical plane D-D' of FIG. 25B.
Figure 25E:
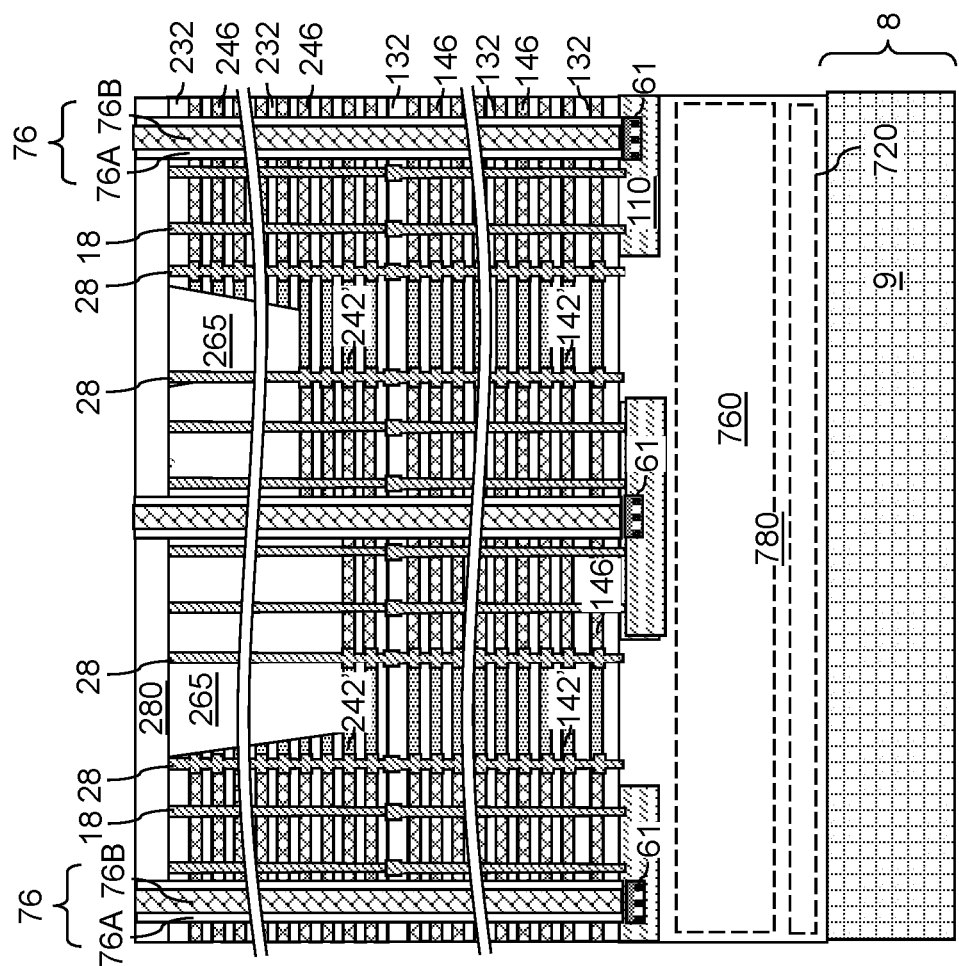
FIG. 25E is a vertical cross-sectional view along the vertical plane E-E' of FIG. 25B.
Figure 25F:
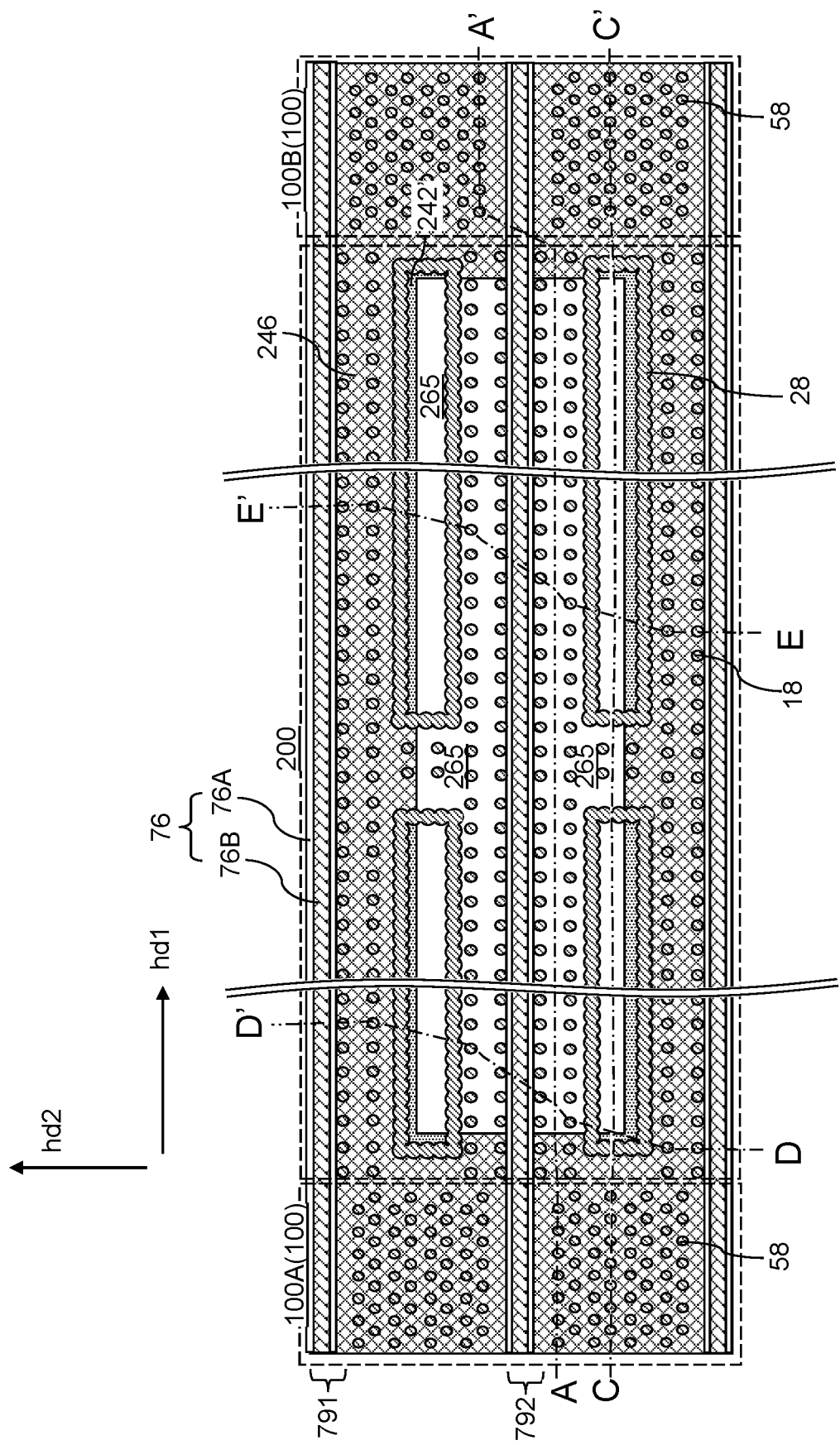
FIG. 25F is a horizontal cross-sectional view along the horizontal plane F-F' of FIGS. 25A and 25C.

In one embodiment, a perforated wall structure 28 may comprise multiple rows of pillar portions that are arranged along a first horizontal direction hd1 and laterally spaced part along a second horizontal direction hd2 at each level of the continuous insulating layers (132L, 232L). In one embodiment, a perforated wall structure 28 comprises a laterally-extending portion located at each level of the continuous sacrificial material layers (142L, 242L) and comprising a plurality of vertically-straight and horizontally-convex segments that are adjoined to each other, as illustrated in FIG. 22F.

Referring to FIGS. 23A-23F, the processing steps of FIGS. 11A-11E can be performed to form a contact-level dielectric layer 280. Subsequently, the processing steps of FIGS. 12A-12E can be performed to form line trenches 79 (which are also referred to as line trenches), and to form source regions 61 in an upper portion of the semiconductor material layer 110.

Each alternating layer stack {(132L, 142L), (232L, 242L)} is divided into a plurality of alternating stacks of insulating layers (132 or 232) and sacrificial material layers (142, 242) (which correspond to volumes of memory blocks) by the line trenches 79. Each line trench 79 can laterally extend along the first horizontal direction hd1 (e.g., word line direction) through the inter-array region 200 and a pair of memory array regions 100 that are adjoined to inter-array region 200. Further, each line trench 79 can vertically extend through an entire thickness of the alternating layer stacks {(132L, 142L), (232L, 242L)}. Each patterned portion of the first alternating layer stack (132L, 142L) located between a neighboring pair of line trenches 79 constitutes a first-tier alternating stack of first insulating layers 132 and first sacrificial material layers 142. Each patterned portion of the second alternating layer stack located between a neighboring pair of line trenches 79 constitutes a second-tier alternating stack of second continuous insulating layers 232L and second continuous sacrificial material layers 242. A plurality of alternating stacks of insulating layers (132 or 232) and sacrificial material layers (which may be first sacrificial material layers 142 or second sacrificial material layers 242) can be formed.

In one embodiment, at least one, or each, of the first retro-stepped dielectric material portions 165 may be divided into a respective pair of first retro-stepped dielectric material portions 165 by the line trenches 79. In one embodiment, at least one, or each, of the second retro-stepped dielectric material portions 265 may be divided into a respective pair of first retro-stepped dielectric material portions 265 by the line trenches 79.

In an illustrative example, a first line trench 79 and a second line trench 79 that laterally extend along the first horizontal direction hd1 can be formed through the alternating layer stack {(132L, 142L), (232L, 242L)} as a neighboring pair of line trenches 79. In one embodiment, the perforated wall structure 28 can be located between the first line trench 79 and the second line trench 79. In one embodiment, the perforated wall structure 28 may be laterally spaced from each of the first line trench 79 and the second line trench 79.

Referring to FIGS. 24A-24F, the processing steps of FIGS. 13A-13E can be performed to form backside recesses (143, 243) through removal of the sacrificial material layers (142, 242) selective to the insulating layers (132, 232). The backside recesses (143, 243) include first backside recesses 143 that are formed by removal of the first sacrificial material layers 142, and second backside recesses 243 that are formed by removal of the second sacrificial material layers 242.

Figure 14A:
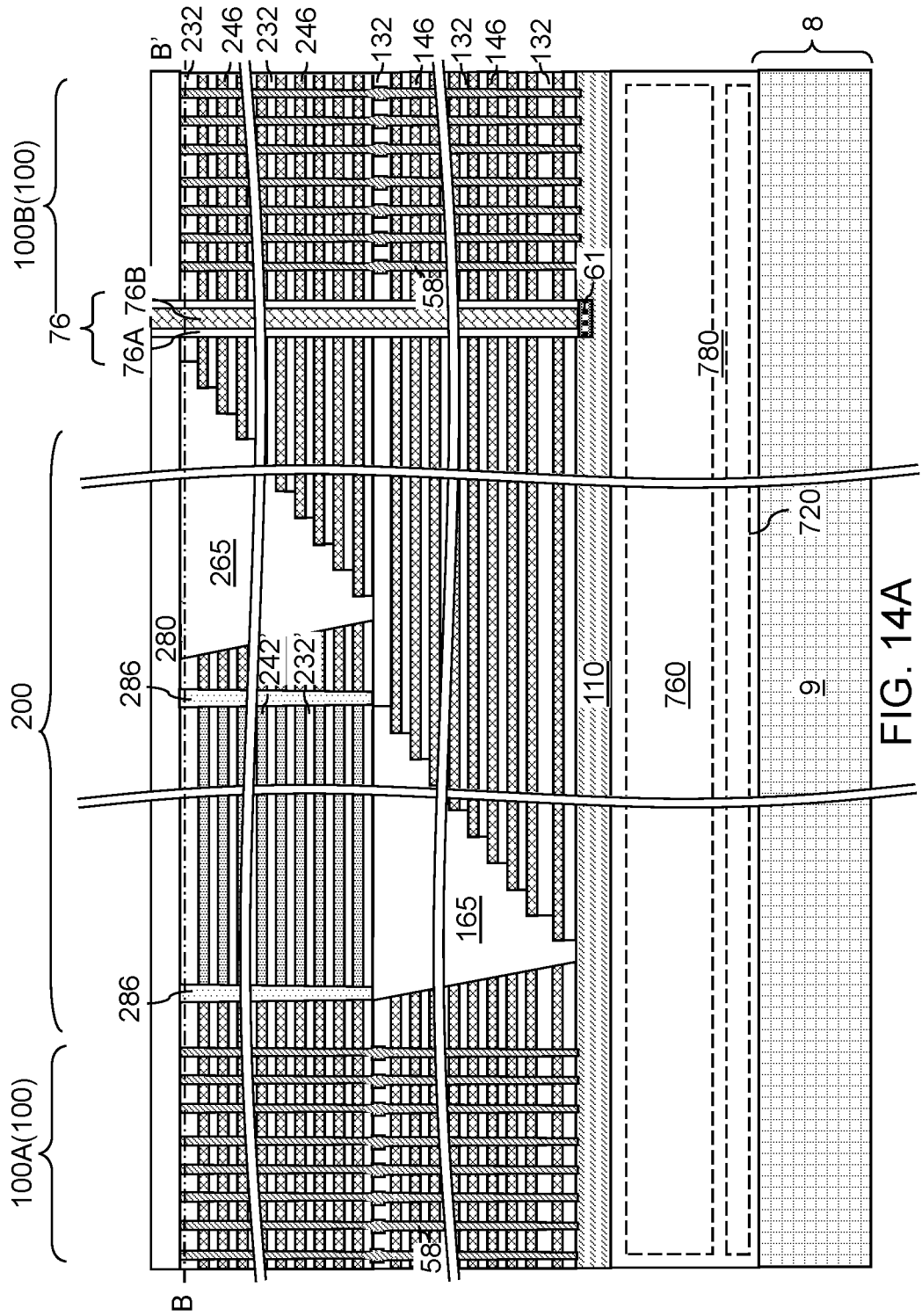
FIG. 14A is a vertical cross-sectional view of the first exemplary structure after formation of electrically conductive layers and line trench fill structures according to an embodiment of the present disclosure.
Figure 14B:
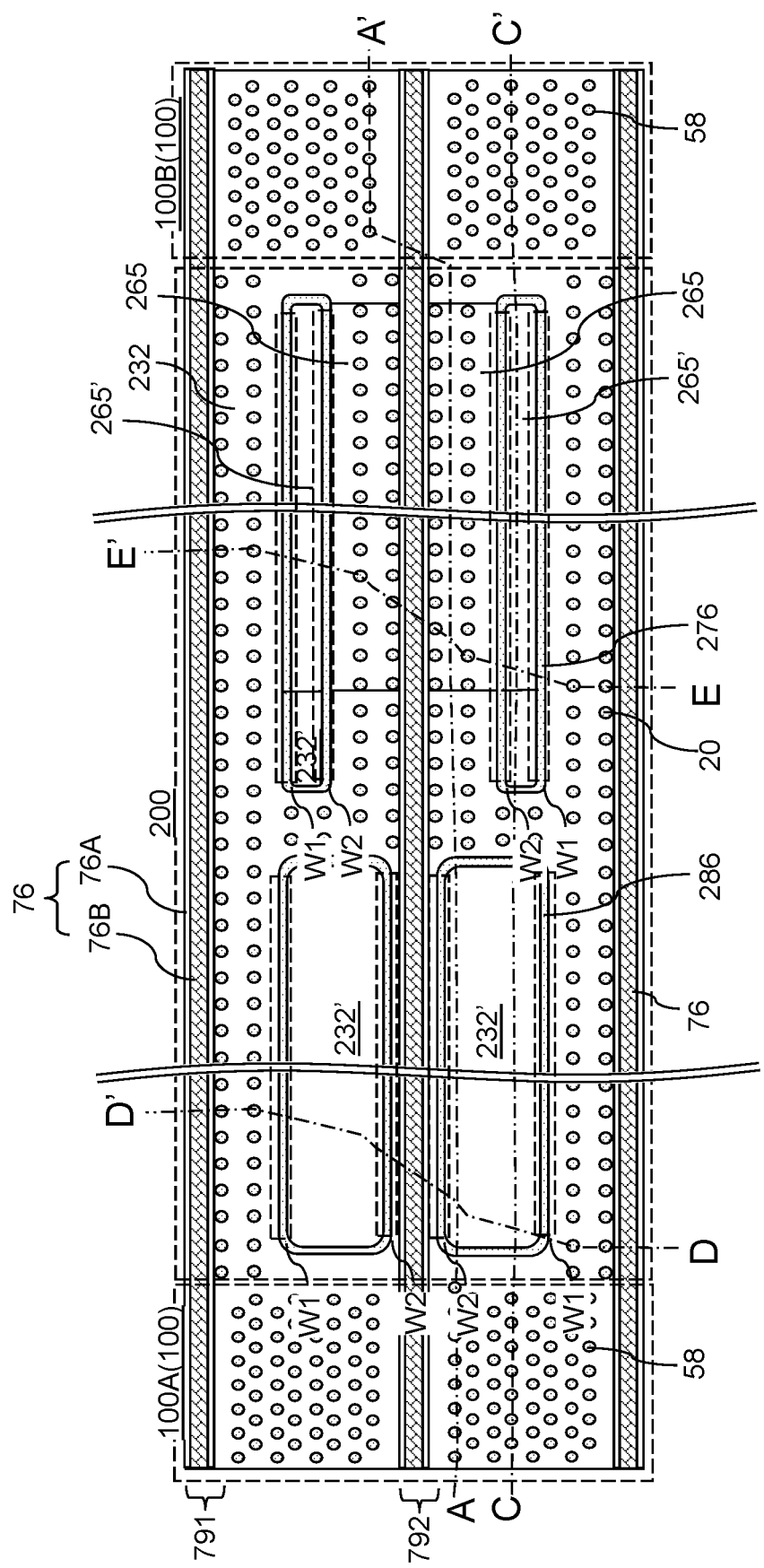
FIG. 14B is a top-down cross-sectional view of the first exemplary structure of FIG. 14A. The hinged vertical plane A-A' is the plane of the vertical cross-sectional view of FIG. 14A.
Figure 14C:
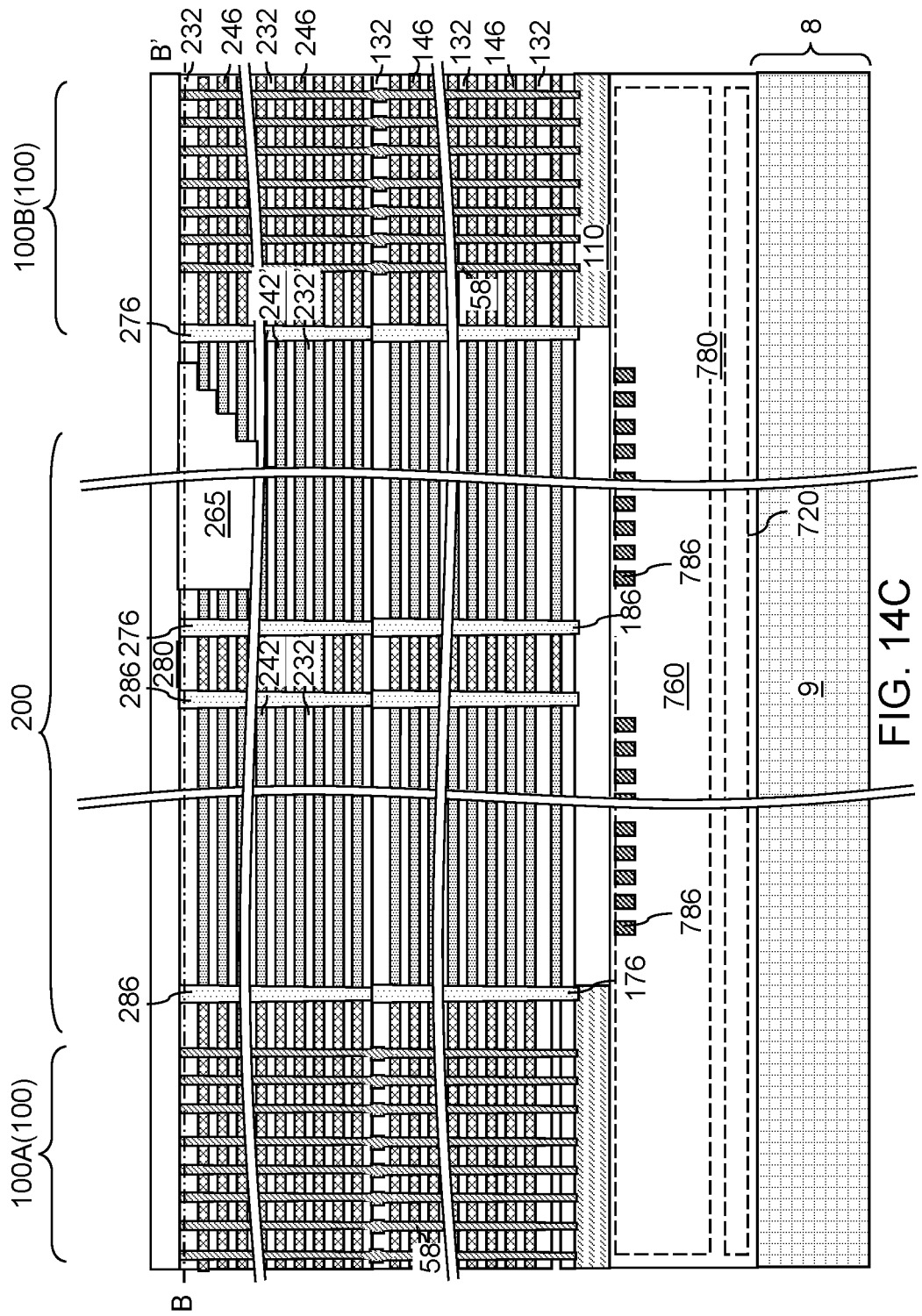
FIG. 14C is a vertical cross-sectional view along the vertical plane C-C' of FIG. 14B.
Figure 14D:
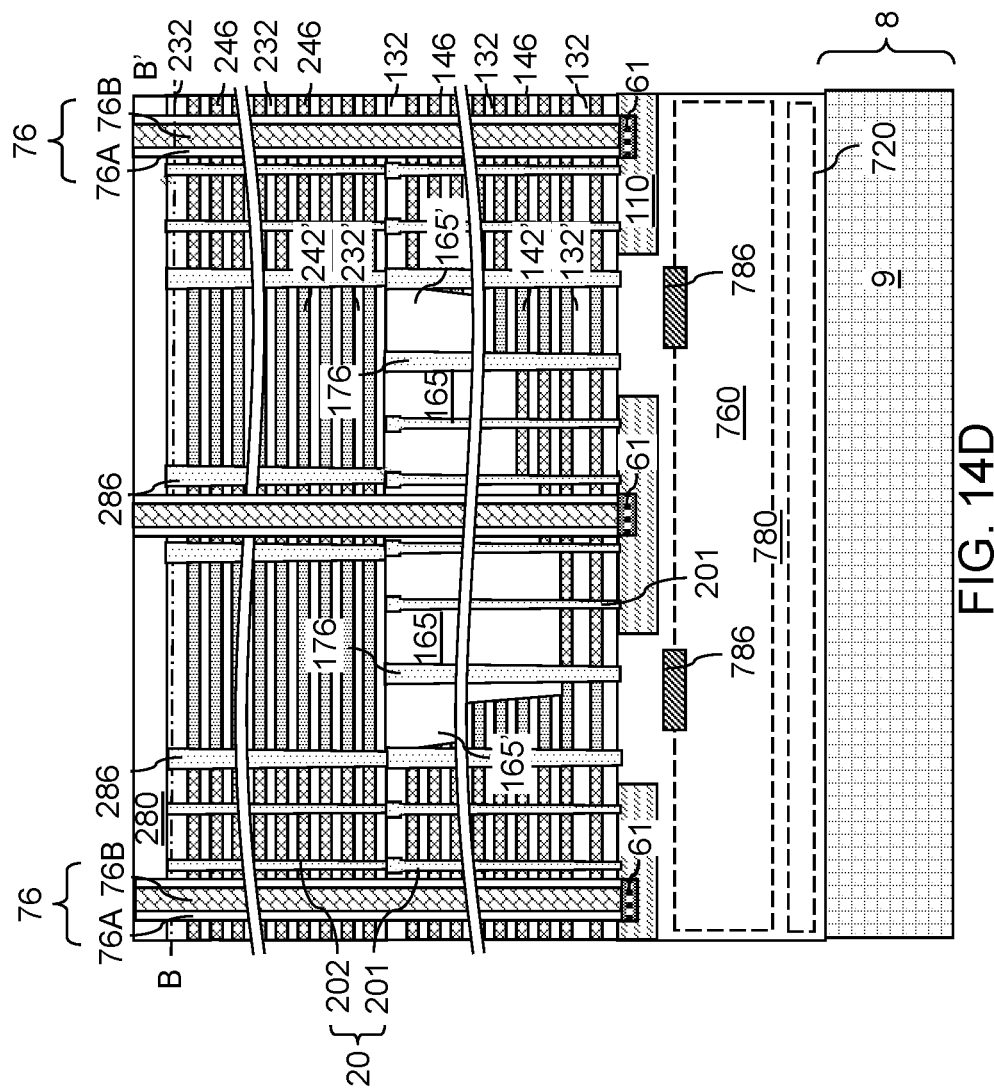
FIG. 14D is a vertical cross-sectional view along the vertical plane D-D' of FIG. 14B.
Figure 14E:
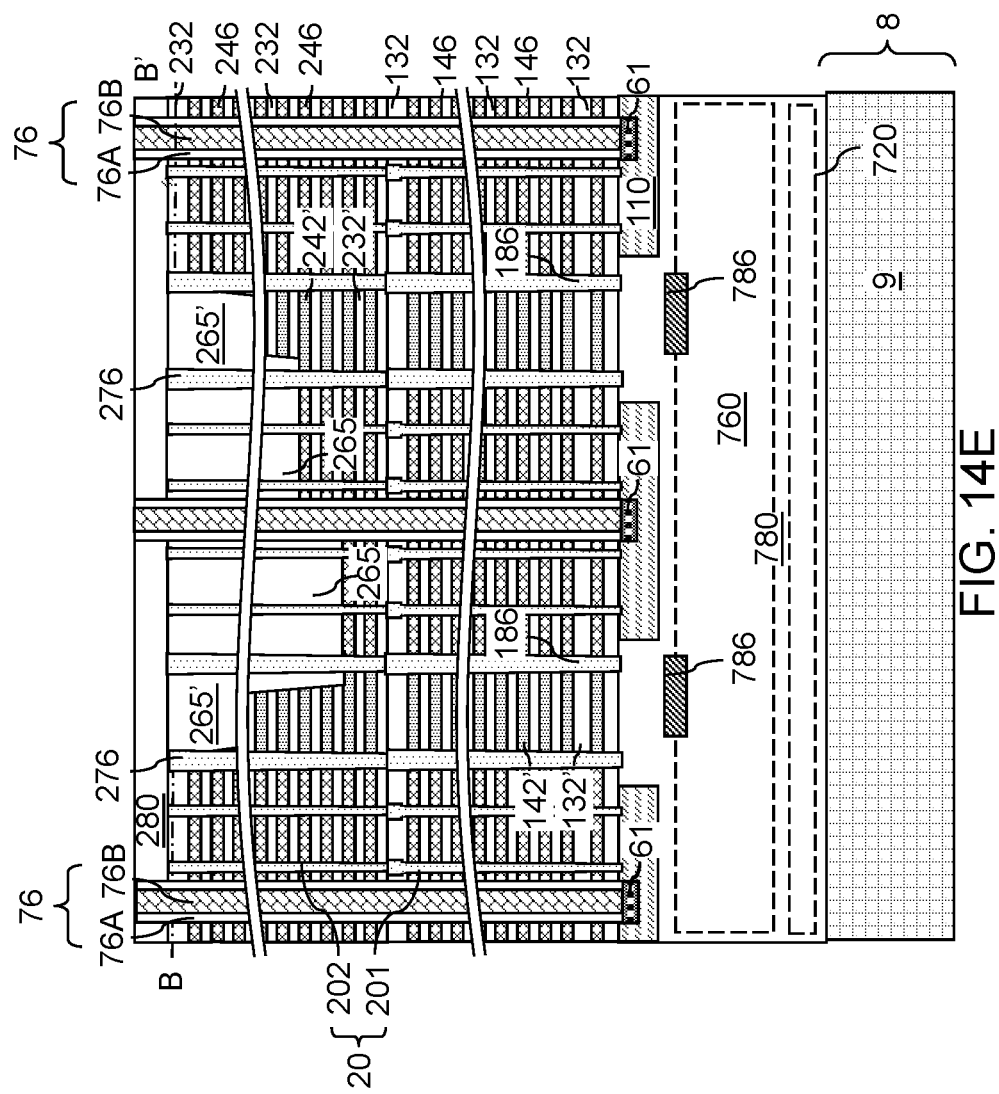
FIG. 14E is a vertical cross-sectional view along the vertical plane E-E' of FIG. 14B.

Subsequently, the processing steps of FIGS. 14A-14B can be performed to form first electrically conductive layers 146 in the first backside recesses 143, and to form second electrically conductive layers 246 in the second backside recesses 246. Residual conductive material may be removed from inside the line trenches 79 and from above the contact-level dielectric layer 280, for example, by an anisotropic or isotropic etch. Each remaining portion of the deposited metallic material in the first backside recesses 143 constitutes a first electrically conductive layer 146. Each remaining portion of the deposited metallic material in the second backside recesses 243 constitutes a second electrically conductive layer 246. Sidewalls of the first electrically conductive layers 146 and the second electrically conductive layers 246 may be physically exposed to a respective line trench 79.

Each electrically conductive layer (146, 246) may be a conductive sheet including openings therein. A first subset of the openings through each electrically conductive layer (146, 246) may be filled with memory opening fill structures 58. A second subset of the openings through each electrically conductive layer (146, 246) may be filled with the support pillar structures 20.

A subset of the electrically conductive layers (146, 246) may comprise word lines for the memory elements. The semiconductor devices in the underlying semiconductor devices 720 may comprise word line switch devices configured to control a bias voltage to respective word lines, and/or bit line driver devices, such as sense amplifiers. The memory-level assembly is located over the substrate semiconductor layer 9. The memory-level assembly includes at least one alternating stack (132, 146, 232, 246) and memory opening fill structures 58 vertically extending through the at least one alternating stack (132, 146, 232, 246). Each of the memory opening fill structures 58 comprises a vertical stack of memory elements located at each level of the electrically conductive layers (146, 246).

Referring to FIGS. 25A-25F, a line trench fill structure 76 can be formed in each line trench 79. In one embodiment, a dielectric liner layer including a dielectric material (such as silicon oxide) can be conformally deposited at a periphery of each line trench 79, and can be anisotropically etched to form a dielectric spacer 76A within each line trench 79. At least one conductive material can be deposited in remaining volumes of the line trenches 79, and excess portions of the at least one conductive material can be removed from above the top surface of the contact-level dielectric layer 280 by a planarization process. Each remaining portion of the at least one conductive material contacting a source region 61 and laterally surrounded by a respective dielectric spacer 76A constitutes a source contact via structure 76B, which laterally extends along the first horizontal direction hd1. Each contiguous combination of a dielectric spacer 76A and a source contact via structure 76B that fills a line trench 79 constitutes a line trench fill structure 76.

Alternatively, at least one dielectric material, such as silicon oxide, may be conformally deposited in the line trenches 79 by a conformal deposition process. Each portion of the deposited dielectric material that fills a line trench 79 constitutes a line trench fill structure 76. In this case, each line trench fill structure may fill the entire volume of a line trench 79 and may consist essentially of at least one dielectric material. In this alternative embodiment, the source region 61 may be omitted, and a horizontal source line (e.g., a direct strap contact layer) may contact a side of the lower portion of the semiconductor channel 60.

Referring to FIGS. 26A-26F, various metal via structures (88, 86A, 86B) can be formed through the contact-level dielectric layer 280 and optionally through underlying material portions onto a respective underlying conductive structure. The various contact via structures (88, 86A, 86B) can include drain contact via structures 88 that are formed in the memory array regions 100 through the contact-level dielectric layer 280 on a top surface of a respective drain region 63.

The various contact via structures (88, 86A, 86B) can include layer contact via structures (e.g., word line and select gate contact via structures) (86A, 86B) that are formed in the inter-array region 200. The layer contact via structures (86A, 86B) can include first contact via structures 86A that contact a respective first electrically conductive layer (e.g., lower word line or source select gate electrode) 146 and second contact via structures 86B that contact a respective second electrically conductive layer (e.g., upper word line or drain select gate electrode) 246. The layer contact via structures (86A, 86B) may be formed through the second retro-stepped dielectric material portion 265 and optionally through the first retro-stepped dielectric material portion 165 on a top surface of a respective one of the electrically conductive layers (146, 246). In one embodiment, the layer contact via structures (86A, 86B) may be arranged in a row extending along the first horizontal direction hd1, and may be located between the perforated wall structure 28 and one of the first line trench 79 and the second line trench 79.

Optionally, connection via structures (not illustrated) may be formed in the inter-array region 200. The connection via structures, if present, may vertically extend through a respective second retro-stepped dielectric material portion 265, a respective first retro-stepped dielectric material portion 165, and a respective opening in the semiconductor material layer 110, and contacts a top surface of a lower-level metal interconnect structure such as a metal pad 786.

Figure 26A:
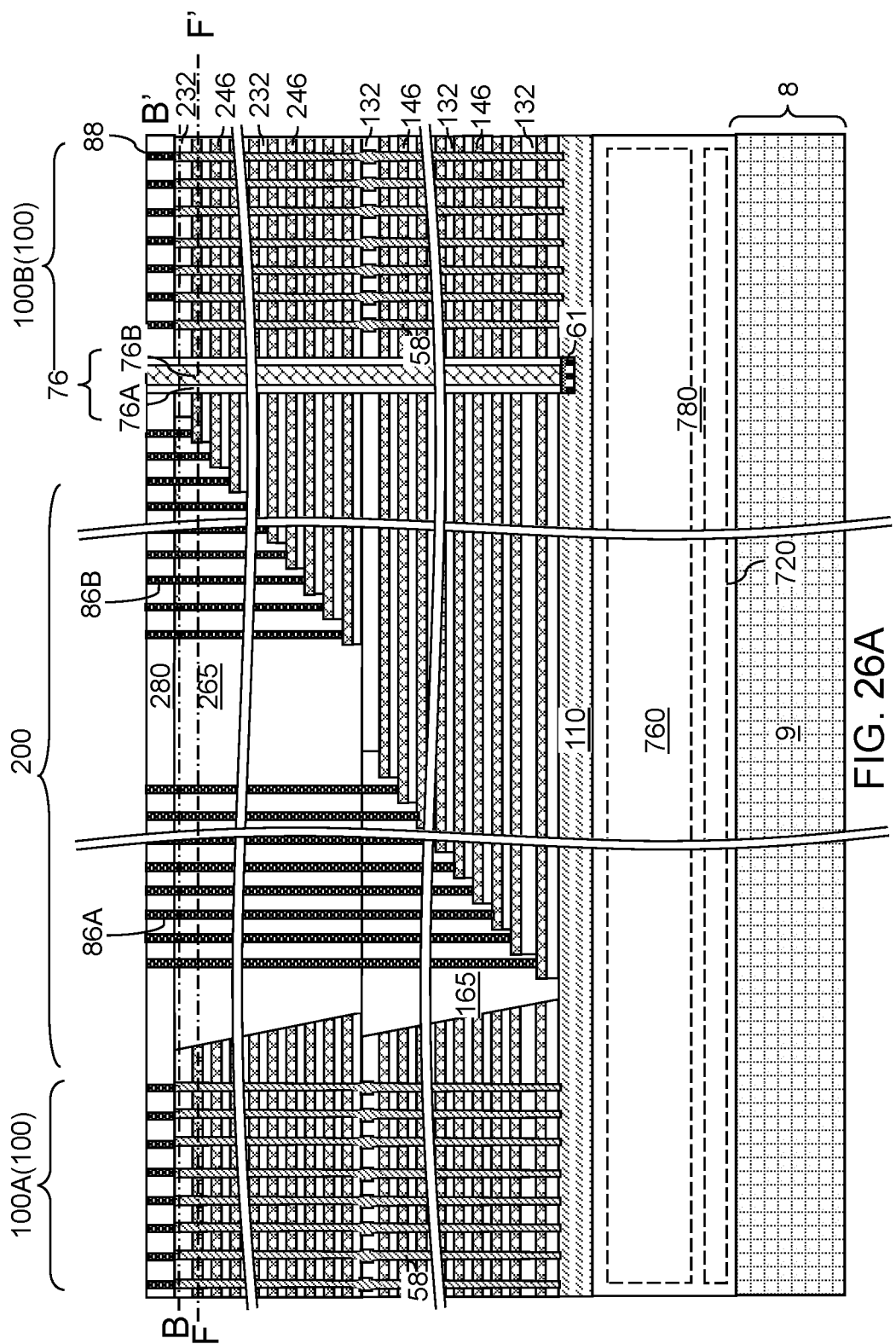
FIG. 26A is a vertical cross-sectional view of the second exemplary structure after formation of various contact via structures according to an embodiment of the present disclosure.
Figure 26B:
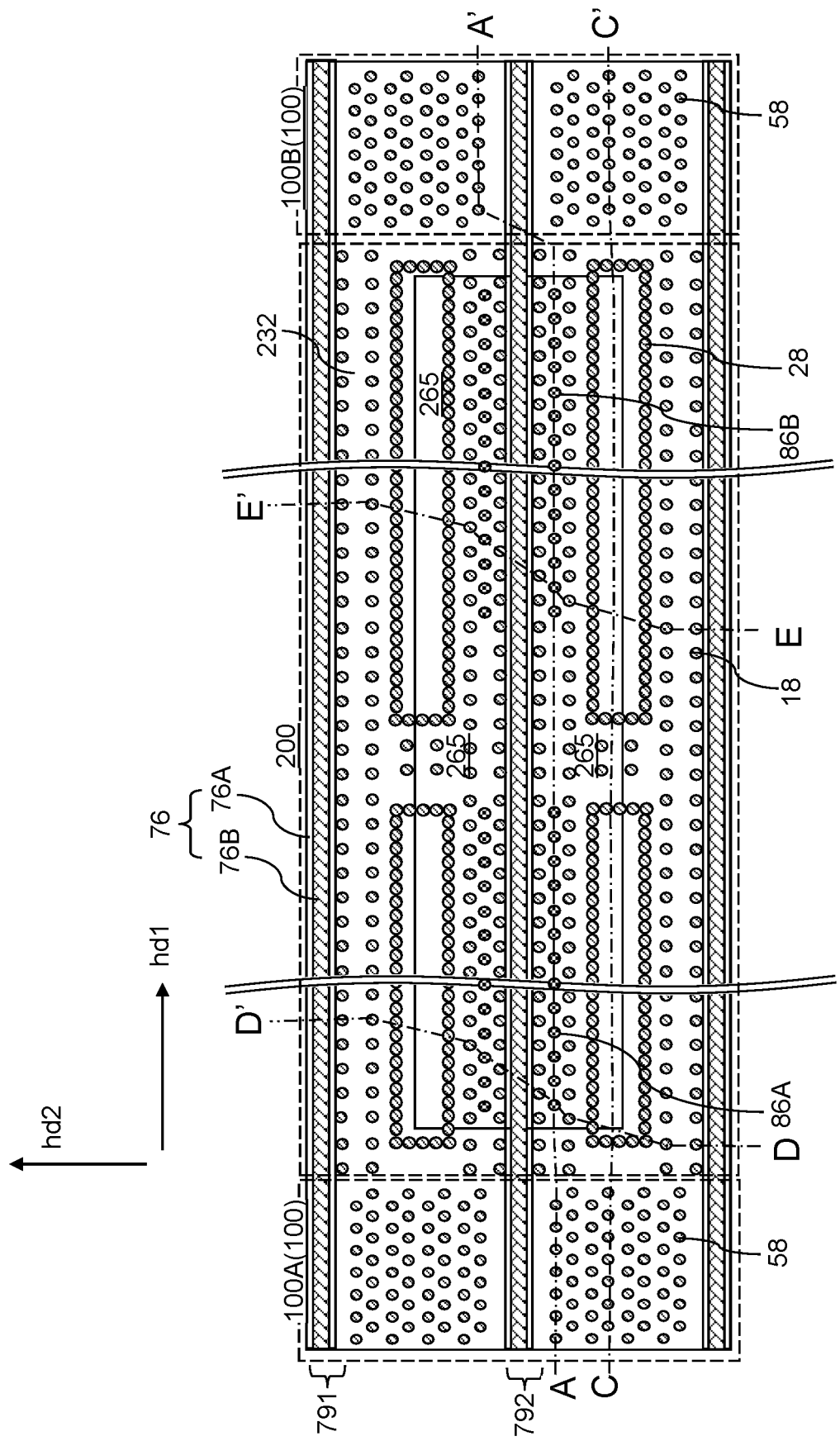
FIG. 26B is a horizontal cross-sectional view along the horizontal plane B-B' of FIG. 26A. The hinged vertical plane A-A' is the plane of the vertical cross-sectional view of FIG. 26A.
Figure 26C:
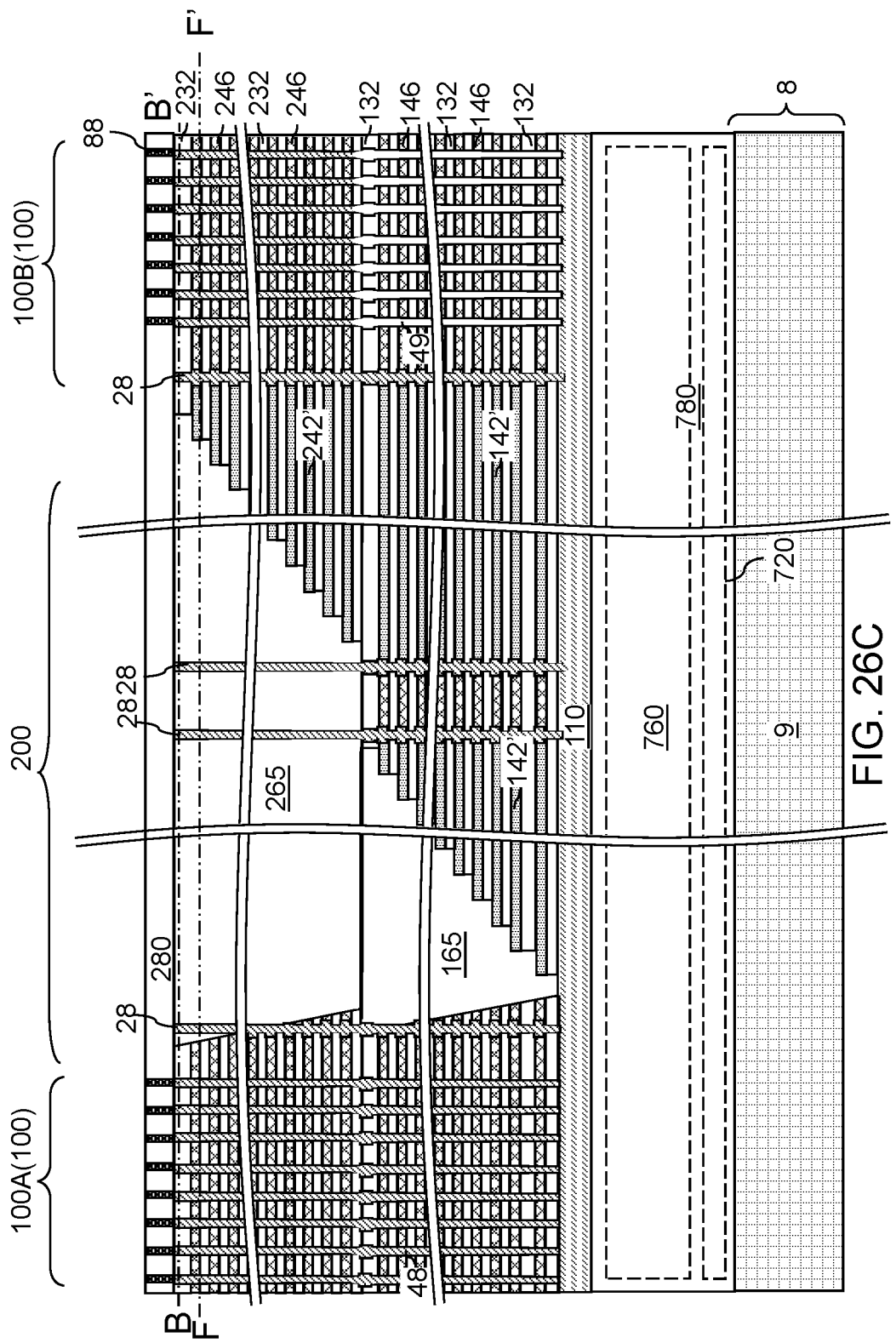
FIG. 26C is a vertical cross-sectional view along the vertical plane C-C' of FIG. 26B.
Figure 26D:
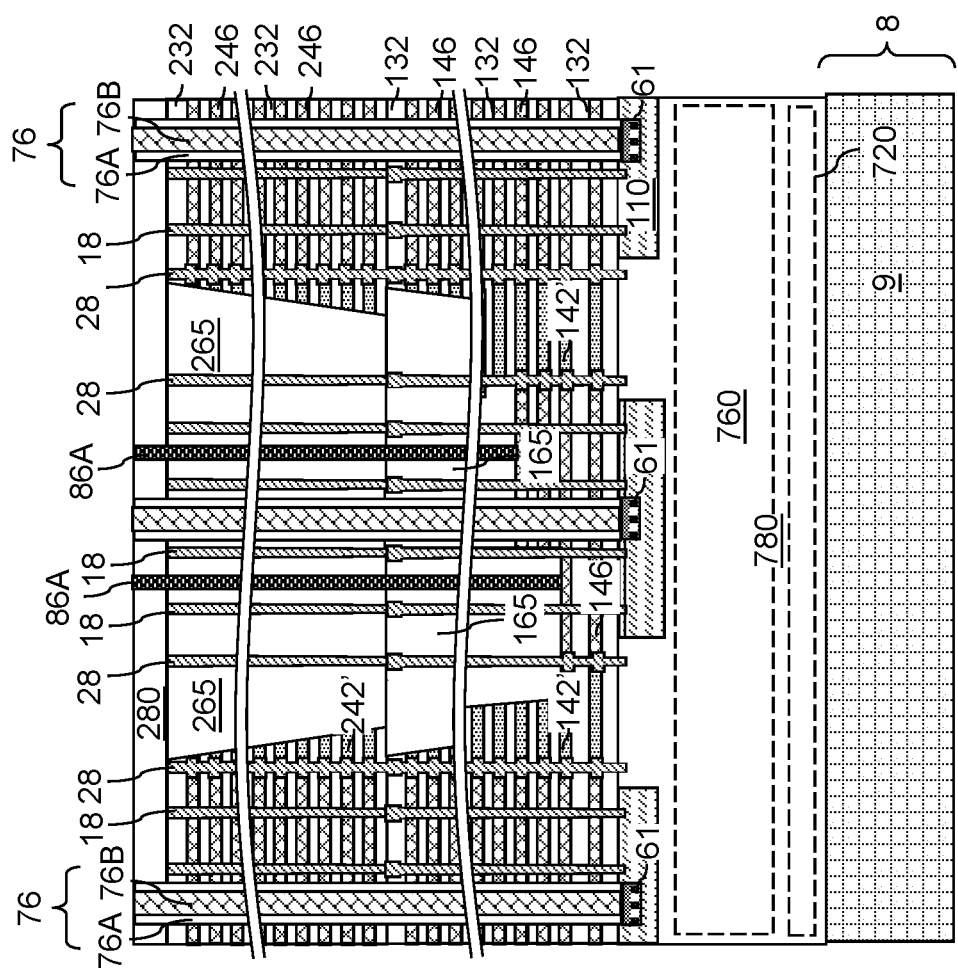
FIG. 26D is a vertical cross-sectional view along the vertical plane D-D' of FIG. 26B.
Figure 26E:
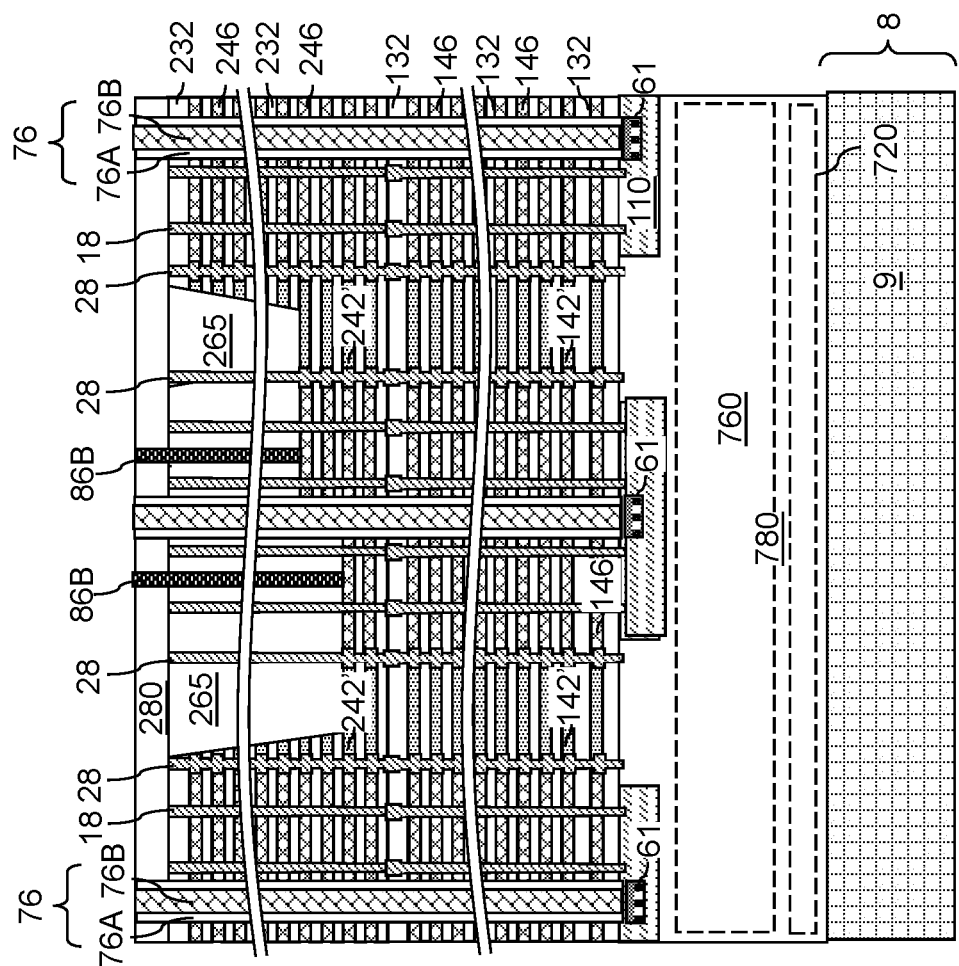
Figure 26F:
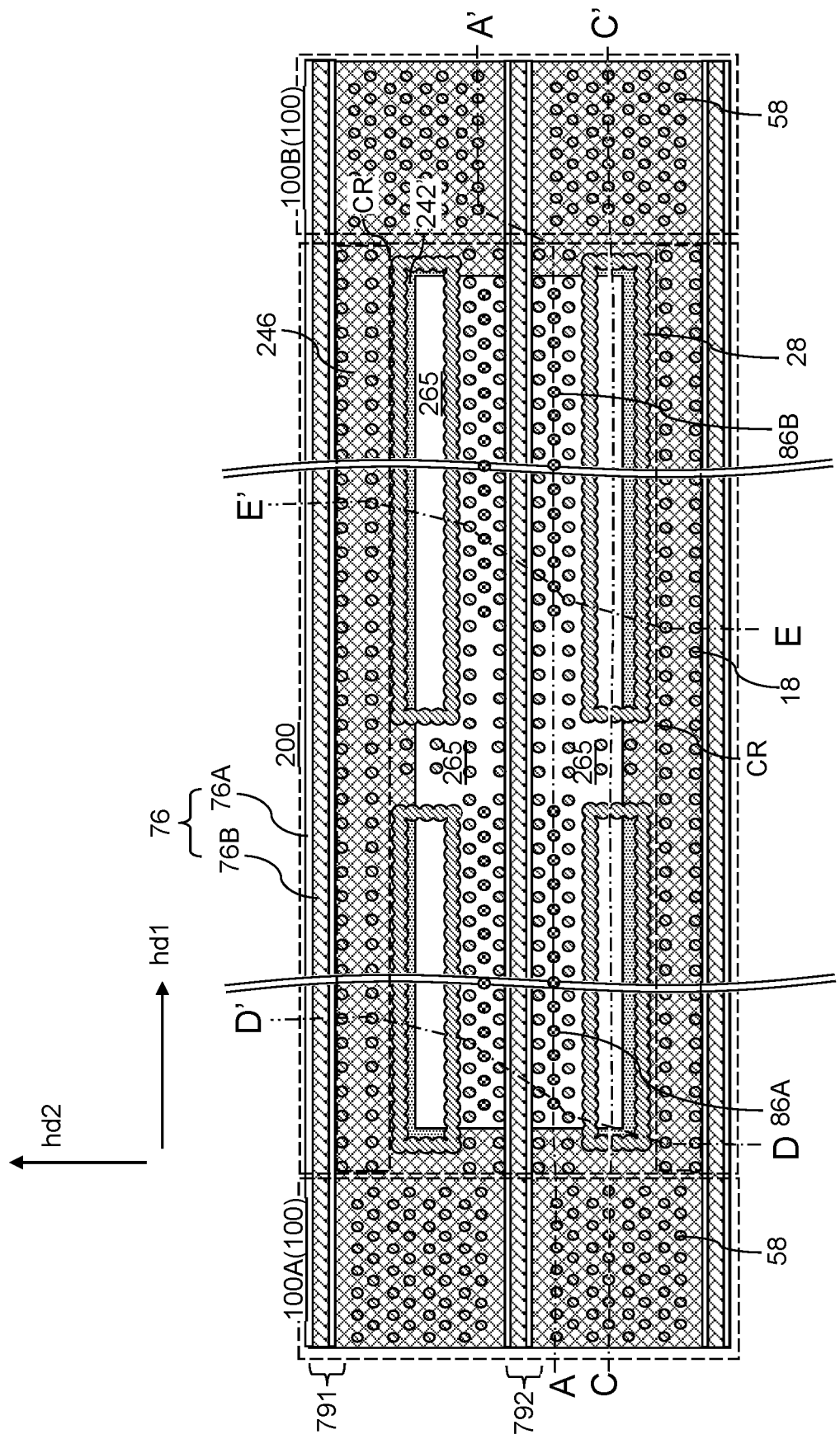

Referring to FIG. 26F, two perforated wall structures 28 are located in each retro-stepped dielectric material portion area 265. Thus, the distance of the conductive path in each electrically conductive layer 246 between each layer contact via structure 86B and the connection region CR is reduced because the conductive path can pass between the two perforated wall structures 28. In alternative embodiments, there may be only one perforated wall structure 28 or three or more perforated wall structures 28 located in each retro-stepped dielectric material portion 265 area.

Figure 27A:
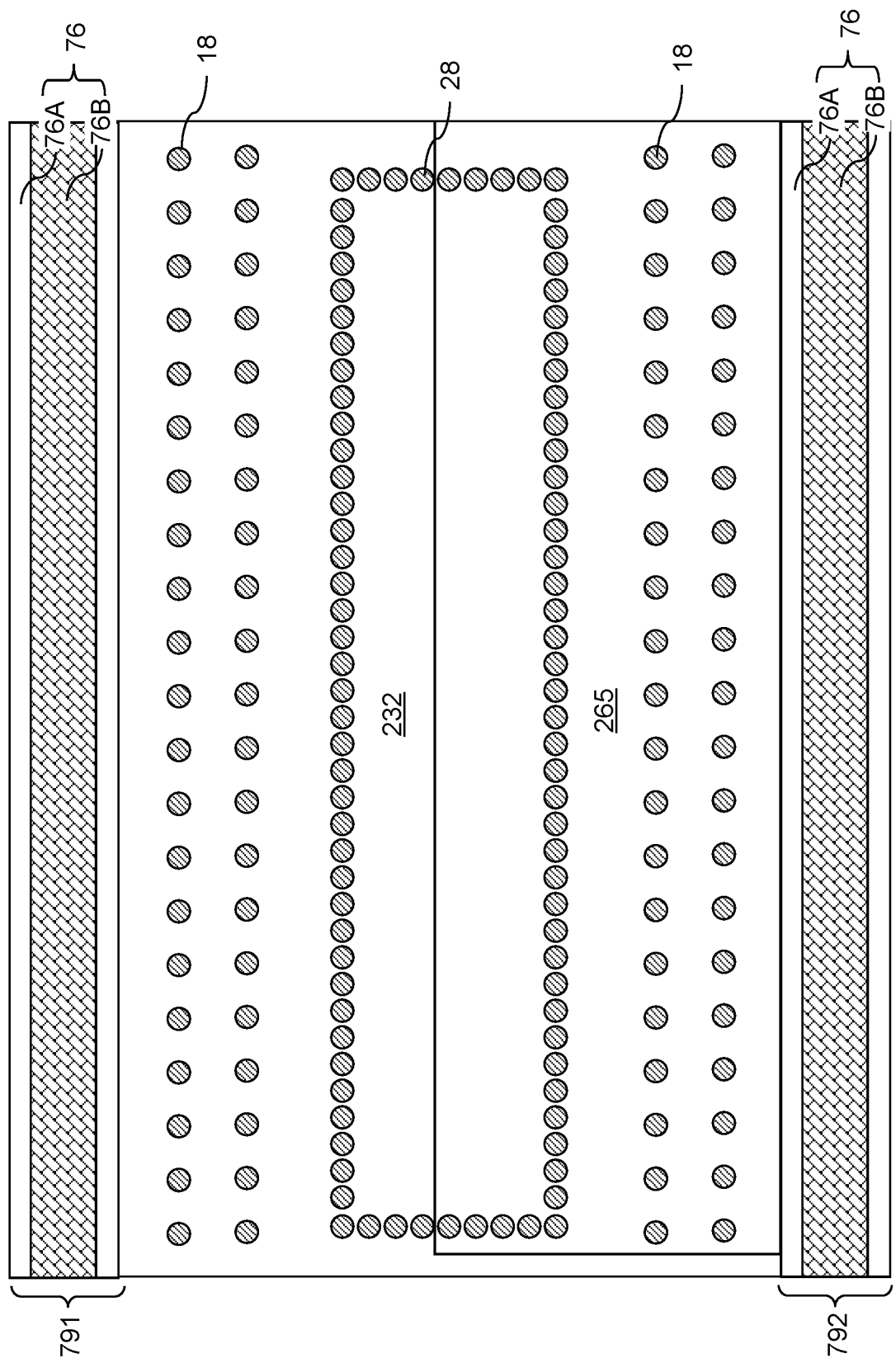
Figure 27B:
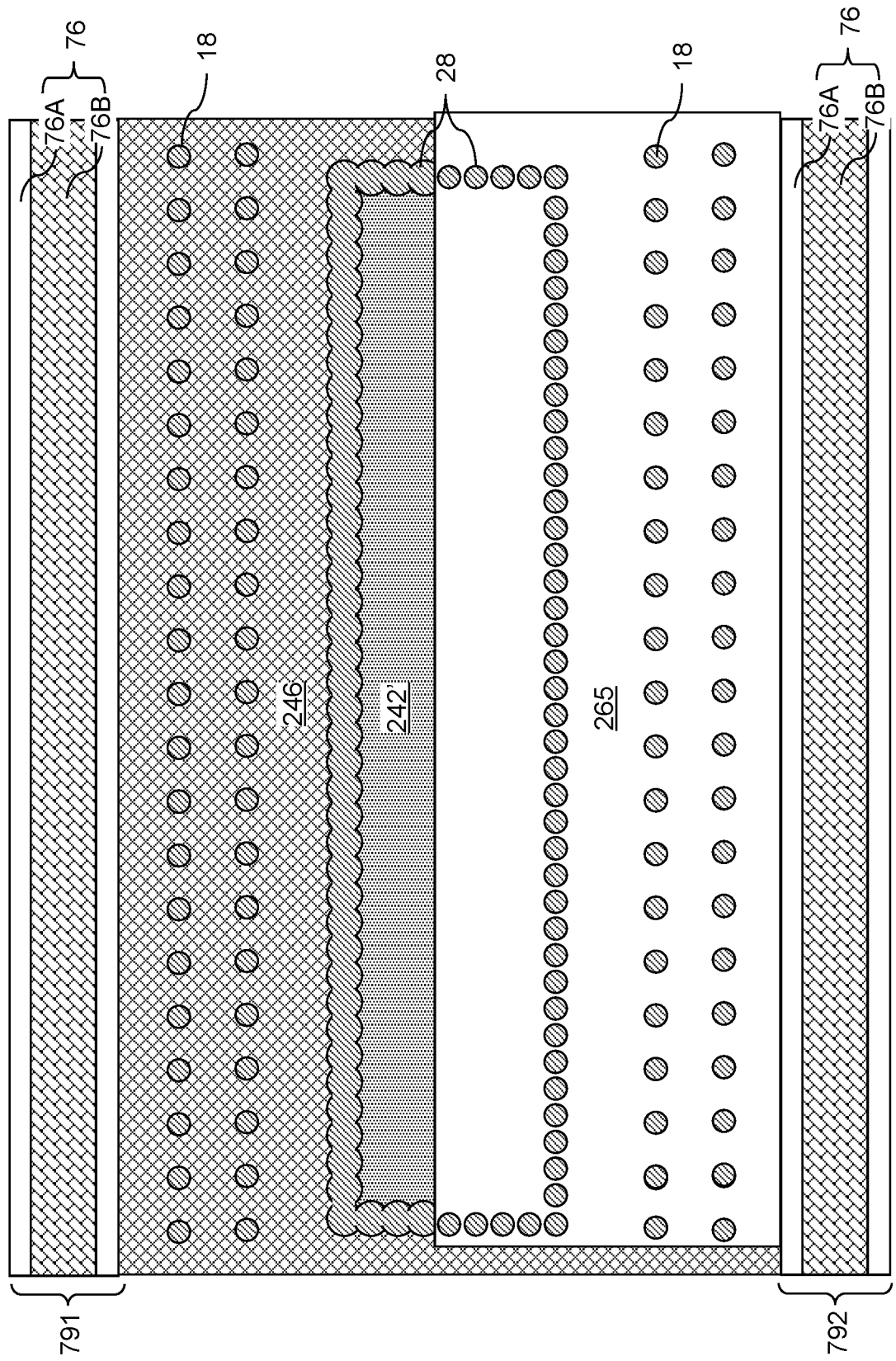

Referring to FIGS. 27A and 27B, a region of a first configuration of the second exemplary structure including a perforated wall structure 28 is illustrated. The perforated wall structure 28 may comprise two rows of pillar portions that are arranged along a first horizontal direction hd1 and laterally spaced part along a second horizontal direction hd2 at each level of the continuous insulating layers (132L, 232L) and may comprise two columns of pillar portions that are arranged along the second horizontal direction hd2 and laterally spaced apart along the first horizontal direction hd1 such that the perforated wall structure 28 laterally encloses a rectangular area.

Figure 27C:
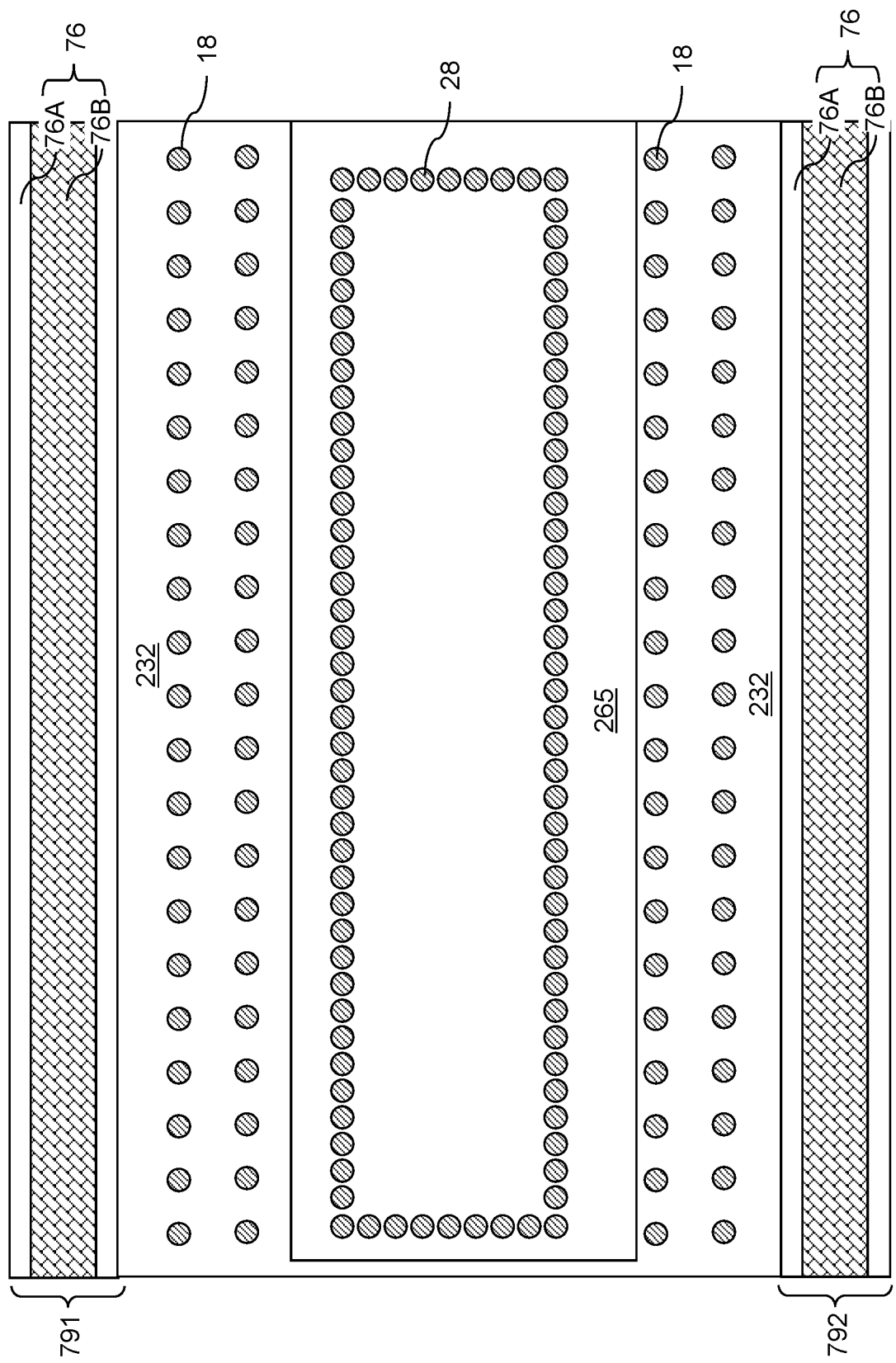
Figure 27D:
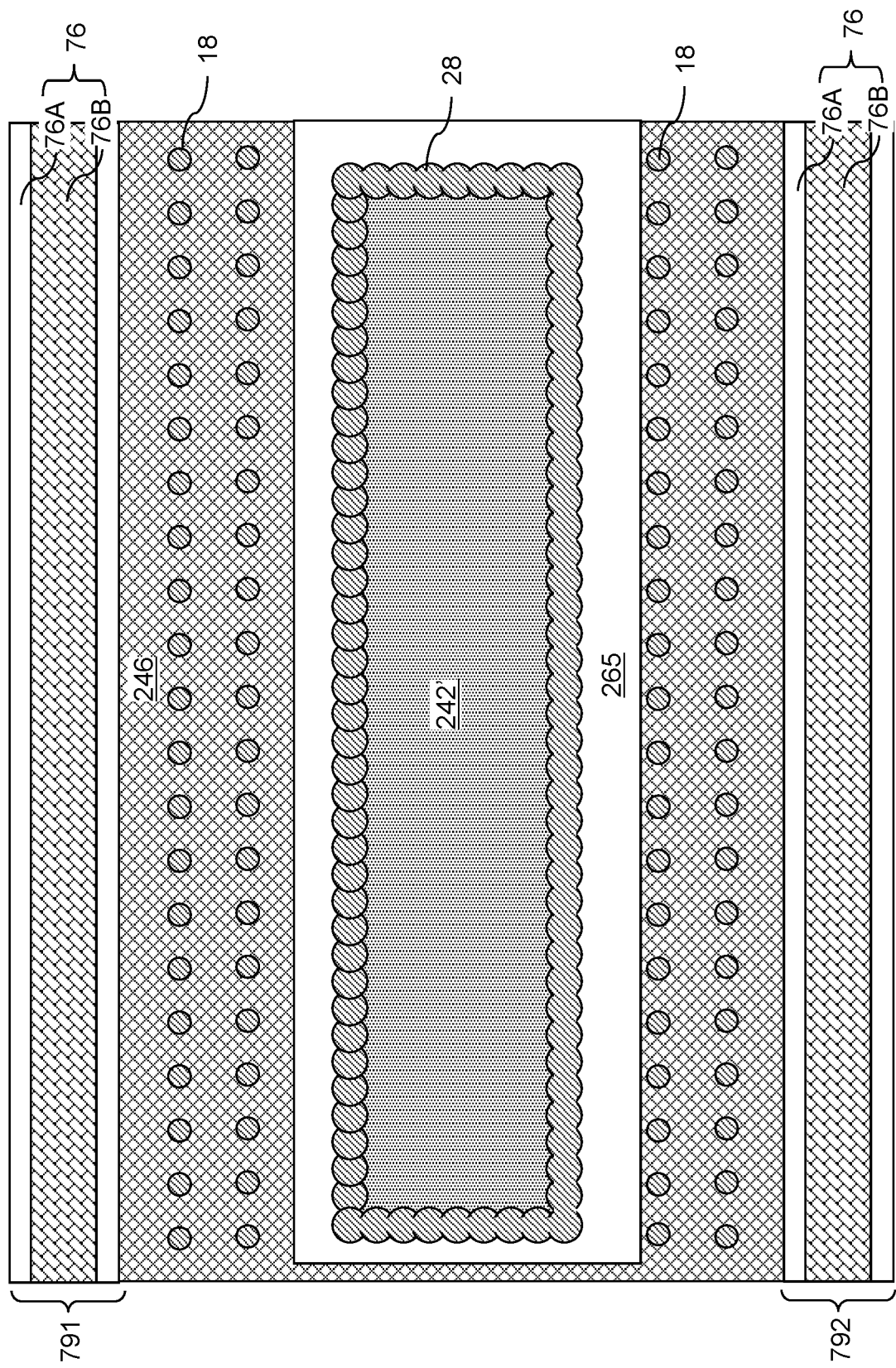

Referring to FIGS. 27C and 27D, an alternative embodiment of the first configuration of the second exemplary structure can be derived from the first configuration of the second exemplary structure by forming the perforated wall structure 28 only in a region in which the retro-stepped dielectric material portion (165, 265) is present.

Figure 27E:
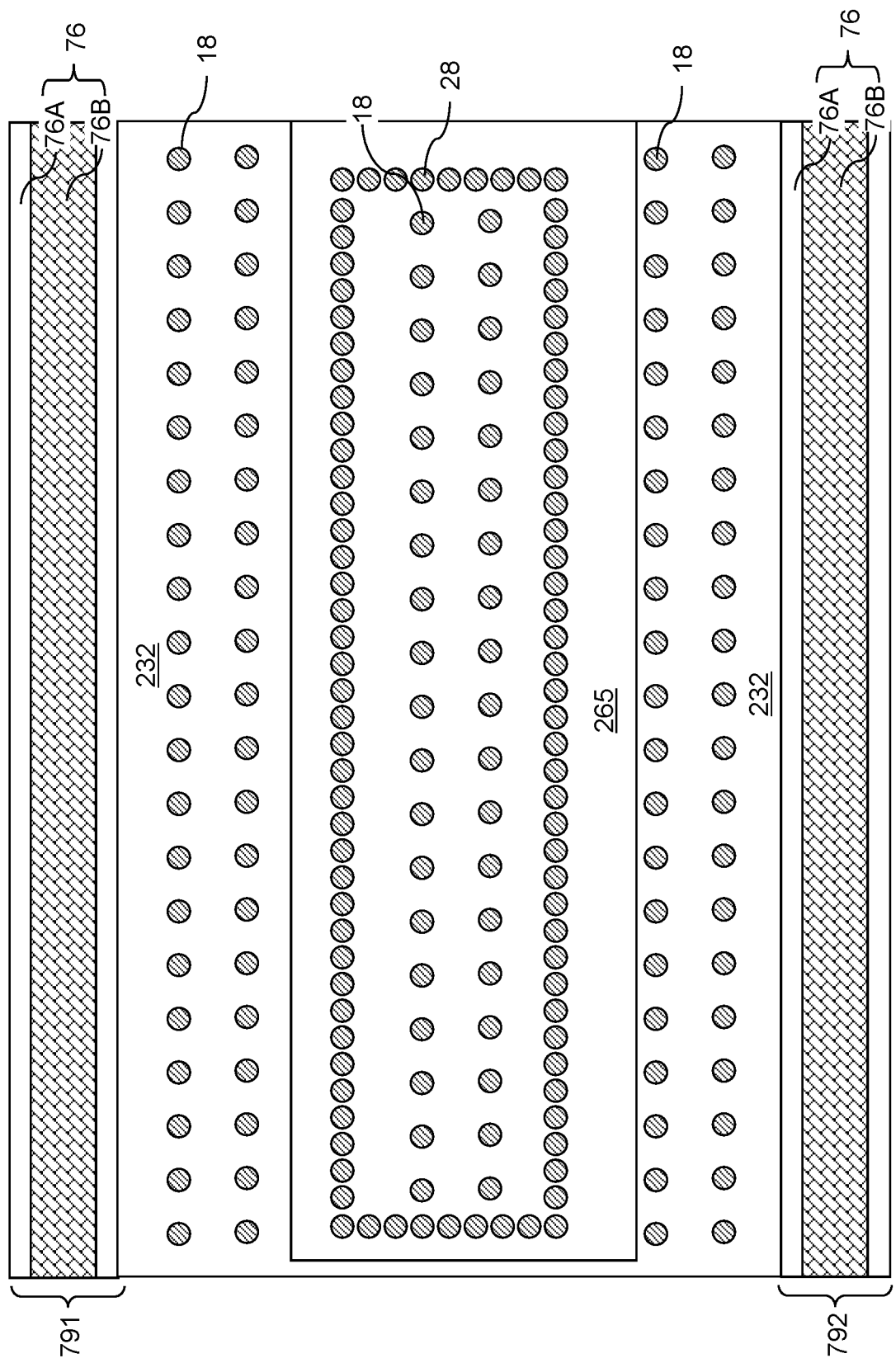
Figure 27F:
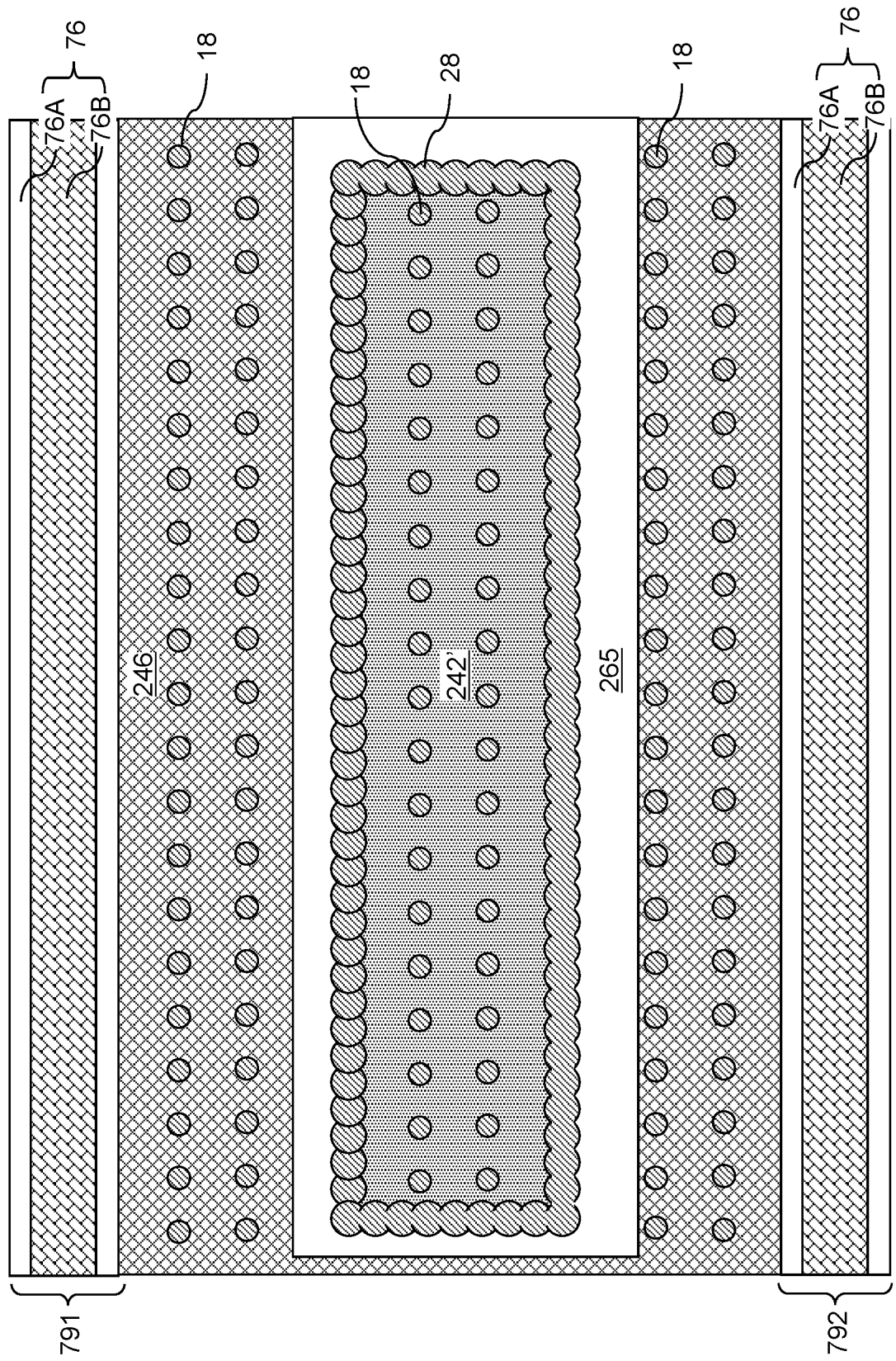

Referring to FIGS. 27E and 27F, another alternative embodiment of the first configuration of the second exemplary structure can be derived from the prior configuration of the second exemplary structure by forming one or more additional support pillar structures 18 in a region surrounded by the perforated wall structure 28.

Figure 28A:
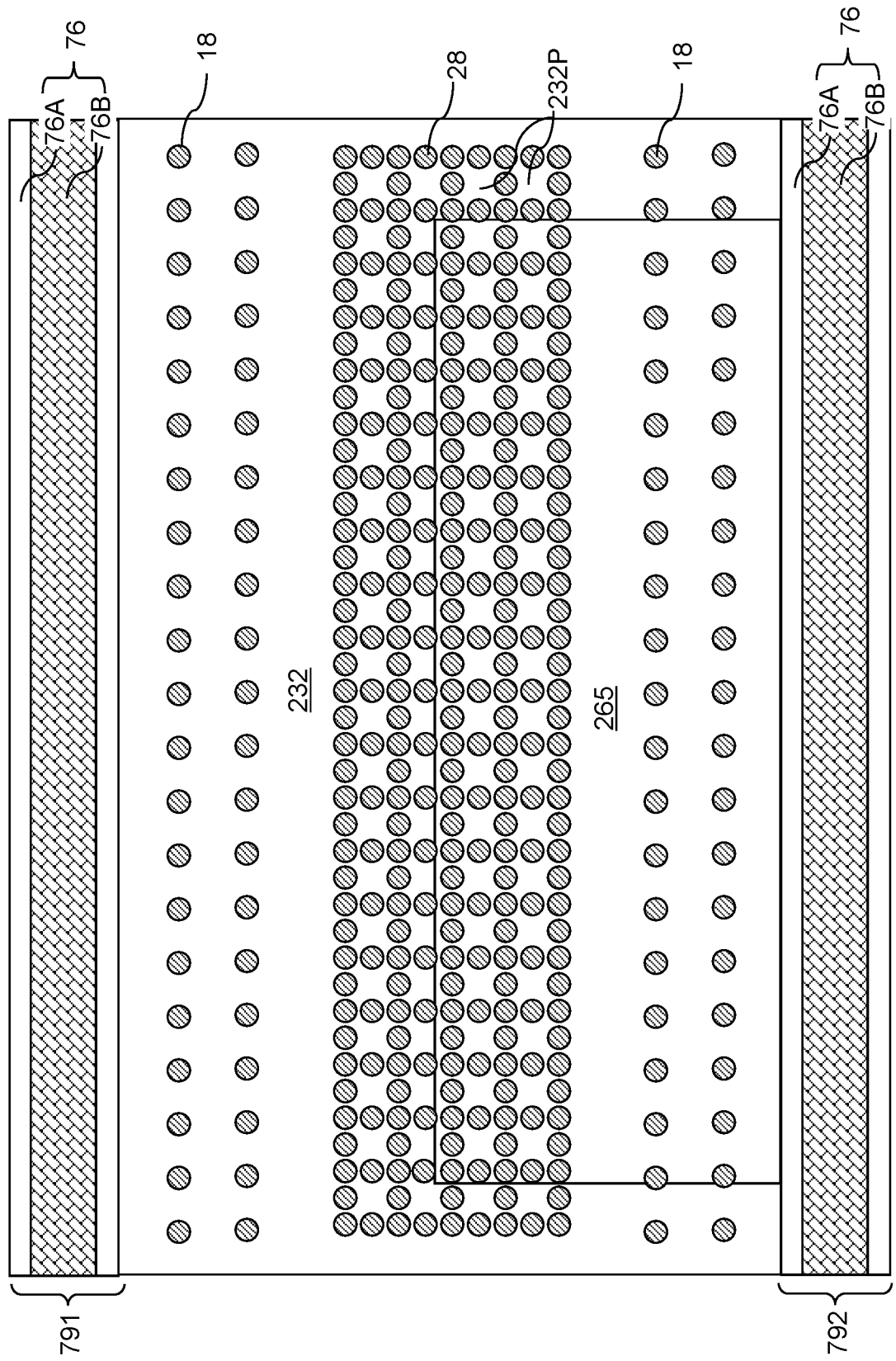
Figure 28B:
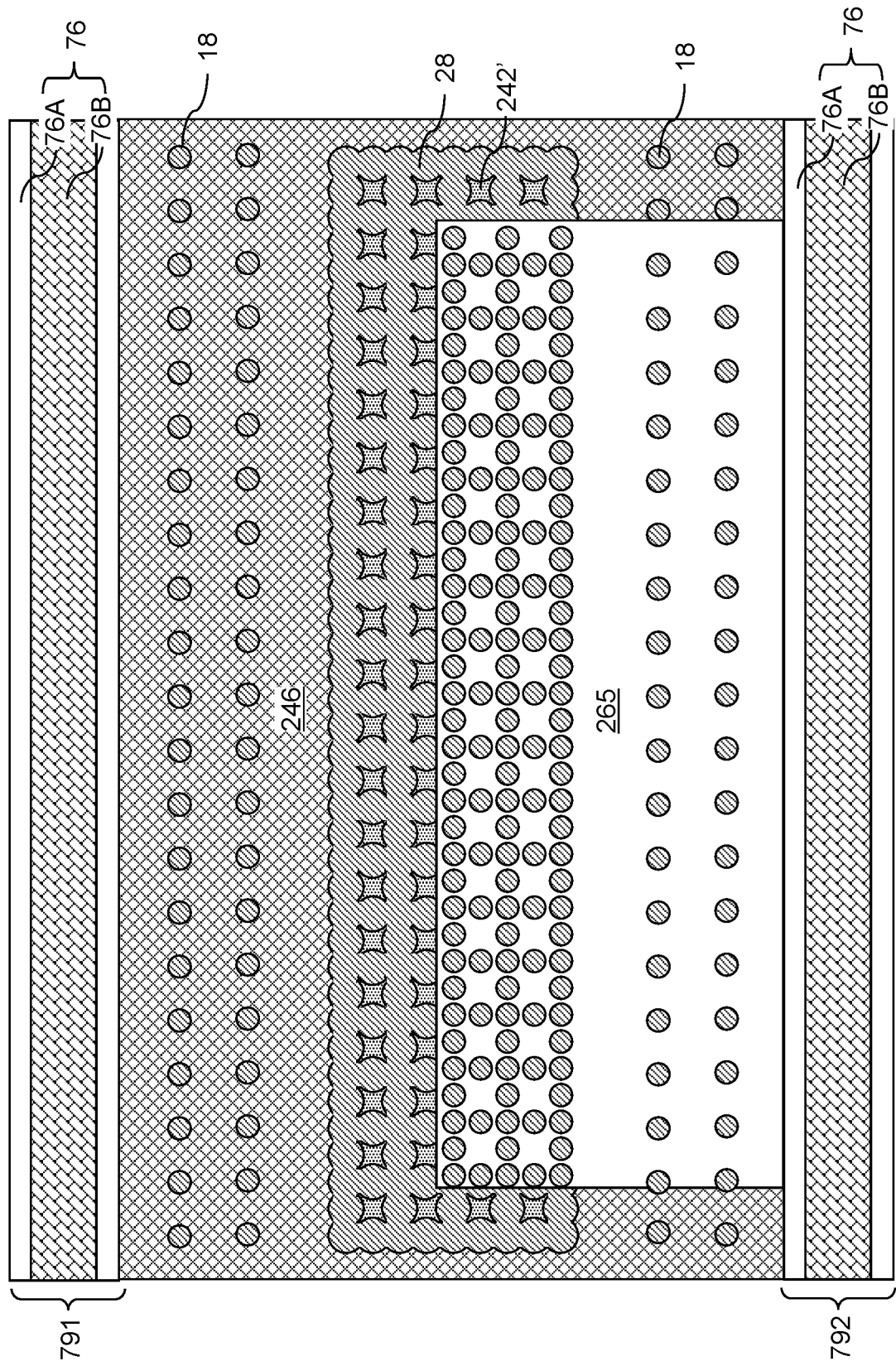

Referring to FIGS. 28A and 28B, a region of a second configuration of the second exemplary structure including a perforated wall structure 28 is illustrated, which can be derived from the second exemplary structure described above by changing the pattern of the columnar openings 29 that are employed to form the perforated wall structure 28. In this case, the perforated wall structure 28 comprises multiple columns of pillar portions that are arranged along the second horizontal direction hd2 and laterally spaced apart along the first horizontal direction hd1 at each level of the insulating layers (132, 232). The multiple rows of pillar structures and the multiple columns of pillar structures define an M×N array of insulator portions 232P that are portions of a respective insulating layer (132, 232) within each level of the insulating layers (132, 232). M and N are positive integers and has a sum that is at least 3. In one embodiment, the perforated wall structure 28 may comprise (N+1) rows of pillar portions at a level of an insulating layer (132 or 232), and may comprise (M+1) columns of pillar portion at a level of the insulating layer (132, 232). In the illustrated example, M is 20 and N is 4. In one embodiment, an M×P array of dielectric material plates (142', 242') can be located at a level of one of the electrically conductive layers (146, 246) within an area of the perforated wall structure 28. P is a positive integer not greater than N. In the illustrated example of FIGS. 28A and 28B, P is 4.

Figure 28C:
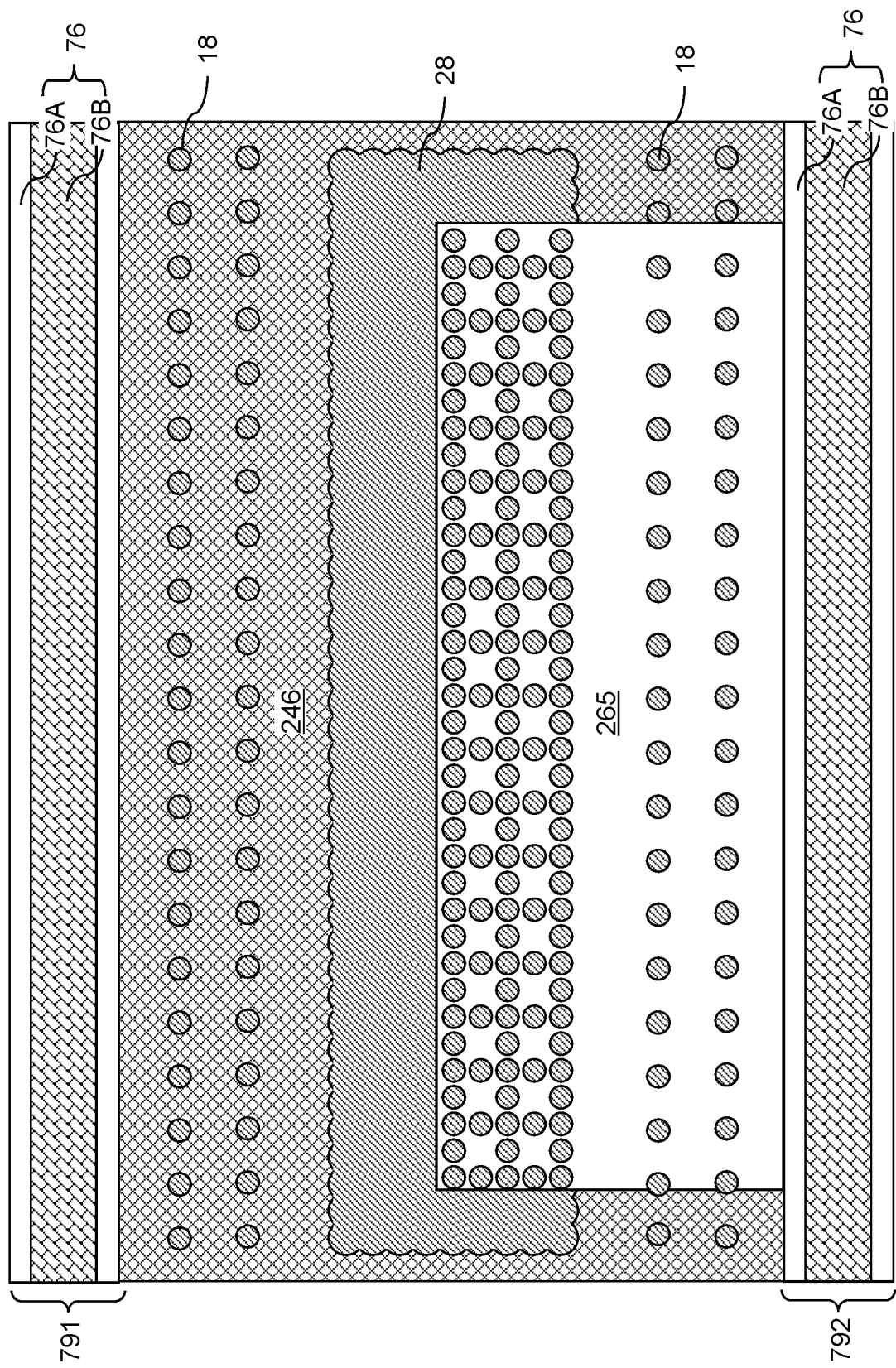

Referring to FIG. 28C, an alternative embodiment of the second configuration of the second exemplary structure can be derived from the second configuration of the second exemplary structure by changing the pattern of the columnar openings 29 so that they are located closer to each other. In this alternative embodiment, the dielectric material plates (142', 242') are omitted and the perforated wall structure 28 comprises a continuous structure which does not surround any dielectric material plates (142', 242').

Referring to FIGS. 29A and 29B, a region of a third configuration of the second exemplary structure including a perforated wall structure 28 is illustrated, which can be derived from the second configuration of the second exemplary structure described above by setting the value of N at 1. In this case, the perforated wall structure 28 comprises multiple columns of pillar portions that are arranged along the second horizontal direction hd2 and laterally spaced apart along the first horizontal direction hd1 at each level of the insulating layers (132, 232). The two rows of pillar structures and the multiple columns of pillar structures define an M×1 array of insulator portions 232P that are portions of a respective insulating layer (132, 232) within each level of the insulating layers (132, 232). M is positive integer that is greater than 1, and may be greater than 2, 3, 4, 5, 6, 7, 8, 9, and/or 10. In one embodiment, the perforated wall structure 28 may comprise 2 rows of pillar portions at a level of an insulating layer (132 or 232), and may comprise (M+1) columns of pillar portion at a level of the insulating layer (132, 232). In the illustrated example, M is 20.

Referring to FIG. 29C, an alternative embodiment of the third configuration of the second exemplary structure can be derived from the second configuration of the second exemplary structure by changing the pattern of the columnar openings 29 so that they are located closer to each other. In this alternative embodiment, the dielectric material plates (142', 242') are omitted and the perforated wall structure 28 comprises a continuous structure which does not surround any dielectric material plates (142', 242').

Referring to FIGS. 30A and 30B, a region of a fourth configuration of the second exemplary structure including a perforated wall structure 28 is illustrated, which can be derived from the second exemplary structure described above by forming a perforated wall structure 28 as a linear structure laterally extending along a first horizontal direction hd1 that is parallel to the lengthwise direction of the line trenches 79, and by forming an additional perforated wall structure 28 located between a neighboring pair of line trenches 79, such as between a first line trench 791 and a second line trench 792. The duration of the isotropic etch process that forms the backside recesses (143, 243) can be selected such that a vertical stack of dielectric material plates (142', 242') is formed, each of which comprises a respective first sidewall contacting one of the perforated wall structure 28 and the additional perforated wall structure 28 and second sidewalls that are concave in a horizontal cross-sectional view.

FIGS. 31A-31B illustrate a third exemplary structure according to an alternative embodiment of the present disclosure. The third exemplary structure may be derived from the second exemplary structure shown in FIGS. 26A-26F by forming the staircase region 200S near the memory plane edge region 300. In this alternative embodiment, the staircase may be formed in the staircase region 200S instead of forming the staircase in the inter-array region 200 which is located between two memory array regions (100A, 100B) away from the memory plane edge region in the second exemplary structure. In the third exemplary structure of FIGS. 31A-31B, the staircase region 200S is located between the memory plane edge region 300 and the memory array region 100 along the first horizontal direction hd1. The memory plane edge region 300 may comprise a dielectric filled region (e.g., a retro-stepped dielectric material portion filled region) which is located at the edge (i.e., at the end) of a memory plane in which the staircase region 200S and the memory array region 100 are located.

The staircase 200S may be an active staircase in which the layer contact via structures (86A, 86B) contact a respective one of the electrically conductive layers (146, 246). Alternatively, the staircase 200S may be a dummy staircase in which no layer contact via structures (86A, 86B) contact any of the electrically conductive layers (146, 246).

In the third exemplary structure, any of the perforated wall structure 28 shapes described above may be used. The perforated wall structure 28 is a monolithic structure having a high mechanical strength and low deformation under compressive stress. Therefore, the perforated wall structure 28 can prevent or reduce insulating layer (132, 232) buckling during or after formation of the backside recesses (143, 243) due to compressive stress generated by the retro-stepped dielectric material portions (165, 265) on the insulating layers (132, 232). This improves the device yield.

According to various embodiments of the present disclosure, at least one perforated wall structure 28 can be used to reduce collapse or deformation of a region of three-dimensional memory device during formation of line trenches 79 and replacement of sacrificial material layers (142, 242) with electrically conductive layers (146, 246). Generally, the at least one perforated wall structure 28 may be used in any region of the three-dimensional memory device such as a memory array region 100 or an inter-array region 200 any other region including stepped surfaces, such as the staircase region 200S. The at least one perforated wall structure 28 may reduce local shrinkage, subsidence and/or collapse of regions including silicon-oxide based materials, such as retro-stepped dielectric material portions (165, 265). The at least one perforated wall structure 28 can be advantageously used to reduce structural deformation of a three-dimensional memory device during manufacture due to the low shrinkage and high mechanical strength of the semiconductor material(s) in the at least one perforated wall structure 28.

Referring to all drawings and according to various embodiments of the present disclosure, a three-dimensional memory device is provided, which comprises: an alternating stack {(132, 146), (232, 246)} of insulating layers (132, 232) and electrically conductive layers (146, 246) located between a first line trench 791 and a second line trench 792 that laterally extend along a first horizontal direction hd1 and over a substrate 8; memory openings 49 vertically extending through each layer of the alternating stack {(132, 146), (232, 246)} and located in a memory array region 100; memory opening fill structures 58 located in the memory openings 49, wherein each of the memory opening fill structures 58 comprises a memory film 50 comprising a dielectric layer stack (52, 54, 56), a vertical semiconductor channel 60, and a dielectric core 62 comprising a dielectric fill material; and a perforated wall structure 28 located between the first line trench 791 and the second line trench 792 and including lateral openings at levels of the insulating layers (132, 232) through which a respective insulating layer (132, 232) laterally extends from outside the perforated wall structure 28 into inside the perforated wall structure 28.

In one embodiment, the perforated wall structure 28 comprises a dummy memory film having a set of material compositions and a same total thickness as the memory film 50, a semiconductor liner having a same thickness and a same material composition as the vertical semiconductor channel 60, and a dielectric fill material portion having a same material composition as the dielectric core 62.

In one embodiment, a topmost surface of the perforated wall structure 28 is located within a same horizontal plane as top surfaces of the memory opening fill structures 58.

In one embodiment, the perforated wall structure 28 comprises a plurality of pillar portions that are laterally spaced apart at each level of the insulating layers (132, 232).

In one embodiment, the perforated wall structure 28 comprises a laterally-extending portion that underlies, and is adjoined to, a respective plurality of pillar portions of the perforated wall structure 28 at each level of the electrically conductive layers (146, 246).

In one embodiment, the three-dimensional memory device comprises a retro-stepped dielectric material portion (165, 265) overlying stepped surfaces of the alternating stack {(132, 146), (232, 246)}, wherein the perforated wall structure 28 vertically extends through the retro-stepped dielectric material portion (165, 265).

In one embodiment, the perforated wall structure 28 comprises a plurality of columnar portions 28C that are laterally spaced apart and vertically extend through the retro-stepped dielectric material portion (165, 265). In one embodiment, the plurality of columnar portions 28C is adjoined to a laterally-extending portion 28L of the perforated wall structure 28 that underlies the retro-stepped dielectric material portion (165, 265).

In one embodiment, portions of the perforated wall structure 28 located at a level of one of the electrically conductive layers (146, 246) comprises: a laterally-extending portion 28C located outside an area of the retro-stepped dielectric material portion (165, 265) and continuously extends from a sidewall of the retro-stepped dielectric material portion (165, 265) and another sidewall of the retro-stepped dielectric material portion (165, 265); and segments of a plurality of columnar portions 28C that are laterally spaced apart and embedded within the retro-stepped dielectric material portion (165, 265).

In one embodiment, the three-dimensional memory device comprises a vertical stack of dielectric material plates (142', 242') located at same levels as the electrically conductive layers (146, 246) within an area enclosed by the perforated wall structure 28 and vertically spaced from each other by the electrically conductive layers (146, 246). In one embodiment, the three-dimensional memory device comprises a retro-stepped dielectric material portion (165, 265) overlying stepped surfaces of the alternating stack {(132, 146), (232, 246)}, wherein sidewalls of the vertical stack of dielectric material plates (142', 242') contact segments of a sidewall of the retro-stepped dielectric material portion (165, 265).

In one embodiment, the perforated wall structure 28 comprises multiple rows of pillar portions that are arranged along a first horizontal direction hd1 and laterally spaced part along a second horizontal direction hd2 at each level of the insulating layers (132, 232).

In one embodiment, the perforated wall structure 28 comprises multiple columns of pillar portions that are arranged along the second horizontal direction hd2 and laterally spaced apart along the first horizontal direction hd1 at each level of the insulating layers (132, 232), wherein the multiple rows of pillar structures and the multiple columns of pillar structures define an M×N array of insulator portions that are portions of a respective insulating layer (132, 232) within each level of the insulating layers (132, 232), wherein M and N are positive integers and has a sum that is at least 3.

In one embodiment, the three-dimensional memory device comprises an M×P array of dielectric material plates (142', 242') located at a level of one of the electrically conductive layers (146, 246) within an area of the perforated wall structure 28, wherein P is a positive integer not greater than N.

In one embodiment, the three-dimensional memory device comprises an additional perforated wall structure 28 located between the first line trench 791 and the second line trench 792, and a vertical stack of dielectric material plates (142', 242') comprising a respective first sidewall contacting one of the perforated wall structure 28 and the additional perforated wall structure 28 and second sidewalls that are concave in a horizontal cross-sectional view.

In one embodiment, the perforated wall structure 28 comprises a laterally-extending portion 28L located at each level of the electrically conductive layers (146, 246) and comprising a plurality of vertically-straight and horizontally-convex segments that are adjoined to each other.

In one embodiment shown in FIGS. 31A-31B, the perforated wall structure 28 is located in a staircase region 200S, and the staircase region 200S borders a memory plane edge region 300.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device, comprising:
    an alternating stack of insulating layers and electrically conductive layers located between a first line trench and a second line trench that laterally extend along a first horizontal direction and over a substrate;
    memory openings vertically extending through each layer of the alternating stack and located in a memory array region;
    memory opening fill structures located in the memory openings, wherein each of the memory opening fill structures comprises a memory film comprising a dielectric layer stack, a vertical semiconductor channel, and a dielectric core comprising a dielectric fill material; and
    a perforated wall structure located between the first line trench and the second line trench and including lateral openings at levels of the insulating layers through which a respective insulating layer laterally extends from outside the perforated wall structure into inside the perforated wall structure.

2. The three-dimensional memory device of claim 1, wherein the perforated wall structure comprises a dummy memory film having a set of material compositions and a same total thickness as the memory film, a semiconductor liner having a same thickness and a same material composition as the vertical semiconductor channel, and a dielectric fill material portion having a same material composition as the dielectric core.

3. The three-dimensional memory device of claim 1, wherein a topmost surface of the perforated wall structure is located within a same horizontal plane as top surfaces of the memory opening fill structures.

4. The three-dimensional memory device of claim 1, wherein:
    the perforated wall structure comprises a plurality of pillar portions that are laterally spaced apart at each level of the insulating layers; and
    the perforated wall structure comprises a laterally-extending portion that underlies and is adjoined to a respective plurality of pillar portions of the perforated wall structure at each level of the electrically conductive layers.

5. The three-dimensional memory device of claim 1, further comprising a retro-stepped dielectric material portion overlying stepped surfaces of the alternating stack, wherein the perforated wall structure vertically extends through the retro-stepped dielectric material portion.

6. The three-dimensional memory device of claim 5, wherein the perforated wall structure comprises a plurality of columnar portions that are laterally spaced apart and vertically extend through the retro-stepped dielectric material portion.

7. The three-dimensional memory device of claim 6, wherein the plurality of columnar portions is adjoined to a laterally-extending portion of the perforated wall structure that underlies the retro-stepped dielectric material portion.

8. The three-dimensional memory device of claim 5, wherein portions of the perforated wall structure located at a level of one of the electrically conductive layers comprises:
    a laterally-extending portion located outside an area of the retro-stepped dielectric material portion and continuously extends from a sidewall of the retro-stepped dielectric material portion to another sidewall of the retro-stepped dielectric material portion; and
    segments of a plurality of columnar portions that are laterally spaced apart and embedded within the retro-stepped dielectric material portion.

9. The three-dimensional memory device of claim 1, further comprising a vertical stack of dielectric material plates located at same levels as the electrically conductive layers within an area enclosed by the perforated wall structure and vertically spaced among one another by the electrically conductive layers.

10. The three-dimensional memory device of claim 9, further comprising a retro-stepped dielectric material portion overlying stepped surfaces of the alternating stack, wherein sidewalls of the vertical stack of dielectric material plates contact segments of a sidewall of the retro-stepped dielectric material portion.

11. The three-dimensional memory device of claim 1, wherein the perforated wall structure comprises multiple rows of pillar portions that are arranged along a first horizontal direction and laterally spaced part along a second horizontal direction at each level of the insulating layers.

12. The three-dimensional memory device of claim 11, wherein the perforated wall structure comprises multiple columns of pillar portions that are arranged along the second horizontal direction and laterally spaced apart along the first horizontal direction at each level of the insulating layers, wherein the multiple rows of pillar structures and the multiple columns of pillar structures define an M×N array of insulator portions that are portions of a respective insulating layer within each level of the insulating layers, wherein M and N are positive integers and has a sum that is at least 3, and an M×P array of dielectric material plates located at a level of one of the electrically conductive layers within an area of the perforated wall structure, wherein P is a positive integer not greater than N.

13. The three-dimensional memory device of claim 1, further comprising:
an additional perforated wall structure located between the first line trench and the second line trench; and
a vertical stack of dielectric material plates comprising a respective first sidewall contacting one of the perforated wall structure and the additional perforated wall structure and second sidewalls that are concave in a horizontal cross-sectional view.

14. The three-dimensional memory device of claim 1, wherein the perforated wall structure comprises a laterally-extending portion located at each level of the electrically conductive layers and comprising a plurality of vertically-straight and horizontally-convex segments that are adjoined among one another.

15. The three-dimensional memory device of claim 1, wherein the perforated wall structure is located in a staircase region, and the staircase region borders a memory plane edge region.

16. A method of forming a memory device, comprising:
forming an alternating layer stack of continuous insulating layers and continuous sacrificial material layers;
forming memory openings and columnar openings through each layer of the alternating layer stack;
forming a continuous perforated cavity by isotropically etching portions of the sacrificial material layers around the columnar openings, wherein volumes of the columnar openings expand at levels of the sacrificial material layers and merge to form the continuous perforated cavity;
forming memory opening fill structures in the memory openings and a perforated wall structure in the continuous perforated cavity, wherein each of the memory opening fill structures comprises a memory film and a vertical semiconductor channel and the perforated wall structure includes lateral openings at levels of the insulating layers through which a respective insulating layer laterally extends from outside the perforated wall structure into inside the perforated wall structure;
patterning the alternating layer stack into multiple alternating stacks of insulating layers and sacrificial material layers; and
replacing the sacrificial material layers with electrically conductive layers.

17. The method of claim 16, further comprising:
covering the memory openings with a patterned etch mask layer, wherein the patterned etch mask layer comprises an opening overlying the columnar openings; and
performing an isotropic etch process that laterally recesses the sacrificial material layers around the columnar openings selective to the insulating layers, whereby the portions of the sacrificial material layers are isotropically etched around the columnar openings.

18. The method of claim 16, wherein the memory opening fill structures and the perforated wall structure are formed by simultaneously depositing a same set of fill materials within each of the memory openings and within the continuous perforated cavity.

19. The method of claim 16, further comprising:
forming a first line trench and a second line trench that laterally extend along a first horizontal direction through the alternating layer stack, wherein the perforated wall structure is located between the first line trench and the second line trench;
forming backside recesses by removing the sacrificial material layers selective to the insulating layers, the perforated wall structure, and the memory opening fill structures; and
forming the electrically conductive layers in the backside recesses.

20. The method of claim 16, further comprising:
forming a stepped cavity by patterning the alternating layer stack, wherein stepped surfaces of the alternating layer stack are physically exposed underneath the stepped cavity; and
forming a retro-stepped dielectric material portion over the stepped surfaces of the alternating layer stack.

* * * * *